United States Patent
Kimura et al.

(10) Patent No.: US 11,514,871 B2
(45) Date of Patent: Nov. 29, 2022

(54) LIQUID CRYSTAL DISPLAY DEVICE, DRIVING METHOD OF THE SAME, AND ELECTRONIC DEVICE INCLUDING THE SAME

(71) Applicant: SEMICONDUCTOR ENERGY LABORATORY CO., LTD., Atsugi (JP)

(72) Inventors: Hajime Kimura, Kanagawa (JP); Atsushi Umezaki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/212,060

(22) Filed: Mar. 25, 2021

(65) Prior Publication Data

US 2021/0233485 A1    Jul. 29, 2021

Related U.S. Application Data

(63) Continuation of application No. 15/893,770, filed on Feb. 12, 2018, now Pat. No. 10,964,281, which is a (Continued)

(30) Foreign Application Priority Data

Mar. 26, 2009  (JP) ................. 2009-077200

(51) Int. Cl.
  *G11C 19/28*   (2006.01)
  *H01L 27/12*   (2006.01)
  (Continued)

(52) U.S. Cl.
  CPC .......... *G09G 3/3677* (2013.01); *G09G 3/3688* (2013.01); *G11C 19/28* (2013.01);
  (Continued)

(58) Field of Classification Search
  CPC .......... G09G 3/3677–3688; G09G 2300/0417; G09G 2310/0286; G09G 2320/043; G11C 19/28
  See application file for complete search history.

(56) References Cited

U.S. PATENT DOCUMENTS

| | | |
|---|---|---|
| 5,410,583 A | 4/1995 | Weisbrod et al. |
| 5,517,542 A | 5/1996 | Huq |

(Continued)

FOREIGN PATENT DOCUMENTS

| | | |
|---|---|---|
| CN | 001135625 A | 11/1996 |
| CN | 001523547 A | 8/2004 |

(Continued)

OTHER PUBLICATIONS

Jang.Y et al., "Integrated Gate Driver Circuit Using a-Si TFT with Dual Pull-down Structure.", IDW '04 : Proceedings of the 11th International Display Workshops, Dec. 8, 2004, pp. 333-336.

(Continued)

*Primary Examiner* — Lin Li

(74) *Attorney, Agent, or Firm* — Fish & Richardson P.C.

(57) ABSTRACT

It is an object to suppress deterioration of characteristics of a transistor in a driver circuit. A first switch for controlling whether to set a potential state of an output signal by being turned on and off in accordance with the first input signal, and a second switch for controlling whether to set a potential state of an output signal by being turned on and off in accordance with the second input signal are included. A first wiring and a second wiring are brought into electrical continuity by turning on and off the first switch or the second switch.

5 Claims, 42 Drawing Sheets

Related U.S. Application Data continuation of application No. 12/731,203, filed on Mar. 25, 2010, now abandoned.

(51) Int. Cl.
  *G02F 1/1368* (2006.01)
  *G09G 3/36* (2006.01)

(52) U.S. Cl.
  CPC ............ G09G 2300/0417 (2013.01); G09G 2310/0286 (2013.01); G09G 2320/043 (2013.01)

(56) References Cited

U.S. PATENT DOCUMENTS

| | | |
|---|---|---|
| 6,064,713 A | 5/2000 | Lebrun et al. |
| 6,091,393 A | 7/2000 | Park |
| 6,300,928 B1 | 10/2001 | Kim |
| 6,426,743 B1 | 7/2002 | Yeo et al. |
| 6,556,646 B1 | 4/2003 | Yeo et al. |
| 6,621,886 B2 | 9/2003 | Kawahata |
| 6,690,347 B2 | 2/2004 | Jeon et al. |
| 6,906,385 B2 | 6/2005 | Moon et al. |
| 6,922,217 B2 | 7/2005 | Kim |
| 7,120,221 B2 | 10/2006 | Moon |
| 7,202,863 B2 | 4/2007 | Kimura et al. |
| 7,215,315 B2 | 5/2007 | Morosawa et al. |
| 7,268,756 B2 | 9/2007 | Koyama et al. |
| 7,289,096 B2 | 10/2007 | Jeon et al. |
| 7,289,593 B2 | 10/2007 | Tobita et al. |
| 7,336,254 B2 | 2/2008 | Iwasaki et al. |
| 7,349,519 B2 | 3/2008 | Jang et al. |
| 7,358,789 B2 | 4/2008 | Kimura |
| 7,379,148 B2 | 5/2008 | Kim |
| 7,403,586 B2 | 7/2008 | Tobita et al. |
| 7,443,944 B2 | 10/2008 | Tobita et al. |
| 7,486,269 B2 | 2/2009 | Moon |
| 7,492,853 B2 | 2/2009 | Tobita |
| 7,528,820 B2 | 5/2009 | Yoon et al. |
| 7,535,027 B2 | 5/2009 | Moon et al. |
| 7,636,412 B2 | 12/2009 | Tobita |
| 7,697,655 B2 | 4/2010 | Chan et al. |
| 7,734,003 B2 | 6/2010 | Chien et al. |
| 7,763,479 B2 | 7/2010 | Chiu et al. |
| 7,782,291 B2 | 8/2010 | Tung |
| 7,786,985 B2 | 8/2010 | Kimura et al. |
| 7,813,467 B2 | 10/2010 | Chan et al. |
| 7,816,193 B2 | 10/2010 | Lin |
| 7,825,888 B2 | 11/2010 | Tobita et al. |
| 7,842,951 B2 | 11/2010 | Park et al. |
| 7,859,510 B2 | 12/2010 | Umezaki |
| 7,911,436 B2 | 3/2011 | Lee et al. |
| 7,936,331 B2 | 5/2011 | Uh et al. |
| 7,978,274 B2 | 7/2011 | Umezaki et al. |
| 8,008,690 B2 | 8/2011 | Moon et al. |
| 8,014,488 B2 | 9/2011 | Jang |
| 8,044,906 B2 | 10/2011 | Kimura et al. |
| 8,053,288 B2 | 11/2011 | Tsai et al. |
| 8,059,078 B2 | 11/2011 | Kimura et al. |
| 8,093,596 B2 | 1/2012 | Chiu et al. |
| 8,265,222 B2 | 9/2012 | Jang |
| 8,309,966 B2 | 11/2012 | Tsai et al. |
| 8,330,492 B2 | 12/2012 | Umezaki |
| 8,390,560 B2 | 3/2013 | Toyoshima et al. |
| 8,421,078 B2 | 4/2013 | Chang et al. |
| 8,456,396 B2 | 6/2013 | Umezaki |
| 8,456,402 B2 | 6/2013 | Kimura et al. |
| 8,462,100 B2 | 6/2013 | Umezaki |
| 8,493,524 B2 | 7/2013 | Her et al. |
| 8,520,159 B2 | 8/2013 | Umezaki et al. |
| 8,531,376 B2 | 9/2013 | Shimoda |
| 8,553,830 B2 | 10/2013 | Jang |
| 8,610,179 B2 | 12/2013 | Moon et al. |
| 8,619,207 B2 | 12/2013 | Kim |
| 8,643,586 B2 | 2/2014 | Umezaki |
| 8,823,620 B2 | 9/2014 | Kimura et al. |
| 8,908,115 B2 | 12/2014 | Umezaki et al. |
| 8,942,339 B2 | 1/2015 | Jang |
| 9,070,593 B2 | 6/2015 | Umezaki |
| 9,184,183 B2 | 11/2015 | Umezaki |
| 9,190,425 B2 | 11/2015 | Kimura et al. |
| 9,214,473 B2 | 12/2015 | Umezaki |
| 9,263,468 B2 | 2/2016 | Umezaki et al. |
| 9,335,599 B2 | 5/2016 | Umezaki |
| 9,454,049 B2 | 9/2016 | Kim |
| 9,461,071 B2 | 10/2016 | Umezaki |
| 9,606,408 B2 | 3/2017 | Umezaki et al. |
| 9,684,215 B2 | 6/2017 | Umezaki |
| 10,048,558 B2 | 8/2018 | Umezaki et al. |
| 10,088,725 B2 | 10/2018 | Umezaki |
| 10,216,053 B2 | 2/2019 | Kim |
| 10,338,443 B2 | 7/2019 | Kim |
| 10,401,699 B2 | 9/2019 | Umezaki |
| 10,527,902 B2 | 1/2020 | Umezaki et al. |
| 10,606,140 B2 | 3/2020 | Umezaki |
| 2002/0018155 A1 | 2/2002 | Nagata et al. |
| 2002/0053703 A1* | 5/2002 | Zhang ................ H01L 27/1259 257/E27.111 |
| 2002/0097829 A1 | 7/2002 | Kawahata |
| 2003/0111677 A1* | 6/2003 | Miyake ................ G09G 3/3688 257/238 |
| 2003/0187903 A1 | 10/2003 | Comer et al. |
| 2003/0222311 A1* | 12/2003 | Kim ...................... H01L 27/124 257/350 |
| 2004/0080679 A1 | 4/2004 | Song et al. |
| 2004/0125069 A1 | 7/2004 | Park et al. |
| 2004/0189585 A1 | 9/2004 | Moon |
| 2004/0253781 A1 | 12/2004 | Kimura et al. |
| 2005/0163938 A1* | 7/2005 | Yamazaki ........... H01L 27/1285 345/55 |
| 2005/0212746 A1 | 9/2005 | Iwasaki et al. |
| 2005/0220262 A1 | 10/2005 | Moon |
| 2005/0264505 A1 | 12/2005 | Kim |
| 2006/0001637 A1 | 1/2006 | Pak et al. |
| 2006/0017681 A1 | 1/2006 | Jang et al. |
| 2006/0028415 A1 | 2/2006 | Yang et al. |
| 2006/0139292 A1 | 6/2006 | Yoon et al. |
| 2006/0202940 A1 | 9/2006 | Azami et al. |
| 2006/0220587 A1 | 10/2006 | Tobita et al. |
| 2007/0001941 A1* | 1/2007 | Umezaki ................ G09G 3/006 345/77 |
| 2007/0085938 A1* | 4/2007 | Yamazaki ............. H01L 27/124 438/149 |
| 2007/0096647 A1 | 5/2007 | Choo et al. |
| 2007/0146289 A1 | 6/2007 | Lee et al. |
| 2007/0146296 A1 | 6/2007 | Kang et al. |
| 2007/0146591 A1 | 6/2007 | Kimura et al. |
| 2007/0153157 A1 | 7/2007 | Kang et al. |
| 2007/0184586 A1* | 8/2007 | Kim .................. G02F 1/136227 438/149 |
| 2007/0197019 A1* | 8/2007 | Kang .................. G09G 3/3677 438/620 |
| 2007/0242176 A1 | 10/2007 | Chang et al. |
| 2007/0279374 A1* | 12/2007 | Kimura ............. G02F 1/133603 345/102 |
| 2008/0002805 A1 | 1/2008 | Tobita et al. |
| 2008/0007296 A1 | 1/2008 | Umezaki |
| 2008/0012816 A1 | 1/2008 | Moon |
| 2008/0036725 A1 | 2/2008 | Lee et al. |
| 2008/0056431 A1 | 3/2008 | Chien et al. |
| 2008/0057605 A1 | 3/2008 | Morisue et al. |
| 2008/0062112 A1* | 3/2008 | Umezaki ............. H01L 27/1222 345/100 |
| 2008/0073649 A1 | 3/2008 | Kim et al. |
| 2008/0076267 A1* | 3/2008 | Oishi .................... G02F 1/1368 438/785 |
| 2008/0079001 A1* | 4/2008 | Umezaki ............. G02F 1/13624 257/59 |
| 2008/0079685 A1* | 4/2008 | Umezaki ............. H01L 27/1222 345/100 |
| 2008/0088564 A1 | 4/2008 | Chang et al. |
| 2008/0180385 A1 | 7/2008 | Yoshida et al. |

(56) References Cited

U.S. PATENT DOCUMENTS

| | | | |
|---|---|---|---|
| 2008/0187089 A1* | 8/2008 | Miyayama | G11C 19/28 377/79 |
| 2008/0219401 A1 | 9/2008 | Tobita | |
| 2008/0224985 A1 | 9/2008 | Jang | |
| 2008/0253499 A1 | 10/2008 | Chan et al. | |
| 2008/0266234 A1 | 10/2008 | Ieong et al. | |
| 2008/0266275 A1 | 10/2008 | Tsai et al. | |
| 2008/0278214 A1 | 11/2008 | Yoon et al. | |
| 2009/0122951 A1 | 5/2009 | Tobita | |
| 2009/0224245 A1* | 9/2009 | Umezaki | G11C 19/28 257/59 |
| 2010/0026619 A1 | 2/2010 | Umezaki | |
| 2010/0182306 A1 | 7/2010 | Kimura et al. | |
| 2010/0226473 A1 | 9/2010 | Liu et al. | |
| 2011/0069806 A1 | 3/2011 | Liao et al. | |
| 2013/0169319 A1 | 7/2013 | Sasaki et al. | |
| 2013/0293800 A1 | 11/2013 | Her et al. | |
| 2017/0018576 A1 | 1/2017 | Umezaki | |
| 2020/0150473 A1 | 5/2020 | Umezaki et al. | |

FOREIGN PATENT DOCUMENTS

| | | |
|---|---|---|
| CN | 001681047 A | 10/2005 |
| CN | 001702497 A | 11/2005 |
| CN | 001767070 A | 5/2006 |
| CN | 001797083 A | 7/2006 |
| CN | 001822088 A | 8/2006 |
| EP | 0731445 A | 9/1996 |
| EP | 1231594 A | 8/2002 |
| EP | 1895545 A | 3/2008 |
| EP | 1970914 A | 9/2008 |
| JP | 06-102536 A | 4/1994 |
| JP | H06-102536 | 4/1994 |
| JP | 2000-150895 A | 5/2000 |
| JP | 2001-326365 A | 11/2001 |
| JP | 2001-343666 A | 12/2001 |
| JP | 2002-133890 A | 5/2002 |
| JP | 2004-145346 A | 5/2004 |
| JP | 2004-274050 A | 9/2004 |
| JP | 2005-050502 A | 2/2005 |
| JP | 2005-527856 | 9/2005 |
| JP | 2005-285168 A | 10/2005 |
| JP | 2006-024350 A | 1/2006 |
| JP | 2006-080472 A | 3/2006 |
| JP | 2006-164477 A | 6/2006 |
| JP | 2006-189762 A | 7/2006 |
| JP | 2006-191026 | 7/2006 |
| JP | 2006-191026 A | 7/2006 |
| JP | 2006-344306 A | 12/2006 |
| JP | 2006-351165 A | 12/2006 |
| JP | 2006-351171 A | 12/2006 |
| JP | 2007-094415 A | 4/2007 |
| JP | 2007-250052 A | 9/2007 |
| JP | 2007-288080 A | 11/2007 |
| JP | 2007-293995 A | 11/2007 |
| JP | 2008-009393 A | 1/2008 |
| JP | 2008-130139 A | 6/2008 |
| JP | 2010-040074 A | 2/2010 |
| JP | 2010-193434 A | 9/2010 |
| JP | 2011-139309 A | 7/2011 |
| KR | 2002-0066962 A | 8/2002 |
| KR | 2005-0062856 A | 6/2005 |
| KR | 2005-0096568 A | 10/2005 |
| KR | 2006-0063691 A | 6/2006 |
| KR | 2006-0076147 A | 7/2006 |
| KR | 2006-0080758 A | 7/2006 |
| KR | 2006-0106634 A | 10/2006 |
| KR | 2007-0109464 A | 11/2007 |
| KR | 2008-0021557 A | 3/2008 |
| KR | 2008-0026391 A | 3/2008 |
| KR | 2008-0029796 A | 4/2008 |
| KR | 2008-0080758 A | 9/2008 |
| KR | 2008-0083379 A | 9/2008 |
| TW | 200701241 | 1/2007 |
| TW | 200707390 | 2/2007 |
| TW | 200733032 | 9/2007 |
| TW | 200820171 | 5/2008 |
| TW | 200832716 | 8/2008 |
| TW | 200841311 | 10/2008 |
| TW | 200901136 | 1/2009 |
| TW | 200905304 | 2/2009 |
| TW | 200905884 | 2/2009 |
| TW | 200908012 | 2/2009 |
| TW | 200945447 | 11/2009 |
| TW | 201005945 | 2/2010 |
| WO | WO-2002/065062 | 8/2002 |
| WO | WO-2003/100511 | 12/2003 |
| WO | WO-2022/029871 | 3/2012 |

OTHER PUBLICATIONS

European Search Report (Application No. 10156273.4) dated May 4, 2011.

Chinese Office Action (Application No. 201010159561.8) dated Nov. 21, 2013.

Taiwanese Office Action (Application No. 99108713) dated Nov. 13, 2014.

Chinese Office Action (Application No. 201410471934.3) dated Feb. 2, 2016.

Korean Office Action (Application No. 2010-0026594) dated May 11, 2016.

Taiwanese Office Action (Application No. 104121481) dated Aug. 29, 2016.

Taiwanese Office Action (Application No. 106107041) dated Jun. 16, 2017.

Korean Office Action (Application No. 2017-0120486) dated Nov. 29, 2017.

Taiwanese Office Action (Application No. 107103663) dated Mar. 15, 2018.

Taiwanese Office Action (Application No. 106137803) dated Apr. 17, 2018.

Taiwanese Office Action (Application No. 108110043) dated Dec. 3, 2019.

Taiwanese Office Action (Application No. 109139569) dated Nov. 4, 2021.

* cited by examiner

Period A1

Period B1

Period C1

Periods D1, E1

Period C1

Period A2

Period B2

Period C2

Periods D2, E2

Period C2

Period A1

Period B1

Period C1

Periods D1, E1

Period A2

Period B2

Period C2

Periods D2, E2

Period A1

Period A2

Period B1

Period B2

Periods C1, C2

Periods D1, D2, E1, E2

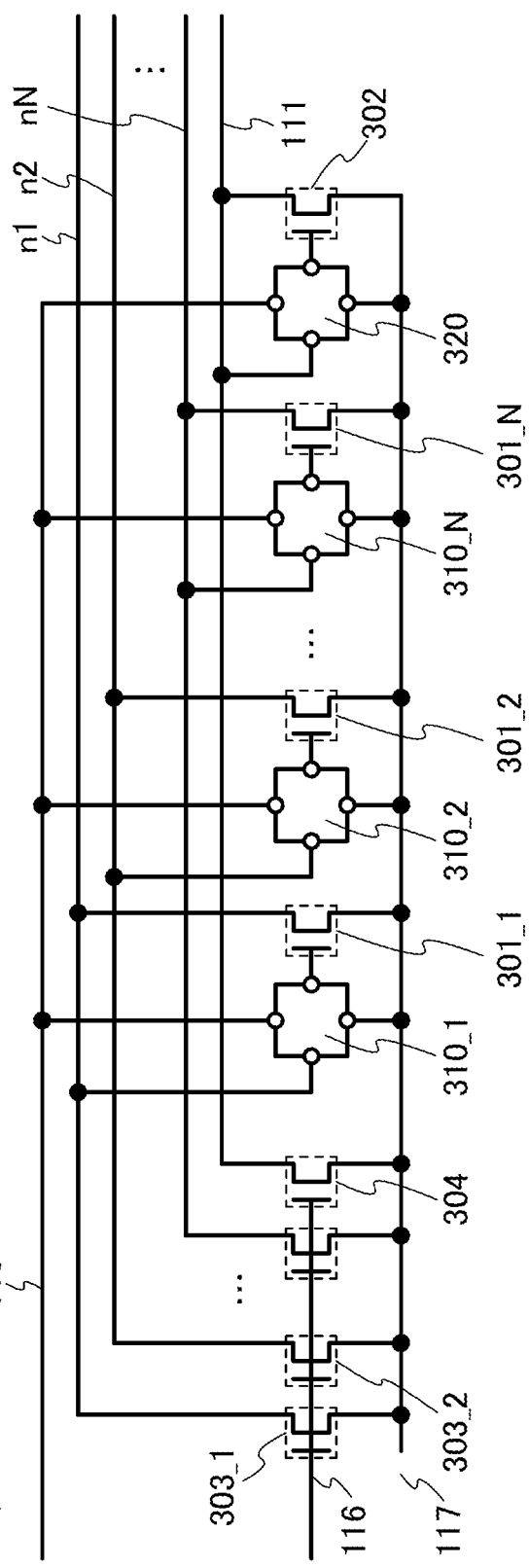
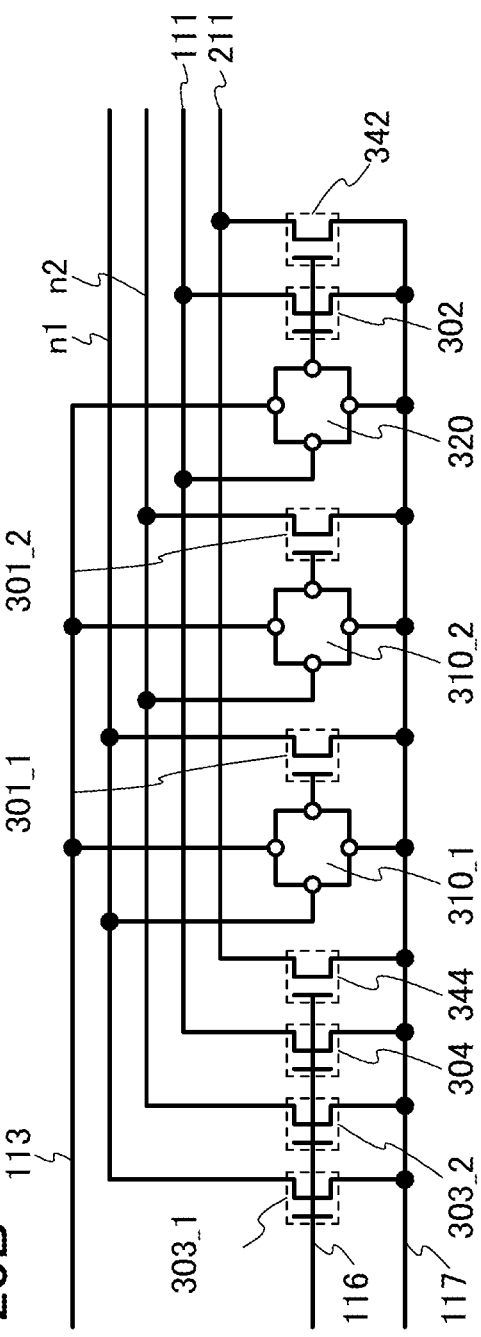
FIG. 20A
FIG. 20B

LIQUID CRYSTAL DISPLAY DEVICE, DRIVING METHOD OF THE SAME, AND ELECTRONIC DEVICE INCLUDING THE SAME

CROSS-REFERENCE TO RELATED APPLICATIONS

This application is a continuation of U.S. application Ser. No. 15/893,770, filed Feb. 12, 2018, now allowed, which is a continuation of U.S. application Ser. No. 12/731,203, filed Mar. 25, 2010, now abandoned, which claims the benefit of a foreign priority application filed in Japan as Serial No. 2009-077200 on Mar. 26, 2009, all of which are incorporated by reference.

BACKGROUND OF THE INVENTION

1. Field of the Invention

The present invention relates to a semiconductor device, a display device, a liquid crystal display device, a method for driving these devices, and a method for manufacturing these devices. The present invention particularly relates to a semiconductor device, a display device, and a liquid crystal display device which include driver circuits formed over the same substrates as pixel portions, and a method for driving these devices. Further, the present invention relates to an electronic device including the semiconductor device, the display device, or the liquid crystal display device.

2. Description of the Related Art

In recent years, with the increase of large display devices such as liquid crystal televisions, display devices have been actively developed. In particular, a technique for forming a driver circuit such as a gate driver over the same substrate as a pixel portion by using transistors including a non-single-crystal semiconductor has been actively developed because the technique greatly contributes to reduction in cost and improvement in reliability.

In a transistor including a non-single-crystal semiconductor, degradation such as variation in threshold voltage or reduction in mobility occurs. As such degradation of the transistor progresses, it becomes difficult to operate a driver circuit and impossible to display images. Patent Documents 1 and 2, and Non-patent Document 1 each disclose a shift register in which degradation of transistors which have a function of making the level of an output signal from a flip flop the L level (L for Low) can be suppressed (hereinafter such a transistor is also referred to as a pull-down transistor). In these documents, two pull-down transistors are used. These two pull-down transistors are connected between an output terminal of a flip flop and a wiring to which VSS (also referred to as negative power supply) is supplied. Moreover, one pull-down transistor and the other pull-down transistor are alternately turned on (i.e., it can also be said that one pull-down transistor and the other pull-down transistor alternately go into an on state). Accordingly, the time during which each of the pull-down transistors is on is reduced, so that degradation of characteristics of the pull-down transistors can be suppressed.

REFERENCE

Patent Document

[Patent Document 1] Japanese Published Patent Application No. 2005-050502

[Patent Document 2] Japanese Published Patent Application No. 2000-024350

Non-Patent Document

[Non-Patent Document 1] Yong Ho Jang et aL "Integrated Gate Driver Circuit Using a-Si TFT with Dual Pull-down Structure", Proceedings of the 11th International Display Workshops 2004, pp. 333-336.

SUMMARY OF THE INVENTION

In a structure employed in conventional techniques, the potential of a gate of a transistor for controlling an output signal to set its level to High (hereinafter also referred to as a pull-up transistor) is higher than a positive power supply voltage or the potential of a clock signal at a High level in some cases. Therefore, high voltage is applied to the pull-up transistor in some cases. Alternatively, in other cases, high voltage is applied to a transistor which is connected to the gate of the pull-up transistor. Alternatively, in some cases, the channel width of a transistor included in a shift register is large so that the shift register operates even when the transistor deteriorates. Alternatively, in some cases when the channel width of a transistor is large, a gate and a source or a dram of the transistor are likely to be short-circuited. Alternatively, in some cases, when the channel width of a transistor is large, parasitic capacitance of transistors included in the shift register is increased.

According to one embodiment of the present invention, it is an object to suppress deterioration of characteristics of a transistor. Alternatively, according to one embodiment of the present invention, it is an object to reduce the channel width of a transistor. Alternatively, according to one embodiment of the present invention, it is an object to suppress deterioration of characteristics of a pull-up transistor or to reduce the channel width of the pull-up transistor. Alternatively, according to one embodiment of the present invention, it is an object to increase the amplitude of an output signal. Alternatively, according to one embodiment of the present invention, it is an object to increase a lime during which a transistor included in a pixel is on. Alternatively, according to one embodiment of the present invention, it is an object to improve insufficient writing of a signal to a pixel. Alternatively, according to one embodiment of the present invention, it is an object to shorten a falling time of an output signal. Alternatively, according to one embodiment of the present invention, it is an object to shorten a rising time of an output signal. Alternatively, according to one embodiment of the present invention, it is an object to prevent a video signal for a pixel in one row from being written to a pixel in a different row. Alternatively, according to one embodiment of the present invention, it is an object to reduce variations in a falling time of an output signal from a driver circuit. Alternatively, according to one embodiment of the present invention, it is an object to uniform feedthrough in pixel transistors. Alternatively, according to one embodiment of the present invention, it is an object to reduce crosstalk. Alternatively, according to one embodiment of the present invention, it is an object to reduce the layout area. Alternatively, it is an object to reduce the size of a frame of a display device. Alternatively, according to one embodiment of the present invention, it is an object to realize higher definition of a display device. Alternatively, according to one embodiment of the present invention, it is an object to increase an yield. Alternatively, according to one embodiment of the present invention, it is an object to reduce manufacturing costs. Alternatively, according to one embodiment of the present invention, it is an object to reduce distortion of an output signal. Alternatively, according to one embodiment of the present invention, it is an object to reduce delay of an output signal. Alternatively, according to one embodiment of the present invention, it is an object to reduce power consumption. Alternatively, according to one embodiment of the present invention, it is an object to decrease the current supply capability of an external circuit. Alternatively, according to one embodiment of the present invention, it is an object to reduce the size of an external circuit or the size of a display device including the external circuit. Note that the description of these objects does not preclude the existence of other objects. Further, one embodiment of the present invention does not necessarily achieve all the above objects.

One embodiment of the present invention is a liquid crystal display device including a driver circuit to which a first input signal, a second input signal, and a third input signal are input and from which an output signal is output; and a pixel in which a liquid crystal element is included and a voltage applied to the liquid crystal element is set in accordance with the output signal. The driver circuit includes a first switch, a second switch, a third switch, and a fourth switch. The first switch and the second switch are turned on and off in accordance with the third input signal. The third switch controls whether to set a potential state of the output signal by being turned on or off in accordance with the first input signal, input of which is controlled by turning on and off of the first switch. The fourth switch controls whether to set a potential slate of the output signal by being turned on or off in accordance with the second input signal, input of which is controlled by turning on and off of the second switch.

One embodiment of the present invention is a liquid crystal display device including a driver circuit to which a first input signal, a second input signal, and a third input signal are input and from which an output signal is output; and a pixel in which a liquid crystal element is included and a voltage applied to the liquid crystal element is set in accordance with the output signal. The driver circuit includes a first transistor having a gate, a source, and a drain; a second transistor having a gate, a source and a drain; a third transistor having a gate, a source, and a drain; and a fourth transistor having a gate, a source, and a drain. The third input signal is input 10 the gate of the first transistor, and the first input signal is input to one of the source and the drain of the first transistor. The third input signal is input to the gate of the second transistor, and the second input signal is input to one of the source and the drain of the second transistor. The gate of the third transistor is electrically connected to the other of the source and the drain of the first transistor, and a potential state of the output signal is controlled by turning on and off of the third transistor. The gale of the fourth transistor is electrically connected to the other of the source and the drain of the second transistor, and a potential state of the output signal is controlled by turning on and off of the fourth transistor.

One embodiment of the present invention is a liquid crystal display device including a driver circuit to which a first input signal, a second input signal, a third input signal, and a fourth input signal are input and from which an output signal is output; and a pixel in which a liquid crystal element is included and a voltage applied to the liquid crystal element is set in accordance with the output signal. The driver circuit includes a first wiring to which the first input signal is input; a second wiring to which the second input signal is input, a third wiring to which the third input signal is input; a fourth wiring to which the fourth input signal is input: a first transistor having a gate, a source, and a drain; a second transistor having a gate, a source, and a drain; a third transistor having a gate, a source, and a drain, a fourth transistor having a gate, a source, and a drain; and a fifth wiring. The gale of the first transistor is electrically connected to the third wiring and one of the source and the drain of the first transistor is electrically connected to the first wiring. The gale of the second transistor is electrically connected to the third wiring and one of the source and the drain of the second transistor is electrically connected to the second wiring. The gate of the third transistor is electrically connected to the other of the source and the drain of the first transistor and one of the source and the drain of the third transistor is electrically connected to the fourth wiring. The gate of the fourth transistor is electrically connected to the other of the source and the drain of the second transistor and one of the source and the drain of the fourth transistor is electrically connected to lire fourth wiring. The fifth wiring is electrically connected to the other of the source and the drain of the third transistor and the other of the source and the drain of the fourth transistor, and a potential applied to the fifth wiring is equal to the potential of the output signal.

One embodiment of the present invention is a liquid crystal display device including a driver circuit to which a first input signal, a second input signal, a third input signal, and a fourth input signal are input and from which an output signal is output; and a pixel in which a liquid crystal element is included and a voltage applied to the liquid crystal element is set in accordance with the output signal. The driver circuit includes a first wiring to which the first input signal is input; a second wiring to which the second input signal is input; a third wiring to which the third input signal is input; a fourth wiring to which the fourth input signal is input; a first transistor having a gate, a source, and a drain, a second transistor having a gate, a source, and a drain; a third transistor having a gate, a source, and a drain; a fourth transistor having a gate, a source, and a drain; and a fifth wiring. The gate and one of the source and the dram of the first transistor are electrically connected to the first wiring. The gate and one of the source and the dram of the second transistor are electrically connected to the second wiring. The gate of the third transistor is electrically connected to the other of the source and the drain of the first transistor and one of the source and the drain of the third transistor is electrically connected to the third wiring. The gate of the fourth transistor is electrically connected to the other of the source and the drain of the second transistor and one of the source and the drain of the fourth transistor is electrically connected to the fourth wiring. The fifth wiring is electrically connected to the other of the source and the drain of the third transistor and the other of the source and the drain of the fourth transistor, and a potential applied to the fifth wiring is equal to the potential of the output signal.

One embodiment of the present invention is a liquid crystal display device including a driver circuit to which a first input signal and a second input signal are input and from which an output signal is output; and a pixel in which a liquid crystal element is included and a voltage applied to the liquid crystal element is set in accordance with the output signal. The driver circuit includes a first wiring to which the first input signal is input; a second wiring to which the second input signal is input; a first transistor having a gate, a source, and a drain; a second transistor having a gate, a source, and a drain; a third transistor having a gate, a source, and a drain, a fourth transistor having a gate, a source, and a drain; and a third wiring. The gate and one of the source and the drain of the first transistor are electrically connected to the first wiring. The gale and one of the source and the drain of the second transistor are electrically connected to the second wiring. The gate and one of the source and the drain of the third transistor are electrically connected to the other of the source and the drain of the first transistor. The gate and one of the source and the drain of the fourth transistor are electrically connected to the other of the source and the drain of the second transistor. The third wiring is electrically connected to the other of the source and the drain of the third transistor and the other of the source and the drain of the fourth transistor and a potential applied to the third wiring is equal to the potential of the output signal.

According to one embodiment of the present invention, the channel width of the third transistor can be equal to the channel width of the fourth transistor.

According to one embodiment of the present invention, the channel width of the first transistor can be smaller than the channel width of the third transistor, and the channel width of the second transistor can be smaller than the channel width of the fourth transistor.

One embodiment of the present invention is a liquid crystal display device including a driver circuit to which a first input signal and a second input signal are input and from which an output signal is output; and a pixel in which a liquid crystal element is included and a voltage applied to the liquid crystal element is set in accordance with the output signal. The driver circuit includes a first wiring to which the first input signal is input; a second wiring to which the second input signal is input; a first transistor having a gate, a source, and a drain; a second transistor having a gate, a source, and a drain: a first diode having an positive electrode and a negative electrode, a second diode having an positive electrode and a negative electrode; and a third wiring. The gate and one of the source and the drain of the first transistor are electrically connected to the first wiring. The gate and one of the source and the drain of the second transistor are electrically connected to the second wiring. The positive electrode of the first diode is electrically connected to the other of the source and the drain of the first transistor. The positive electrode of the second diode is electrically connected to the other of the source and the drain of the second transistor. The third wiring is electrically connected to the negative electrode of the first diode and the negative electrode of the second diode and a potential applied to the third wiring is equal to the potential of the output signal.

According to one embodiment of the present invention, the channel width of the first transistor can be equal to the channel width of the second transistor.

One embodiment of the present invention is an electronic device including at least the liquid crystal display device disclosed in any of the above and an operation switch for controlling operation of the liquid crystal display device.

Note that a variety of switches can be used as a switch. Examples of a switch are an electrical switch, a mechanical switch, and the like Thai is, there is no particular limitation on the kind of switch as long as it can control the flow of current.

Examples of switch include a transistor (e.g., a bipolar transistor or a MOS transistor), a diode (e.g., a PN diode, a PIN diode, a Schottky diode, a metal-insulator-metal (MJM) diode, a metal-insulator-semiconductor (MIS) diode, or a diode-connected transistor), or a logic circuit combining such elements. As examples of mechanical switches, there is a switch formed by a micro electro mechanical system (MEMS) technology similarly to a digital micromirror device (DMD). Such a switch includes an electrode which can be moved mechanically, and controls electrical connection or non-electrical-connection with the movement of the electrode.

Note that a CMOS switch may be employed as a switch by using both n-channel and p-channel transistors.

Note that a display element, a display device which is a device having a display element, a light-emitting element, and a light-emitting device which is a device having a light-emitting element can use various types and can include various elements. For example, a display element, a display device, a tight-emitting element, and a light-emitting device can include a display medium in which contrast, luminance, reflectivity, transmittance, or the like is changed by an electromagnetic action, such as an EL (electroluminescent) element (e.g., an EL element including organic and inorganic materials, an organic EL element, or an inorganic EL element), an LED (e.g., a white LED, a red LED, a green LED, or a blue LED), a transistor (e.g., a transistor that emits light corresponding to a current), an electron emitter, a liquid crystal element, electronic ink, an electrophoresis element, a grating light valve (GLV), a digital micromirror device (DMD), or a carbon nanotube can be used. Alternatively, examples of display devices can be a plasma display and a piezoelectric ceramic display. Note that example of display devices having EL elements include an EL display and the like. Examples of display devices having electron emitters include a field emission display (FED), an SED-type flat panel display (SED: surface-conduction electron-emitter display), and the like. Examples of display devices having liquid crystal elements include a liquid crystal display (e.g., a transmissive liquid crystal display, a transflective liquid crystal display, a reflective liquid crystal display, a direct-view liquid crystal display, or a projection liquid crystal display) and the like. Examples of display devices having electronic ink or electrophoretic elements include electronic paper.

An example of liquid crystal elements is an element which controls transmission and non-transmission of light by optical modulation action of liquid crystals. Such an element can be formed using a pair of electrodes and a liquid crystal layer. Note that the optical modulation action of liquid crystals is controlled by an electric field applied to the liquid crystal (including a lateral electric field, a vertical electric field and a diagonal electric field). Specifically, the following liquid crystals can be used for a liquid crystal element: a nematic liquid crystal, a cholesteric liquid crystal, a smectic liquid crystal, a discotic liquid crystal, a thermotropic liquid crystal, a lyotropic liquid crystal, a low molecular weight liquid crystal, a high molecular weight liquid crystal, a PDLC (polymer dispersed liquid crystal), a ferroelectric liquid crystal, an anti-ferroelectric liquid crystal, a main chain type liquid crystal, a side chain type polymer liquid crystal, a plasma addressed liquid crystal (PALC), a banana-shaped liquid crystal. Also, the following modes can be employed: TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue-phase mode. Note that the present invention is not limited thereto, and various kinds of liquid crystal elements can be used.

Note that transistors with various structures can be used. Therefore, there is no limitation to the kinds of transistors to be used. For example, a thin film transistor (TFT) including a non-single crystal semiconductor film typified by amorphous silicon, polycrystalline silicon, microcrystalline (also referred to as microcrystal, nanocrystal, or semi-amorphous) silicon, or the like can be used.

As an example of a transistor, a transistor including a compound semiconductor or an oxide semiconductor, such as ZnO, a-InGaZnO, SiGe, GaAs, IZO (indium zinc oxide), ITO (indium tin oxide), SuO, TiO, or AlZnSnO (AZTO), a thin film transistor obtained by thinning such a compound semiconductor or an oxide semiconductor, or the like can be given.

As an example of a transistor, a transistor formed by using an inkjet method or a printing method, or the like can be given.

Further, as an example of a transistor, a transistor or the like including an organic semiconductor or a carbon nanotube can be given.

Note that transistors with various structures can be used. For example, a MOS transistor, a junction transistor, a bipolar transistor, or the like can be used as a transistor.

Alternatively, as an example of a transistor, a multi-gate structure having two or more gate electrodes can be used.

As another example of a transistor, a transistor with a structure where gate electrodes are formed above and below a channel can be used.

Alternatively, as an example of a transistor, a transistor with a structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be given.

Further alternatively, as an example of a transistor, a transistor with a structure where a source electrode or a drain electrode may overlap with a channel region (or part of it) can be given.

Further alternatively, as an example of a transistor, a transistor with a structure where an LDD region is provided may be applied.

Further, there is no particular limitation on the kind of substrate for forming a transistor and a transistor can be formed using a variety of kinds of substrate. As an example of the substrate, a semiconductor substrate, a single crystal substrate (e.g., a silicon substrate), an SOI substrate, a glass substrate, a quart/substrate, a plastic substrate, a metal substrate, a stainless steel substrate, a substrate including a stainless steel foil, a tungsten substrate, a substrate including a tungsten foil, a flexible substrate, an attachment film, paper including a fibrous material a base material film, or the like can be given. As an example of a glass substrate, a barium borosilicate glass substrate, an aluminoborosilicate glass substrate, soda lime glass substrate, or the like can be given. For a flexible substrate, a flexible synthetic resin such as plastics typified by polyethylene terephthalate (PET), polyethylene naphthalate (PEN), and polyether sulfone (PES), or acrylic can be used, for example. Examples of an attachment film are an attachment film formed using polypropylene, polyester, vinyl polyvinyl fluoride, polyvinyl chloride, and the like. Examples of a base film are a base film formed using polyester, polyamide, polyimide, inorganic vapor deposition film, paper, and the like. Specifically, when a transistor is formed using a semiconductor substrate, a single crystal substrate, an SOI substrate, or the like, a transistor with few variations in characteristics, size, shape, or the like, high current supply capability, and a small size can be formed. By forming a circuit using such transistors, power consumption of the circuit can be reduced or the circuit can be highly integrated.

Note that the transistor may be formed using one substrate, and then, the transistor may be transferred to another substrate. Example of a substrate to which a transistor is transferred are, in addition to the above-described substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, improvement in electrical characteristics of a transistor or reduction in power consumption of the transistor can be achieved. Further, improvement in reliability, improvement in heat resistance, reduction in weight, or reduction in thickness of a device which includes the transistor can be achieved.

Note that all the circuits which are necessary to realize a desired function can be formed using one substrate (e.g., a glass substrate, a plastic substrate, a single crystal substrate, or an SOI substrate). In this manner, cost can be reduced by reduction in the number of component parts or reliability can be improved by reduction in the number of connection to circuit components.

In addition, not all the circuits which are necessary to realize the predetermined function are needed to be formed using one substrate. That is, part of the circuits which are necessary to realize the predetermined function may be formed using one substrate and another part of the circuits which are necessary to realize the predetermined function may be formed using another substrate. For example, part of the circuits which are necessary to realize the predetermined function may be formed over a glass substrate and another part of the circuits which are necessary to realize the predetermined function may be formed using a single crystal substrate. Then, the single crystal substrate provided with the another part of the circuits which are necessary to realize the predetermined function may be connected to a glass substrate by COG (chip on glass) so that the single crystal substrate provided with the circuit (also referred to as an IC chip) can be provided for the glass substrate. Alternatively, the IC chip can be connected to the glass substrate by using TAB (tape automated bonding), COF (chip on film), SMT (surface mount technology), a printed substrate, or the like. When part of the circuits is formed over a substrate where a pixel portion is formed in this manner, cost can be reduced by reduction in the number of component parts or reliability can be improved by reduction in the number of connections between circuit components. Specifically, a circuit in a portion where a driving voltage is high, a circuit in a portion where a driving frequency is high, or the like consumes much power in many cases. Therefore, such a circuit is formed over a substrate (e.g., a single crystal substrate) which is different from a substrate over which the pixel portion is formed, so that an IC chip is formed. By the use of this IC chip, increase in power consumption can be prevented.

Note that a transistor may be, for example, an element having at least three terminals: a gate, a drain, and a source. The element has a channel region between a drain region and a source region. Current can flow through the drain region, the channel region, and the source region. Here, since a source and a drain may change depending on a structure, operating conditions, and the like of the transistor, it is difficult to define which is the source or the drain. Therefore, in some cases, a region functioning as the source or the drain is not called the source or the drain. As an example, one of the source and the drain is referred to as a first terminal, a first electrode, or a first region, and the other of the source and the drain is referred to as a second terminal, a second electrode, or a second region in some cases. In addition, a gate is referred to as a third terminal or a third electrode in some cases.

Note that a transistor may be an element including at least three terminals; a base, an emitter and a collector. In that case too, one of the emitter and the collector is referred to as a first terminal, a first electrode, or a first region, and the other of the emitter and the collector is referred to as a second terminal, a second electrode, or a second region in some cases. Note that in the case where a bipolar transistor is used as a transistor, a gate can be rephrased as a base.

Note that when it is explicitly described that A and B are connected, the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be provided in the connections shown in the drawings and texts, without being limited to a predetermined connection, for example, the connection shown in the drawings and texts.

For example, when A and B are electrically connected, one or more elements that enable electrical connection between A and B (e.g., a switch, a transistor, a capacitor, an inductor, a resistor, or a diode) may be connected between A and B.

For example, when A and B are functionally connected, one or more circuits that enable functional connection between A and B (e.g., a logic circuit such as an inverter, a NAND circuit, or a NOR circuit: a signal converter circuit such as a DA converter circuit, an AD converter circuit, or a gamma correction circuit: a potential level convener circuit such as a power supply circuit (e.g., a step-up voltage circuit or a step-down voltage circuit) or a level shifter circuit for changing a potential level of a signal; a voltage source; a current source; a switching circuit: or an amplifier circuit such as a circuit that can increase signal amplitude, the amount of current, or the like (e.g., an operational amplifier, a differential amplifier circuit, a source follower circuit, or a buffer circuit), a signal generating circuit, a memory circuit, or a control circuit) may be connected between A and B. Note that for example, when a signal outputted from A is transmitted to B, it can be said that A and B are functionally connected even if another circuit is provided between A and B.

Note that when it is explicitly described that A and B are electrically connected, the case where A and B are electrically connected (i.e., the case where A and B are connected with another element or another circuit provided therebetween), the case where A and B are functionally connected (i.e., the case where A and B are functionally connected with another circuit provided therebetween), and the case where A and B are directly connected (i.e., the case where A and B are connected without another element or another circuit provided therebetween) are included therein. Thai is, when it is explicitly described that A and B are electrically connected, the description is the same as the case where it is explicitly only described that A and B are connected.

When it is explicitly described that B is formed on or over A, it does not necessarily mean that B is formed in direct contact with A. The description includes the case where A and B are not in direct contact with each other, that is, the case where another object is interposed between A and B Here, each of A and B is an object (e.g., a device, an element, a circuit, a wiring, an electrode, a terminal a conductive film, or a layer).

Accordingly, for example, when it is explicitly described that a layer B is formed on (or over) a layer A, it includes both the case where the layer B is formed in direct contact with the layer A; and the case where another layer (e.g., a layer C or a layer D) is formed in direct contact with the layer A, and the layer B is formed in direct contact with the layer C or D. Note that another layer (e.g., the layer C or the layer D) may be a single layer or a plurality of layers.

Similarly, when it is explicitly described that B is formed above A, it does not necessarily mean that B is formed in direct contact with A, and another object may be interposed between A and B. Accordingly, the case where a layer B is formed above a layer A includes the case where the layer B is formed in direct contact with the layer A and the case where another layer (such as a layer C and a layer D) is formed in direct contact with the layer A and the layer B is formed in direct contact with the layer C or the D. Note that another layer (e.g., a layer C or a layer D) may be a single layer or a plurality of layers.

Note that when it is explicitly described that B is formed over, on, or above A, B may be formed diagonally above A. Note that the same can be said when it is explicitly described that B is formed below or under A.

Note that explicit singular forms preferably mean singular forms. However, without being limited thereto, such singular forms can include plural forms. Similarly, explicit plural forms preferably mean plural forms. However, without being limited thereto, such plural forms can include singular forms.

Note that the size, the thickness of layers, or regions in diagrams are sometimes exaggerated for simplicity. Therefore, embodiments of the present invention are not limited to such scales.

Note that a diagram schematically illustrates an ideal example, and embodiments of the present invention are not limited to the shape or the value illustrated in the diagram. For example, the following can be included: variation in shape due to a manufacturing technique or dimensional deviation: or variation in signal, voltage, or current due to noise or difference in timing.

Note that technical terms are used in order to describe a specific embodiment or the like in many cases, and there are no limitations on terms. However, one embodiment of the present invention should not be construed as being limited by the technical terms.

Note that terms which are not defined (including terms used for science and technology, such as technical terms and academic parlance) can be used as live terms which have a meaning equivalent to a general meaning that an ordinary person skilled in the art understands. It is preferable that the term defined by dictionaries or the like be construed as a consistent meaning with the background of related art.

The terms such as first, second, and third are used for distinguishing various elements, members, regions, layers, and areas from others. Therefore, the terms such as first, second, and third do not limit the number of elements, members, regions, layers, areas, or the like. Further, for example, "first" can be replaced with "second", "third", or the like.

Terms for describing spatial arrangement, such as "over", "above", "under", "below", "laterally", "right", "left", "obliquely", "back", "front", "inside", "outside", and "in" are often used for briefly showing, with reference to a diagram, a relation between an element and another element or between some characteristics and other characteristics. Note that embodiments of the present invention are not limited thereto, and such terms for describing spatial arrangement can indicate not only the direction illustrated in a diagram but also another direction. For example, when it is explicitly described that "B is over A", it does not necessarily mean that B is placed over A, and can include the case where B is placed under A because a device in a diagram can be inverted or rotated by 180°. Accordingly, "over" can refer to the direction described by "under" in addition to the direction described by "over". Note that embodiments of the present invention are not limited thereto, and "over" can refer to other directions described by "laterally", "right", "left", "obliquely", "back", "front", "inside", "outside", and "in" in addition to the directions described by "over" and "under" because a device in a diagram can be rotated in a variety of directions. That is, the terms for describing spatial arrangement can be construed adequately depending on the situation.

One embodiment of the present invention includes a first switch connecting a first wiring and a second wiring and a second switch connecting the first wiring and the second wiring. The first switch is on and the second switch is off in a first period. The first switch is off and the second switch is off in a second period. The first switch is off and the second switch is on in a third period. The first switch is off and the second switch is off in a fourth period.

One embodiment of the present invention includes a first path and a second path between a first wiring and a second wiring. The first wiring and the second wiring are brought into electrical contact through the first path in a first period. The first wiring and the second wiring are electrically disconnected in a second period. The first wiring and the second wiring are electrically connected through the second path in a third period. The first wiring and the second wiring are electrically disconnected in a fourth period.

One embodiment of the present invention includes a first transistor and a second transistor. A first terminal of tire first transistor is connected to a first wiring, a second terminal of the first transistor is connected to a second wiring, and a gate of the first transistor is connected to a third wiring. A first terminal of the second transistor is connected to the first wiring, a second terminal of the second transistor is connected to the second wiring, and a gate of the second transistor is connected to a fourth wiring.

One embodiment of the present invention includes a first transistor and a second transistor. The first transistor is on and the second transistor is off in a first period. The first transistor is off and the second transistor is on in a second period. The first transistor is off and the second transistor is on in a third period. The first transistor is off and the second transistor is on in a fourth period.

One embodiment of the present invention includes a first transistor, a second transistor, and a third transistor. A first terminal of the first transistor is connected to a first wiring, a second terminal of the first transistor is connected to a second wiring, and a gate of the first transistor is connected to a third wiring. A first terminal of the second transistor is connected to the first wiring, a second terminal of the second transistor is connected to the second wiring, and a gate of the second transistor is connected to a fourth wiring. A first terminal of the third transistor is connected to a fifth wiring, a second terminal of the third transistor is connected to the second wiring, and a gale of the third transistor is connected to a sixth wiring.

According to one embodiment of the present invention, deterioration in characteristics of a transistor can be suppressed. Alternatively, according to one embodiment of the present invention, the channel width of a transistor can be reduced. Particularly, suppression of deterioration in characteristics of a pull-up transistor or reduction in channel width of a pull-up transistor can be achieved. Alternatively, according to one embodiment of the present invention, a layout area can be reduced. Alternatively, according to one embodiment of the present invention, the size of a frame of a display device can be reduced. Alternatively, according to one embodiment of the present invention, a high-definition display device can be obtained. Alternatively, according to one embodiment of the present invention, an yield can be increased. Alternatively, according to one embodiment of the present invention, manufacturing costs can be reduced. Alternatively, according to one embodiment of the present invention, power consumption can be reduced. Alternatively, according to one embodiment of the present invention, current supply capability of an external circuit can be reduced. Alternatively, according to one embodiment of the present invention, the size of an external circuit or the size of a display device including the external circuit can be reduced.

BRIEF DESCRIPTION OF THE DRAWINGS

FIGS. 20A and 20B are examples of a circuit diagram of a semiconductor device in Embodiment 3.

DETAILED DESCRIPTION OF THE INVENTION

Figure 1A:
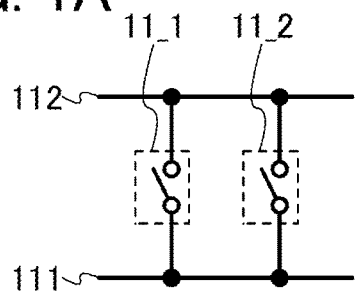
FIGS. 1A, 1C, 1E, and 1G are examples of a circuit diagram of a semiconductor device in Embodiment 1

Hereinafter, embodiments will be described with reference to drawings. However, the embodiments can be implemented with various modes. It will be readily appreciated by those skilled in the art that modes and details can be changed in various ways without departing from the spirit and scope of the present invention. Therefore, this invention is not interpreted as being limited to the description of the embodiments below. Note that in structures of the invention described below, the same portions or portions having similar functions are denoted by the same reference numerals, and description thereof is not repeated.

Note that what is described (or pan thereof) in one embodiment can be applied to combined with, or exchanged with another content in the same embodiment and/or what is described (or part thereof) in another embodiment or other embodiments.

Note that in each embodiment, a content described in the embodiment is a content described with reference to a variety of diagrams or a content described with a paragraph disclosed in this specification.

In addition, by combining a diagram (or part thereof) described in one embodiment with another part of the diagram, a different diagram (or part thereof) described in tire same embodiment, and/or a diagram (or part thereof) described in one or a plurality of different embodiments, much more diagrams can be formed.

Note that in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. Therefore, for example, in a diagram (e.g., a cross-sectional view, a plan view, a circuit diagram, a block diagram, a flow chart, a process diagram, a perspective view, a cubic diagram, a layout diagram, a timing chart a structure diagram, a schematic view, a graph, a list, a ray diagram, a vector diagram, a phase diagram, a waveform chart, a photograph, or a chemical formula) or a text in which one or more active elements (e.g., transistors or diodes), wirings, passive elements (e.g., capacitors or resistors), conductive layers, insulating layers, semiconductor layers, organic materials, inorganic materials, components, substrates, modules, devices, solids, liquids, gases, operating methods, manufacturing methods, or the like are described, part of the diagram or the text is taken out, and one embodiment of the invention can be constituted.

Embodiment 1

In this embodiment, one example of a semiconductor device w ill be described. The semiconductor device in this embodiment can be used for a variety of kinds of driver circuit, for example, a shift register, a gate driver, or a source driver. Note that the semiconductor device in this embodiment can also be referred to as a driver circuit or a circuit.

First, a semiconductor device of this embodiment will be described with reference to FIG. 1A. The semiconductor device in FIG. 1A includes a plurality of switches: switches 11_1 and 11_2. The switches 11_1 and 11_2 connects a wiring 111 and a wiring 112. However, this embodiment is not limited to this example. The semiconductor device can include three or more switches.

Next, an example of a signal, voltage, or the like which is input to or output from each wiring is described.

As an example, a signal OUT is output from the wiring 111. The signal OUT can have a first potential state and a second potential state, for example. For example, the signal OUT is a digital signal having two states of the H level (also referred to as a High level) and the L level (also referred to as a Low level) in many cases, and can function as an output signal. Thus, the wiring 111 can function as a signal line. In particular, the wiring 111 can be arranged so as to extend to a pixel portion. Moreover, the wiring 111 can be connected to a pixel. For example, in the case of a liquid crystal display device, a structure in which the wiring 111 is connected to a pixel including a liquid crystal element and a voltage applied to the liquid crystal element is set in accordance with the potential of the wiring 111 can be employed. Alternatively, the wiring 111 can be connected to a gate of a transistor (e.g., a selection transistor or a switching transistor) included in a pixel. In such a case, the signal OUT can function as a selection signal, a transfer signal, a start signal, a reset signal, a gate signal, or a scan signal. Therefore, the wiring 111 can function as a gate signal line (a gate line) or a scan line.

For example, a signal CK1 is input to the wiring 112. The signal CK1 can have a first potential state and a second potential slate, for example. For example, the signal CK1 is a digital signal which repeatedly switch between the H level and the L level in many cases and can function as a clock signal. Therefore, the wiring 112 can function as a signal line or a clock signal line. However, this embodiment is not limited to this example. Other than the above, a variety of signals, voltages, or currents can be input to the wiring 111 or the wiring 112. For example, a voltage is supplied to the wiring 111 or the wiring 112 so that the wiring 111 or the wiring 112 can function as a power supply line.

For example, the first potential state, that is, the potential of a signal in the L level, is represented by V1, and the second potential state, that is, the potential of a signal in the H level, is represented by V2. Further, V2 is higher than V1. Note that this embodiment is not limited thereto, and the potential of the signal in the L level can be lower or higher than V1. Alternatively, the potential of the signal in the H level can be lower or higher than V2. For example, although a signal is referred to as a signal in the H level, there is the case where the potential of the signal is lower than V2 or the case where the signal is higher than V2 depending on a circuit configuration. Alternatively, although a signal is referred to as a signal in the L level, there is the case where the potential of the signal is lower than V1 or the case where the signal is higher than V1 depending on a circuit configuration.

Note that the term "approximately" means that a value includes a variety of errors such as an error due to noise, an error due to variations in a process, an error due to variations in steps of manufacturing an element, and/or a measurement error.

Note that in general, a voltage refers to the difference between potentials of two points (also referred to as the potential difference), and a potential refers to electrostatic energy (electric potential energy) that a unit charge in an electrostatic field has at one point. However, in an electronic circuit, even in the case of only one point, a difference between the potential of the one point and a potential used as reference (also referred to as a reference potential) can be used as a value. In addition, both the value of a voltage and the value of a potential are represented by volt (V) in a circuit diagram; therefore, it is hard to distinguish voltage and potential. Therefore, in the document (the specification and the scope of claims) of this application, voltage is sometimes treated as a value even in the case of only one point is considered, unless otherwise specified.

Note that the signal CK1 can be a balanced signal or an unbalanced signal. A balanced signal is a signal whose period in which the signal is the H level and whose period in which the signal is in the L level in one cycle have approximately the same length. An unbalanced signal is a signal whose period in which the signal is the H level and whose period in which the signal is in the L level in one cycle have different lengths. Note that the term "different" here does not include a range of the term "approximately the same".

Next, functions of the switches 11_1 and 11_2 are described. The switches 11_1 and 11_2 have a function of controlling an electrical continuity state between the wiring 111 and the wiring 112. Accordingly, as shown in FIG. 1B, there are a plurality of paths of paths 2_1 and 21_2 between the wirings 111 and 112. Alternatively, the switches 11_1 and 11_2 have a function of controlling whether to set the potential state of the signal OUT. However, this embodiment is not limited to this example. The switches 11_1 and 11_2 can have a variety of functions other than the above.

Note that the term "a path between a wiring A (e.g., the wiring 111) and a wiring B (e.g., the wiring 112)" includes the case where a switch connects the wiring A and the wiring B. However, this embodiment is not limited thereto, and a variety of elements (e.g., a transistor, a diode, a resistor, or a capacitor) or a variety of circuits (e.g., a buffer circuit, an inverter circuit, or a shift register) other than a switch can connect the wirings A and B Accordingly, an element such as a resistor or a transistor can be connected in series or in parallel with the switch 11_1, for example.

Next, operation of the semiconductor device in FIG. 1A will be described with reference to a timing change in FIG. 2A. However, this embodiment is not limited to this example. The semiconductor device in FIG. 1A can be controlled at a variety of timings.

Figure 2A:
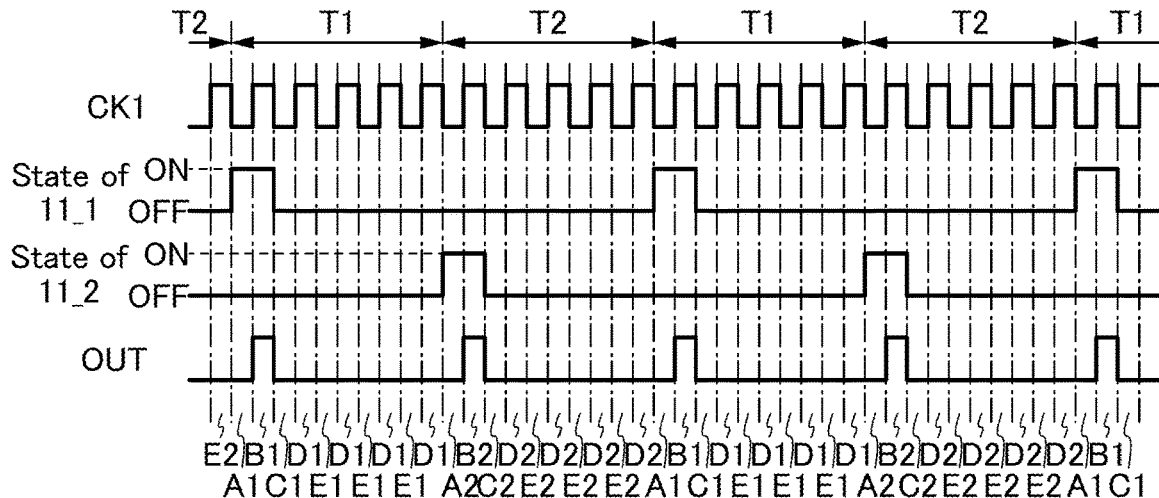
FIG. 2A is an example of a timing chart for illustrating operation of a semiconductor device in Embodiment 1.

The timing change in FIG. 2A shows the waveform of the signal CK1, the waveform of a state (ON or OFF) of the switch 11_1, the waveform of a state (ON or OFF) of the switch 11_2, and the waveform of the signal OUT. The timing change in FIG. 2A includes a plurality of periods, and each period has a plurality of sub-periods. For example, the liming chart in FIG. 2A includes a plurality of periods (hereinafter a period is also referred to as a frame period) T1 and of periods T2. A period T1 includes a plurality of sub-periods (hereinafter a sub-period is also referred to as one gate selection period) A1, B1, C1, D1, and F1. The period T2 includes a plurality of sub-periods A2, B2, C2, D2, and E2. However, this embodiment is not limited to this example. The liming chart in FIG. 2A can include a different period other than a period T1 and a period T2 or one of a period T1 and a period T2 can be eliminated. Further, a period T1 can include a variety of periods other than the periods A1 to E1, or any of the periods A1 to E1 can be eliminated. Furthermore, a period T2 can include a variety of periods other than the periods A2 to E2, or any of the periods A2 to F2 can be eliminated.

Figure 1B:
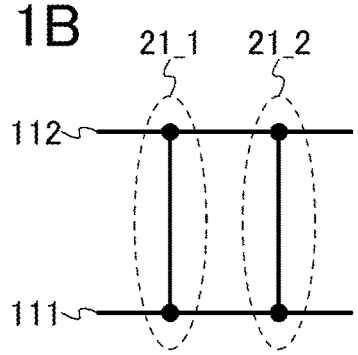
FIGS. 1B, 1D, and 1F are examples of a schematic view for illustrating operation of the semiconductor device in Embodiment 1.

Note that the semiconductor device in FIG. 1A alternately performs operation of a period T1 and operation of a period T2, for example. However, this embodiment is not limited to this example. The semiconductor device in FIG. 1A can perform the operations of a period T1 and a period T2 in a variety of orders.

Note that for example, in a period T1, the semiconductor device in FIG. 1A repeats operation of the period D1 and operation of the period E1 until the switch 11_1 is turned on. Then, when the switch 11_1 is turned on the semiconductor device in FIG. 1A sequentially performs operation of the period A1, operation of the period B1, and operation of the period C1. After that, the semiconductor device in FIG. 1A repeats the operation of the period D1 and the operation of the period E1 until the switch 11_1 is turned on again. However, this embodiment is not limited to this example. The semiconductor device in FIG. 1A can perform the operations of the periods A1 to E1 in a variety of orders.

Note that for example, in the period T2, the semiconductor device in FIG. 1A repeats operation of the period D2 and operation of the period E2 until the switch 11_2 is turned on. Then, when the switch 11_2 is turned on the semiconductor device in FIG. 1A sequentially performs operation of the period A2 operation of the period B2, and operation of the period C2. After that, the semiconductor device in FIG. 1A repeats the operation of the period D2 and the operation of the period E2 until the switch 11_2 is turned on again. However, this embodiment is not limited to this example. The semiconductor device in FIG. 1A can perform the operations of the periods A2 to E2 in a variety of orders.

The operation of the period T1 is described. In the period T1, the switch 11_1 is on or off and the switch 11_2 is off.

Figure 2B:
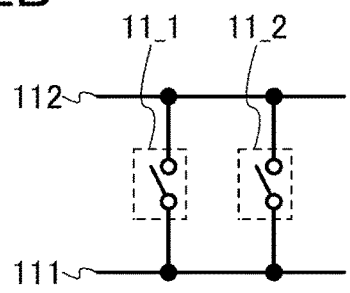
FIGS. 2B, 2D, and 2F are examples of a circuit diagram of the semiconductor device in Embodiment 1.
Figure 2C:
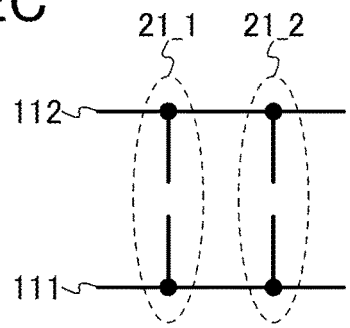
FIGS. 2C, 2E, and 2G are examples of a schematic view for illustrating the operation of the semiconductor device in Embodiment 1.
Figure 2D:
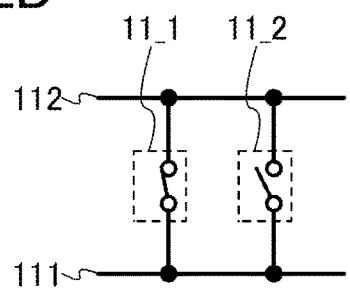
Figure 2E:
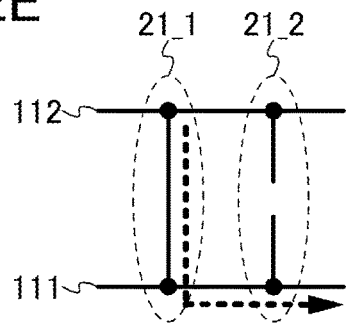

As shown in FIG. 2D, in the period A1 of the period T1, the switch 11_1 is on and the switch 11_2 is off. Therefore, as shown in FIG. 2E, the path 21_1 is in conduction and the path 212 is out of conduction. Then, a signal (e.g., the signal CK1 in the L level) input to the wiring 112 is supplied to the wiring 111 through the switch 11_1. Thus, the signal OUT goes into the L level.

As shown tn FIG. 2l), in the period B1 of the period T1, the switch 11_1 is kept on and the switch 11_2 is kept off. Therefore, as shown in FIG. 2E, the path 21_1 is kept in conduction and the path 21_2 is kept out of conduction. Then, a signal (e.g., the signal CK1 in the H level) input to the wiring 112 is supplied to the wiring 111 through the switch 11_1. Thus, the signal OUT goes into the H level.

As shown in FIG. 2B, in the period C1 of the period T1, the switch 11_1 is off and the switch 11_2 is kept off. Therefore, as shown in FIG. 2C, the path 21_1 is brought out of conduction and the path 21_2 is kept out of conduction. Then, since the wiring 111 and the wiring 112 are kept out of electrical continuity, a signal (e.g., the signal CK1 in the L level) input to the wiring 112 is not supplied to the wiring 111.

Note that in the period C1 of the period T1, the timing when the switch 11_1 is turned off comes after the liming when the signal CK1 goes into the L level in many cases. Therefore, before the switch 1M is turned off a signal (e.g., the signal CK1 in the L level) input to the wiring 112 is supplied to the wiring 111 through the switch 11_1 in many cases. Thus, the signal OUT goes into the L level. However, this embodiment is not limited to this example. A signal in the L level or the voltage V1 can be supplied to the wiring 111.

As shown in FIG. 2B, in the period D1 and the period E1 of the period T1, the switch 11_1 and the switch 11_2 are kept off. Therefore, as shown in FIG. 2C, the path 21_1 and the path 21_2 are kept out of conduction. Therefore, since the wiring 111 and the wiring 112 are out of electrical continuity, a signal input to the wiling 112 is not supplied to the wiring 111. Accordingly, the signal OUT remains at the L level.

Next, operation of the period T2 is described. In the period T2, the switch 11_1 is off and the switch 11_2 is on or off.

Figure 2F:
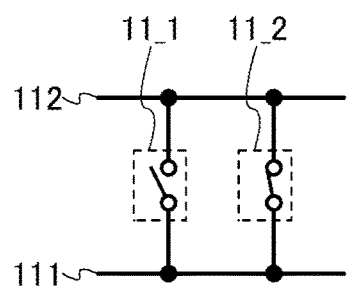
Figure 2G:
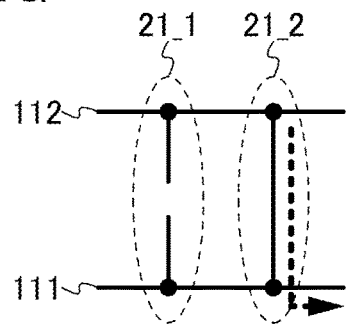

As show n in FIG. 2F, in the period A2 of the period T2, the switch 11_1 is off and the switch 11_2 is on. Therefore, as shown in FIG. 2G, the path 21_1 is out of conduction and the path 21_2 is in conduction. Then, a signal (e.g., the signal CK1 in the L level) input to the wiring 112 is supplied to the wiring 111 through the switch 11_2. Thus, the signal OUT goes into the L level.

As shown in FIG. 2F, in the period B2 of the period T2, the switch 11_1 is kept off and the switch 11_2 is kept on. Therefore, as shown in FIG. 2G the path 21_1 is kept out of conduction and the path 212 is kept in conduction. Then, a signal (e.g., the signal CK1 in the H level) input to the wiring 112 is supplied to the wiring 111 through the switch 11_2. Thus, the signal OUT is in the H level.

As shown in FIG. 2B, in the period C2 of the period T2, the switch 11_1 is kept off and the switch 11_2 is off. Therefore, as shown in FIG. 2C, the path 21_1 is kept out of conduction and the path 21_2 is out of conduction. Then, since the wiring 111 and the wiring 112 are out of electrical continuity, a signal (e.g., the signal CK1 in the L level) input to the wiring 112 is not supplied to the wiring 111.

Note that in the period C2 of the period T2 the timing when the switch 11_2 is turned off comes after the timing when the signal CK1 goes into the L level in many cases. Therefore, before the switch 11_2 is turned off, a signal (e.g., the signal CK1 in the L level) input to the wiring 112 is supplied to the wiring 111 through the switch 11_2 in many cases. Thus, the signal OUT goes into the L level. However, this embodiment is not limited to this example A signal in the L level or the voltage V1 can be supplied to the wiring 111.

As shown in FIG. 2B, in the period D2 and the period F2 of the period T2, the switch 11_1 and the switch 11__2 are kept off Therefore, as shown in FIG. 2C, the path 21_1 and the path 21_2 are kept out of conduction. Therefore, since the wiring 111 and the wiring 112 are out of electrical continuity, a signal input to the wiring 112 is not supplied to the wiring 111. Accordingly, the signal OUT remains at the L level.

By thus switching periods during which each switch is on, the number of times when the switch is on or the length of time during winch the switch is on can be reduced. Accordingly, deterioration of characteristics of an element, a circuit, or live like used as the switch can be suppressed.

In addition, by suppression of deterioration in characteristics of an element, a circuit, or the like used as a switch, a variety of advantages can be obtained. For example, in the case where the wiring 111 has a function of a gate signal line or a scan line, or in die case where the wiring 111 is connected to a pixel, a video signal stored in the pixel is adversely influenced by the waveform of the signal OUT in some cases. For example, in the case where the potential of the signal OUT is not increased to V2, the length of time during which a transistor (e.g., a selection transistor or a switching transistor) included in the pixel is on is shorter. As a result, writing of the video signal to the pixel becomes deficient and display quality is decreased in some cases. Alternatively, in the case where the falling time or the rising time of live signal OUT is longer, a video signal for one pixel in a selected row is written to a pixel in another row in some cases. As a result, display quality is decreased. Alternatively, in the case where the rising time of the signal OUT varies, the effect of feedthrough to a video signal stored in the pixel varies in some cases. As a result, display unevenness is caused.

However, in the semiconductor device in this embodiment, deterioration of characteristics of an element, a circuit, or the like used as a switch can be suppressed. Therefore, since the potential of the signal OUT can be increased to V2, tire length of time during which the transistor included in the pixel is on can be increased. As a result, time for writing a video signal to the pixel can be adequately secured, so that increase in display quality can be achieved. Alternatively, since the falling time and the rising time of the signal OUT can be shortened, a video signal for a pixel in a selected row can be prevented from being written to a pixel in another row. As a result, increase in display quality can be achieved. Alternatively, since variation in the falling time of the signal OUT can be suppressed, variation in the effect of feedthrough to a video signal stored in the pixel can be suppressed. Accordingly, display unevenness can be suppressed.

Note that in the period T1, the period B1 can be referred to as a selection period and each of the period A1, the period C1, the period D1, and the period E1 can be referred to as non-selection period. Similarly, in the period T2, live period B2 can be referred to as a selection period and each of the period A2, the period C2, the period D2, and the period E2 can be referred to as non-selection period.

Note that in the period T1, a period in which the switch 111 is on (the period A1 and the period A2) can be referred to as a first period, and a period in which the switch 11_1 is oft (the period C1 the period D1, and the period E1 can be referred to as a second period. Similarly, in the period T2, each of the period A2 and the period B2 can be referred to as a third period, and each of the period C2, the period D2, and the period E2 can be referred to as a fourth period.

Note that the period T1 and the period T2 each can be referred to as a frame period, and the periods A1 to E1 and the period A2 to E2 each can be referred to as a sub-period or one gate selection period.

Note that a period or a sub-period can be rephrased as step, process, or operation.

Note that in the period T1, the period D1 and the period E1 can be arranged so as to be repeated in this order before the period A1. Similarly, in the period T2, the period D2 and the period E2 can be arranged so as to be repeated in this order before the period A2. In such a case, it is preferable that the length of time from the beginning of the period T1 to the beginning of the period A1 and the length of time from the beginning of the period T2 to the beginning of the period A2 be approximately the same. However, this embodiment is not limited to this example.

Figure 1C:
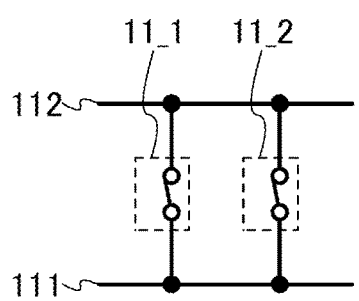
Figure 1D:
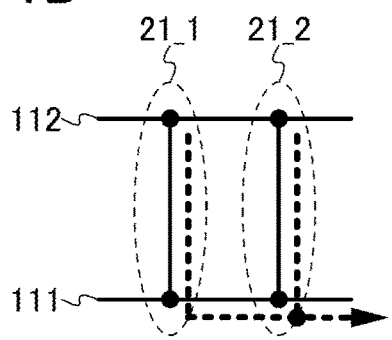

Note that as shown in FIG. 1C, the switch 11_1 and the switch 11_2 can be on in the same period. In that case, as shown in FIG. 1D, the path 211 and the path 21_2 are in conduction in the same period. Therefore, a signal which is input to the wiring 112 is supplied to the wiring 111 through the switch 11_1 and the switch 11_2. However, this embodiment is not limited to this example.

Figure 1E:
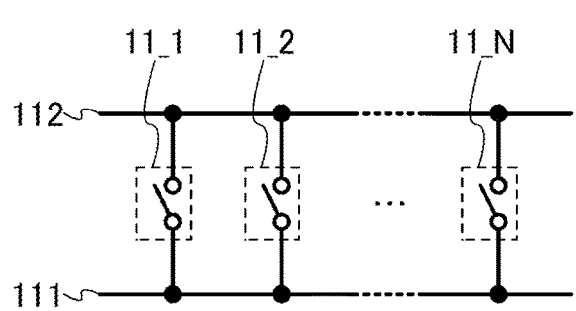
Figure 1F:
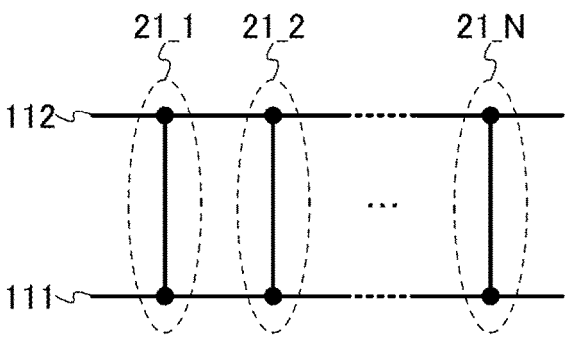

Note that as shown in FIG. 1E, tire semiconductor device can include a plurality of switches 11_1 to 11_N (N is a natural number of 2 or more) The switches 11_1 to 11_N connect the wiring 111 and the wiring 112. The switches 11_1 to UJV have functions similar to that of the switch 11_1 or the switch 11_2. Therefore, as shown in FIG. 1F, there are paths 21_1 to 21_1 between the wiring 111 and the wiring 112.

Figure 3:
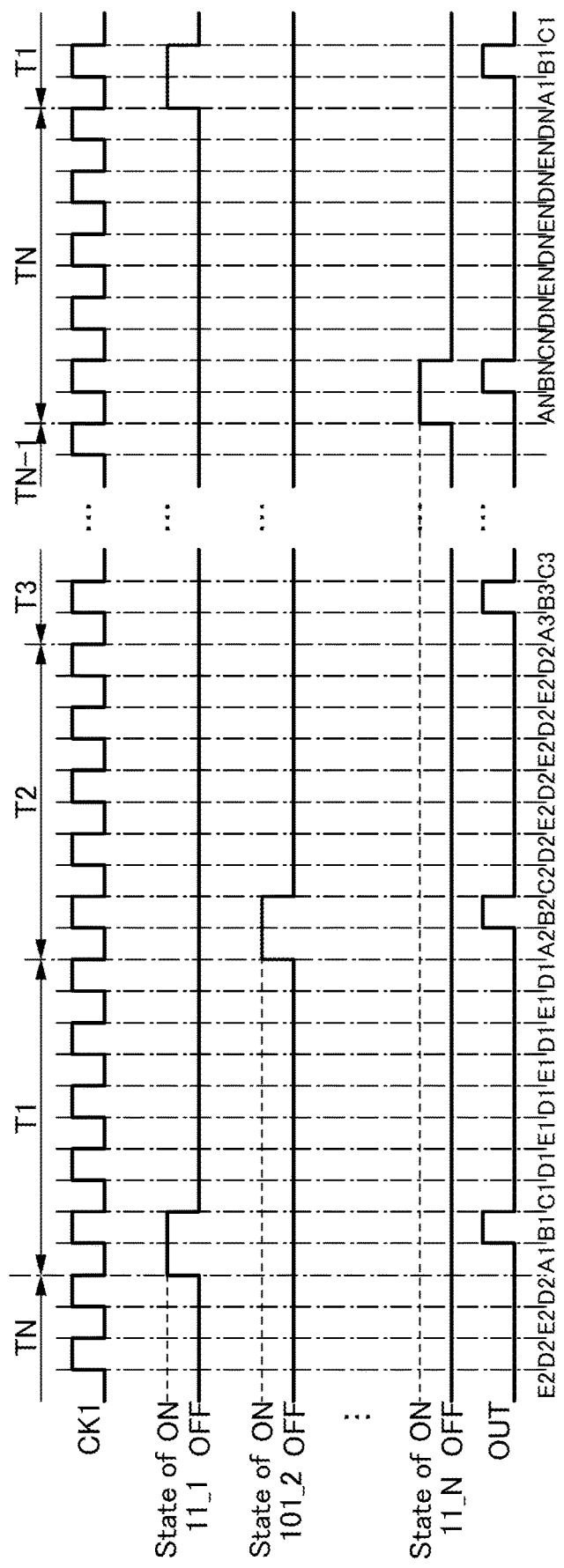
FIG. 3 is an example of a timing chart for illustrating operation of a semiconductor device in Embodiment 1.

Note that in the case where the semiconductor device includes N switches, a plurality of periods including periods T1 to TN can exist as shown in FIG. 3. For example, in a liming chart of FIG. 3, the periods T1 to TN are sequentially arranged. However, this embodiment is not limited to this example. In this embodiment, the periods T1 to TN can be arranged in a variety of orders. Alternatively, any of the periods T1 to TN can be eliminated. The periods T1 to TN can each include a plurality of sub-periods. For example, the period T1 (i is any one of 1 to N) can include a plurality of sub-periods Ai to Ei. In the periods Ai to Ei, as in the periods A1 to E1, respectively, or the periods A2 to E2, respectively, the switches 11_1 to 11_N except the switch 11_1 (e.g., the switches 11_1 to 11_i−1 and the switches 11_i+1 to 11_N) are off. In addition, the switch 11_i is on in the period Ai and the period Bi of the period T1, and the switch 11_i is off in the period 11_i is on the period Ai and the period Bi of the period T1.

Note that when N is a large number, the number of limes when each of the switches is turned on or the length of time during which each of the switches is on can be reduced. However, when N is a too large number, the number of switches is increased too much and the circuit scale becomes larger. Therefore, it is preferable that N be 6 or less. It is more preferable that N be 4 or less. It is further preferable that M be 3 or 2. However, this embodiment is not limited to this example.

Figure 1G:
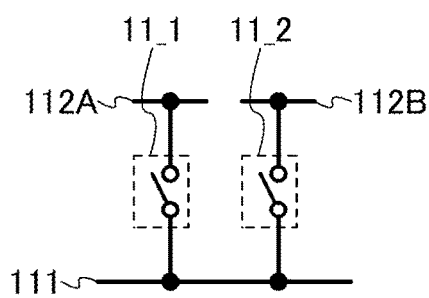

As shown in FIG. 1G, the wiring 112 can be divided into a plurality of wirings 112A and 112B. In addition, the switch III can connect the wiring 111 and the wiring 112A and the switch 11_2 can connect the wiring 111 and the wiring 112B. The wirings 112A and 112B can be connected to a variety of wirings or a variety of elements other than the ones cited above.

Note that as in FIG. 1G the wiring 112 can be divided into a plurality of wirings in FIG. 1E.

Embodiment 2

In this embodiment, an example of a semiconductor device is described. The semiconductor device in this embodiment can include live semiconductor device described in Embodiment 1. Specifically, a structure in the case where, for example, a transistor is used as a switch included in the semiconductor device in Embodiment 1 is described. However, this embodiment is not limited to this example. A variety of elements, a variety of circuits, or the like can be used as a switch. Note that description of the content described in Embodiment 1 is omitted. Note that the content described in this embodiment can be combined with the content described in Embodiment 1 as appropriate.

Figure 4A:
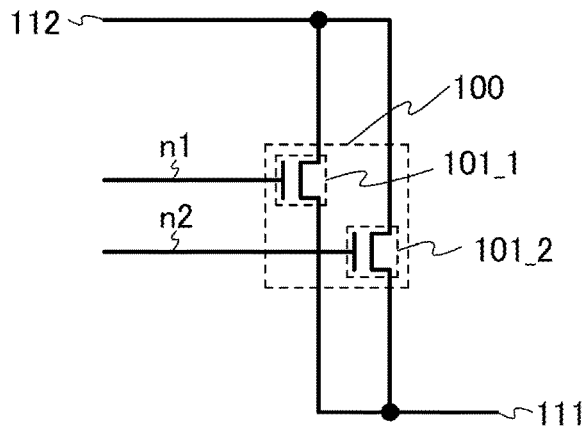
FIGS. 4A and 4B are examples of a circuit diagram of a semiconductor device in Embodiment 2 and FIG. 4C is an example of a timing chart for illustrating operation of the semiconductor device in Embodiment 2.

First, the semiconductor device of this embodiment will be described with reference to FIG. 4A. The semiconductor device in FIG. 4 includes a circuit 100. The circuit KM) has a structure similar to that in the case where a transistor is used as a switch in the structure described in Embodiment 1. FIG. 4A shows a structure in the case where a transistor 101_1 is used as live switch 11_1 FIG. 1A and a transistor 101_2 is used as the switch 11_2 in FIG. 1A. Therefore, the transistor 101_1 has a function similar to that of the switch 11_1 and the transistor 101_2 has a function similar to that of the switch 11_2. Note that this embodiment is not limited thereto, and a transistor can be used as the switch in the structure described in Embodiment 1. Moreover, a CMOS switch can be used as the switch.

Note that the transistor 101_1 and the transistor 101_2 are n-channel transistors. The n-channel transistor is turned on when a potential difference (Vgs) between a gate and a source of the n-channel transistor exceeds a threshold voltage (Vth). Note that this embodiment is not limited thereto, and the transistor 101_1 and/or the transistor 101_2 can be a p-channel transistor. The p-channel transistor is turned on when a potential difference (Vgs) between a gate and a source of the p-channel transistor becomes less than a threshold voltage (Vth).

Next, the connection relation in the semiconductor device of FIG. 4A will be described. A First terminal of the transistor 101_1 is connected to the wiring 112 and a second terminal of the transistor 101_1 is connected to the wiring 111. A First terminal of the transistor 101_2 is connected to the wiring 112 and a second terminal of the transistor 101_2 is connected to the wiring 111.

Note that a portion where a gate of the transistor 101_1 and a circuit 10 are connected to each other is referred to as a node n1 and a connection portion of a gate of the transistor 101_2 and the circuit 10 is referred to as a node n2. Note that the node n1 and the node n2 can also be referred to as wirings.

Next, functions of the transistor 101_1 and the transistor 101_2 are described.

The transistor 101_1 has a function of controlling a timing of supplying the potential of the wiring 112 to die wiring 111 in accordance with the potential of the node n1. For example, in the case where a voltage (e.g., the voltage V1 or the voltage V2) is supplied to the wiring 112, the transistor 101_1 has a function of controlling a liming of supplying the voltage supplied to the wiring 112 to the wiring 111 in accordance with the potential of the node n1. As another example, in the case where a signal (e.g., the signal CK1) is input to the wiring 112, the transistor 101_1 has a function of controlling a liming of supplying the signal input to the wiring 112 to the wiring 111 in accordance with the potential of the node n1. In such a case, when the signal CK1 has the L level, the transistor 101_1 has a function of controlling a timing of supplying the signal CK1 in the L level to the wiring 111. Alternatively, the transistor 101_1 has a function of controlling a timing when the signal OUT goes into the L level. Alternatively, when the signal CK1 has the H level, the transistor 101_1 has a function of controlling a timing of supplying the signal CK1 in the H level to the wiring 111. Alternatively, the transistor 101_1 has a function of controlling a timing when the signal OUT goes into the H level. At that time, the node n1 can be m a floating state. In that case, the transistor 101_1 has a function of raising the potential of the node n1 in accordance with the rise of the potential of the wiring 111. Alternatively, the transistor 101_1 has a function of performing bootstrap operation. Alternatively, the transistor 101_1 has a function of controlling whether to set a potential state of the signal OUT by being turned on or off in accordance with a signal input to its gate.

The transistor 101_2 has a function of controlling a timing of supplying the potential of the wiring 112 to the wiring 111 in accordance with the potential of the node n2. For example, in the case where a voltage (e.g., the voltage V1 or the voltage V2) is supplied to the wiring 112, the transistor 101_2 has a Junction of controlling a timing of supplying the voltage supplied to the wiring 112 to the wiring 111 in accordance with the potential of the node n2. As another example, in the case w here a signal (e.g., tire signal CK1) is input to the wiring 112, the transistor 101_2 has a function of controlling a timing of supplying the signal input to the wiring 112 to the wiring 111 in accordance with the potential of the node n2. In such a case, when the signal CK1 has the L level, the transistor 101_2 has a function of controlling a timing of supplying the signal CK1 in the L level to the wiring 111. Alternatively, the transistor 101_2 has a function of controlling a timing when the signal OUT goes into the L level. Alternatively, when the signal CK1 has the H level, the transistor 101_2 has a function of controlling a timing of supplying the signal CK1 in the H level to the wiring 111. Alternatively, the transistor 101J2 has a function of controlling a liming when the signal OUT goes into the H level. At that time, the node n2 can be in a floating state. In that case, the transistor 101_2 has a function of raising the potential of the node n2 in accordance with the rise of the potential of the wiring 111. Alternatively, the transistor 101_2 has a function of performing bootstrap operation. Alternatively, the transistor 101_2 has a function of controlling whether to set a potential state of the signal OUT by being turned on or off in accordance with a signal input to its gate.

Figure 4B:
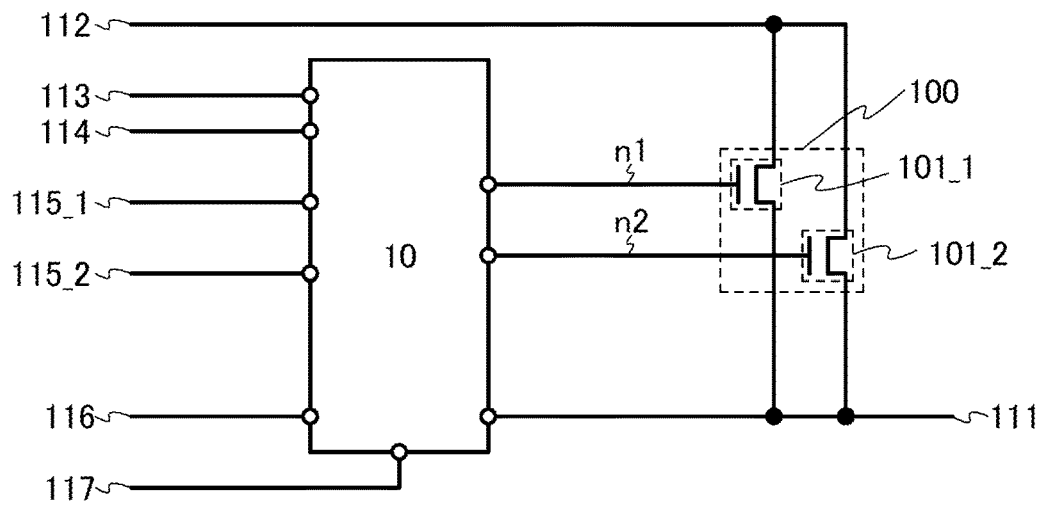

As shown in FIG. 4B, the semiconductor device of this embodiment can include the circuit 10. For example, the circuit 10 is connected to a wiring 113, a wiring 114, a wiring 115_1, a wiring 115_2, a wiring 116, a wiring 117, the gate of the transistor 101_1, the gale of the transistor 101_2, and/or the wiring 111. However, this embodiment is not limited to this example. The circuit 10 can be connected to another wiring or another node depending on the configuration of the circuit 10. Alternatively, it is acceptable that the circuit 10 is not connected to the wiring 113, the wiring 114, the wiring 115_1, the wiring 115_2, the wiring 116, the wiring 117, the gate of the transistor 101_1, the gate of the transistor 101_2, and/or the wiring 111.

The circuit 10 includes one or more transistors in many cases. These transistors have the same polarity as the transistors 101_1 and 101_2 and are n-channel transistors in many cases. However, this embodiment is not limited to this example. The circuit 10 can include p-channel transistors. Alternatively, the circuit 10 can includes an n-channel transistor and a p-channel transistor. That is the circuit 10 can be a CMOS circuit.

The signal OUT is output from the wiring HI as in Embodiment 1. The signal CK1 is input to the wiring 112 as in Embodiment 1. Note that the term "signal CK2" means an inverted signal of the signal CK1 or a signal which is out of phase with the signal CK1 by 180° in many cases. The voltage V2 is supplied to the wiring 113. The voltage V2 can function as a power supply voltage, a reference voltage, or a positive power supply voltage. Thus, the wiring 113 can function as a power supply line. A signal SP is input to the wiring 114. The signal SP can function as a start signal. Thus, the wiring 114 can function as a signal line. For example, in the case where a plurality of semiconductor devices is included and the wiring 114 is connected to the wiring 111 of the semiconductor in a different stage (e.g., in the previous stage), the signal SP can function as a selection signal, a transfer signal, a start signal, a reset signal, a gate signal, or a scan signal. In that case, the wiring 114 can function as a gate signal line or a scan line A signal SEL1 is input to the wiring 115_1. The signal SEL1 repeatedly goes into the H level or the L level every certain period (e.g., every frame period) and can function as a clock signal, a selection signal, or a control signal. Accordingly, the wiring 115_1 can function as a signal line. A signal SEL2 is input to the wiring 115_2. The signal SEL2 is an inverted signal of the signal SEL1 or a signal which is out of phase with the signal SEL1 by 180° in many cases. Accordingly, the wiring 115_2 can function as a signal line. A signal RE is input to the wiring 116. The signal RE can function as a reset signal. Accordingly, the wiring 116 can function as a signal line. Specifically, a plurality of semiconductor devices is connected to the wiring 116. In that case, in the case where the wiring 116 is connected to the wiring 111 of the semiconductor device in a different stage (e.g., in the next stage), the signal RE can function as a selection signal, a transfer signal, a start signal, a reset signal, a gate signal, or a scan signal. In that case, the wiring 116 can function as a gate signal line or a scan line. The voltage V1 is supplied to the wiring 117. The voltage V1 can function as a power supply voltage, a reference voltage, a ground voltage, or a negative power supply voltage. Therefore, the wiring 117 can function as a pow er supply line. Note that this embodiment is not limited thereto, and a variety of signals, currents, or voltages can be supplied to the wirings 111, 112, 113, 114, 11_5, 115_2, 116, and 117.

Note that the signal CK1 or the signal CK2 can be a balanced signal or an unbalanced signal. Similarly, the signal SET1 or the signal SEL2 can be a balanced signal or an unbalanced signal.

The circuit 10 has a function of controlling a timing of supplying a signal, a voltage, or the like to the node n1, the node n2, and or the wiring 111 in accordance with the voltage V1, the signal CK2, the signal SP, the signal SELL the signal SEL2, the signal RE, the potential of the node n, the potential of the node n2, and/or the signal OUT. Alternatively, the circuit 10 has a function of controlling the potential of the node n1, the potential of the node n2, and/or the potential of the wiring 111 in accordance with the voltage V1, the signal CK2, the signal SP, the signal SEL1, the signal SEL2, the signal RE, the potential of the node n1, the potential of the node n2, and/or the signal OUT. For example, the circuit 10 has a function of supplying a signal in the H level or the voltage V2 to the node n1 and/or the node n2. Alternatively, the circuit 10 has a function of supplying a signal in the L level or the voltage V1 to the node n1, the node n2, and/or the wiring 111. Alternatively, the circuit 10 has a function of slopping supply of the signal, voltage, or the like to the node n1 and/or the node n2. Alternatively, the circuit 10 has a function of increasing the potential of the node n1 and/or the potential of the node n2. Alternatively, the circuit 10 has a function of decreasing or maintaining the potential of the node n1, the potential of the node n2, and/or the potential of the wiring 111. Alternatively, the circuit 10 has a function of making (be node n1 and-or the node n2 go into a floating state. Note that this embodiment is not limited thereto, and the circuit 10 can have a variety of other functions. In addition, the circuit 10 does not necessarily have ail the functions listed above.

Figure 4C:
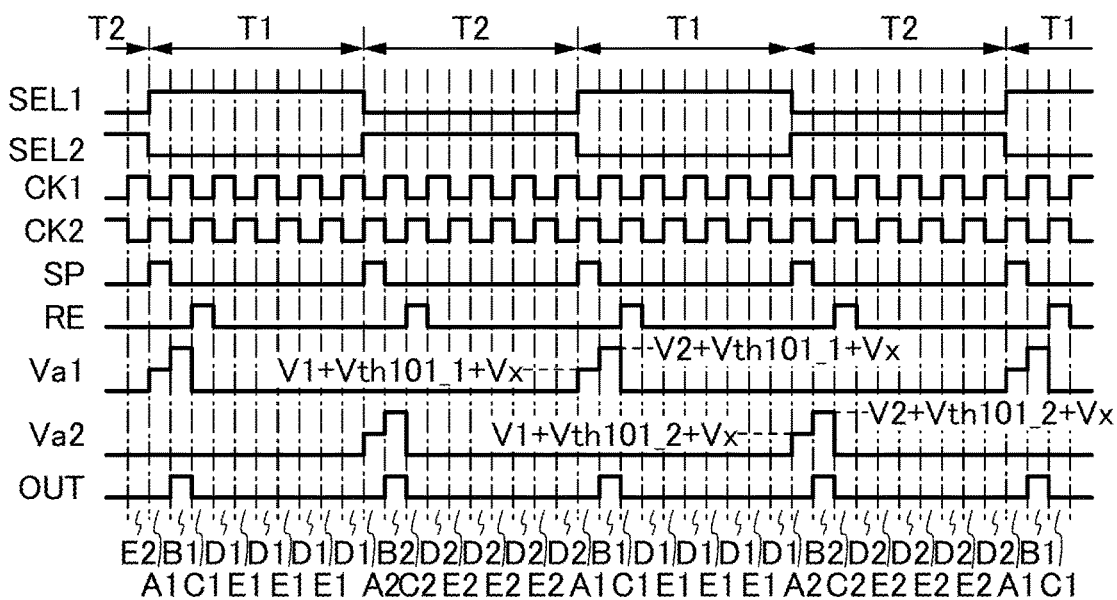

Next, an example of operation in this embodiment is described. Here, for example, operation of the semiconductor device in FIG. 4B is described with reference to a timing chart in FIG. 4C. FIGS. 5A to 5E, and FIGS. 6A to 6E. The riming chart in FIG. 4C shows the signal CK1, the signal CK2, the signal SP, the signal RE, the potential of the node n1 (Va1), the potential of the node n2 (Va2), and the signal OUT Note that description common to the timing chart in FIG. 2A is omitted. Note that the content of operation of the semiconductor device in FIG. 4B can be applied to the content described in this embodiment or the content described in a different embodiment.

Figure 5A:
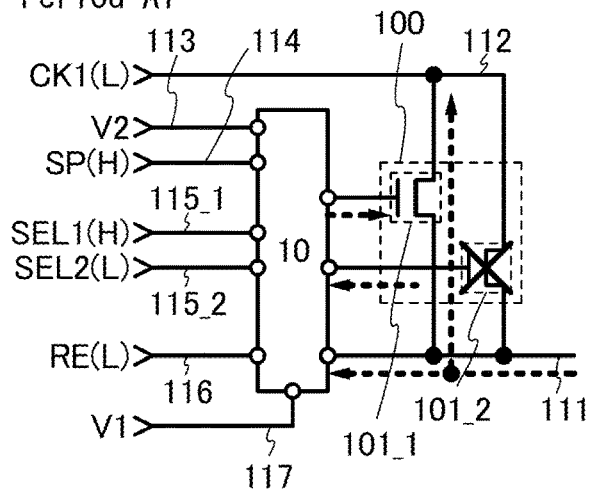
FIGS. 5A to 5E are examples of a schematic view for illustrating operation of a semiconductor device in Embodiment 2 and FIG. 5F is an example of a circuit diagram of the semiconductor device in Embodiment 2.

First, as shown in FIG. 5A, in the period A1, the signal SP is in the H level, the signal SEL1 is in the H level, and the signal SEL2 is in the L level. Accordingly, the circuit 10 supplies the signal SP in the H level or the voltage V2 to the node n1. Then, the circuit 10 increases the potential of the node n1. After that, the transistor 101_1 is turned on when the potential of the node n1 becomes (V1+Vth101_1+Vx) (Vth101_1 represents the threshold voltage of the transistor 101_1). At that time, Vx is larger than 0. Accordingly, the wirings 112 and 111 have electrical continuity through the transistor 101_1, so that the signal CK1 in the L level is supplied from the wiring 112 to the wiring 111 through the transistor 101_1. As a result, the signal OUT goes into the L level. After that, the potential of the node n1 is further increased. Then, when supply of the voltage or the signal from the circuit 10 to the node n1 is stopped, the circuit 10 and the node n1 are brought out of electrical continuity. As a result, the node n1 goes into a floating stale and the potential of the node n1 is maintained as (V1+Vth101_1+Vx).

Note that in the period A1, the circuit 10 can supply the signal in the L level or the voltage V2 to the node n2.

Note that in the period A1, the circuit 10 can supply the signal in the L level or the voltage V2 to the wiring 111.

Figure 5B:
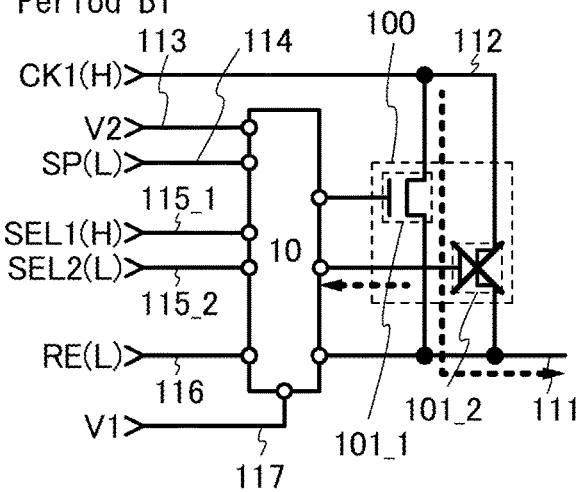

Next, as shown in FIG. 5B, the signal SP is in the L level, the signal SEL1 remains at the H level, and the signal SEL2 remains at the L level in the period B1. Thus, the signal 10 still does not supply the voltage, the signal, or the like to the node n1. Therefore, the node n1 is kept in the floating state and the potential of the node n1 remains as (V1+Vth101_1+Vx). That is, since the transistor 101_1 is kept on, the wiring 112 and the wiring 111 are kept in electrical continuity through the transistor 101_1. At this time, the signal CK1 is increased from the L level to the H level, so that the potential of the wiring 111 starts to rise. Since the node n1 remains in. The floating state, the potential of the node n1 is increased by parasitic capacitance between the gate and the second terminal of the transistor 101_1. This is so-called bootstrap. In this manner, since the potential of the node n1 is increased to (V2+vth101_1+Vx), the potential of the wiring ill can be increased to V2. Thus, the signal OUT goes into the H level.

Note that in the period B1, the circuit 10 can supply the signal in the L level or the voltage V2 to the node n2.

In addition, it is acceptable that the circuit 10 does not supply a signal, a voltage, or the like to the wiring 111 in tire period B1.

Figure 5C:
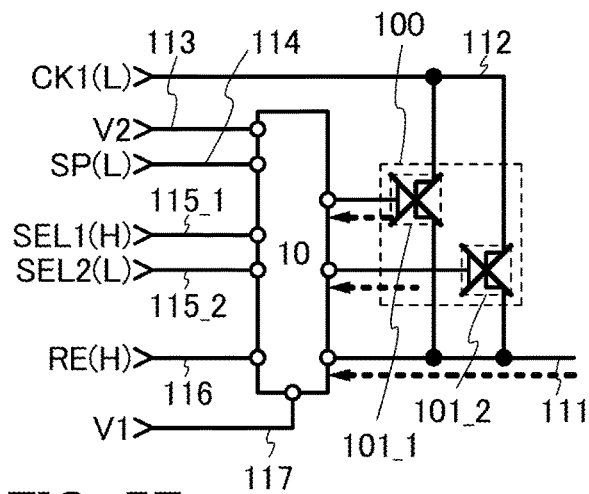

Next, as shown in FIG. 5C, the signal RE is in the H level in the period C1. Therefore, the circuit 10 supplies the signal in the L level or the voltage V1 to the node n1. The node n2, and/or the wiring 111. Then, the potential of the node n1, the potential of the node n2, and/or the potential of the wiring 111 becomes equal to V1. Therefore, since the transistor 101_1 and the transistor 101_2 are turned off, the wiring 112 and the wiring 111 are out of electrical continuity. Thus, the signal OUT is in the L level.

Note that in the period C1, a liming when the signal CK1 falls to the L level can be set to come up earlier than a timing when the potential of the node n_1 falls to the L level. Then, as shown in FIG. 5E, the signal CK1 in the L level can be supplied from the wiring 112 to the wiring 111 through the transistor 101_1. In the case where a transistor other than the transistor 101_1 is included, for example, the channel width of the transistor 101_1 is larger than that of the transistor other than the transistor 101_1 in many cases. Therefore, the potential of the wiring 111 can be quickly decreased. That is, a falling time of the signal OUT can be shortened. Thus, for reduction of the potential of the wiring 111, the following three cases can be possible: the case where the circuit 10 supplies the signal in the L level or the voltage V1 to the wiring 111; the case where the signal CK1 in the L level is supplied from the wiring 112 to the wiring 111 through the transistor 101_1; and the case where the circuit 10 supplies the signal in the L level or the voltage V1 to the wiring 111 and the signal CK1 in the L level is supplied from the wiring 112 to the wiring 111 through the transistor 101_1.

Figure 5D:
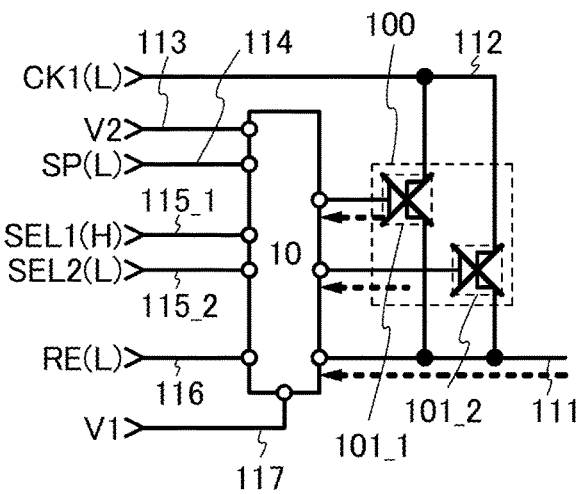
Figure 5E:
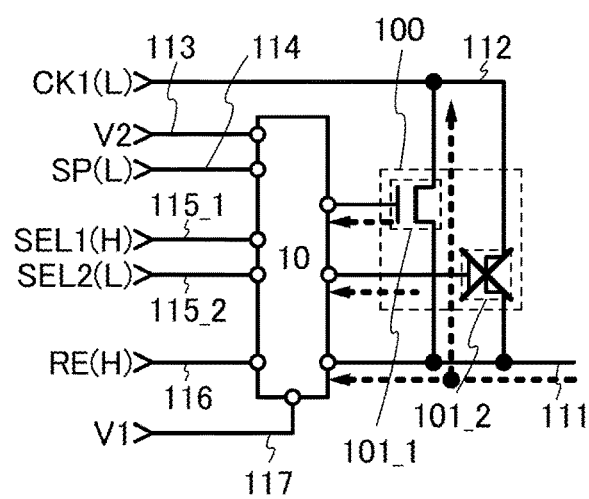

Next, as shown in FIG. 5D, the circuit 10 supplies the voltage V1 or the signal in the L level to the node n1, the node n2, and/or the wiring 111 in the period D1 and the period E1. Then, the potential of the node n1, the potential of the node n2, and/or the potential of the wiring 111 remains at VL. Therefore, since the transistor 101_1 and the transistor 101_2 are kept off, the wiring 112 and the wiring 111 are kept out of electrical continuity. Thus, the signal OUT remains at the L level.

Figure 6A:
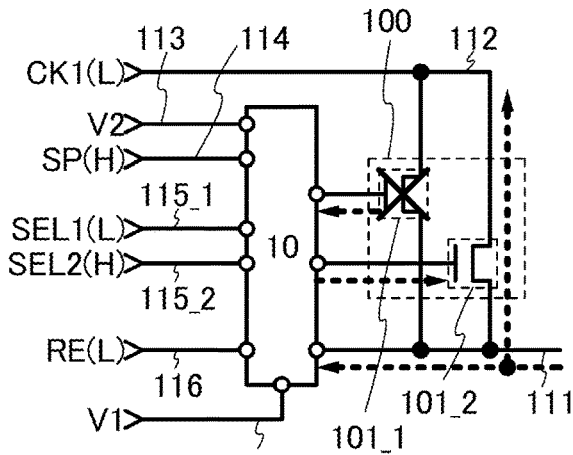
FIGS. 6A to 6E are examples of a schematic view for illustrating operation of a semiconductor device in Embodiment 2.

Next, as shown in FIG. 6A, the signal SP is in the H level, the signal SEL1 is in the L level, and the signal SEL2 is in the H level in the period A2. Accordingly, the circuit 10 supplies the signal SP in the H level or the voltage V2 to the node n2. Then, the circuit 10 increases the potential of the node n2. After that, the transistor 101_2 is turned on when the potential of the node n2 becomes (V1+Vth101_2+Vx) (Vth101_2 represents the threshold voltage of the transistor 101_2). At that time. Vx is larger than 0. Accordingly, the wirings 112 and 111 have electrical continuity through the transistor 101J2, so that the signal CK1 in the L level is supplied from the wiring 112 to the wiring 111 through the transistor 101_2. As a result, the signal OUT goes into the L level. After that, the potential of the node n2 is further increased. Then, when supply of the voltage or the signal from the circuit 10 to the node n2 is stopped, the circuit 10 and the node n2 are brought out of electrical continuity. As a result, the node n2 goes into a floating state and the potential of the node n2 is maintained as (V1+Vth101_2+Vx).

Note that in the period A2, the circuit 10 can supply the signal in the L level or the voltage V2 to the node n1.

Note that in the period A2, the circuit 10 can supply the signal in the L level or the voltage V2 to the wiring 111.

Figure 6B:
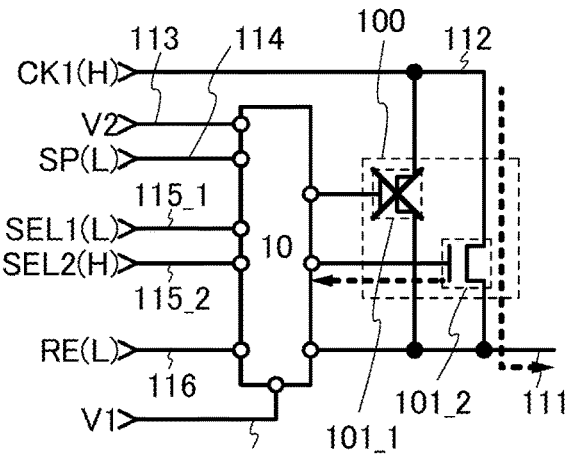

Next, as shown in FIG. 6B, in the period B2, the signal SP is in the L level, the signal SEL1 remains at the L level, and the signal SEL2 remains at the H level. Thus, the circuit 10 still does not supply the voltage, the signal, or the like to the node n2. Therefore, the node n2 is kept in the floating state and the potential of the node n2 remains as (V1+Vth101_2+Vx). That is, since the transistor 101_2 is kept on, the wiring 112 and the wiring 111 are kept in electrical continuity through the transistor 101_2. At this time, the signal CK1 is increased from the L level to the H level, so that the potential of the wiring 111 starts to rise. Since the node n2 remains in the floating state, the potential of the node n2 is increased by parasitic capacitance between the gate and the second terminal of the transistor 101_2. This is so-called bootstrap. In this manner, since the potential of the node n2 is increased to (V2+Vth101_2+Vx), the potential of the wiring 111 can be increased to V2. Thus, the signal OUT goes into the H level.

Note that the circuit 10 can supply the signal in the L level or the voltage V2 to the node n1 in the period B2.

Note that it is acceptable that the circuit 10 does not supply a signal, a voltage, or the like to the wiring 111 in the period B2.

Figure 6C:
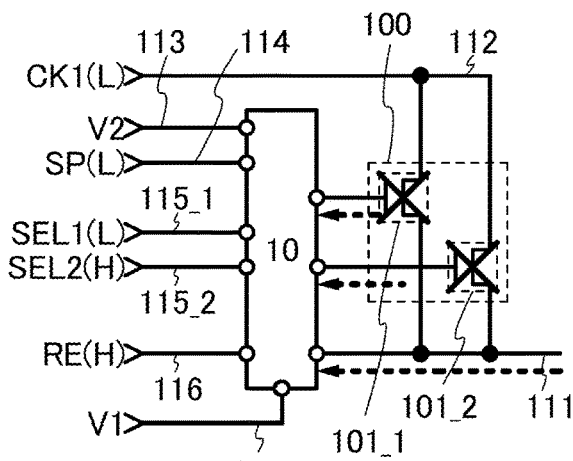

Next, as shown in FIG. 6C, the signal RE is in the H level in the period C2. Therefore, the circuit 10 supplies the signal in the L level or the voltage V2 to the node n1, the node n2, and or the wiring 111. Then, the potential of the node n1, the potential of the node n2, and/or the potential of the wiring 111 becomes equal to V1. Therefore, since the transistor 101_1 and the transistor 101_2 are turned off, the wiring 112 and the wiring 111 are out of electrical continuity. Thus, the signal OUT goes into the L level.

Note that in the period C2, a timing when the signal CK1 falls to the L level can be set to come up earlier than a timing when the potential of the node n2 is decreased. Then, as shown in FIG. 6E, the signal CK1 in the L level can be supplied from the wiring 112 to the wiring 111 through the transistor 101_2. In the case where another transistor is included, for example, the channel width of the transistor 101_2 is larger than that of the another transistor in many cases. Therefore, the potential of the wiring 111 can be quickly decreased. That is, a falling time of the signal OUT can be shortened. Thus, for reduction of the potential of the wiring 111, the following cases can be possible, for example: the case where the circuit 10 supplies the signal in the L level or the voltage V1 to the wiring 111; the case where the signal CK1 in the L level is supplied from the wiring 112 to the wiring 111 through die transistor 101_2; and the case where the circuit 10 supplies the signal in the L level or the voltage V1 to the wiring 111 and the signal CK1 in the L level is supplied from the wiring 112 to the wiring 111 through the transistor 101_2.

Figure 6D:
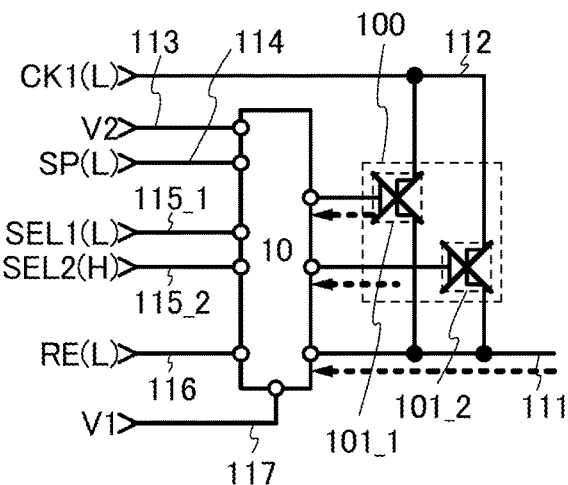
Figure 6E:
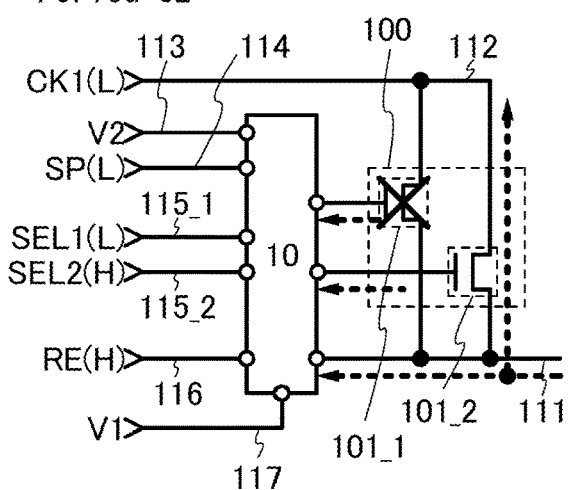

Next, as shown in FIG. 6D, the circuit 10 supplies the voltage V1 or the signal in the L level to the node n1, the node n2, and or the wiring 111 in the period D2 and the period E2. Then, the potential of the node n 1, the potential of the node n2, and or the potential of the wiring 111 remains at V1. Therefore, since the transistor 101_1 and the transistor 101_2 are kept off, the wiring 112 and the wiring 111 are kept out of electrical continuity. Thus, the signal OUT remains at the L level.

In this manner, since the transistor 101_2 is off in the period T1 and the transistor 101_1 is off in the period T2, the number of limes when each of the transistor 101_1 and the transistor 101_1 is turned on or the length of time during which each of the transistor 101_1 and the transistor 101_2 is on is reduced. Therefore, deterioration of characteristics of the transistor 101_1 and the transistor 101_2 can be suppressed.

In this manner, deterioration of characteristics of the transistor can be suppressed in the semiconductor device in this embodiment. In addition, since the potential of the signal OUT in the H level can be increased to V2, the length of time during which the transistor included in the pixel is on can be increased. As a result, time for writing a video signal to the pixel can be adequately secured, so that increase in display quality can be achieved. Alternatively, since the falling time and the rising time of the signal OUT can be shortened, a video signal for a pixel in a selected row can be prevented front being written to a pixel in another row. As a result, increase in display quality can be achieved. Alternatively, since variation in the falling time of the signal OUT can be suppressed, variation in the effect of feedthrough to a video signal stored in the pixel can be suppressed. Accordingly, display unevenness can be suppressed.

In addition, all the transistors in the semiconductor device in this embodiment can be n-channel transistors or all the transistors in the semiconductor device in this embodiment can be p-channel transistors. Accordingly, reduction in the number of steps, improvement in yield, improvement in reliability, or reduction in cost can be realized more efficiently as compared to the case of using a CMOS circuit. In particular, when all the transistors including those in a pixel portion and the like are n-channel transistors, a non-single-crystal semiconductor, a microcrystalline semiconductor, an organic semiconductor, an oxide semiconductor, or the like can be used for a semiconductor layer of the transistor. However, a transistor formed using such a semiconductor easily deteriorates in many cases. On the other hand, deterioration of the transistor of the semiconductor device in this embodiment can be suppressed.

In addition, it is not necessary to increase the channel width of a transistor so that a semiconductor device is operated even when characteristics of the transistor deteriorate. Accordingly, the channel width of the transistor can be reduced. This is because degradation of the transistor can be suppressed in the semiconductor device in this embodiment.

Note that it is acceptable that the circuit 10 can supply the signal in the L level or the voltage V1 to the node n1 or does not supply a voltage, a signal, or the like to the node n1 in the period C1, the period D1, the period E1, the period A2, the period B2, the period C2, the period D2, and/or the period E2. However, this embodiment is not limited to this example.

Note that it is acceptable that the circuit 10 can supply the signal in the L level or the voltage V1 to the node n2 or does not supply a voltage, a signal, or the like to the node n2 in the period A1, the period B1, the period C1, the period D1, the period E1, the period C2, the period D2, and or the period E2. However, this embodiment is not limited to this example.

Note that it is acceptable that the circuit 10 can supply the signal in the L level or the voltage V1 to the wiring 111 or does not supply a voltage, a signal, or the like to the wiring 111 in the period A1, the period C1, live period D1, the period E1, the period A2, the period C2, the period D2, and/or the period E2. However, this embodiment is not limited to this example.

Figure 7A:
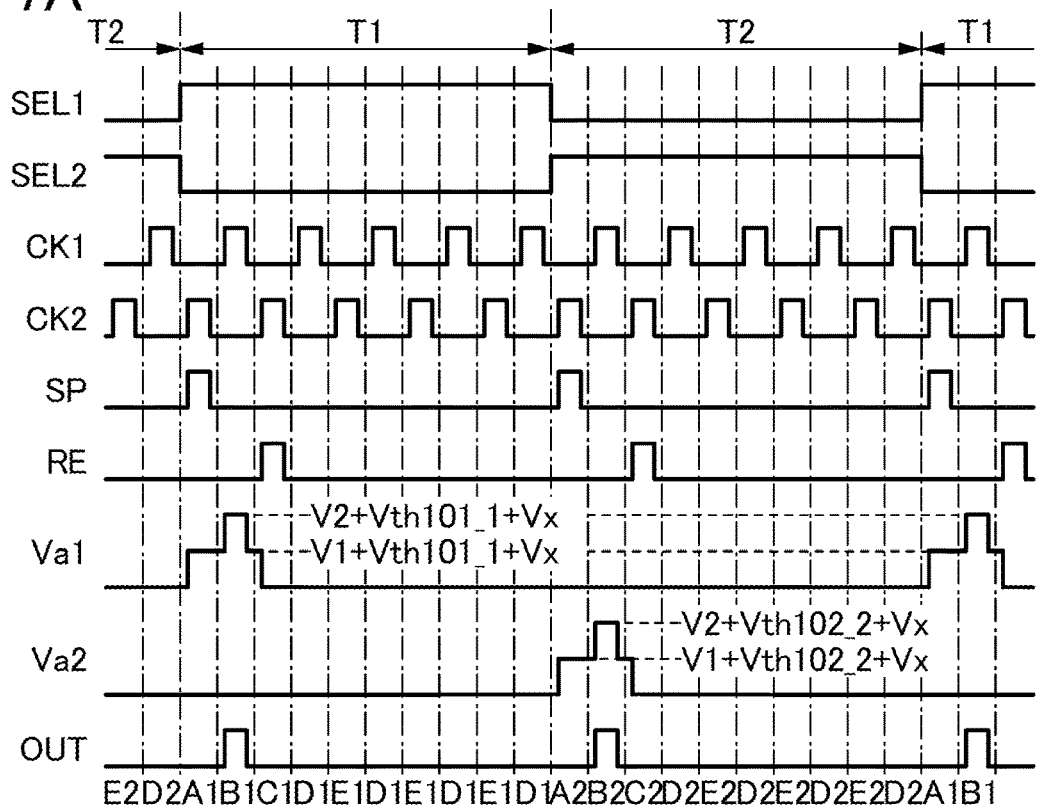
FIGS. 7A and 7B are examples of a timing chart for illustrating operation of a semiconductor device in Embodiment 2.

Note that the signal CK1 and the signal CK2 can be unbalanced signals. FIG. 7A shows a timing chart of the case where a period in which a signal is in the H level is shorter than a period in which the signal is in the L level in one cycle, for example. Thus, in the period C1 or the period C2, since the signal CK1 in the L level is supplied to the wiring 111, the falling lime of the signal OUT can be shortened. Alternatively, in the case where the wiring 111 is provided so as to extend to the pixel portion, a wrong video signal can be prevented from being written to a pixel. However, this embodiment is not limited to this example. The period in which a signal is in the H level can be longer than a period in which the signal is in the L level in one cycle.

Figure 7B:
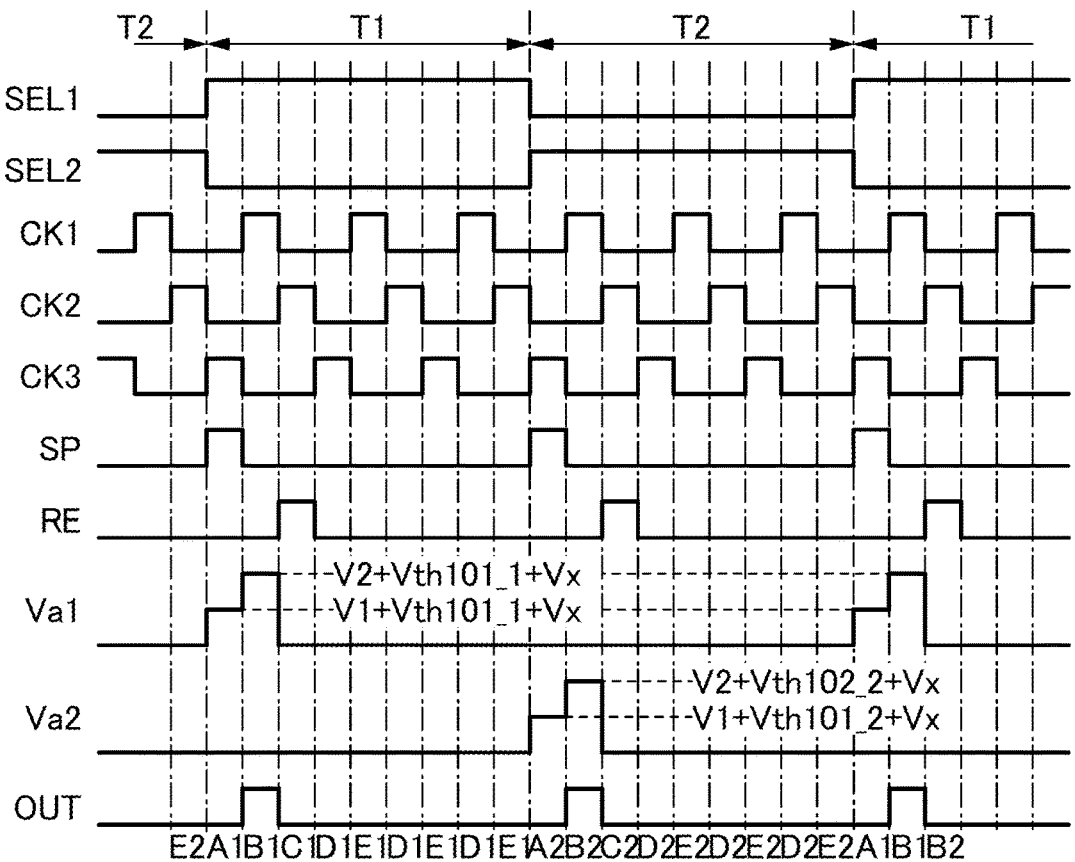

Note that polyphase clock signals can be used for the semiconductor device in this embodiment. For example, in the case of (n+1)-phase (n is a natural number) clock signals, the (n+1)-phase clock signals are (n+1) clock signals whose cycles are different by i/(n+1) cycle. Alternatively, any two of the polyphase clock signals can be input to the respective wiring 112 and wiring 113. FIG. 7B illustrates an example of a timing chart in the case where a three-phase clock signals ore input to the semiconductor device. However, this embodiment is not limited to this example.

Note that the larger n becomes, the lower clock frequency becomes. Therefore, reduction in power consumption can be achieved. However, when n is too large a number, the number of signals is increased: therefore, a layout area becomes larger or the scale of an external circuit becomes larger in some cases. Therefore, it is preferable that n is smaller than 8. It is more preferable that n be smaller than 6. It is further preferable that n is 4 or 3. However, this embodiment is not limited to this example.

Note that since the transistor 101_1 and the transistor 101_2 have similar functions, it is preferable that the channel width of the transistor 101_1 and the channel width of the transistor 101_2 be approximately the same. By making the transistors have approximately the same size in such a manner, the transistors can have approximately the same current supply capability. Further, the degree of deterioration of the transistors can be approximately the same. Accordingly, when a plurality of transistors is switched to be used, the waveforms of the signal OUT can be approximately the same. Note that this embodiment is not limited thereto, and the channel width of the transistor 101_1 can be different front the channel width of the transistor 101_2.

Note that the term "the channel width of a transistor" can also be referred to as the W|L (W is channel width and L is channel length) ratio of a transistor.

Note that the transistor 10M and the transistor 101_2 can be on in the same period. For example, when the transistor 101_1 and the transistor 101_2 are on in the period B1 or the period B2, the potential of the wiring 111 can be increased quicker than that in the case w here only one of the transistors 101_1 and 101_2 is on. Therefore, the falling time of the signal OUT can be shortened.

Figure 8A:
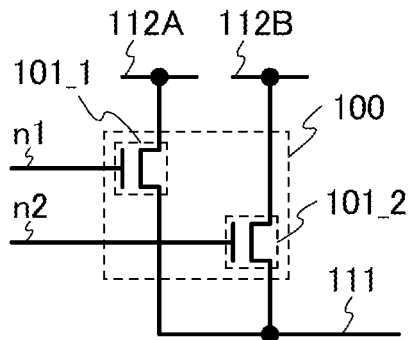
FIGS. 8A to 8F are examples of a circuit diagram of a semiconductor device in Embodiment 2.

As shown in FIG. 8A, the wiring 112 can be divided into a plurality of wirings of wirings 112A and 112B. Then, the first terminal of the transistor 101_1 can be connected to the wiring 112A and the first terminal of the transistor 101_2 can be connected to the wiring 112B. Alternatively, the wiring 112A and the wiring 112B can be connected to another wiring, another node, or the like.

Note that as in FIG. 8A, the wiring 112 can be divided into a plurality of wirings (e.g., the wirings 112A and 112B) in FIGS. 4A and 4B.

Figure 8B:
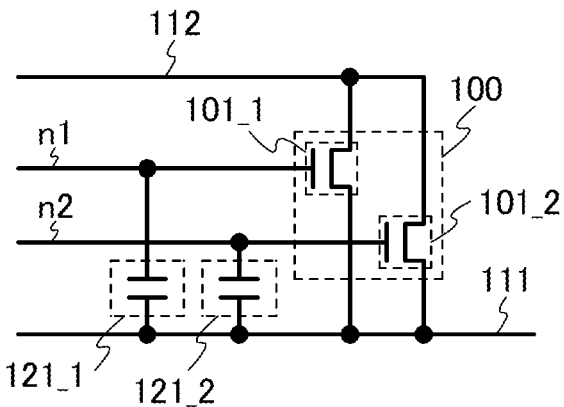

Note that as show n in FIG. 8B, a capacitor 12M can be connected between the gate and the second terminal of the transistor 101_1. A capacitor 121_2 can be connected between the gate and the second terminal of the transistor 101_2. In this manner, the potential of the node n1 or the potential of the node n2 is easily increased in bootstrap operation. Therefore, since Vgs of the transistor 101_1 and Vgs of the transistor 101_2 can be increased, the channel widths of these transistors can be reduced Alternatively, the falling time or the rising time of the signal OUT can be shortened. However, this embodiment is not limited to this example. One of the capacitor 121_1 and the capacitor 121_2 can be eliminated. Alternatively, the capacitor 121_1 or 121_2 can be connected between a gate and the second terminal of the transistor 1 or 1 (i.e., between the node n1 or the node n2 and the wiring 112). Alternatively, an MIS capacitor can be used as the capacitor, for example.

Note that a material used for one electrode of each of the capacitor 121_1 and the capacitor 121_2 is preferably a material similar to that for the gate of each of the transistor 101_1 and the transistor 101_2, for example. A material used for the other electrode of each of the capacitor 121_1 and the capacitor 121_2 is preferably a material similar to that for a source and a drain of each of the transistor 101_1 and the transistor 101_2. Thus, a layout area can be reduced. Alternatively, capacitance value can be increased. However, this embodiment is not limited to this example. As a material used for the one electrode of each of the capacitor 121_1 and the capacitor 121_2 and the other electrode of each of the capacitor 121_1 and the capacitor 121_2, a variety of materials can be used.

Note that it is preferable that the capacitance value of the capacitor 121_1 and the capacitance value of the capacitor 121_2 be approximately the same. Alternatively, it is preferable that the area where one electrode of the capacitor 121_1 overlaps with the other electrode thereof be approximately equal to the area where one electrode of the capacitor 121_2 overlaps with the other electrode thereof. In this manner, even if transistors are switched to be used. Vgs of the transistor 101_1 and Vgs of tire transistor 101_2 can be approximately the same: therefore, the waveforms of the signal OUT can be approximately the same. However, this embodiment is not limited to this example. The capacitance value of the capacitor 121_1 and the capacitance value of the capacitor 121_2 can be different from each other. Alternatively, the area where one electrode of the capacitor 121_1 overlaps with the other electrode thereof can be different from the area where one electrode of the capacitor 121_2 overlaps with the other electrode thereof.

Note that as in FIG. XB, the capacitor 121_1 can be connected between the gale and the second terminal of the transistor 101_1 in FIGS. 4A and 4B and FIG. 8A. Alternatively, the capacitor 121_2 can be connected between the gate and the second terminal of the transistor 101_2.

Figure 8C:
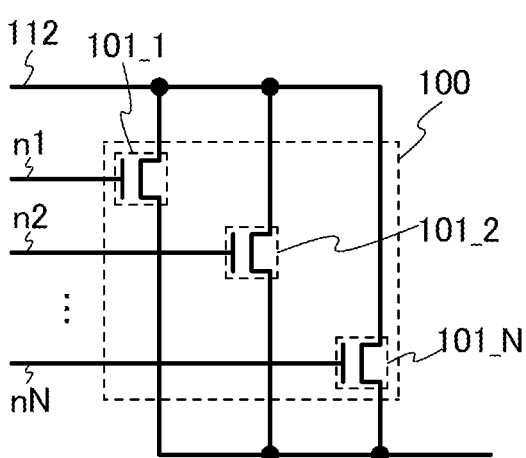

Note that as shown in FIG. 8C the circuit 100 can include a plurality of transistors of the transistors 101_1 to 101_N. First terminals of the transistor 101_1 to 101_N are connected to the wiring 112. Second terminals of the transistors 101_1 to 101_N are connected to the wiring 111. In addition, gates of the transistors 101_1 to 101_N are referred to as nodes n1 to nN, respectively. The structure shown in FIG. 8C correspond to a structure in the case where a transistor is used as a switch in Embodiment 1 Therefore, the transistors 101_1 to 101_N have functions similar to those of the switches 101_1 to 101_1, respectively.

Note that the larger N is, the smaller the number of times when each of the transistors is turned on becomes or the shorter the length of time when each of the transistors is on becomes, therefore, deterioration of characteristics of the transistor can be suppressed. However, if N is too large a number, the number of transistors is increased, and a circuit scale becomes larger. Therefore, it is preferable that N is smaller than 6. It is more preferable that N is smaller than 4. It is further preferable that N is 3 or 2.

Note that as in FIG. 8C, the circuit 100 can include a plurality of transistors of the transistors 101_1 to 101_N in FIGS. 4A and 4B and FIGS. 8A and 8B. Specifically in the case where the circuit 100 includes the plurality of transistors of the transistors 101_1 to 101_N in FIG. 8A, the wiring 112 can be divided into N wirings. Specifically in the case where the circuit 100 includes the plurality of transistors of the transistors 101_1 to 101_N in FIG. 8B, capacitors can be connected between the respective gates of the transistors 101_1 to 101_N and the respective second terminals of the transistors 101_1 to 101_1.

Figure 8D:
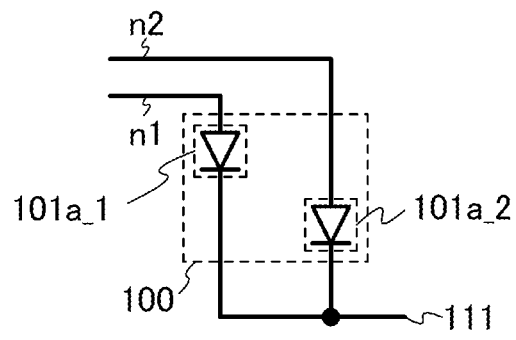

As shown in FIG. 8D, the transistor 101_1 can be replaced with a diode 101a_1 one terminal (hereinafter also referred to as an anode) of which is connected to the node n1 and the other terminal (hereinafter also referred to as a cathode) of which is connected to the wiring 111. Similarly, the transistor 101_2 can be replaced with a diode 101a_2 one terminal (also referred to as an anode) of which is connected to the node n2 and the other terminal (also referred to as a cathode) of which is connected to the wiring 111. However, this embodiment is not limited to this example. As shown in FIG. 8F, the first terminal of the transistor 101_1 can be connected to the node n1, so that a structure in which the transistor 101_1 is diode-connected can be obtained. Similarly, if the first terminal of the transistor 101_2 is connected to the node n2, a structure in which die transistor 101_2 is diode-connected can be obtained.

Figure 8E:
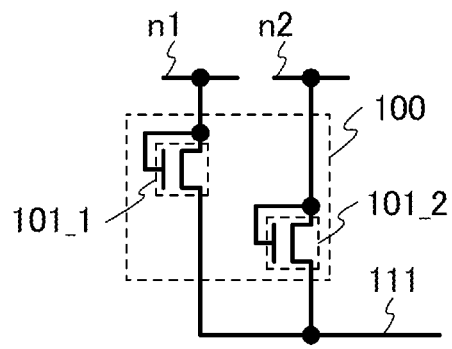
Figure 8F:
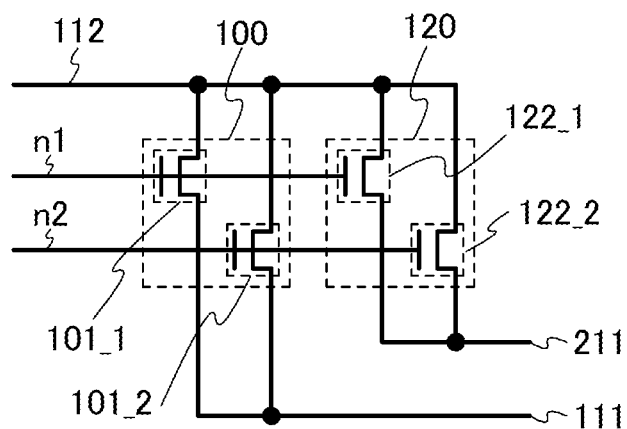

Note that as in FIGS. 8D and 8E, the transistor can be replaced with a diode in FIGS. 4A and 4B and FIGS. 8A to 8C. Alternatively, a structure in which a transistor is diode-connected can be employed.

Note that it is possible to obtain two signals as shown in FIG. 8F. In order to achieve this, a semiconductor device can include a circuit 120. The circuit 120 includes a plurality of transistors of transistors 122_1 and 122_2. The circuit 120 has a function similar to that of the circuit 100. The transistors 122_1 and 122_2 have similar functions as the transistors 101_1 and 101_2, respectively. A first terminal of the transistor 122_1 is connected to the wiring 112, a second terminal of the transistor 122_1 is connected to a wiring 211, and a gate of the transistor 122_1 is connected to the node n1. A first terminal of the transistor 122_2 is connected to the wiring 112, a second terminal of the transistor 122_2 is connected to the wiring 211, and a gate of the transistor 122_2 is connected to the node n2. In this manner, the transistor 101_1 and the transistor 122_1 are controlled at the same timing and tire transistor 101_2 and the transistor 122_2 are controlled at the same timing. Accordingly, a signal output from the wiring 211 goes into the H level or the L level at approximately the same timing as the signal OUT.

Note that in the case where a signal output from the wiring 111 functions as a gate signal or a selection signal, a signal output from the wiring 211 can function as a transfer signal, a reset signal, a gate signal, or the like. In such a case, the load of the wiring 111 is higher than that of the wiring 211 in many cases; therefore, the channel width of tire transistor 101_1 is preferably larger than that of the transistor 122_1. Similarly, the channel width of the transistor 102_2 is preferably larger than that of the transistor 122_2. However, this embodiment is not limited to this example.

Note that as in FIG. 8F, when the semiconductor device includes the circuit 120 in FIGS. 4A and 4B and FIGS. 8A to 8E, two output signals can be obtained. In addition, the circuit 120 can include a plurality of transistors of the transistors 122_1 and 122_2. Specifically in the case where the circuit 100 includes the plurality of transistors of the transistors 101_1 to 101_N in FIG. 8C, the circuit 120 can include N transistors.

Next, a specific example of the circuit 10 is described. First, a structure in which the circuit 10 includes a circuit 200 is described with reference to FIG. 9A. The circuit 200 is part of the circuit 10. The circuit 200 is connected to the wiring 114, the wiring 115_1, the wiring 115_2, the node n1, and/or the node n2. However, this embodiment is not limited to this example. The circuit 200 can be connected to another wiring or another node.

The circuit 200 includes one or more transistors in many cases. These transistors have the same polarity as the transistors 101_1 and 101_2 and are n-channel transistors in many cases. However, this embodiment is not limited to this example. The circuit 200 can include p-channel transistors. Alternatively, the circuit 200 can include an n-channel transistor and a p-channel transistor. That is, the circuit 200 can be a CMOS circuit.

The circuit 200 has a function of controlling a timing when a signal or a voltage is supplied to the node n1 and/or the node n2 in accordance with the signal SP, the signal SEL1, the signal SEL2, the potential of the node n1, and/or the potential of the node n2. Thus, the circuit 200 has a function of controlling the potential of the node n1 and or the potential of the node n2. For example, the circuit 200 has a function of supplying a signal in the H level or the voltage V2 to the node n1 and/or the node n2. Alternatively, the circuit 200 has a function of supplying a signal in the L level or the voltage V1 to the node n1 and/or the node n2. Alternatively, the circuit 200 has a function of stopping supply of the signal, voltage, or the like to the node n1 and/or the node n2. Alternatively, the circuit 200 has a function of increasing the potential of the node n1 and or the potential of the node n2. Alternatively, the circuit 200 has a function of decreasing or maintaining the potential of the node n1 and/or the potential of the node n2. Alternatively, the circuit 200 has a function of making the node n1 and/or the node n2 go into a floating state.

Here, one example of the circuit 200 is described with reference to FIG. 9B. The circuit 200 includes a plurality of transistors of transistors 201_1 and 201_2. A first terminal of the transistor 201_1 is connected to the wiring 115_1, a second terminal of the transistor 201_1 is connected to the gate of the transistor 101_1, and a gate of the transistor 201_1 is connected to the wiring 114. A first terminal of the transistor 201_2 is connected to the wiring 115_2, a second terminal of the transistor 201_2 is connected to the gate of the transistor 101_2, and a gate of the transistor 201_2 is connected to the wiring 114. Note that this embodiment is not limited thereto, and a variety of structures can be applied to the circuit 200.

The transistors 201_1 and the transistor 201_2 preferably have the same polarity as the transistor 101_1 and the transistor 101_2 and are n-channel transistors. However, this embodiment is not limited to this. The transistor 201_1 and or the transistor 201_2 can be p-channel transistors.

The transistor 201_1 has a function of controlling electrical continuity of the wiring 115_1 and the node n1 in accordance with the potential of tire wiring 114. Alternatively, the transistor 201_1 has a function of supplying the potential of the wiring 115_1 to the node n1 in accordance with the potential of the wiring 114. Alternatively, the transistor 20M has a function of being turned on or off in accordance with the signal SP. Alternatively, the transistor 201_1 has a function of controlling whether to input the signal SEL1 to the transistor 101_1. Alternatively, the transistor 201_1 has a function of controlling whether to set a potential state of the signal OUT by being turned on or off. The transistor 201_2 has a function of controlling electrical continuity of the wiring 115_2 and the node n2 in accordance with the potential of the wiring 114. Alternatively, the transistor 201_2 has a function of supplying the potential of the wiring M5_2 to the node n2 in accordance with the potential of the wiring 114. Alternatively, the transistor 201_2 has a function of being turned on or off in accordance with the signal SP Alternatively, the transistor 201_2 has a function of controlling whether to input the signal SEL2 to the transistor 101_2 or not. Alternatively, the transistor 201_2 has a function of controlling whether to set a potential stale of live signal OUT by being turned on or off.

Figure 9A:
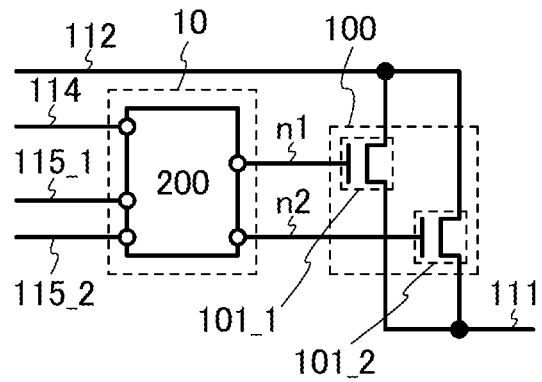
FIGS. 9A to 9F are examples of a circuit diagram of a semiconductor device in Embodiment 2.
Figure 9B:
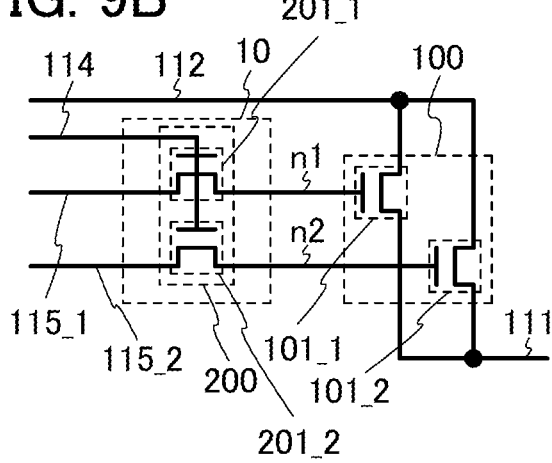
Figure 10A:
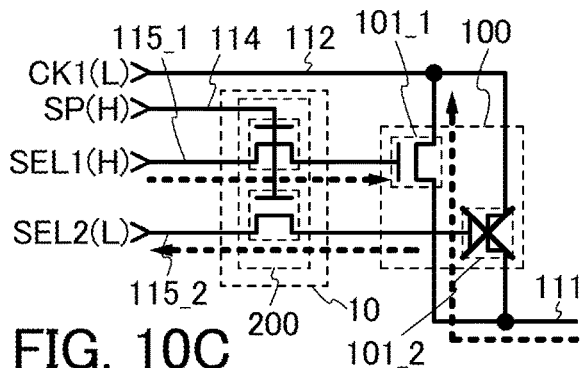
FIGS. 10A to 10H are examples of a schematic view for illustrating operation of a semiconductor device in Embodiment 2.

Operation of the semiconductor device tn FIG. 9A is described. Here, for example, the case where a circuit configuration shown in FIG. 9B is applied to the circuit 200 is described. In the period A1, as shown in FIG. 10A, since the signal SP is in the H level, the transistor 201_2 and the transistor 201_2 are on. Therefore, the signal SEL1 in the H level is supplied from the wiring 115_1 to the node n1 through the transistor 201_1 and the signal SEL2 in the L level is supplied from the wiring 115_2 to the node n2 through the transistor 201_2. In this manner, the potential of the node n1 starts increasing and the potential of the node n1 becomes equal to V2. Alter that, the transistor 201_1 is turned off when the potential of the node n1 is raised to a value obtained by subtracting the threshold voltage of the transistor 201_1 (Vrth201_1) from the potential of the wiring 114 (V2), (V2−Vth201_1). Therefore, the node n1 goes into a floating state while the potential is maintained as (V2−Vth201_1).

Figure 10B:
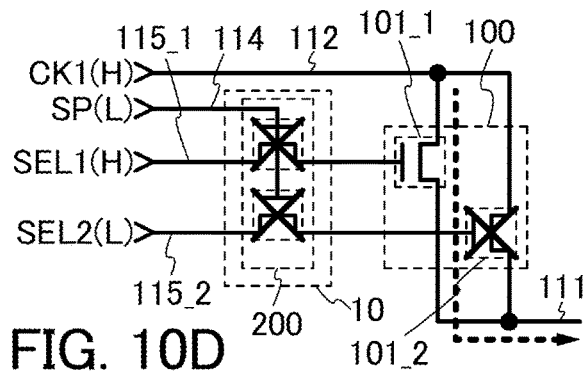
Figure 10C:
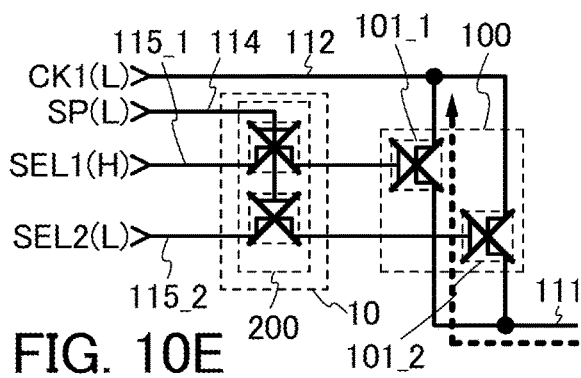
Figure 10D:
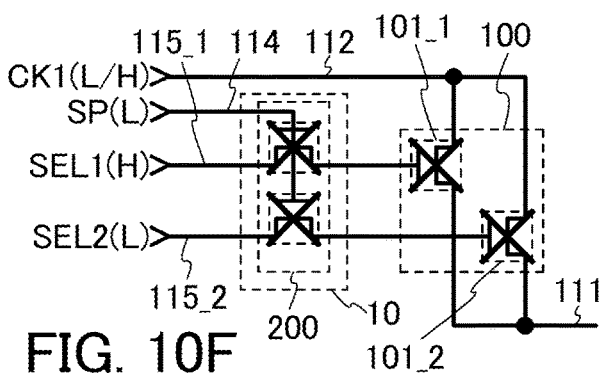

In the periods B1 to F1, since the signal SP is in the L level, the transistor 201_1 and the transistor 201_2 are off. Accordingly, the wiring 115_1 and the node n1 are out of electrical continuity, and the wiring 115_2 and the node n2 are out of electrical continuity. Note that FIG. 10B shows a schematic view of the semiconductor device in the period B1. FIG. 10C shows a schematic view of the semiconductor device in the period C1, and FIG. 10D shows a schematic view of the semiconductor device in the period D1 and the period E1.

Figure 10E:
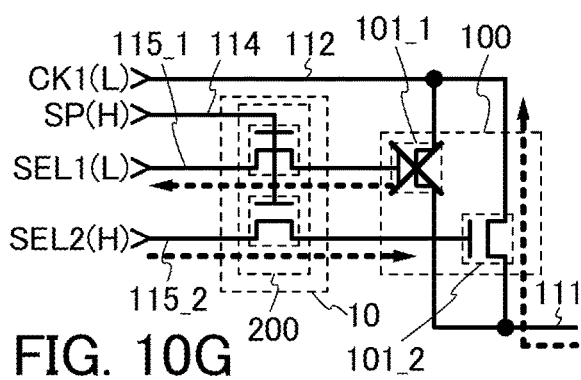

Next, in the period A2, as shown in FIG. 10E, since the signal SP is in the H level, the transistor 201_1 and the transistor 201_2 are on. Therefore, the signal SEL1 in the L level is supplied from the wiring 115_1 to the node n1 through the transistor 201_1 and the signal SEL2 in the H level is supplied from the wiring 115_2 to the node n2 through the transistor 201_2. In this manner, the potential of the node n1 becomes equal to V1 and the potential of the node n2 starts increasing. After that, the transistor 201_2 is turned off when the potential of the node n2 is raised to a value obtained by subtracting the threshold voltage of the transistor 201_2 (Vth201_2) from the potential of the wiring 114 (V2), (V2−Vth201_2). Therefore, the node n2 goes into a floating slate while its potential is maintained as (V2−Vth201_2).

Figure 10F:
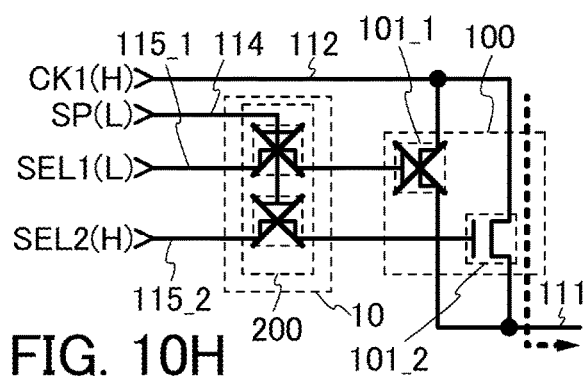
Figure 10G:
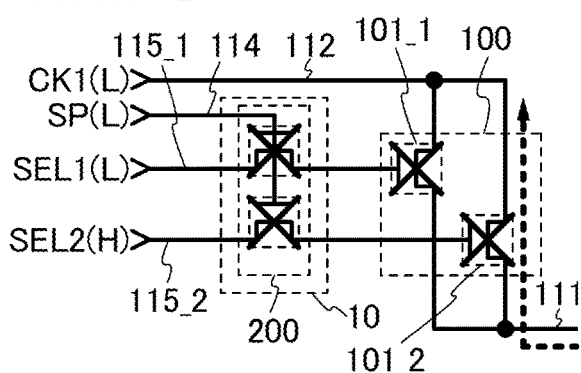
Figure 10H:
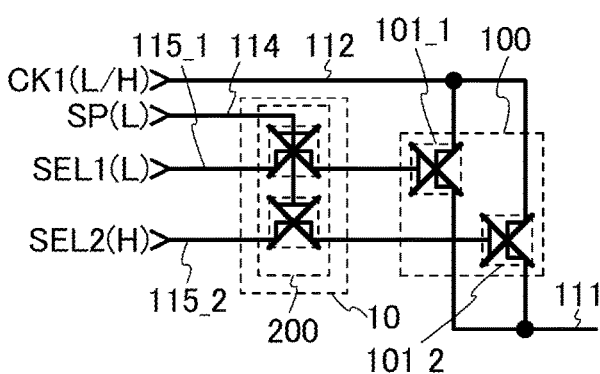

In the periods B2 to E2, since the signal SP is in the L level, the transistor 201_1 and the transistor 201_2 are off. Accordingly, the wiring 115_1 and the node n1 are out of electrical continuity, and the wiring 115_2 and the node u2 are out of electrical continuity. Note that FIG. 10F show s a schematic view of the semiconductor device in the period B2, FIG. 10G shows a schematic view of the semiconductor device in the period C2, and FIG. 10H shows a schematic view of the semiconductor device in the period D2 and the period E2.

By forming the circuit 10 in this manner, any of transistors in the circuit 100 can be selectively turned on or off. In addition, even in the ease where a transistor in the circuit 100 is made off, the circuit 10 applies a potential to a gate of the transistor that is made off. Therefore, the gate of the transistor can be prevented from going into a floating state.

Note that since the transistor 201_1 and the transistor 201_2 have similar functions, it is preferable that the channel width of the transistor 201_1 and the channel width of the transistor 201_2 be approximately the same. By making the transistors have approximately the same size in such a manner, the transistors can have approximately the same current supply capability. Further, the degree of deterioration of the transistors can be approximately the same. Accordingly, when transistors are switched to be used, the waveforms of the signal OUT can be approximately the same because the potential of the node n1 and the potential of the node n2 can be approximately the same Note that this embodiment is not limited thereto, and the channel width of the transistor 201_1 can be different from the channel width of the transistor 201_2.

Note that since the load of the transistor 201_1 (e.g., the node n1) is lower than the load of the transistor 101_1 (e.g., the wiring 111) in many cases, the channel width of the transistor 201_1 is preferably smaller than that of the transistor 101_1. Similarly, since the load of the transistor 201_2 (e.g., the node n2) is lower than the load of the transistor 101_2 (e.g., the wiring 111) in many cases, the channel width of the transistor 201_2 is preferably smaller than that of the transistor 101_2. However, this embodiment is not limited to this example. The channel width of the transistor 201_1 can be larger than that of the transistor 101_1. In addition, the channel width of the transistor 201_2 can be larger than that of the transistor 101_2.

Figure 9C:
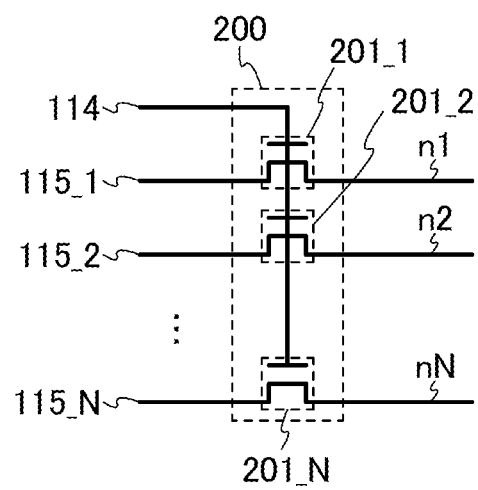

Note that as shown in FIG. 9C, in the case where the circuit 100 includes a plurality of transistors of the transistors 101_1 to 101_N as in FIG. 8C, the circuit 200 can include a plurality of transistors of the transistors 201_1 to 201_N. First terminals of the transistors 201_1 to 201_A; are connected to the wirings 115_1 to 115_N, respectively. Second terminals of the transistors 201_1 to 201_N are connected to the nodes n1 to nN, respectively. Gates of the transistors 201_1 to 201_A are connected to the wiring 114.

Figure 9D:
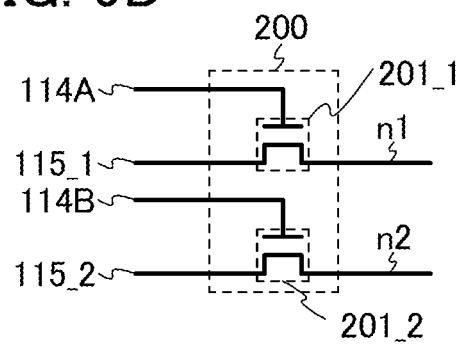

As shown in FIG. 9D, the wiring 114 can be divided into a plurality of wirings of wirings 114A and 114B. Thus, the wirings 114A and 114B can have functions similar to that of the wiring 114. The gate of the transistor 201_1 is connected to the wiring 114A. The gate of the transistor 201_2 is connected to the wiring 114B. In that case, signals with approximately the same waveforms can be input to the wirings 114A and 114B. Alternatively, signals with different waveforms can be input to the wirings 114A and 114B.

As in FIG. 9D, the wiring 114 can be divided into a plurality of wirings in FIG. 9C.

Figure 9E:
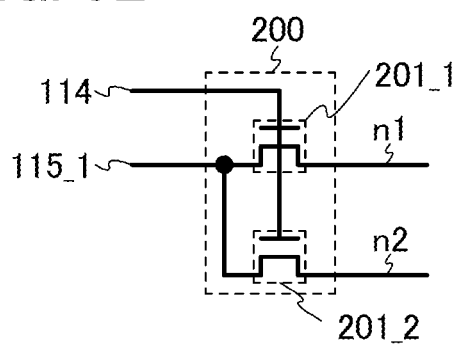

Note that as shown in FIG. 9E, the first terminal of the transistor 201_1 and the first terminal of the transistor 201_2 can be connected to the same wiring. In an example of FIG. 9E, the first terminals of the transistors 201_1 and 201_2 are connected to the wiring 115_1. However, this embodiment is not limited to this example. The first terminals of the transistors 201_1 and 201_2 can be connected to a variety of wirings other than the above. For example, the first terminals of the transistors 201_1 and 201_2 can be connected to the wiring 113 or a wiring to which the signal CK2 is input.

Note that as in FIG. 9E the first terminals of the transistors 201_1 and 201_2 can be connected to the same wiring in FIGS. 9C and 9D. Specifically in the case of FIG. 9C, the first terminals of the transistors 201_1 and 201_N can be connected to the same wiring.

Figure 9F:
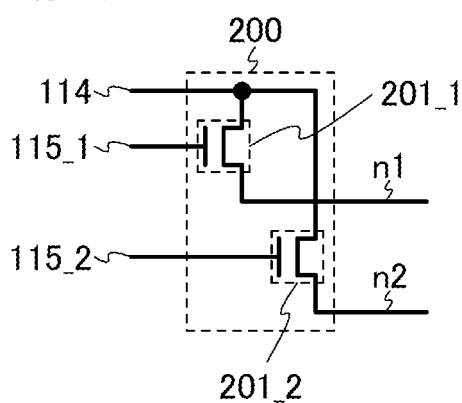

Note that as shown in FIG. 9F, the first terminal of the transistor 201_1 can be connected to the wiring 114, the second terminal of the transistor 201_1 can be connected to the node n1, and the gate of the transistor 20M can be connected to the wiring 115_1. The first terminal of the transistor 201_2 can be connected to the wiring 114, the second terminal of the transistor 201_2 can be connected to the node n2, and the gate of the transistor 201__2 can be connected to the wiring 115_2. In that case, when the signal SEL1 is in the H level and the signal SEL2 is in the L level in the period T1, the transistor 201_1 is on and the transistor 201_2 is off. Accordingly, in the period A1, since the signal SP in the H level is supplied from the wiring 114 to the node n1 through the transistor 2011, the potential of the node n1 is raised. On the other hand, when the signal SFX1 is in the L level and the signal SEL2 is in the H level in the period T2, the transistor 201_1 is off and the transistor 201_2 is on. Accordingly, in the period A2, since the signal SP in the H level is supplied from the wiring 114 to the node n2 through the transistor 201_2, the potential of the node n2 is raised.

Note that as shown in FIG. HA, a diode-connected transistor 202J can be connected between the second terminal of the transistor 201_1 and the node n1. Similarly, a diode-connected transistor 202_2 can be connected between the second terminal of the transistor 201_2 and the node n2. The first terminal of the transistor 202_1 is connected to the second terminal of the transistor 201_1, the second terminal of the transistor 202_1 is connected to the node n1, and the gate of the transistor 202_1 is connected to the second terminal of the transistor 201_1. The first terminal of the transistor 202_2 is connected to the second terminal of the transistor 201_2, the second terminal of the transistor 202_2 is connected to the node n2, and the gate of the transistor 202_2 is connected to the second terminal of the transistor 201_2. The transistor 201_1 and the transistor 201_2 can each function as a diode. When the transistor 201_1 is out of conduction, the transistor 201_1 has a function of preventing decrease in the potential of the node n1. Similarly, when the transistor 201_2 is out of conduction, the transistor 201_2 has a function of preventing decrease in the potential of the node n2. However, this embodiment is not limited to this example. A variety of elements or circuits can be connected between the second terminal of the transistor 201_1 and the node n1 and/or between the second terminal of the transistor 201_2 and the node n2. Alternatively, a variety of elements or circuits can be connected between the first terminal of the transistor 201_1 and the wiring 115_1 and or between the first terminal of the transistor 201_2 and the wiring 115_2. For example, as shown in FIG. 11B, the transistor 202_1 can be connected between the first terminal of the transistor 201_1 and the wiring 115_1. Alternatively, the transistor 202_2 can be connected between the first terminal of the transistor 201_2 and the wiring 115_2.

Figure 11A:
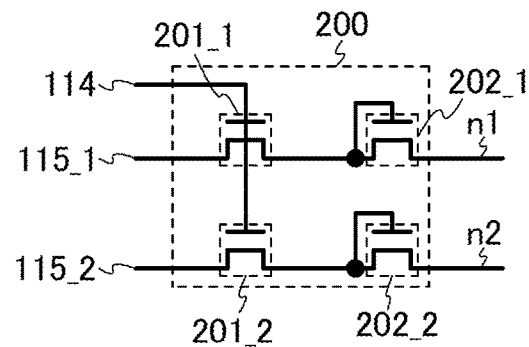
FIGS. 11A to 11F are examples of a circuit diagram of a semiconductor device in Embodiment 2.
Figure 11B:
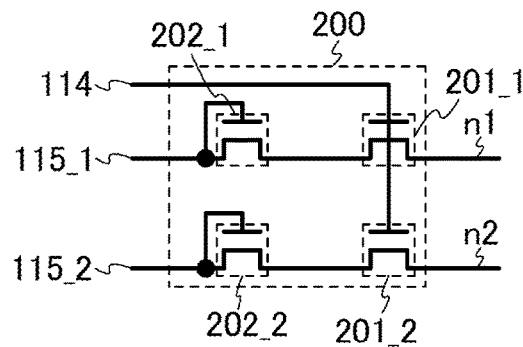
Figure 11C:
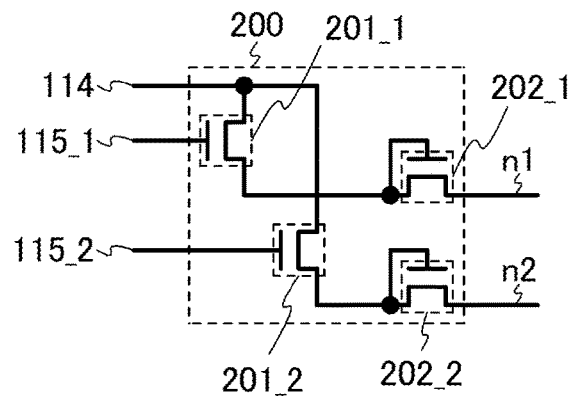
Figure 11D:
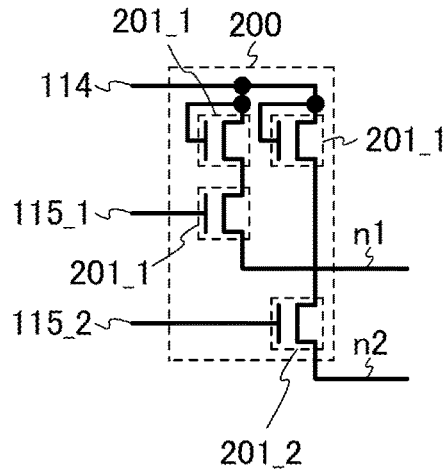

Note that as in FIGS. 11A and 11B, a variety of elements or circuit can be connected between the second terminal of the transistor 201_1 and the node n1, between the second terminal of the transistor 201_2 and the node n2, between the first terminal of the transistor 201_1 and the wiring 115_1, and/or between the first terminal of the transistor 201_2 and the wiring 115_2 in FIGS. 9C to 9F. FIG. 11C shows an example of a structure in which the diode-connected transistor 202_1 is connected between the second terminal of the transistor 201_1 and the node n1 and the diode-connected transistor 202_2 is connected between the second terminal of the transistor 201_2 and the node n2 in FIG. 9F. FIG. 11D shows an example of a structure in which the diode-connected transistor 2021 is connected between the first terminal of the transistor 201_1 and the wiring 114 and the diode-connected transistor 202_2 is connected between the first terminal of the transistor 201_2 and the wiring 114 in FIG. 9F.

Figure 11E:
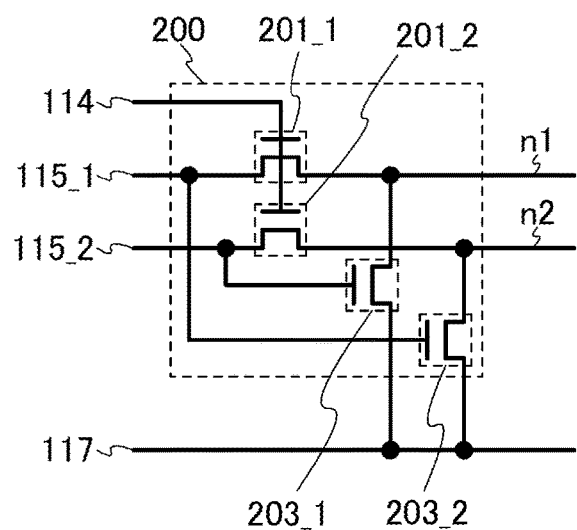

Note that as shown in FIG. 11E, the circuit 200 can include a plurality of transistors of transistors 203_1 and 203_2. The transistors 203_1 and the transistor 203_2 preferably have the same polarity as the transistor 201_1 and the transistor 201_2 and are n-channel transistors. However, this embodiment is not limited to this. The transistors 203_1 and 203_2 can be p-channel transistors. A first terminal of the transistor 203_1 is connected to the wiring 117, a second terminal of the transistor 203_1 is connected to the node n1, and a gate of the transistor 203_1 is connected to the wiring 115_2. A first terminal of the transistor 203_2 is connected to the wiring 117, a second terminal of the transistor 203_2 is connected to the node n2, and a gate of the transistor 203_2 is connected to the wiring 115_1. However, this embodiment is not limited to this example. For example, the second terminal of tire transistor 203_1 can be connected to the node n2. Alternatively, the second terminal of the transistor 203_2 can be connected to the node n1.

Note that the transistor 203_1 has a function of controlling a liming when the voltage V1 is supplied to the node n1 by controlling a state of electrical continuity of the wiring 117 and the node n1 in accordance with the signal SEL2 and can function as a switch. The transistor 203_2 has a function of controlling a timing when live voltage V1 is supplied to the node n2 by controlling a state of electrical continuity of the wiring 117 and the node n2 in accordance with the signal SEL1, and can function as a switch. In this manner, the voltage V1 is supplied to the node n2 through the transistor 203_2 in the period T1. Therefore, even when the transistor 201_2 is off, the potential of the node n2 can be fixed. Similarly, the voltage V1 is supplied to the node n1 through the transistor 203_1 in the period T2. Therefore, even when the transistor 201_1 is off, the potential of the node n1 can be fixed. As a result, a semiconductor device with high resistance to noise can be obtained.

Figure 11F:
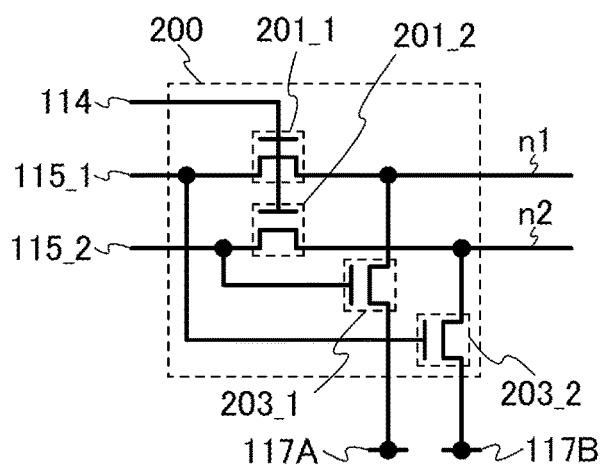

As shown in FIG. 11F, the wiring 117 can be divided into a plurality of wirings of wirings 117A and 117B. The first terminal of the transistor 203_1 and the first terminal of the transistor 203_2 can be connected to the wiring 117A and the wiring 117B, respectively. The wirings 117A and 117B can be connected to a variety of wirings, elements, or nodes.

Figure 12A:
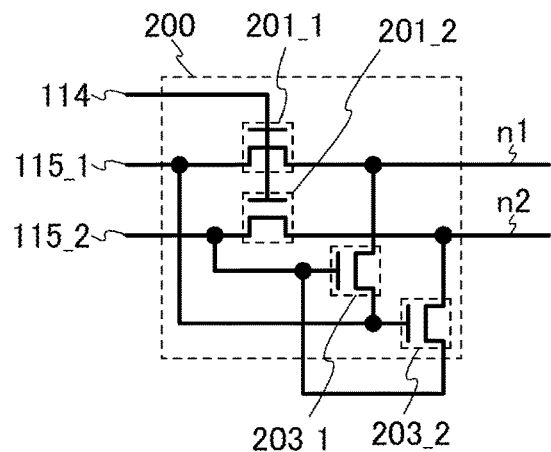
FIGS. 12A to 12F are examples of a circuit diagram of a semiconductor device in Embodiment 2.

Note that as shown in FIG. 12A, the second terminal of the transistor 203_1 can be connected to the wiring 115_1. The second terminal of the transistor 203_2 can be connected to the wiring 115_2. In this manner, a signal in the H level is input to the first terminal of the transistor 203_1 in a period during which the transistor 203_1 is off (e.g., the period T1). Accordingly, backward bias is applied to the transistor 203_1, so that deterioration can be suppressed. Similarly, a signal in the H level is input to the first terminal of the transistor 203_2 in a period during which the transistor 203_2 is off (e.g., the period T2). Accordingly, reverse bias is applied to the transistor 203_2, so that deterioration can be suppressed.

Figure 12B:
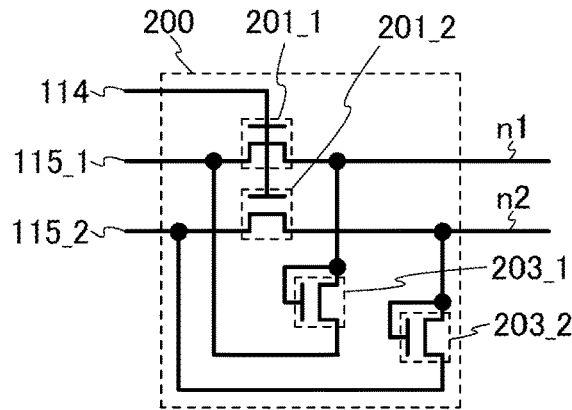

Note that as shown in FIG. 12B, the transistor 203_1 and the transistor 203_2 can be diode-connected transistors. For example, the first terminal of the transistor 2031 is connected to the wiring 115_1, the second terminal of the transistor 203_1 is connected to the node n1, and the gate of the transistor 203_1 is connected to the node n1. Similarly, the first terminal of the transistor 203_2 is connected to the wiring 115_2, the second terminal of the transistor 203_2 is connected to the node n2, and the gate of the transistor 203_2 is connected to the node n2. In that case, in the period T1, when the signal SHL2 is in the L level, the signal SEL2 in the L level is supplied from the wiring 115_2 to the node n2 through the transistor 203_2. Accordingly, the potential of the node n2 can be fixed to approximate V1. On the other hand, in the period T2, when the signal SEL1 is in the L level, the signal SEL1 in the L level is supplied from the wiring 115_1 to the node n1 through the transistor 203_1. Accordingly, the potential of the node n1 can be fixed to approximate V1. However, this embodiment is not limited to this. For example, the gate of the transistor 203_1 can be connected to the wiring 115_1. Alternatively, the gate of the transistor 203_2 can be connected to the wiring 115_2.

Figure 12C:
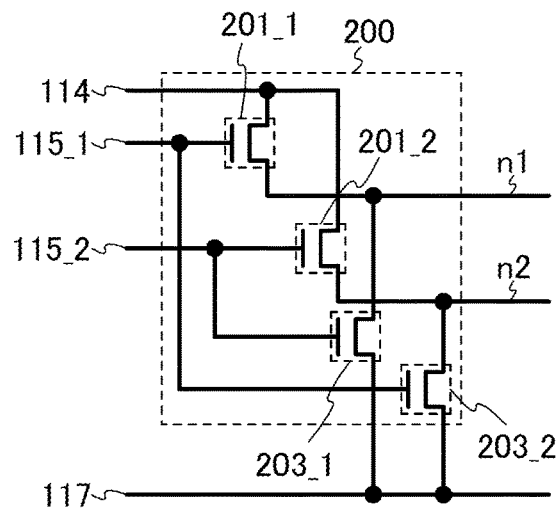
Figure 12D:
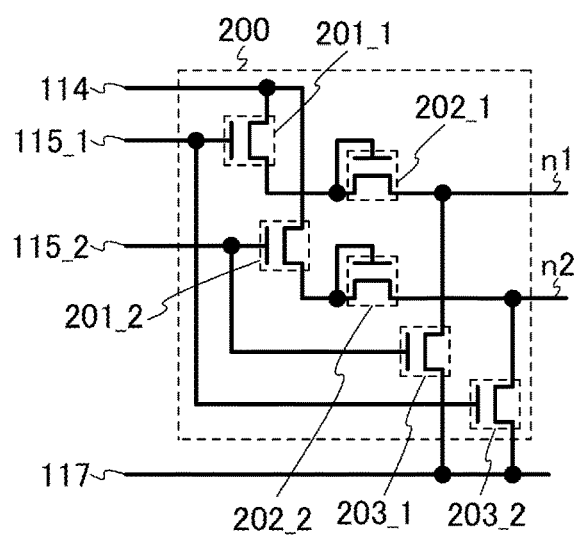
Figure 12E:
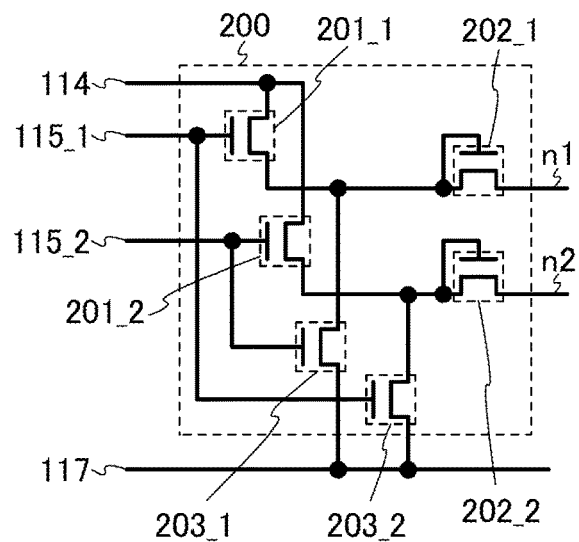
Figure 12F:
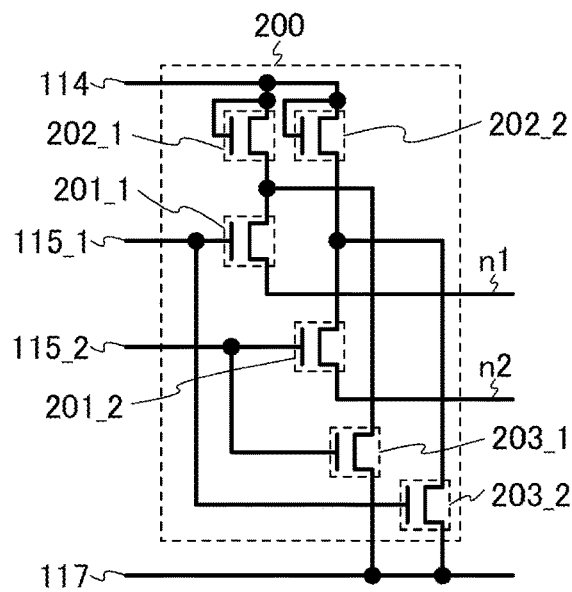

Note that as in FIGS. 11E and 11F and FIGS. 12A and 12B, the circuit 200 can include lire transistors 203_1 and 203_2 in FIGS. 9C to 9F and FIGS. 11A to 11D. For example, FIG. 12C shows a structure in which the circuit 200 includes the transistors 203_1 and 203_2 in FIG. 9F. FIGS. 12D and 12E show a structure in which the circuit 200 includes the transistors 203_1 and 203_2 in FIG. 11A. FIG. 12F shows a structure in which the circuit 200 includes the transistors 203_1 and 203_2 in FIG. 11D.

Note that the second terminal of the transistor 203_1 and the second terminal of the transistor 203_2 can be connected to a variety of wirings or nodes. For example, as shown in FIG. 12E, the second terminal of the transistor 203_1 can be connected to the second terminal of the transistor 201_1. Similarly, the second terminal of the transistor 203_2 can be connected to the second terminal of the transistor 201_2. Alternatively, as shown in FIG. 12F, the second terminal of the transistor 203_1 can be connected to the first terminal of the transistor 201_1. Similarly, the second terminal of the transistor 203_2 can be connected to the first terminal of the transistor 201_2.

Note that as shown in FIG. 3F, the circuit 200 can include a plurality of transistors of the transistors 203_1 and 203_2 in addition to. The transistor 201_1 and 201_2. The transistors 203_1 and the transistor 203_2 preferably have the same polarity as the transistor 201_1 and the transistor 201_2 and are n-channel transistors. However, this embodiment is not limited to this. The transistors 203_1 and 203_2 can be p-channel transistors. The first terminal of the transistor 203_1 is connected to the wiring 114, the second terminal of the transistor 203_1 is connected to the node n1, and the gate of the transistor 203_1 is connected to the wiring 118. The first terminal of the transistor 203_2 is connected to the wiring 114, the second terminal of the transistor 203_2 is connected to the node n2, and the gale of the transistor 203_2 is connected to the wiring 118. The signal CK2 is input to the wiring 118. Accordingly, the wiring 118 can function as a signal line or a clock signal line. Note that this embodiment is not limited thereto, and a variety of signals, voltages, or currents can be input to the wiring 118. The transistor 203_1 has a function of controlling a state of electrical continuity of the wiring 114 and the node n1 in accordance with the potential of the wiring 118. Alternatively, the transistor 203_1 has a function of supplying the potential of the wiring 114 to the node n1 in accordance with the potential of the wiring 118. The transistor 203_2 has a function of controlling a state of electrical continuity of the wiring 114 and the node n2 in accordance with the potential of the wiring 118. Further, the transistor 203_2 has a function of supplying the potential of the wiring 114 to the node n2 in accordance with the potential of the wiring 118. However, this embodiment is not limited to this example. The transistors 203_1 and 203_2 can have a variety of functions other than the above.

Note that the first terminal of the transistor 203_1 and the first terminal of the transistor 203_2 can be connected to different wirings. Note that the gate of the transistor 203_1 and the gate of the transistor 203_2 can be connected to different wirings.

Figure 5F:
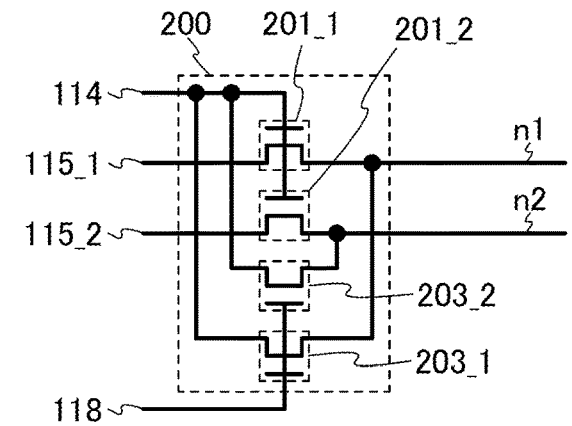

Note that as in FIG. 5F, a transistor with a function similar to those of the transistors 2031 and 203_2 can be additionally provided in FIGS. 9C to 9F. FIGS. 11A to 11F, and FIGS. 12A to 12F.

Figure 13A:
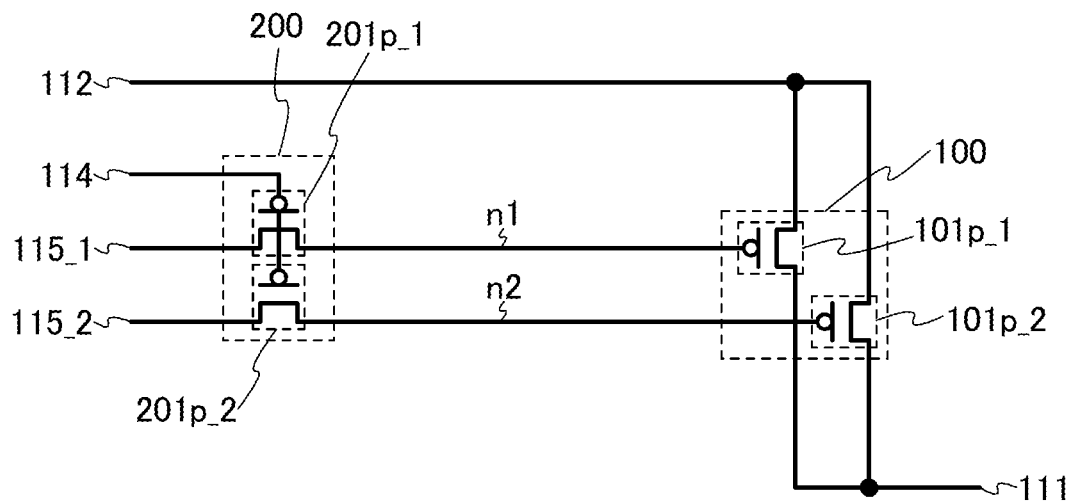
FIG. 13A is an example of a circuit diagram of a semiconductor device in Embodiment 2 and FIG. 13B is an example of a timing chart for illustrating operation of the semiconductor device in Embodiment 2.
Figure 13B:
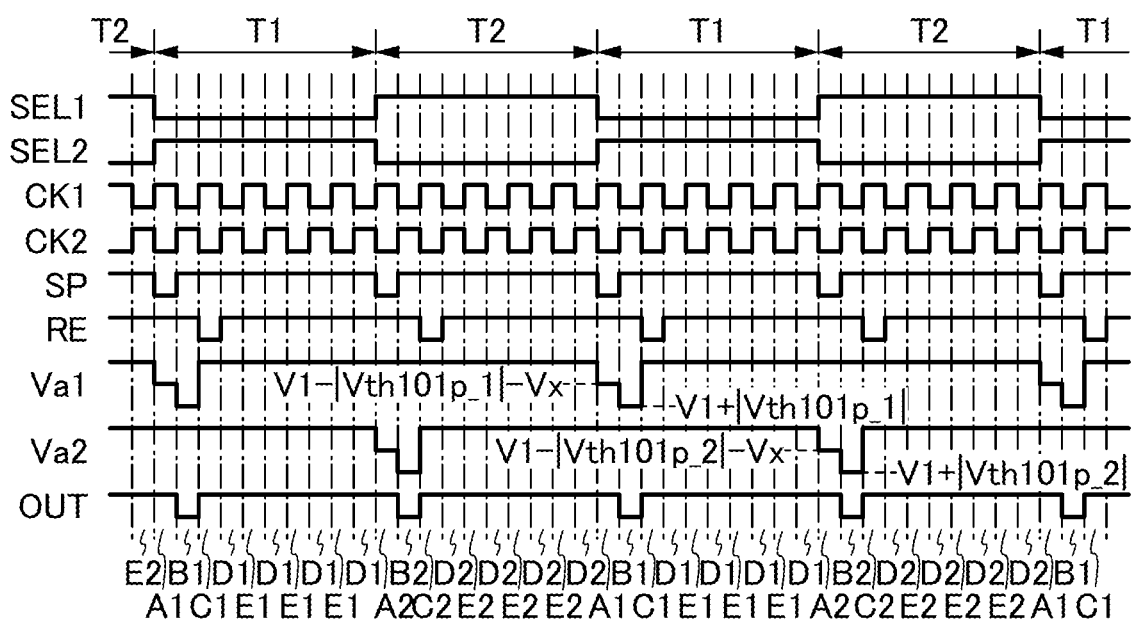

Note that as shown in FIG. 13A, p-channel transistors can be used as the transistors 101_1 and 101_2 and transistors 201_1 and 201_2. Transistors 101p_1 and 101p_2 correspond to the transistors 101_1 and 1012 and are p-channel transistors. Transistors 102p_1 and 102p_2 correspond to the transistors 102_1 and 102_2 and are p-channel transistors. In addition, it is to be noted that in the case where the transistor is a p-channel transistor, the voltage V1 is supplied to the wiring 113; the voltage V2 is supplied to the wiring 117 and the signal CK1, the signal SP, the signal RE, the potential of the node n1, the potential of the node n2, and the signal OUT are inverted as compared to those in the timing chart in FIG. 4B, as shown in FIG. 13B.

Note that as in FIG. 13A, a p-channel transistor can be used as the transistor in FIGS. 9C to 9F. FIGS. 11A to 11F, and FIGS. 12A to 12F.

Embodiment 3

In this embodiment, an example of a structure which is different from that of the circuit 10 described in Embodiment 2 is described. Note that description of the content in Embodiments 1 and 2 is omitted. Note that the content described in this embodiment can be combined with the content described in Embodiments 1 and 2 as appropriate.

Figure 14:
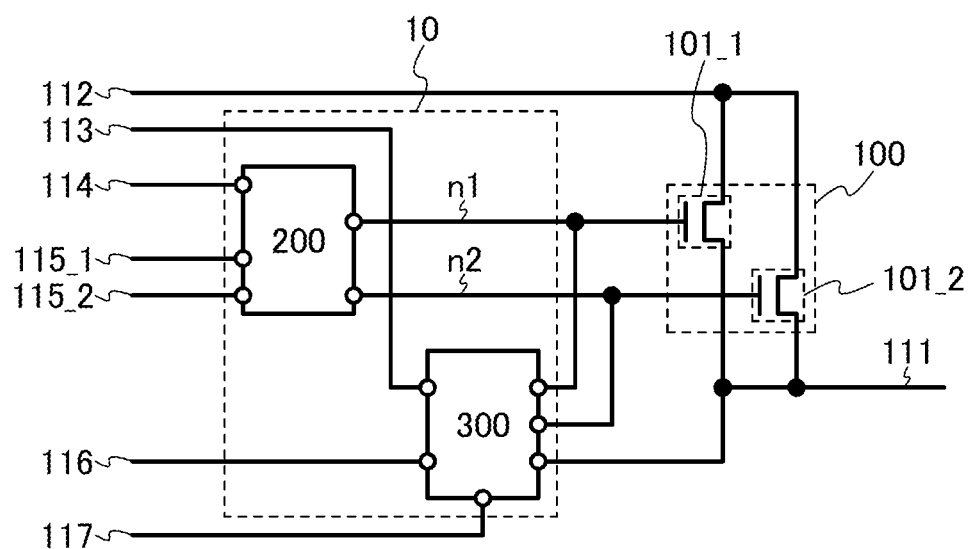
FIG. 14 is an example of a circuit diagram of a semiconductor device in Embodiment 3.

First, a specific example of the circuit 10 which is different from that in Embodiment 2 is described with reference to FIG. 14. The circuit 10 in FIG. 14 includes a circuit 300 in addition to the circuit 200. The circuit 300 is part of the circuit 10. Note that part of the circuit 300 can be used also as part of the circuit 200. Part of the circuit 200 can be used also as part of the circuit 300. The circuit 300 is connected to the wiring 113, the wiring 116, the wiring 117, the node n1, the node n2, and/or the wiring 111. However, this embodiment is not limited to this example. The circuit 200 can be connected to a variety of wirings or nodes.

The circuit 300 includes one or more transistors in many cases. These transistors have the same polarity as the transistors 101_1 and 101_2 and are n-channel transistors in many cases. However, this embodiment is not limited to this example. The circuit 300 can include p-channel transistors. Alternatively, the circuit 300 can include an n-channel transistor and a p-channel transistor. That is, the circuit 300 can be a CMOS circuit.

The circuit 300 has a function of controlling a liming when a signal or a voltage is supplied to the node n1, the node n2, and or the wiring 111 in accordance with a falling time of the signal RE, the potential of the node n1, the potential of the node n2, and/or the signal OUT. In this manner, the circuit 200 has a function of controlling the potential of the node n1, the potential of the node n2, and-or the potential of the wiring 111. For example, the circuit 200 has a function of supplying a signal in the L level or the voltage V1 to the node n1, the node n2, and/or the wiring 111.

Next, an example of the circuit 500 is described with reference to FIG. 15A. In the example in FIG. 15A, the circuit 300 includes a plurality of transistors of transistors 301_1 and 301_2, a transistor 302, a plurality of transistors of transistors 303_1 and 303_2, a transistor 304, a plurality of circuits of circuits 310_1 and 310_2, and a circuit 320.

Note that the transistors 301_1 and 301_2, the transistor 302, the transistors 303_1 and 303_2, and the transistor 304 are n-channel transistors, for example. However, this embodiment is not limited to this example. The transistors 301_1 and 301_2, the transistor 302, the transistors 303_1 and 303_2, and or the transistor 304 can be p-channel transistors.

Figure 15A:
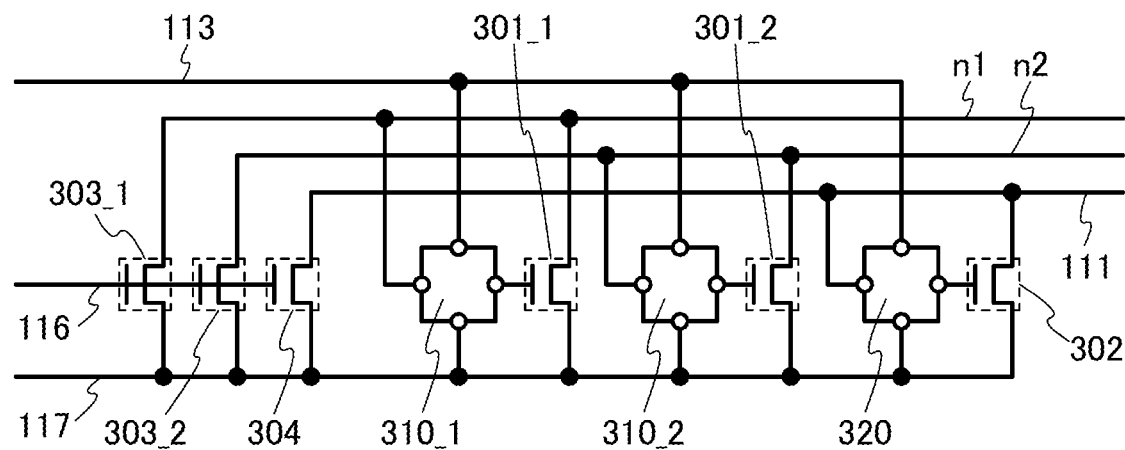
FIGS. 15A and 15B are examples of a circuit diagram of a semiconductor device in Embodiment 3.
Figure 15B:
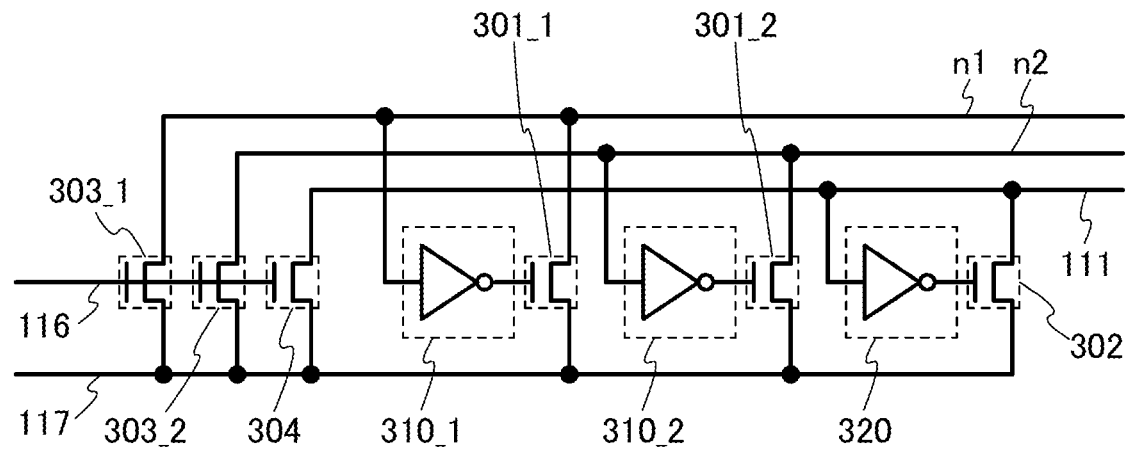

Note that as shown in FIG. 15B, for example, inverter circuits can be used as the circuits 310_1 and 310_2 and the circuit 320. Note that this embodiment is not limited thereto, and a variety of circuits can be used as the circuits 310_1 and 310_2 and the circuit 320.

Next, connection relation of lire circuit 300 in FIG. 15A is described. A first terminal of the transistor 301_1 is connected to the wiring 117 and a second terminal of the transistor 301_1 is connected to the node n1. A first terminal of the transistor 301_2 is connected to the wiring 117 and a second terminal of the transistor 301_2 is connected to the node n2. A first terminal of the transistor 302 is connected to the wiring 117 and a second terminal of the transistor 302 is connected to the wiring 111. A first terminal of the transistor 303_1 is connected to the wiring 117, a second terminal of the transistor 303_1 is connected to the node n1, and a gate of the transistor 303_1 is connected to the wiring 116. A first terminal of the transistor 303_2 is connected to the wiring 117, a second terminal of the transistor 303_2 is connected to the node n2, and a gale of the transistor 303_2 is connected to die wiring 116. A first terminal of the transistor 304 is connected to the wiring 117, a second terminal of the transistor 304 is connected to the wiring 111, and a gate of the transistor 304 is connected to the wiring 116. The circuit 310_1 is connected to the wiring 113, the node n1, the wiring 117, and a gate of the transistor 301_1. The circuit 310J2 is connected to the wiring 113, the node n2, the wiring 117, and a gale of the transistor 301_2. The circuit 320 is connected to the wiring 113, the wiring 111, the wiring 117, and a gate of the transistor 302.

Next, functions of the circuits 310_1 and 310_2 and the circuit 320 are described. The circuit 310_1 has a function of controlling a conduction state of the transistor 301_1 by controlling the potential of the gate of the transistor 301_1 in accordance with the potential of the node n1 and can function as a control circuit. The circuit 310_2 has a function of controlling a conduction state of die transistor 301_2 by controlling the potential of the gate of the transistor 301_2 in accordance with the potential of the node n2 and can function as a control circuit. The circuit 320 has a function of controlling a conduction state of the transistor 302 by controlling the potential of the gate of the transistor 302 in accordance with the potential of the wiring 111 and can function as a control circuit. Note that this embodiment is not limited thereto, and the circuits 310_1 and 310_2 and the circuit 320 can have a variety of other functions.

Next, functions of the transistors 301_1 and 301_2, the transistor 302, the transistors 303_1 and 303_2, and the transistor 304 are described. The transistor 301_1 has a function of controlling a timing when the voltage V1 is supplied to the node n1 by controlling a state of electrical continuity of the wiring 117 and the node n1 in accordance with an output signal of the circuit 310_1 and can function as a switch. The transistor 301_2 has a function of controlling a timing when the voltage V1 is supplied to the node n2 by controlling a slate of electrical continuity of the wiring 117 and the node n2 in accordance with an output signal of the circuit 310_2 and can function as a switch. The transistor 302 has a function of controlling a timing when the voltage V1 is supplied to the wiring 111 by controlling a state of electrical continuity of the wiring 117 and the wiring 111 in accordance with an output signal of the circuit 320 and can function as a switch. The transistor 303_1 has a function of controlling a timing when the voltage V1 is supplied to the node n1 by controlling a state of electrical continuity of the wiring 117 and the node n1 in accordance with tire signal RE and can function as a switch. The transistor 303_2 has a function of controlling a timing when the voltage V1 is supplied to the node n2 by controlling a state of electrical continuity of the wiring 117 and the node n2 in accordance with the signal RE and can function as a switch. The transistor 304 has a function of controlling a timing when the voltage V1 is supplied to the wiring 111 by controlling a state of electrical continuity of the wiring 117 and the wiring 111 in accordance with the signal RE and can function as a switch. However, this embodiment is not limited to this example. The transistors 301_1 and 301_2, the transistor 302, the transistors 303_1 and 303_2, and the transistor 304 can have a variety of functions other than the above.

Next, an example of operation of the circuit 300 in FIG. 15A is described. Note that the operation of a semiconductor device in FIG. 13A has a part in common with that of the semiconductor device in FIG. 4A. Therefore, the operation of the semiconductor device in FIG. 15A is described with reference to the timing change in FIG. 4C Note that description of operation which is the same as that of the semiconductor device in Embodiment 1 and Embodiment 2 is omitted.

Figure 16A:
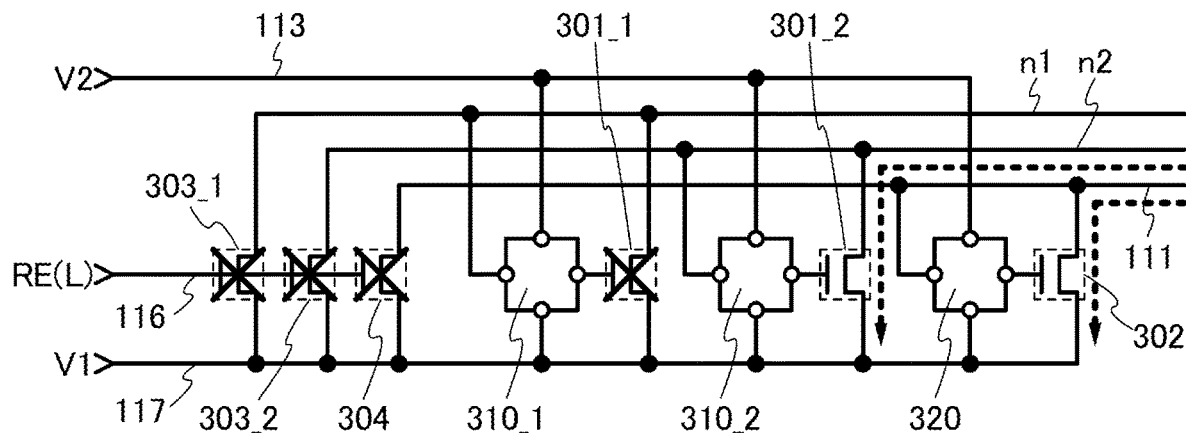
FIGS. 16A to 16C are examples of a schematic view for illustrating operation of a semiconductor device in Embodiment 3.

First, in the period A1, since the signal RE is in the L level, the transistors 303_1 and 303_2, and the transistor 304 are off as shown in FIG. 16A. An output signal from the circuit 310_1 is in the L level because the potential of the node n1 becomes equal to (V2+Vth101_1+Vx), for example. Accordingly, the transistor 301_1 is off. The output signal from the circuit 310_2 is in the H level because the potential of the node n2 is approximate V1. Accordingly, the transistor 301_2 is on. The output signal from the circuit 320 is in the H level because the potential of the wiring 111 is approximate V1. Thus, the transistor 302 is on. As a result, the wiring 117 and the node n1 are brought out of electrical continuity, the wiring 117 and the node n2 are brought into electrical continuity through the transistor 301_2, and the wiring 117 and the wiring 111 are brought into electrical continuity through the transistor 302. Accordingly, the voltage V1 is supplied from the wiring 117 to the node n2 through the transistor 301_2. The voltage V1 is supplied from the wiring 117 to the wiring 111 through the transistor 302.

Figure 16B:
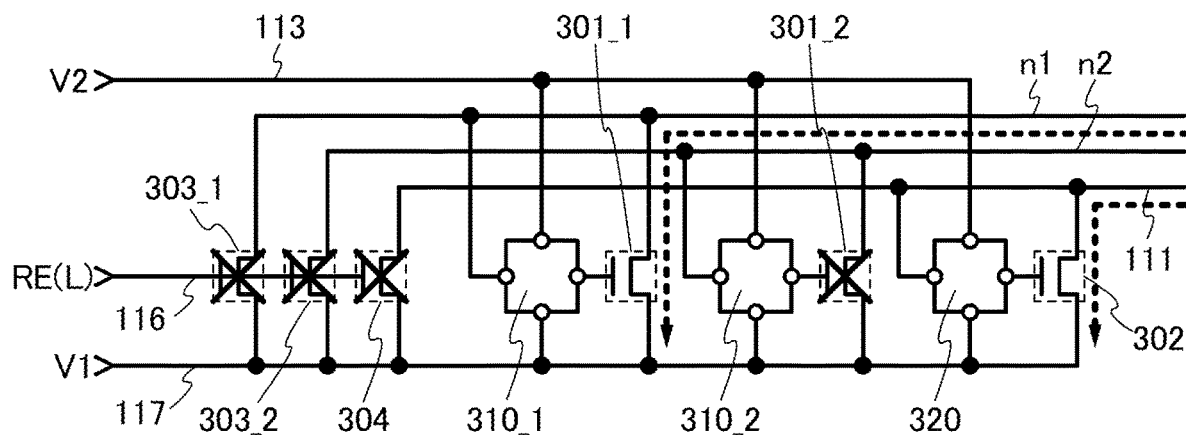

On the other hand, as shown in FIG. 16B, the period A2 is different from the period A1 in that the output signal from the circuit 310_1 is in the H level because the potential of the node n1 is approximate V1 and the output signal from the circuit 310_2 is in the L level because the potential of the node n2 is equal to (V2+Vth101_2+Vx), for example. Accordingly, the transistor 301_1 is on and the transistor 301_2 is off. As a result, the wiring 117 and the node n1 are brought into electrical continuity through the transistor 301_1 and the wiring 117 and the node n2 are brought out of electrical continuity. Accordingly, live voltage V1 is supplied to the node n1 through the wiring 117.

Figure 16C:
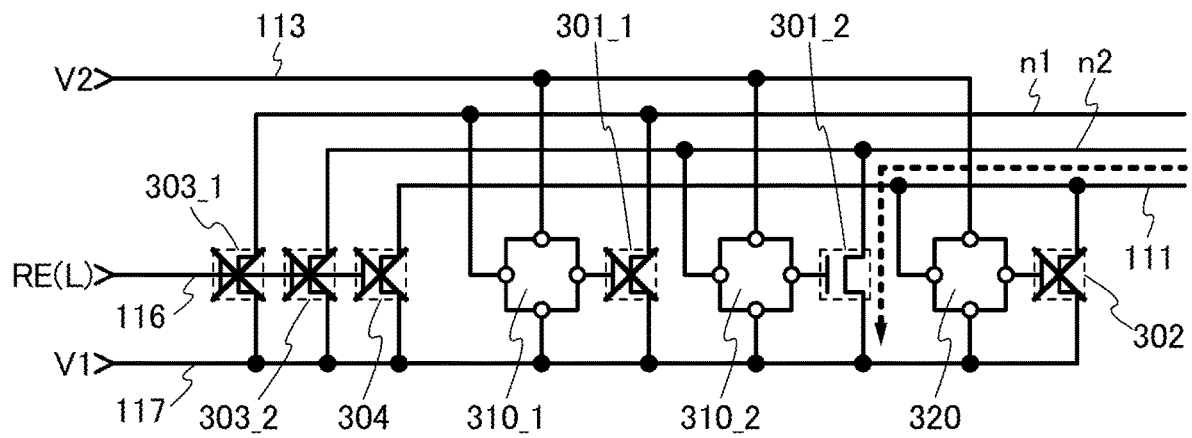

Then, in the period B1, since the signal RE remains at the L level, the transistors 303_1 and 303_2, and the transistor 304 are kept off as shown in FIG. 16C. An output signal from the circuit 310_1 remains at the L level because the potential of the node n1 remains as (V2+Vth101_1+Vx), for example. Accordingly, the transistor 301_1 is kept off. The output signal from the circuit 310_2 remains at the H level because the potential of the node n2 remains at approximate V1. Accordingly, the transistor 301_2 is kept on. The output signal from the circuit 320 goes into the L level because the potential of the wiring 111 is approximate V2. Thus, the transistor 302 is off. As a result, the wiring 117 and the node n1 are kept out of electrical continuity, the wiring 117 and the node n2 are kept in electrical continuity through the transistor 301_2, and the wiring 117 and the wiring 111 are brought out of electrical continuity. Accordingly, the voltage V1 is supplied from the wiring 117 to the node n2 through the transistor 301_2.

Figure 17A:
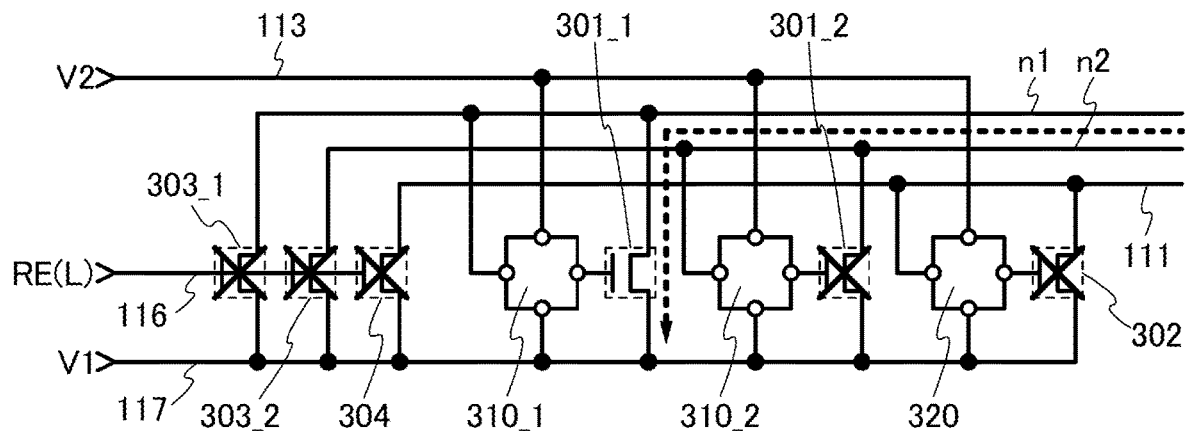
FIGS. 17A to 17C are examples of a schematic view for illustrating operation of a semiconductor device in Embodiment 3.

On the other hand, as shown in FIG. 17A, the period B2 is different from the period B1 in that the output signal from the circuit 310_1 remains at the L level because the potential of the node n1 remains at approximate V1 and the output signal from the circuit 310_2 remains at the L level because the potential of the node n2 remains as approximate (V2+Vth101_2+Vx), for example. Accordingly, the transistor 301_1 is kept on and the transistor 301_2 is kept off. As a result, the wiring 117 and the node n1 are kept in electrical continuity through the transistor 301_1 and the wiring 117 and the node n2 are kept out of electrical continuity. Accordingly, the voltage V1 is supplied to the node n1 through the wiring 117.

Figure 17B:
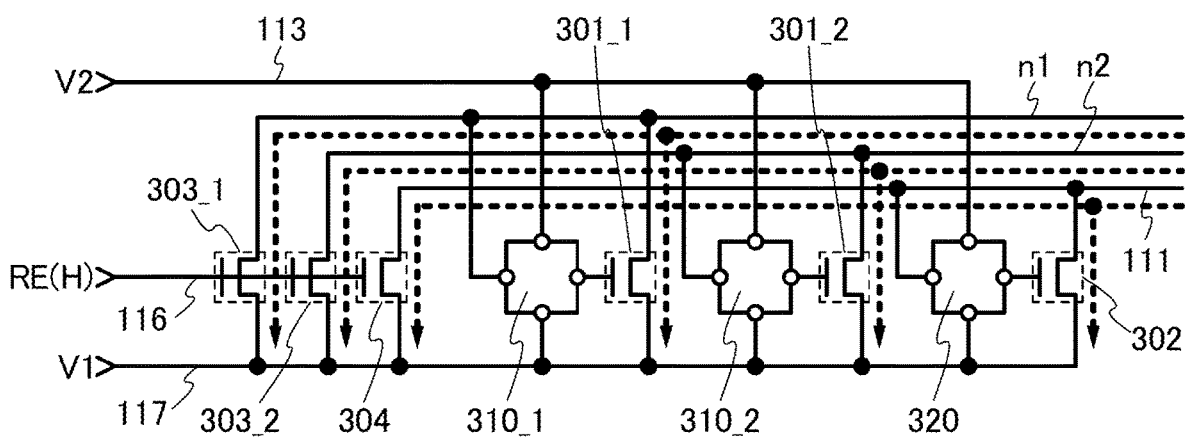

Next, in the periods C1 and C2, since the signal RE is in the H level, the transistors 303_1 and 303_2, and the transistor 304 are on as shown in FIG. 17B. An output signal from the circuit 310_1 is in the H level because the potential of the node n1 is approximate V1. Accordingly, the transistor 301_1 is on. The output signal from the circuit 310_2 is in the H level because the potential of the node n2 is approximate V1. Accordingly, the transistor 301_2 is on. The output signal from the circuit 320 is in the H level because the potential of the wiring 111 is approximate V1. Thus, the transistor 302 is on. As a result, the wiring 117 and the node n1 are brought into electrical continuity through the transistors 301_1 and 303_1, the wiring 117 and the node n2 are brought into electrical continuity through the transistors 301_2 and 303 and the wiring 117 and the wiring 111 are brought into electrical continuity through the transistor 302 and the transistor 304. Accordingly, the voltage V1 is supplied from the wiring 117 to the node n1 through the transistor 301_1 and the transistor 303_1. The voltage V1 is supplied from the wiring 117 to the node n2 through the transistor 301_2 and the transistor 303_2. The voltage V1 is supplied from the wiring 117 to the wiring 111 through the transistor 302 and the transistor 304.

Figure 17C:
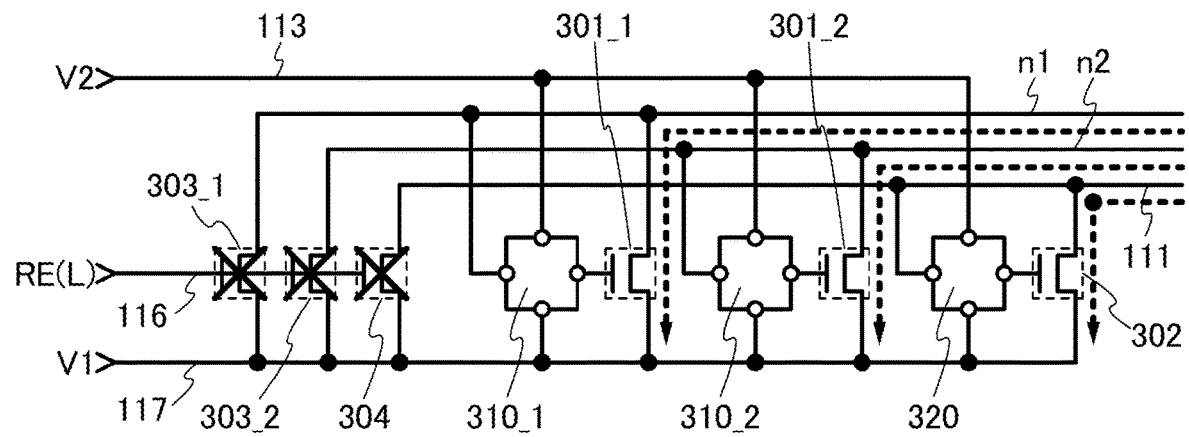

Next, in the period D1, the period D2, the period E1, and the period E2, since the signal RE is in the L level, the transistors 303_1 and 303_2, and the transistor 304 are off as shown in FIG. 17C. An output signal from the circuit 310_1 remains at the H level because the potential of the node n_1 remains at approximate V1. Accordingly, the transistor 301_1 is kept on. The output signal from the circuit 310_2 remains at the H level because the potential of the node n2 remains at approximate V1. Accordingly, the transistor 301_2 is kept on. The output signal from the circuit 320 remains at the H level because the potential of live wiring M1 remains at approximate V1. Thus, the transistor 302 is kept on. As a result, the wiring 117 and the node n1 are kept in electrical continuity through the transistor 301_1, the wiring 117 and the node n2 are kept in electrical continuity through the transistor 301_2, and the wiring 117 and the wiring 111 are kept in electrical continuity through the transistor 302. Accordingly, the voltage V1 is supplied from the wiring 117 to the node n1 through the transistor 301_1. The voltage V1 is supplied from the wiring 117 to the node n2 through the transistor 301_2. The voltage V1 is supplied from the wiring 117 to the wiring 111 through the transistor 302.

Note that since functions of the transistors 301_1 and 301_2 are similar to each other, it is preferable that the channel widths of the transistors 301_1 and 301_2 be approximately the same. Similarly, since functions of the transistors 303_1 and 303_2 are similar to each other, it is preferable that the channel widths of the transistors 303_1 and 303_2 be approximately the same. However, this embodiment is not limited to this example. The transistors 301_1 and 301_2 can have channel widths different from each other. In addition, the transistors 303_1 and 303_2 can have channel widths different from each other.

Note that the transistors 301_1 and 301_2 have functions of controlling a timing when the voltage V1 is supplied to the nodes n1 and n2, and the transistor 302 has a function of controlling a liming when live voltage V1 is supplied to the wiring 111. Since the load of each of the node n1 and the node n2 is lower than the load of the wiring 111 in many cases, the channel width of each of the transistors 301_1 and 301_2 is preferably smaller than that of the transistor 302. From a similar reason, the channel width of each of the transistors 303_1 and 303_2 is preferably smaller than that of the transistor 304. However, this embodiment is not limited to this example. The channel width of each of the transistor 301_1 and 301_2 can be larger than or approximately the same as that of the transistor 302. In addition, the channel width of each of the transistors 303_1 and 303_2 can be larger than or approximately the same as that of the transistor 304.

Figure 18A:
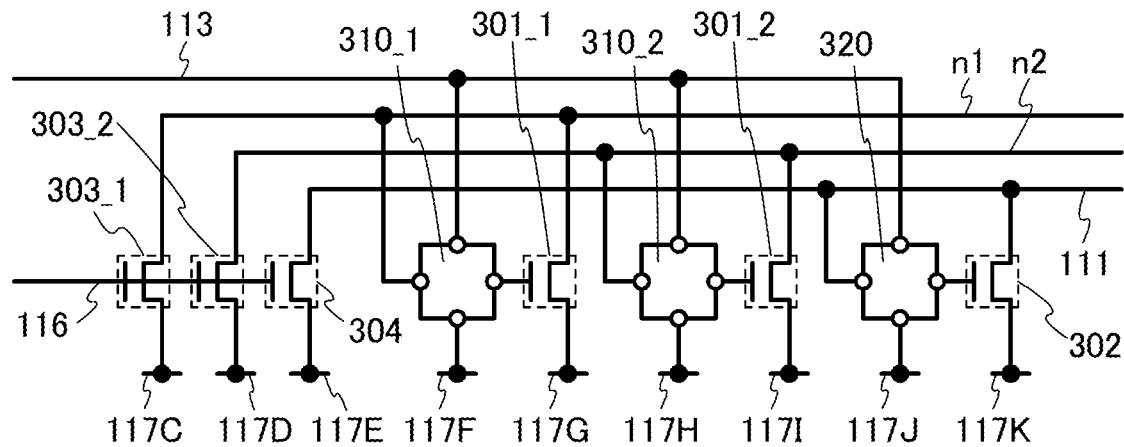
FIGS. 18A to 18C are examples of a circuit diagram of a semiconductor device in Embodiment 3.

Note that as shown in FIG. 18A, the wiring 117 can be divided into a plurality of wirings of wirings 117C to 117K as in Embodiments 1 and 2. The wiring 117C, the wiring 117D, the wiring 117E, the wiring 117F, the wiring 117G, the wiring 117H, the wiring 117I, the wiring 117J, and the wiring 117K can be connected to the first terminal of the transistor 303_1, the first terminal of the transistor 303_2, the first terminal of the transistor 304, the circuit 310_1, the first terminal of the transistor 301_1, the circuit 310_2, the first terminal of the transistor 301_2, the circuit 320, and the first terminal of the transistor 302, respectively. The wirings 117C to 117K can be connected to a variety of wirings such as the wiring 111, the wiring 112, the wiring 113, the wiring 114, the wirings 115_1 and 115_2, the wiring 116, the wiring 118, and the wiring 211 or a variety of nodes such as the node n1 and the node n2. However, this embodiment is not limited to this example. The wiring 113 can be divided into a plurality of wirings in a similar manner.

Figure 18B:
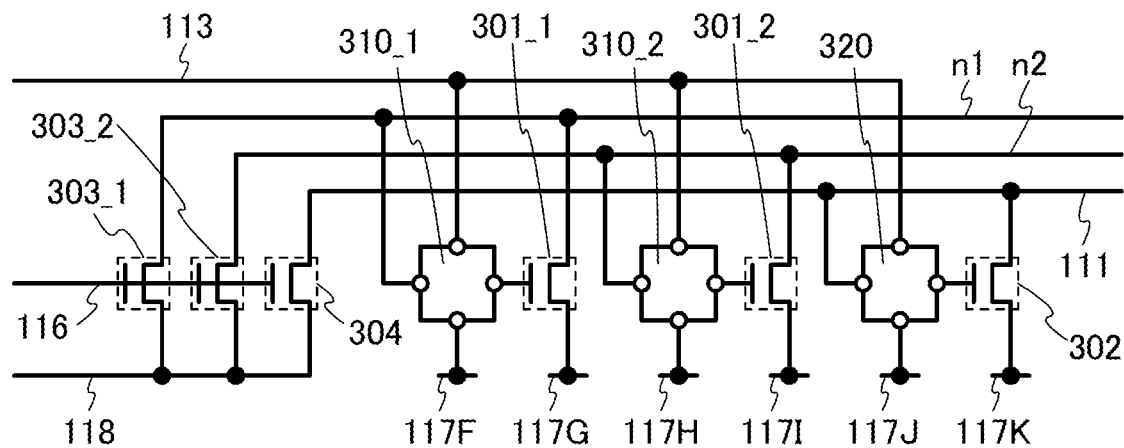

Note that as shown in FIG. 18B, the first terminal of the transistor 303_1, the first terminal of the transistor 303_2, and the first terminal of the transistor 304 can be connected to the wiring 118.

Figure 18C:
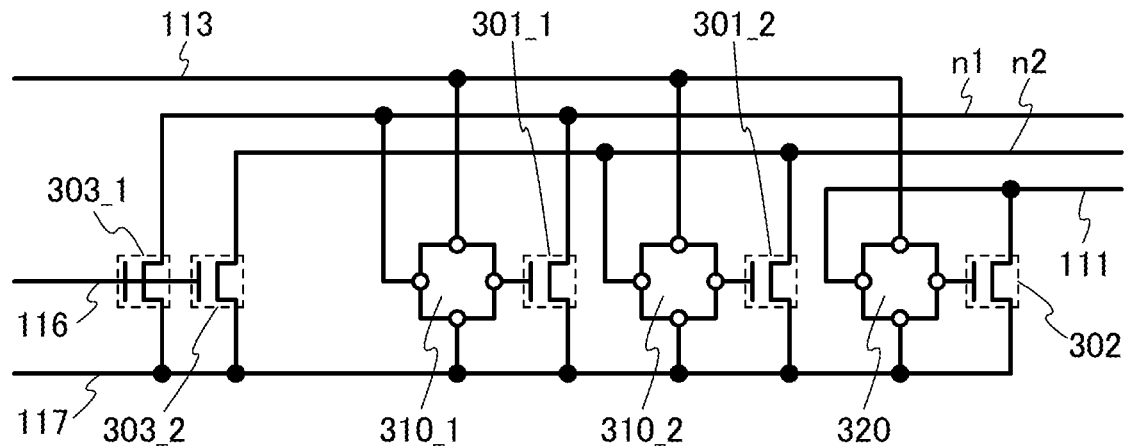

Note that as shown in FIG. 18C, the transistor 304 can be eliminated. However, this embodiment is not limited to this example. The transistor 303_1 and/or the transistor 303_2 can be eliminated.

Figure 19A:
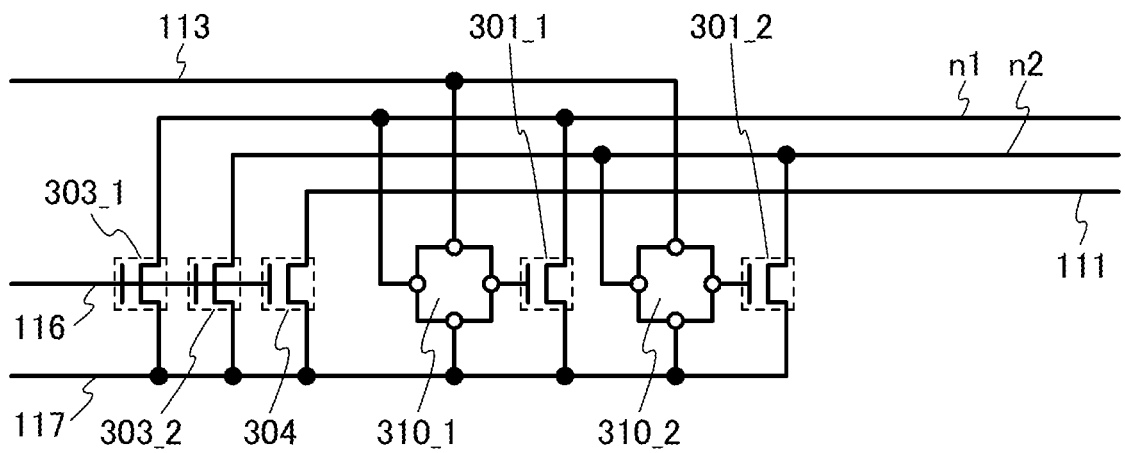
FIGS. 19A to 19O are examples of a circuit diagram of a semiconductor device in Embodiment 3.
Figure 19B:
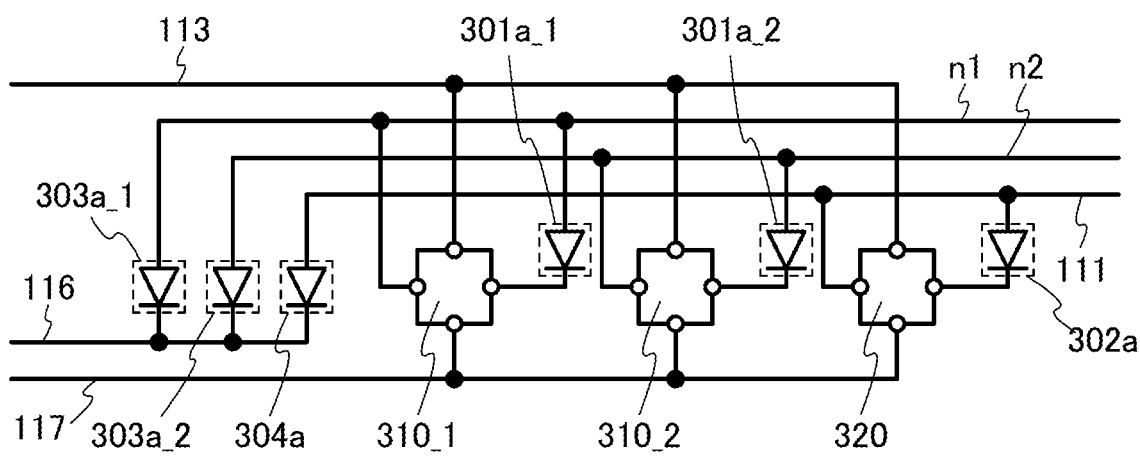
Figure 19C:
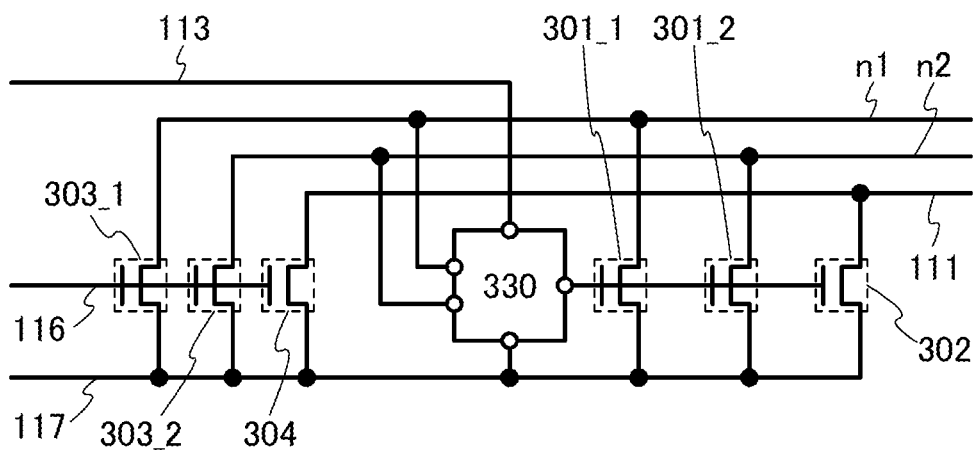

Note that like in FIG. 19C, the transistor 303_1, the transistor 303_2, and/or the transistor 304 can be eliminated in FIGS. 18A and 18B.

Note that as shown in FIG. 19A, the circuit 320 and the transistor 302 can be eliminated. However, this embodiment is not limited to tins example. The circuit 310_1 and the transistor 301_1 can be eliminated or the circuit 310_1 and the transistor 301_2 can be eliminated.

Note that as in FIG. 19A, the circuit 310_1 and the transistor 301_1 can be eliminated, the circuit 310_1 and the transistor 301_2 can be eliminated, or the circuit 320 and the transistor 302 can be eliminated in FIGS. 18A to 18C.

Note that as shown in FIG. 19B, the transistor 301_1 can be replaced with a diode 301a_1 one terminal (also referred to as an anode) of which is connected to the node n1 and the oilier terminal (also referred to as a cathode) of which is connected to an output terminal of the circuit 310_1. In addition, the transistor 301_2 can be replaced with a diode 301a_2 one terminal (also referred to as an anode) of which is connected to the node n2 and the other terminal (also referred to as a cathode) of which is connected to an output terminal of the circuit 310_2. In addition, the transistor 302 can be replaced with a diode 302a one terminal (also referred to as an anode) of which is connected to the wiring 111 and lire other terminal (also referred to as a cathode) of which is connected to an output terminal of the circuit 320. In addition, the transistor 303_1 can be replaced with a diode 303a_1 one terminal (also referred to as an anode) of which is connected to the node n1 and the other terminal (also referred to as a cathode) of which is connected to the wiring 116. In addition, the transistor 303_2 can be replaced with a diode 303a_2 one terminal (also referred to as an anode) of which is connected to the node n2 and the other terminal (also referred to as a cathode) of which is connected to the wiring 116. In addition, the transistor 304 can be replaced with a diode 304a one terminal (also referred to as an anode) of which is connected to the wiring 111 and the other terminal (also referred to as a cathode) of which is connected to the wiring 116. However, this embodiment is not limited to this example. By connecting gates of transistors to respective second terminals of the transistors, the transistors can be diode-connected. Alternatively, the transistors can be diode-connected by connecting the gates of the transistor to the respective first terminals of the transistors.

Note that as in FIG. 19B, the transistor 301_1, the transistor 301_2, the transistor 302, the transistor 303_1, the transistor 303_2, and/or the transistor 304 can be replaced with a diode in FIGS. 18A to 18C and FIG. 19A. Alternatively, these transistors can be diode-connected.

Note that as shown in FIG. 19C, the transistors 301_1 and 301_2 and the transistor 302 can share a circuit for controlling a conduction state of each of the transistors 301_1 and 301_2 and the transistor 302. A circuit 330 has a function of controlling a conduction slate of each of the transistors 301_1 and 301_2 and the transistor 302 by controlling the potential of the gate of each of the transistors 301_1 and 301_2 and the transistor 302 in accordance with the potential of the node n1 or n2 and can function as a control circuit. In the period A1, the period A2, the period B1, and the period B2 show n in FIG. 4C, since the potential of the node n1 or the node n2 is higher than V1, an output signal from the circuit 330 is in the L level. Accordingly, the transistors 301_1 and 301_2 and the transistor 302 are off. In the period C1, the period C2, the period D1, the period D2, the period E1, and the period E2, since the potential of the node n1 or the node n2 is approximate V1, an output signal from the circuit 330 is in the H level. Accordingly, the transistors 301_1 and 301_2 and the transistor 302 are on.

Note that as in FIG. 10C, the transistors 301_1 and 301_2 and the transistor 302 can share a circuit for controlling a conduction state of each of the transistors 301_1 and 301_1 and the transistor 302 in FIGS. 18A to 18C and FIGS. 19A and 19B.

Note that as shown in FIG. 20A, in the case where the circuit 100 includes the plurality of transistors of the transistors 101_1 to 101_N as in FIG. 10C, the circuit 300 can include a plurality of transistors of transistors 301_1 to 301_1, a plurality of transistors of transistors 303_1 to 303_N, and a plurality of circuits of circuits 310_1 to 310_N. The transistors 301_1 to 301_N correspond to the transistor 301_1 or the transistor 301_2 and have functions similar to that of the transistor 301_1 or the transistor 301_2. The transistors 303_1 to 303_N correspond to the transistor 303_1 or the transistor 303_2 and have functions similar to that of the transistor 303_1 or the transistor 303_2. The circuits 310_1 to 310_N corresponds to and have functions similar to that of the circuit 310_1 or the circuit 310_2. First terminals of the transistors 301_1 to 301_1 are connected to the wiring 117. Second terminals of the transistors 301_1 to 301_N are connected to the nodes n1 to nN, respectively. Gates of the transistors 301_1 to 301_N are connected to respective output terminals of the circuits 310_1 to 310_N. First terminals of the transistors 303_1 to 303_N are connected to the wiring 117. Second terminals of the transistors 303_1 to 303_N are connected to the nodes n1 to nN, respectively. Gates of the transistors 303_1 to 303_N are connected to the wirings 116.

Note that as in FIG. 20A, the circuit 300 can include the plurality of transistors of the transistors 301_1 to 301_N, the plurality of transistors of the transistors 303_1 to 303_N, and/or the plurality of circuits of the circuits 310_1 to 310_N in FIGS. 18A to 18C and FIGS. 19A to 19C.

Note that in the case where the semiconductor device includes the circuit 120 as in FIG. 8F, the circuit 300 can includes a transistor 342 and a transistor 344 as shown in FIG. 20B. The transistor 342 corresponds to the transistor 302 and has a function similar to that of the transistor 302. The transistor 344 corresponds to the transistor 304 and has a function similar to that of the transistor 304. A first terminal of the transistor 342 is connected to the wiring 117, a second terminal of the transistor 342 is connected to the wiring 211, and a gate of the transistor 342 is connected to the gate of the transistor 302. A first terminal of the transistor 344 is connected to the wiring 117, a second terminal of the transistor 344 is connected to the wiring 211, and a gate of the transistor 344 is connected to the wiring 116.

Note that as in FIG. 20B, the circuit 300 can include the transistor 342 and or the transistor 344 in FIGS. 18A to 18C, FIGS. 19A to 10C, and FIG. 20A.

Figure 21:
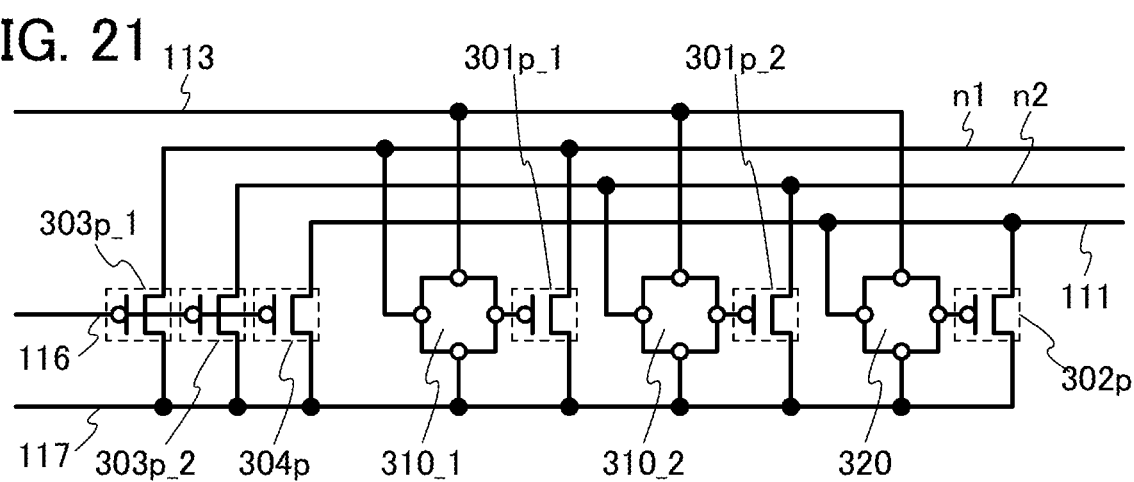
FIG. 21 is an example of a circuit diagram of a semiconductor device in Embodiment 3.

Note that as shown in FIG. 21, p-channel transistors can be used as the transistors 301_1 and 301_2, the transistor 302, the transistors 303_1 and 303_2, and the transistor 304. Transistors 301p_1 and 301p_2, a transistor 302p, a transistors 301p_1 and 303p_2, and a transistor 304p correspond to the transistors 301_1 and 301_2, the transistor 302, the transistors 303_1 and 303_2, and the transistor 304, respectively, and are p-channel transistors. Note that in the case where the transistors are p-channel transistors, the voltage V1 is supplied to the wiring 113, the voltage V2 is supplied to the wiring 117, an output signal from the circuit 310_1, an output signal from the circuit 310_2, an output signal from the circuit 320, the potential of the node n1, the potential of the node n2, and the signal OUT are inverted as compared to the case where the transistors are n-channel transistors.

Note that as in FIG. 21, p-channel transistors can be used as the transistors in FIG. 18A to 18C. FIGS. 19A to 19C, and FIGS. 20A and 20B.

Next, specific examples of the circuits 310_1 and 310_2 and the circuit 320 are described.

Figure 22A:
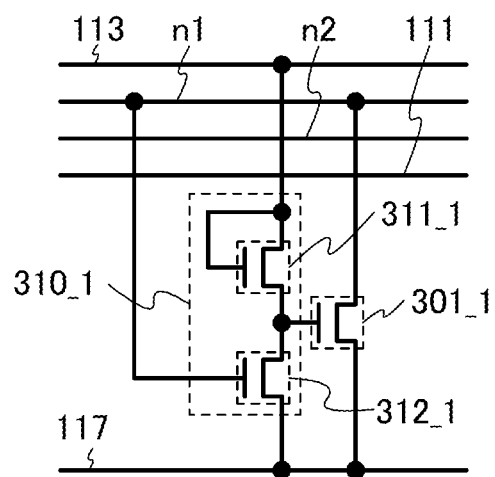
FIGS. 22A to 22D are examples of circuit diagrams of a semiconductor device in Embodiment 3.

First, FIG. 22A shows an example of the circuit 310_1. The circuit 310_1 includes a transistor 311_1 and a transistor 312_1. A first terminal of the transistor 311_1 is connected to the wiring 113, a second terminal of the transistor 311_1 is connected to the gate of the transistor 301_1, and a gate of the transistor 311_1 is connected to the wiring 113. A first terminal of the transistor 312_1 is connected to the wiring 117, a second terminal of the transistor 312_1 is connected to the gate of the transistor 301_1, and a gate of the transistor 312_1 is connected to the node n1. The transistor 301_1, and the transistor 312_1 are n-channel transistors. However, this embodiment is not limited to this example. The transistor 311_1 and/or the transistor 312_1 can be p-channel transistors. The transistor 311_1 has a function of increasing the potential of the gate of the transistor 301_1 in the case where the potential of the gate of the transistor 301_1 becomes equal to approximate V1 and can function as a diode. The transistor 312_1 has a function of controlling a timing when die voltage V1 is supplied to die gate of the transistor 301_1 by controlling a state of electrical continuity of the wiring 117 and die transistor 301_1 in accordance with the potential of the node n1 and can function as a switch.

Operation of the circuit 310_1 in FIG. 22A is described. In the period A1 and the period B1, since the potential of the node n1 has larger value than the threshold voltage of the transistor 312_1, the transistor 312_1 is on. Therefore, by setting the channel width of the transistor 312_1 larger than that of the transistor 311_1, the potential of the gate of the transistor 301_1 is approximate V1. For example. The value of the potential of the gate of the transistor 301_1 is smaller than the sum of the potential of the wiring 117 (V1) and the threshold voltage of the transistor 301_1 (Vth301_1). In the period A2, the period B2, the period C1, the period C2, the period D1, the period D2, the period E1, and the period E2, since the potential of the node n1 is approximate V1, the transistor 312_1 is off. Therefore, the value of the potential of the gate of the transistor 301_1 is equal to the value obtained by subtracting the threshold voltage of the transistor 311_1 (Vth311_1) from the potential of the wiring 113 (V2), (V2−Vth311_1).

Note that the channel width of the transistor 312_1 is preferably two or more times as large as the channel width of the transistor 311_1. It is more preferable that the channel width of the transistor 312_1 be four or more times as large as the channel width of the transistor 311_1. It is further preferable that the channel width of the transistor 312_1 be eight or more times as large as the channel width of the transistor 311_1. However, this embodiment is not limited to this example.

Note that the gate and the first terminal of the transistor 311_1 can be connected to a variety of wirings. For example, the gate and the first terminal of the transistor 311_1 can be connected to the wiring 112 or the wiring 118. However, this embodiment is not limited to this example.

Note that the first terminal of the transistor 312_1 can be connected to a variety of wirings. For example, the first terminal of the transistor 312_1 can be connected to the wiring 115_2. However, this embodiment is not limited to this example.

Figure 22B:
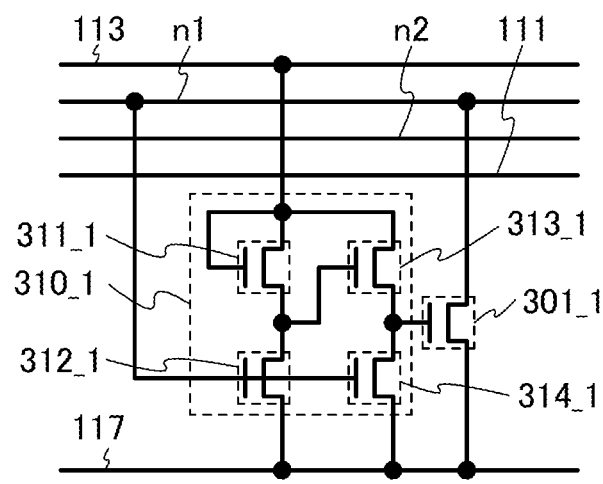

Note that as shown in FIG. 22B, the circuit 310_1 can include a transistor 313_1 and a transistor 314_1 in addition to the transistor 311_1 and the transistor 312_1. A first terminal of the transistor 313_1 is connected to the wiring 113, a second terminal of the transistor 313_1 is connected to the gate of the transistor 301_1, and a gate of the transistor 313_1 is connected to the second terminal of the transistor 311_1 and the second terminal of the transistor 312_1. The transistor 311_1 and the transistor 312_1 are n-channel transistors. However, this embodiment is not limited to this example. The transistor 311_1 and or the transistor 312_1 can be p-channel transistors. The transistor 313_1 has a function of controlling a timing when a voltage supplied to the wiring 113 is supplied to the transistor 301_1 and can function as a bootstrap transistor or a switch. A first terminal of the transistor 314_1 is connected to the wiring 117, a second terminal of the transistor 314_1 is connected to the second terminal of the transistor 313_1, and a gate of the transistor 314_1 is connected to the node n1. The transistor 314_1 has a function of controlling a timing when the voltage V1 is supplied to the gate of the transistor 301_1 by controlling a state of electrical continuity of the wiring 117 and the transistor 301_1 in accordance with the potential of the node n1 and can function as a switch.

Note that the first terminal of the transistor 313_1 can be connected to a variety of wirings. For example, the First terminal of the transistor 313_1 can be connected to the wiring 112 or the wiring 118. However, this embodiment is not limited to this example.

Note that the first terminal of the transistor 314_1 can be connected to a variety of wirings. For example, the first terminal of the transistor 314_1 can be connected to the wiring 115_2. However, this embodiment is not limited to this example.

Figure 22C:
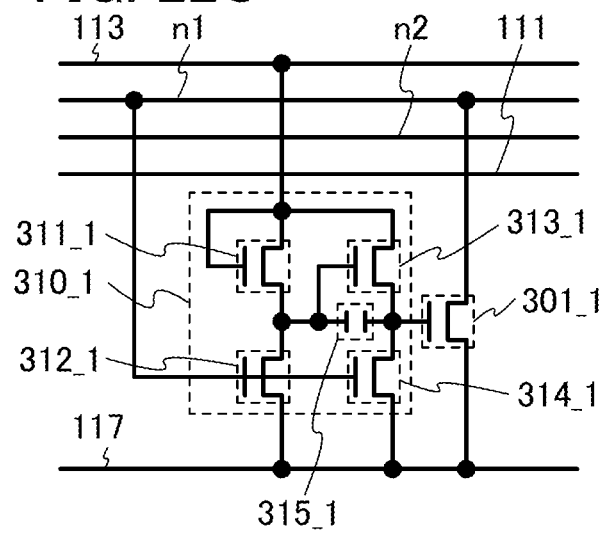

Note that in FIG. 22B, a capacitor 315_1 can be connected between the gate and the second terminal of the transistor 313_1 as shown in FIG. 22C.

Figure 22D:
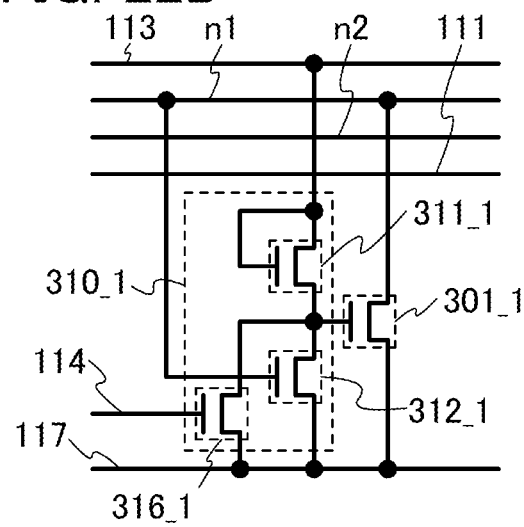

Note that as shown in FIG. 22D, the circuit 300 can include a transistor 316_1. A first terminal of the transistor 316_1 is connected to the wiring 117, a second terminal of the transistor 316_1 is connected to the gate of the transistor 301_1, and a gate of the transistor 316_1 is connected to the wiring 114. The transistor 316_1 is an n-channel transistor. However, this embodiment is not limited to this example. The transistor 316_1 can be a p-channel transistor. The transistor 316_1 has a function of controlling a timing when the voltage V1 is supplied to the transistor 301_1 by controlling a state of electrical continuity of the wiring 117 and the gate of the transistor 301_1 in accordance with the signal SP.

Note that as in FIG. 22D, the transistor 316_1 whose first terminal is connected to the wiring 117, second terminal is connected to the gate of the transistor 301_1, and gale is connected to the wiring 114 can be additionally provided in FIGS. 22B and 22C.

Figure 23A:
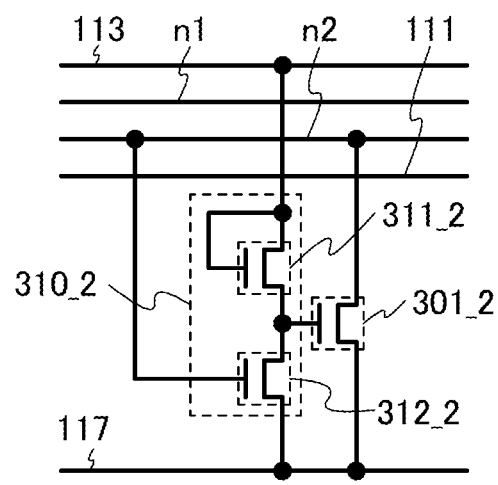
FIGS. 23A to 23D are examples of a circuit diagram of a semiconductor device in Embodiment 3.

Next, FIG. 23A shows an example of the circuit 310_2. The circuit 310_2 includes a transistor 311_2 and a transistor 312_2. A first terminal of the transistor 311_2 is connected to the wiring 113, a second terminal of the transistor 311_2 is connected to the gate of the transistor 301_2, and a gate of the transistor 311_2 is connected to the wiring 113. A first terminal of the transistor 312_2 is connected to the wiring 117, a second terminal of the transistor 312_2 is connected to the gate of the transistor 301_2, and a gale of the transistor 312_2 is connected to the node n2. The transistor 311_2 and the transistor 312_2 are n-channel transistors. However, this embodiment is not limited to this example. The transistor 311_2 and/or the transistor 312_2 can be p-channel transistors. The transistor 311_2 has a function of increasing the potential of the gate of the transistor 301_2 when the potential of the gate of the transistor 301_2 is approximate V1 and can function as a diode. The transistor 312_2 has a function of controlling a timing when the voltage V1 is supplied to the gate of the transistor 301_2 by controlling a state of electrical continuity of the wiring 111 and the transistor 301_2 in accordance with the potential of the node n2 and can function as a switch.

Operation of the circuit 310_2 in FIG. 23A is described. In the period A1 and the period B1, since the potential of the node n2 has larger value than the threshold voltage of the transistor 312_2, the transistor 312_2 is on. Therefore, by setting the channel width of the transistor 312_2 larger than that of the transistor 311_2, the potential of the gate of the transistor 301_2 is approximate V1. For example, the value of the potential of the gate of the transistor 301_2 is smaller than the sum of the potential of the wiring 117 (V1) and the threshold voltage of the transistor 301_2 (Vth301_2). In the period A2, the period B2, the period C1, the period C2, the period D1, the period D2, the period E1, and the period E2, since the potential of the node n2 is approximate V1, the transistor 312_2 is off. Therefore, the value of the potential of the gate of the transistor 301_2 is equal to the value obtained by subtracting the threshold voltage of the transistor 311_2 (Vth311_2) from the potential of the wiring 113 (V2), (V2−Vth311_2).

Note that the channel width of the transistor 312_2 is preferably two or more times as large as the channel width of the transistor 311_2. It is more preferable that the channel width of the transistor 312_2 be four or more times as large as the channel width of the transistor 311_2. It is further preferable that the channel width of the transistor 312_2 be eight or more times as large as the channel width of the transistor 311_2. However, this embodiment is not limited to this example.

Note that the gate and tire first terminal of the transistor 311_2 can be connected to a variety of wirings. For example, the gate and the first terminal of the transistor 311_2 can be connected to the wiring 112 or the wiring 118. However, this embodiment is not limited to this example.

Note that tire first terminal of the transistor 312_2 can be connected to a variety of wirings. For example, the first terminal of the transistor 312_2 can be connected to the wiring 115_1. However, this embodiment is not limited to this example.

Figure 23B:
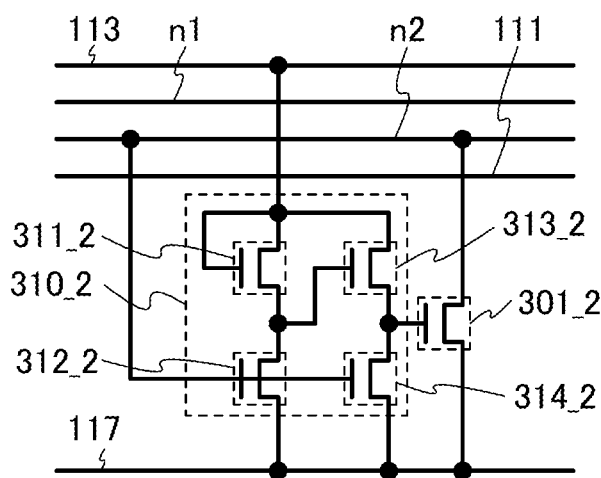

Note that as shown in FIG. 23B, the circuit 310_2 can include a transistor 313_2 and a transistor 314_2 in addition to the transistor 311_2 and the transistor 312_2. A first terminal of the transistor 313_2 is connected to the wiring 113, a second terminal of the transistor 313_2 is connected to the gate of the transistor 301_2, and a gate of the transistor 313_2 is connected to the second terminal of the transistor 311_2 and the second terminal of the transistor 312_2. The transistor 311_2 and the transistor 312_2 are n-channel transistors. However, this embodiment is not limited to this example. The transistor 311_2 and/or the transistor 312_2 can be p-channel transistors. The transistor 313_2 has a function of controlling a timing when a voltage supplied to the wiring 113 is supplied to the transistor 301_2 and can function as a bootstrap transistor or a switch. The transistor 314_2 has a function of controlling a timing when the voltage V1 is supplied to the gate of the transistor 301_2 by controlling a state of electrical continuity of the wiring 117 and the transistor 301_2 in accordance with the potential of the node n2 and can function as a switch.

Note that the first terminal of the transistor 313_2 can be connected to a variety of wirings. For example, the first terminal of the transistor 313_2 can be connected to the wiring 112 or the wiring 118. However, this embodiment is not limited to this example.

Note that the first terminal of the transistor 314_2 can be connected to a variety of wirings. For example, the first terminal of the transistor 314_2 can be connected to the wiring 115_1. However, this embodiment is not limited to this example.

Figure 23C:
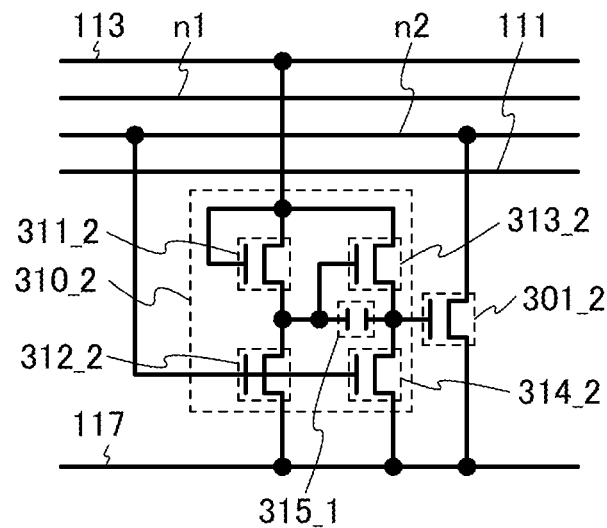

Note that in FIG. 23C, a capacitor 315_2 can be connected between the gate and the second terminal of the transistor 313_2 as shown in FIG. 23C.

Figure 23D:
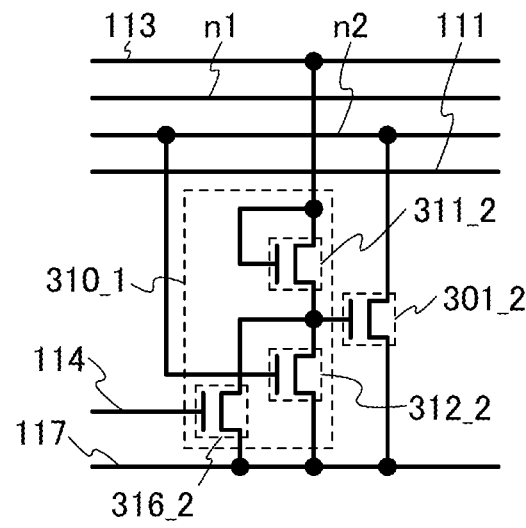

Note that as shown in FIG. 23D, the circuit 300 can include a transistor 316_2. A first terminal of the transistor 316_2 is connected to the wiring 117, a second terminal of the transistor 316_2 is connected to the gate of the transistor 301_2, and a gate of the transistor 316_2 is connected to the wiring 114. The transistor 316_2 is an n-channel transistor. However, this embodiment is not limited to this example. The transistor 316_2 can be a p-channel transistor. The transistor 316_2 has a function of controlling a timing when the voltage V1 is supplied to the transistor 301_2 by controlling a slate of electrical continuity of the wiring 111 and the gate of the transistor 301_2 in accordance with the signal SP.

Note that as in FIG. 23D, the transistor 316_2 whose first terminal is connected to the wiring 117, second terminal is connected to the gate of die transistor 301_2, and gate is connected to the wiring 114 can be additionally provided in FIGS. 23B and 23C.

Figure 24A:
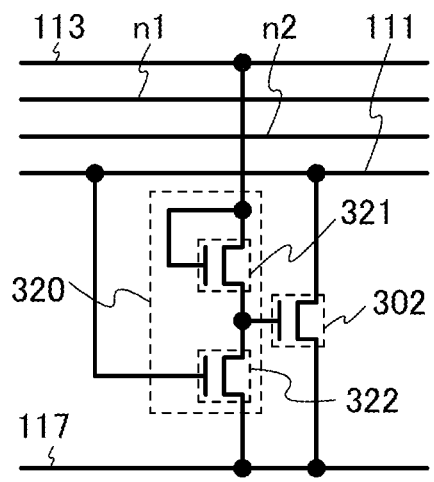
FIGS. 24A to 24D are examples of a circuit diagram of a semiconductor device in Embodiment 3.

Next, FIG. 24A shows an example of the circuit 320. The circuit 320 includes a transistor 321 and a transistor 322. A first terminal of the transistor 321 is connected to the wiring 113, a second terminal of the transistor 321 is connected to the gate of the transistor 302, and a gate of the transistor 321 is connected to the wiring 113. A first terminal of the transistor 322 is connected to the wiring 117, a second terminal of the transistor 322 is connected to the gale of the transistor 302, and a gate of the transistor 322 is connected to the wiring 111. The transistor 321 and the transistor 322 are n-channel transistors. However, this embodiment is not limited to this example. The transistor 321 and-or the transistor 322 can be p-channel transistors. The transistor 321 has a function of increasing the potential of the gate of the transistor 302 when the potential of the gate of the transistor 302 becomes equal to approximate V1 and can function as a diode. The transistor 322 has a function of controlling a timing when the voltage V1 is supplied to the gate of the transistor 302 by controlling a stale of electrical continuity of the wiring 117 and the transistor 302 in accordance with the potential of the wiring 111 and can function as a switch.

Operation of the circuit 320 in FIG. 24A is described. In the period B1 and the period B2 in FIG. 4C, since the potential of the wiring 111 has larger value than the threshold voltage of the transistor 322, the transistor 322 is on. Therefore, by setting the channel width of the transistor 322 larger than that of the transistor 321, the potential of the gate of the transistor 302 is approximate V1. For example, the value of the potential of the gate of the transistor 302 is smaller than the sum of the potential of the wiring 117 (V1) and the threshold voltage of the transistor 302 (Vth302). In the period A1, the period A2, the period C1, the period C2, the period D1, the period D2, the period E1, and the period E2, since the potential of the wiring 111 is approximate V1, the transistor 322 is off. Therefore, the value of the potential of the gate of the transistor 302 is equal to the value obtained by subtracting the threshold voltage of the transistor 321 (Vth321) from the potential of the wiring 113 (V2), (V2−Vth321).

Note that the channel width of the transistor 322 is preferably two or more times as large as the channel width of the transistor 321. It is more preferable that the channel width of the transistor 322 be four or more times as large as the channel width of the transistor 321. It is further preferable that the channel width of the transistor 322 be eight or more times as large as the channel width of the transistor 321. However, this embodiment is not limited to this example.

Note that the gate and the first terminal of the transistor 321 can be connected to a variety of wirings. For example, the gate and the first terminal of the transistor 321 can be connected to the wiring 112 or die wiring 118. However, this embodiment is not limited to this example.

Note that the first terminal of the transistor 322 can be connected to a variety of wirings. For example, the first terminal of the transistor 322 can be connected to the wiring 112. However, this embodiment is not limited to this example.

Figure 24B:
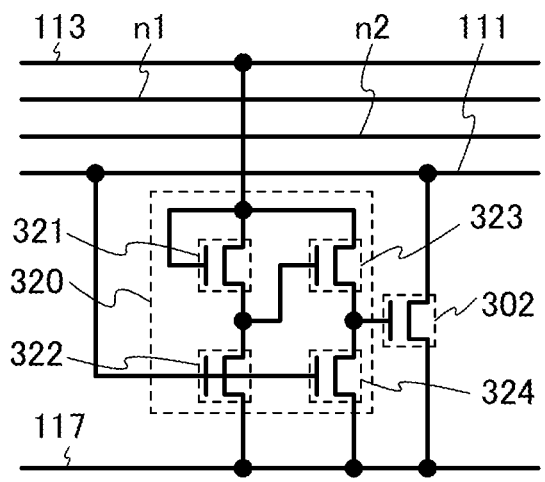

Note that as shown in FIG. 24B, the circuit 320 can include a transistor 323 and a transistor 324 in addition to the transistor 321 and the transistor 322. A first terminal of the transistor 323 is connected to the wiring 113, a second terminal of the transistor 323 is connected to the gate of the transistor 302, and a gate of the transistor 323 is connected to the second terminal of the transistor 321 and the second terminal of the transistor 322. A first terminal of the transistor 324 is connected to the second terminal of the transistor 323, a second terminal of the transistor 324 is connected to the wiring 117, and a gate of the transistor 324 is connected to the wiring 111. The transistor 323 and the transistor 324 are n-channel transistors. However, this embodiment is not limited to this example. The transistor 323 and or the transistor 324 can be p-channel transistors. The transistor 323 has a function of controlling a timing when a voltage supplied to the wiring 113 is supplied to the transistor 302 and can function as a bootstrap transistor or a switch. The transistor 324 has a function of controlling a timing when the voltage V1 is supplied to the gate of the transistor 302 by controlling a state of electrical continuity of the wiring 117 and the transistor 302 in accordance with the potential of tire wiring 111 and can function as a switch.

Note that the first terminal of the transistor 323 can be connected to a variety of wirings. For example, the first terminal of the transistor 323 can be connected to the wiring 112 or the wiring 118. However, this embodiment is not limited to this example.

Note that the first terminal of the transistor 324 can be connected to a variety of wirings. For example, the first terminal of the transistor 324 can be connected to the wiring 118.

Figure 24C:
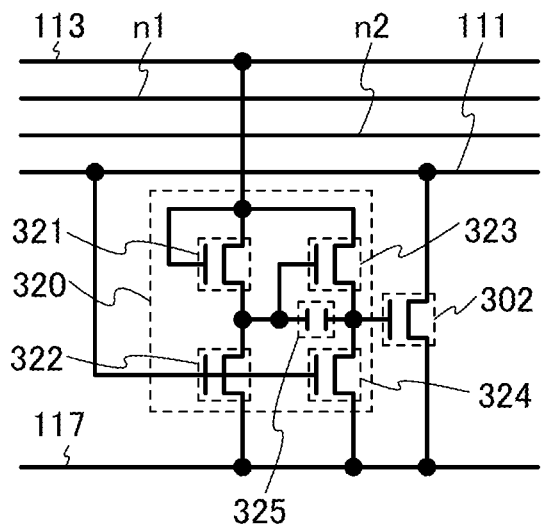

Note that as shown in FIG. 24C, a capacitor 325 can be connected between the gate and the second terminal of the transistor 323 in addition to the structure shown in FIG. 24B.

Figure 24D:
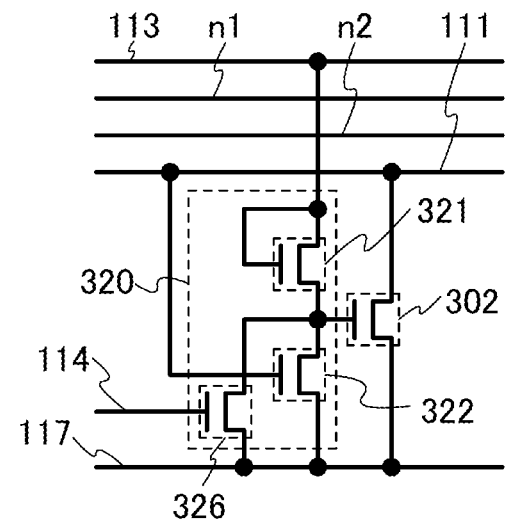

Note that as shown in FIG. 24D, the circuit 320 can include a transistor 326. A first terminal of the transistor 326 is connected to the wiring 117, a second terminal of the transistor 326 is connected to the gate of the transistor 302, and a gate of the transistor 326 is connected to the wiring 114. The transistor 326 is an n-channel transistor. However, this embodiment is not limited to this example. The transistor 326 can be a p-channel transistor. The Transistor 326 has a function of controlling a timing when the voltage V1 is supplied to the transistor 302 by controlling a state of electrical continuity of the wiring 117 and the gate of the transistor 302 in accordance with the signal SP.

Note that as in FIG. 24D, the transistor 326 whose first terminal is connected to the wiring 117, second terminal is connected to the gate of the transistor 302, and gate is connected to the wiring 114 can be additionally provided in FIGS. 24B and 24C.

Figure 25A:
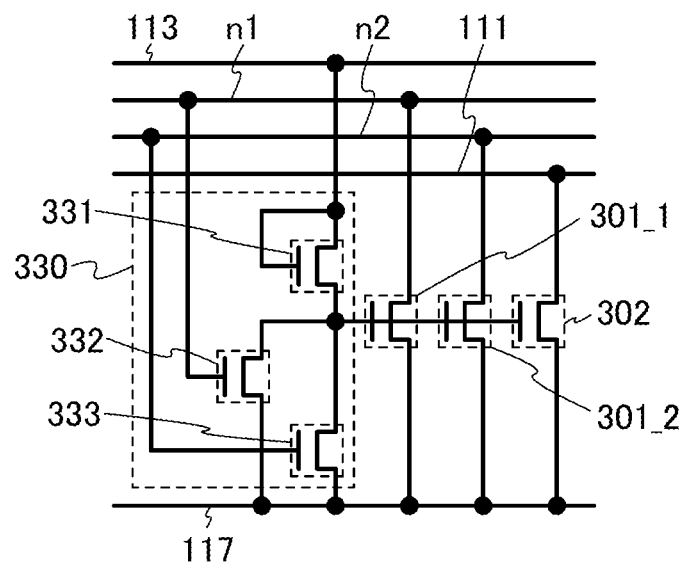
FIGS. 25A and 25B are examples of a circuit diagram of a semiconductor device in Embodiment 3.

Next, FIG. 25A show s an example of the circuit 330. The circuit 330 includes a transistor 331, a transistor 332, and a transistor 333. A first terminal of the transistor 331 is connected to the wiring 113, a second terminal of the transistor 331 is connected to the gate of the transistor 301_1, the gate of the transistor 301_2, and the gate of the transistor 302, and a gate of the transistor 331 is connected to the wiring 113. A first terminal of the transistor 332 is connected to the wiring 117, a second terminal of the transistor 332 is connected to the second terminal of the transistor 331, and a gate of the transistor 332 is connected to the node n1. A first terminal of the transistor 333 is connected to the wiring 117, a second terminal of the transistor 333 is connected to the second terminal of the transistor 331, and a gate of the transistor 333 is connected to the node n2. The transistor 331, the transistor 332, and the transistor 333 are n-channel transistors. However, this embodiment is not limited to this example. The transistor 331, the transistor 332, and/or the transistor 333 can be p-channel transistors.

Operation of the circuit 330 in FIG. 25A is described. In the period A1, the period A2, the period B1, and the period B2, since the potential of the node n1 or the potential of the n2 has larger value than the threshold voltage of the transistor 332 or 333, the transistor 332 or 333 is on. At that time, by setting the channel width of the transistor 332 or 333 larger than that of the transistor 331, the potentials of the gates of the transistors 301_1, 301_2, and 302 are set to approximate V1. In the period C1, the period C2, the period D1, the period D2, the period E1, and the period E2, since the potential of the node n1 and the potential of the node n2 are approximate V1, the transistor 332 and the transistor 333 are off. Therefore, the value of the potential of each of the gate of the transistor 301_1, the gate of the transistor 301_2, and the gale of the transistor 302 is equal to the value obtained by subtracting the threshold voltage of the transistor 331 (Vth331) from the potential of the wiring 113 (V2), (V2−Vth331+Vx). At that time, Vx is larger than 0.

Note that the channel width of the transistor 332 or 333 is preferably two or more times as large as tire channel width of the transistor 331. It is more preferable that the channel width of the transistor 332 be four or more times as large as the channel width of the transistor 331. It is further preferable that the channel width of the transistor 332 be eight or more limes as large as the channel width of the transistor 331. However, this embodiment is not limited to this example.

Note that the gate and the first terminal of the transistor 331 can be connected to a variety of wirings. For example, the gale and the first terminal of the transistor 331 can be connected to the wiring 112 or the wiring 118. However, this embodiment is not limited to this example.

Note that the gate of the transistor 332 and the gate of the transistor 333 can be connected to a variety of wirings. For example, the gate of the transistor 332 can be connected to the wiring 114 and the gate of the transistor 333 can be connected to the wiring 111. However, this embodiment is not limited to this example.

Note that the first terminal of the transistor 332 and the first terminal of the transistor 333 can be connected to different wirings. For example, the first terminal of the transistor 332 can be connected to the wiring 115_2 and the first terminal of the transistor 333 can be connected to different wiring 115_1. However, this embodiment is not limited to this example.

Figure 25B:
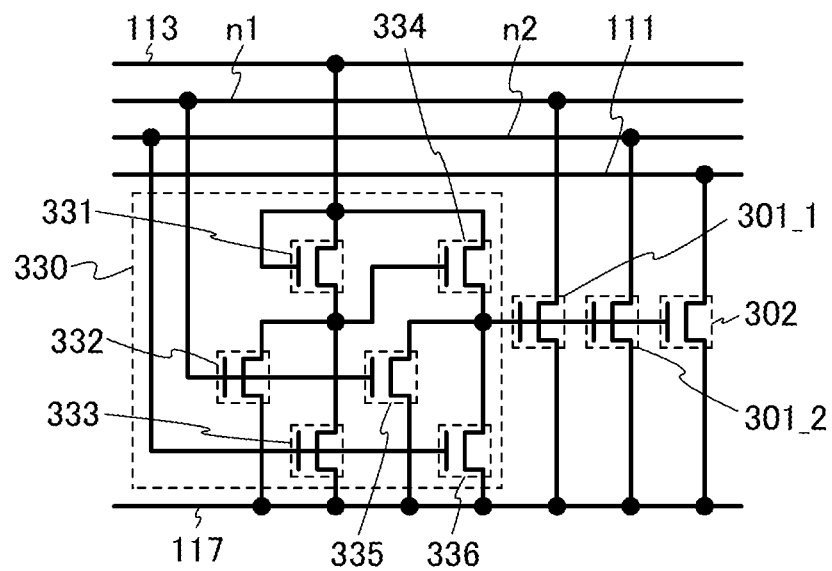

Note that as shown in FIG. 25B, the circuit 330 can include a transistor 334, a transistor 335, and a transistor 336 in addition to the transistor 331, the transistor 332, and the transistor 333. A first terminal of the transistor 334 is connected to the wiring 113, a second terminal of the transistor 334 is connected to the gate of the transistor 301_1, the gate of the transistor 301_2, and the gate of the transistor 302, and a gate of the transistor 334 is connected to the second terminal of the transistor 331. A first terminal of the transistor 335 is connected to the wiring 117, a second terminal of the transistor 335 is connected to the second terminal of the transistor 334, and a gate of the transistor 335 is connected to the node n1. A first terminal of the transistor 336 is connected to the wiring 117, a second terminal of the transistor 336 is connected to the second terminal of the transistor 334, and a gate of the transistor 336 is connected to the node n2. The transistor 334, the transistor 335, and the transistor 336 are n-channel transistors. However, this embodiment is not limited to this example, lire transistor 334, the transistor 335, and the transistor 336 can be p-channel transistors.

Note dial a capacitor can be connected between the gate and the second terminal of the transistor 334.

Note that the first terminal of the transistor 334 can be connected to a variety of wirings. For example, the first terminal of the transistor 334 can be connected to the wiring 112 or the wiring 118. However, this embodiment is not limited to this example.

Note that the gate of the transistor 335 and the gate of the transistor 336 can be connected to a variety of wirings. For example, the gate of the transistor 335 can be connected to the wiring 114 and the gate of the transistor 336 can be connected to the wiring 111. However, this embodiment is not limited to this example.

Note that the first terminal of the transistor 335 and the first terminal of the transistor 336 can be connected to different wirings. For example, the first terminal of the transistor 335 can be connected to the wiring 115_2 and the first terminal of the transistor 336 can be connected to different wiring 115_1. However, this embodiment is not limited to this example.

Figure 41:
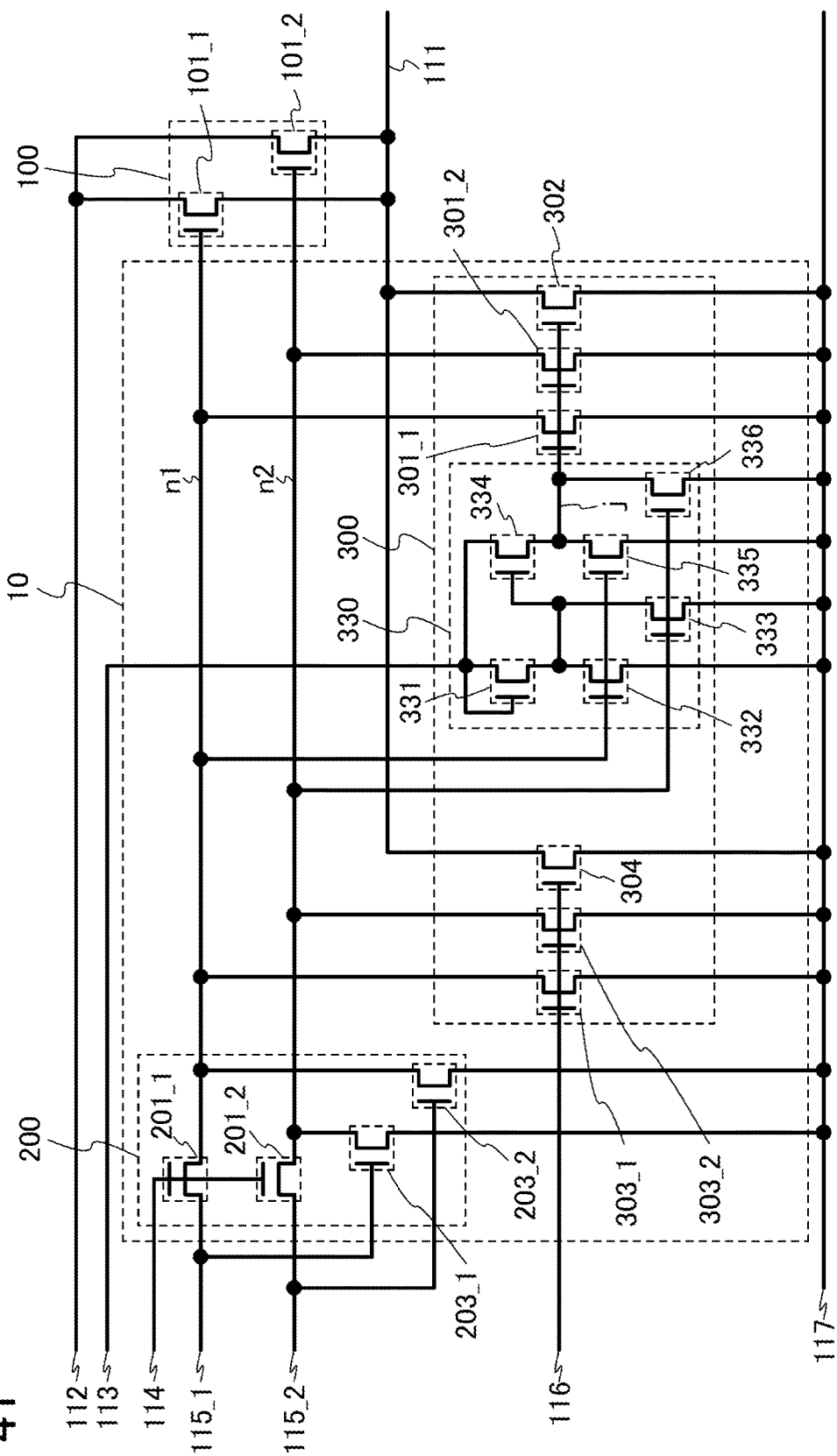
FIG. 41 is an example of a circuit diagram of a semiconductor device in Embodiment 3.

Here, FIG. 41 shows an example of a semiconductor device in the case where contents described in Embodiments 1 to 3 are combined as appropriate. However, this embodiment is not limited to this example. The semiconductor device can have a variety of structures by combination of contents described in Embodiments 1 to 3 other than the above.

The semiconductor device in FIG. 41 includes the circuit 100 and the circuit 10. The circuit 10 includes the circuit 200 and the circuit 300. The circuit 300 includes the circuit 330. In the semiconductor device in FIG. 41, the structure shown in FIG. 4A is employed for the circuit 100, the structure shown in FIG. 11E is employed for the circuit 200, the structure shown in FIG. 19C is employed for the circuit 300, and the structure shown in FIG. 25B is employed for the circuit 330.

Figure 42A:
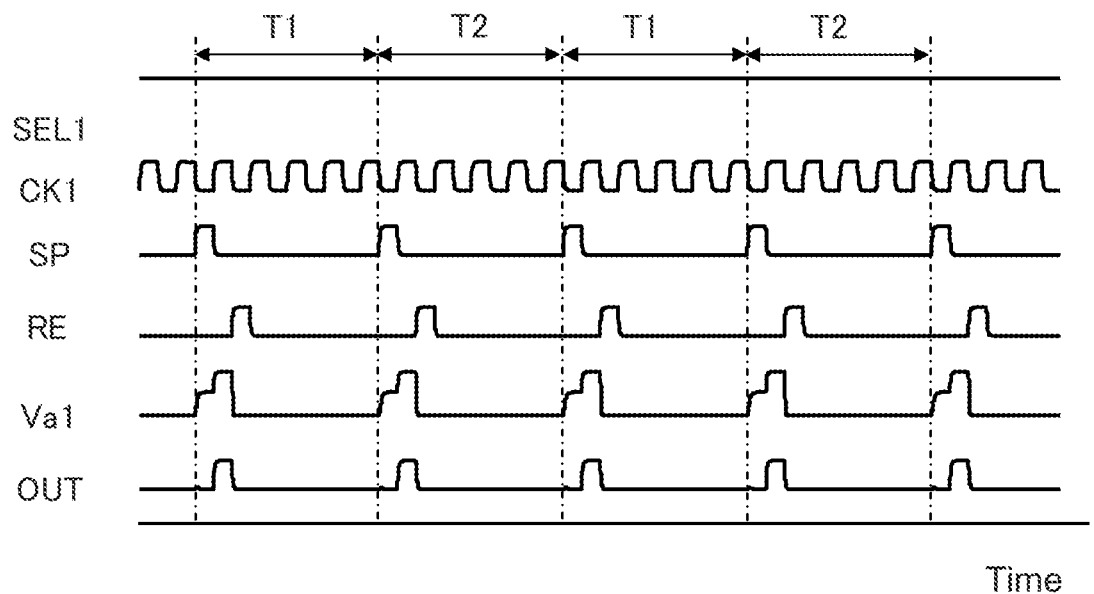
FIGS. 42A and 42B are diagrams each showing a result of verification of a semiconductor device in Embodiment 3.
Figure 42B:
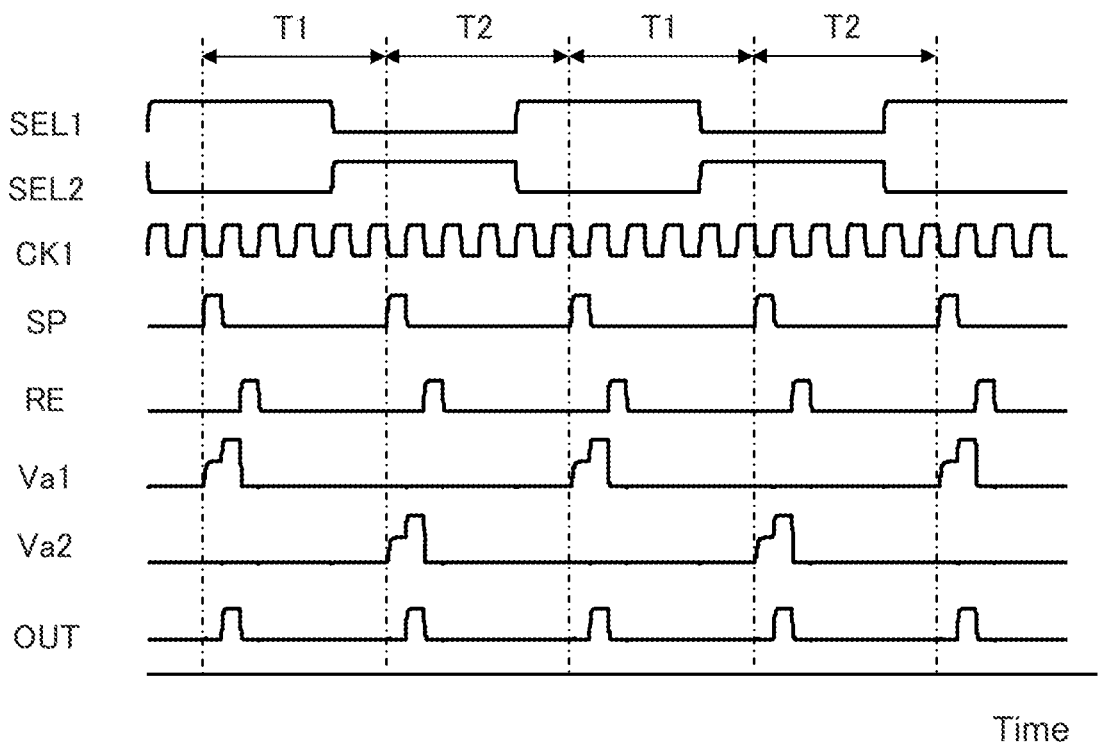

Further, operation of the semiconductor device in FIG. 41 is verified. The result of the verification is shown in FIGS. 42A and 42B. FIGS. 42A and 42B are diagrams showing the result of the verification of the semiconductor device in this embodiment. Note that the verification was performed using a SPICE. In addition, for a comparison example, verification is performed also for operation of the semiconductor device with a circuit configuration in which the transistor 101_2, the transistor 201_2, the transistor 203_1, the transistor 203_2, the transistor 301_2, the transistor 303_2, the transistor 333, and the transistor 336 are not provided. Further, the verification w as performed under the following conditions; Vdd is 30V; Vss is 0V; a clock frequency is 25 kHz (one cycle is 20 μsec), the mobility of each transistor is 1 $cm^2$/VS; the threshold voltage of each transistor is 5V; and output capacitance is 50 pF.

FIG. 42A is a timing chart of the verification result of the semiconductor device used as the comparison example. As shown in FIG. 42A, in the semiconductor device of the comparison example, in both of the period T1 and the period 12, the transistor 101_1 is turned on in accordance with the potential of the node n1; the wiring 112 and the wiring 111 are brought into electrical continuity through the transistor 101_1; and the signal CK1 is supplied from the wiring 112 to the wiring 111 through the transistor 101_1.

FIG. 42B is a timing chart of the verification result of the semiconductor device shown in FIG. 41. As shown in FIG. 42B in the semiconductor device shown in FIG. 41, in the period T1, the transistor 101_1 is turned on tn accordance with the potential of the node n1; the wiring 112 and the wiring 111 are brought into electrical continuity through the transistor 101_1; and the signal CK1 is supplied from the wiring 112 to the wiring 111 through the transistor 101_1: and in the period T2, the transistor 101J is turned on in accordance with the potential of the node n2; the wiring 112 and the wiring 111 are brought into electrical continuity through the transistor 101_1: and die signal CK1 is supplied from the wiring 112 to the wiring 111 through the transistor 101_1. Therefore, as shown in FIGS. 42A and 42B, it can be seen that, since transistors which are on and operated are different in each period in the semiconductor device of this embodiment, the number of times when each of the transistors is turned on and the length of time when each of the transistors is on can be reduced.

Embodiment 4

In this embodiment, an example of a shift register will be described. A shift register in this embodiment can include any of the semiconductor devices in Embodiments 1 to 3. Note that the shift register can be referred to as a semiconductor device or a gate driver. The contents described in Embodiments 1 to 3 are not repeated. Further, the contents described in Embodiments 1 to 3 can be combined with a content described in this embodiment as appropriate.

First, an example of the shift register is described with reference to FIG. 26. The shift register 500 includes a plurality of flip flops 501_1 to 501_N (N is a natural number).

Note that each of the flip flops 501_1 to 501_N corresponds to any of the semiconductor devices described in Embodiment 3. As an example, FIG. 26 illustrates the case where the semiconductor device in FIG. 4A is used for each of the flip flops 501_1 to 501_N. Note that this embodiment is not limited thereto, and other semiconductor devices or circuits described in Embodiment 3 can be used for the flip flops 501_1 to 501_N.

Next, connection relations of tire shift register are described. The shift register 500 is connected to wirings 511_1 to 511_N, a wiring 512, a wiring 513, a wiring 514, a wiring 515_1, a wiring 515_2, a wiring 516, a wiring 517, and a wiring 518. Moreover, in the flip flop 501_i (i is any one of 2 to N), the wiring 111, the wiring 112, the wiring 113, the wiring 114, the wiring 115_1, the wiring 115_2, the wiring 116, and the wiring 117 are connected to the wiring 115_1, the wiring 512, the wiring 514, the wiring 511_i−1, the wiring 515_1, the wiring 515_2, the wiring 511_i+1, and the wiring 516, respectively. Note that the wiring 112 in flip flops of odd-numbered stages and the wiring 112 in flip flops of even-numbered stages are often connected to different portions. For example, in the case where the wiring 112 in a flip flop of the ith stage is connected to the wiring 512, the wiring 112 in a flip flop of the (i+1)th flip flop or (i−1)th stage is connected to the wiring 513.

In the flip flop 501_1, the wiring 114 is often connected to the wiring 517. Moreover, m the flip flop 501_N, the wiring 116 is often connected to the wiring 518. However, this embodiment is not limited to this.

Next, an example of a signal or voltage which is input to or output from each wiring is described. As an example, signals GOUT_1 to GOUT_N are output from the wirings 511_1 to 511_N, respectively. The signals GOUT_1 to GOUT_N are output signals from the flip flops 501_1 to 501_1, respectively. Moreover, the signals GOUT_1 to GOUT_N correspond to the signal OUT, and can function as an output signal, a selection signal, a transfer signal, a start signal, a reset signal, a gate signal, or a scan signal. A signal GCK1 is input to the wiring 512. The signal GCK1 corresponds to the signal CK1 and can function as a clock signal. As an example, a signal GCK2 is input to the wiring 513. The signals GCK2 corresponds to the signal CK2 and can function as an inverted clock signal. As an example, the voltage V2 is supplied to the wiring 514. As an example, the signals SEL1 and SEL2 are input to the wiring 515_1 and 515_2, respectively. For example, voltage V1 is supplied to the wiring 516. For example, a signal GSP is input to the wiring 517. The signal GSP corresponds to the signal SP, and can function as a start signal or a vertical synchronization signal. As an example, a signal GRE is input to the wiring 518. The signal GRE corresponds to the signal RE, and can function as a reset signal. Note that this embodiment is not limited thereto, and various other signals, voltages, or currents can be input to these wirings.

The wirings 511_1 to 511_N can function as a signal line, a gate signal line, or a scan line. The wirings 512 and 513 can function as a signal line or a clock signal line. The wiring 514 can function as a power supply line. The wirings 515_1, and 515_2 can function as a signal line. The wiring 516 can function as a power supply line or a ground line. The wiring 517 can function as a signal line. The wiring 518 can function as a signal line. Note that this embodiment is not limited thereto, and these wirings can function as various other wirings.

Note that signals, voltages, or the like are input to the wiring 512, the wiring 513, the wiring 514, the wiring 515_1, the wiring 515_2, the wiring 516, the wiring 517, and the wiring 518 from the circuit 520. The circuit 520 has a function of controlling the shift register by supplying a signal, a voltage, or the like to the shift register, and can function as a control circuit, a controller, or the like.

As an example, the circuit 520 includes a circuit 521 and a circuit 522. The circuit 521 has a function of generating a power supply voltage such as a positive pow er supply voltage, a negative power supply voltage, a ground voltage, or a reference voltage and can function as a power supply circuit or a regulator. The circuit 522 has a function of generating a variety of signals such as a clock signal, an inverted clock signal, a start signal, a reset signal, and/or a video signal and can function as a timing generator. Note that this embodiment is not limited thereto, and the circuit 520 can include a variety of circuits or elements in addition to the circuits 521 and 522. For example, the circuit 520 can include an oscillator, a level shift circuit, an inverter circuit, a buffer circuit, a DA conversion circuit, an AD conversion circuit, an operational amplifier, a shift register, a look-up table, a coil, a transistor, a capacitor, a resistor, and/or a divider.

Figure 26:
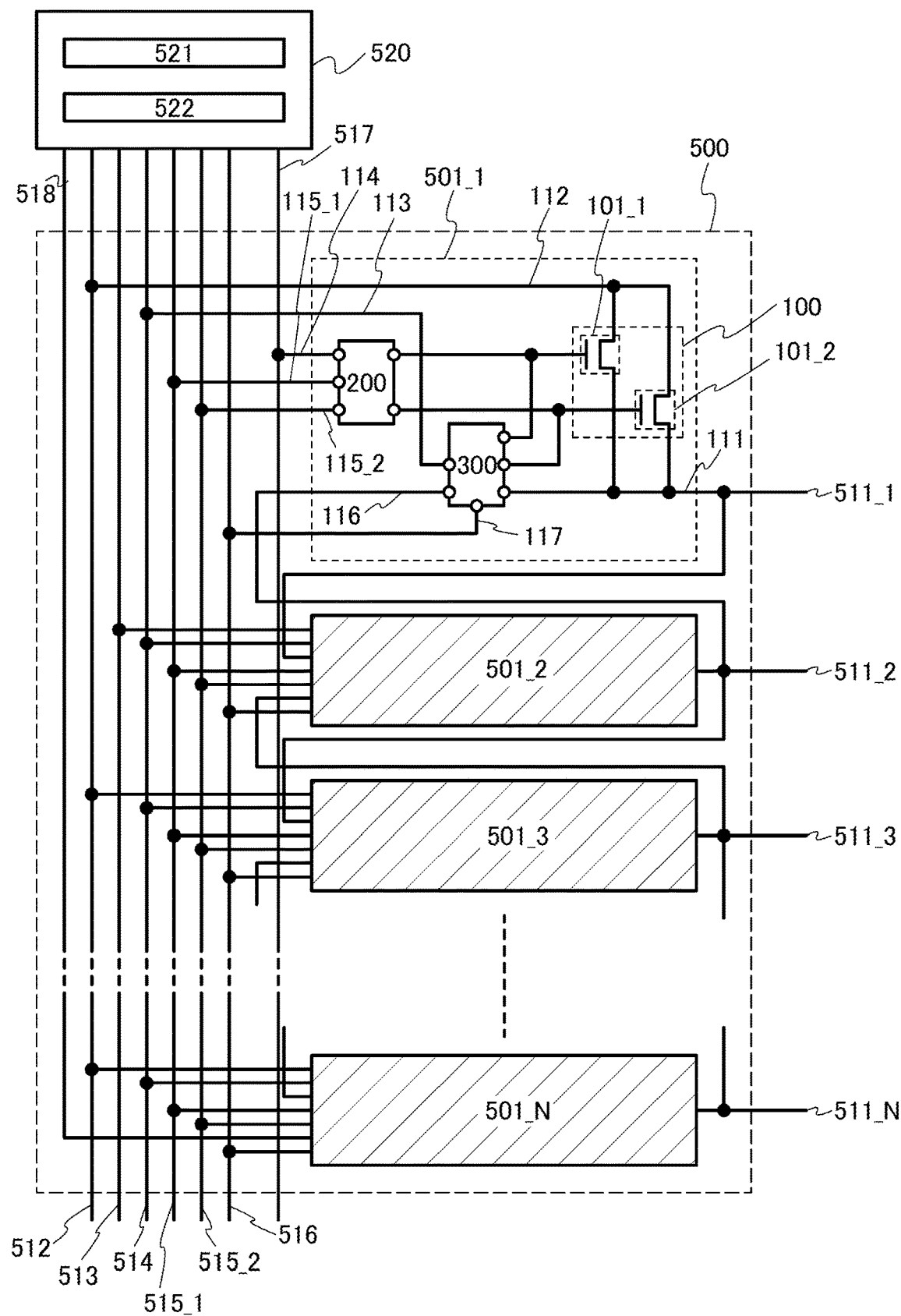
FIG. 26 is an example of a circuit diagram of a shift register in Embodiment 4.
Figure 27:
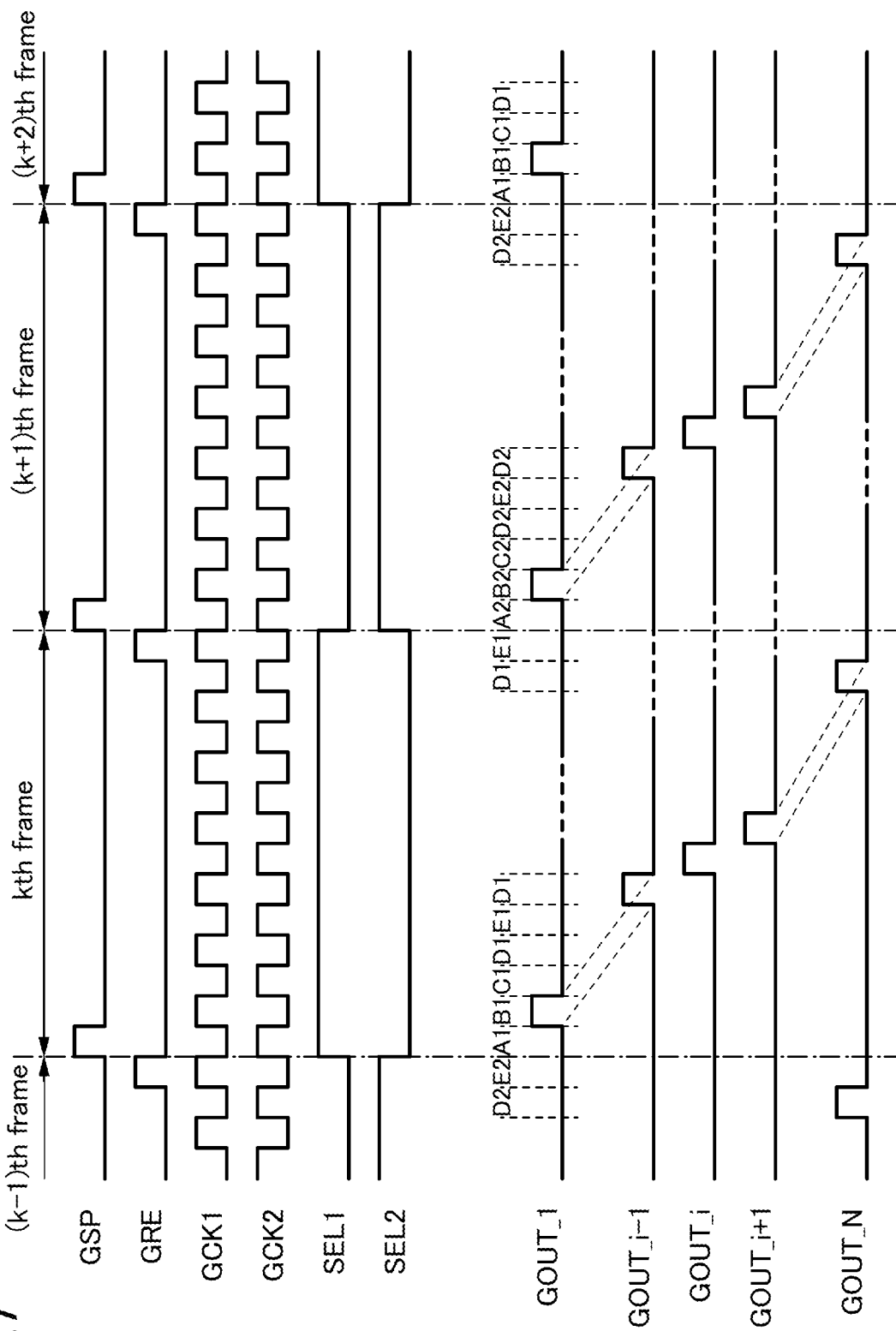
FIG. 27 is an example of a liming chart for illustrating operation of a shift register in Embodiment 4.

Next, operation of the shift register in FIG. 26 is described with reference to a timing chart in FIG. 27. FIG. 27 is an example of a timing chart for illustrating operation of the shift register. FIG. 27 illustrates an example of the signals GSP, GRE, GCK1, GCK2, SEL1, SEL2, GOUT_1, GOUT_i−1, GOUT_i, GOUT_i+1, and GOUT_N. Note that the description of the same operation as that of any of the semiconductor devices in Embodiments 1 to 3 is omitted.

Operation of the flip flop 501_1 in a kth (k is a natural number) frame is described. First, the signal GOUT_i−1 is set at the H level. Accordingly, the flip flop 501_1 starts operation of the period A1, and the signal GOUT_i is set at the L level. After that, the signal GCK1 and the signal GGK2 are inverted. Accordingly, the flip flop 501_i sums operation of the period B1, and the signal GOUT_i is set at the H level. The signal GOUT_i is input to the flip flop 501_i as a reset signal and input to the flop 501_i as a start signal. Thus, the flip flop 501_J−1 starts operation of the period C1, and the flip flop 501_i+1 starts the operation of the period A1. After that, the signal GCK1 and the signal GCK2 are inverted again. Then, the flip flop 501_i+1 starts the operation of the period B1, and die signal GOUT_i+1 is set at the H level. The signal GOUT_i+1 is input to the flip flop 501_i as a reset signal. Thus, the flip flop 501_1 starts the operation of the period C1, and the signal GOUT_i is set at the L level. After that, until the signal GOUT_i−1 is set at the H level again, the flip flop 501_i repeat operation of the period D1 and operation of the period E1 every time the signal GCK1 and the signal GCK2 are inverted.

Operation of the flip flop 501_i in a (k+1)th frame is described. First, the signal GOUT_i−1 goes into the H level. Accordingly, the flip flop 501_i starts operation of the period A2, and the signal GOUT_i goes into the L level. After that, the signal GCK1 and the signal GCK2 are inverted. Accordingly, the flip flop 501_i starts operation of the period B2, and the signal GOUT_i goes into the H level. The signal GOUT_i is input to the flip flop 501_i−1 as a reset signal and input to the flop 501_i+1 as a start signal. Thus, the flip flop 501_i−1 starts operation of the period C2, and the flip flop 501_i+1 starts the operation of the period A2. After that, the signal GCK1 and the signal GCK2 are inverted again. Then, the flip flop 501_i+1 starts the operation of the period B1, and the signal GOUT_i+1 goes into the U level. The signal GOUT_i+1 is input to the flip flop 50_i as a reset signal. Thus, the flip flop 501_i starts the operation of the period C2, and the signal GOUT_i goes into the L level. After that, until the signal GOUT_i−1 goes into the H level again, the flip flop 501_i repeats operation of the period D2 and operation of the period E2 every lime the signal GCK1 and the signal GCK2 are inverted.

In the flip flop 501_1, instead of an output signal of a flip flop of the previous stage, the signal GSP is input from the circuit 520 through the wiring 517. Accordingly, when the signal GSP is set at the H level, the flip flop 501_1 starts the operation of the period A1 or A2.

In the flip flop 501_N instead of an output signal of a flip flop of the next stage, the signal GRE is input from the circuit 520 through the wiring 518. Accordingly, when the signal GRE is set at the H level, the flip flop 501_1 starts the operation of the period C1 or C2.

In this manner, by using any of the semiconductor devices in Embodiments 1 to 3, the shift register in this embodiment can obtain advantages similar to those of the semiconductor device.

Note that the relation between the signal GCK1 and the signal GCK2 can be unbalanced. For example, as shown in a timing chart of FIG. 28A, a period during which the signals GCK1 and GC7K2 are at the H level can be shorter than a period during which these signals are at the L level. Accordingly, even when delay, distortion, or the like of the signals GOUT_1 to GOUT_N occurs, a period during which these signals are simultaneously set at the H level can be prevented. Thus, when the shift register in this embodiment is used in a display device, a plurality of rows can be prevented from being selected at one time. Note that this embodiment is not limited thereto, and it is possible to make a period during which the signal GCK1 and or the signal GCK2 are/is at the H level longer than a period during which the signal GCK1 and or the signal GCK2 are/is at the L level.

Note that multi-phase clock signals can be input to the shift register. For example, as shown in a timing chart of FIG. 28B, W-phase clock signals (M is a natural number of 3 or more) can be used. In that case, as for the signals GOUT_1 to GOUT_N, a period during which the signal is set at the H level at a given stage can overlap with a period during which the signal is set at the H level at the previous and next stages. Accordingly, when this embodiment is used for a display device, a plurality of rows are selected at the same time. Thus, a video signal to a pixel in another row can be used as a precharge voltage.

Figure 28A:
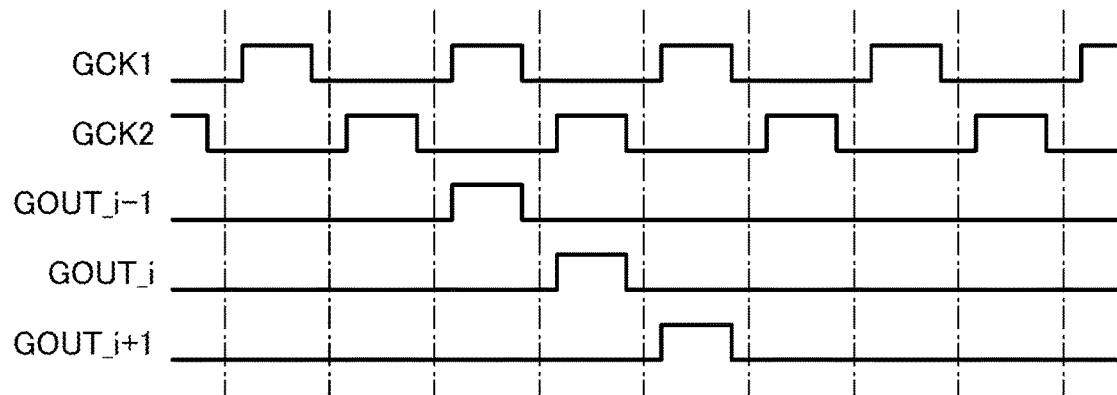
FIGS. 28A and 28B are examples of a timing chart for illustrating operation of a shift register in Embodiment 4.
Figure 28B:
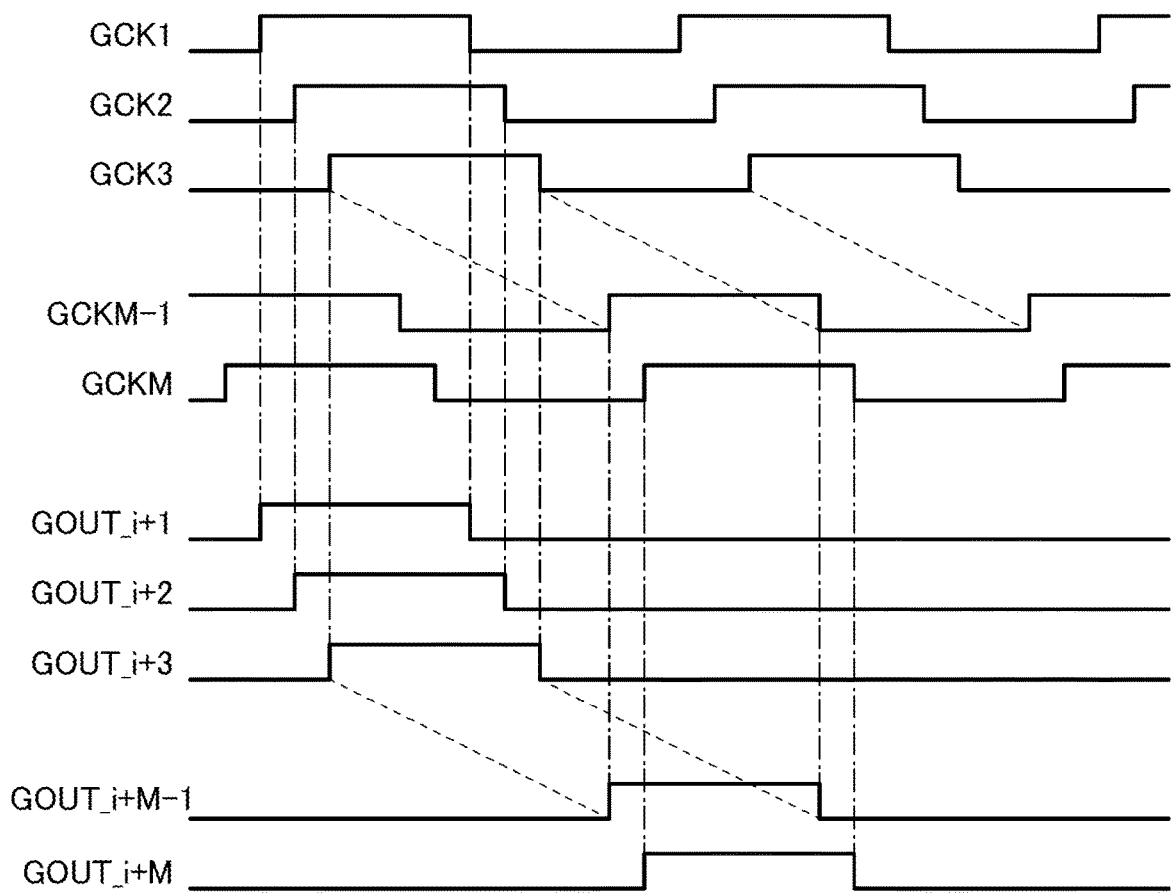

Note that in FIG. 28B, it is preferable that M≤8. It is more preferable that M≤6, is further preferable that M≤4. This is because when the shill register is used in a scan line driver circuit in a display device, a plurality of kinds of video signals are written into a pixel if M is too large. This is also because the display quality is sometimes degraded since a period during which a wrong video signal is input to the pixel becomes longer.

Note that as in FIG. 28B, multi-phase clock signals can be used in the timing chart of FIG. 28A.

Note that the wiring 518 and another wiring (e.g., the wiring 512, the wiring 513, the wiring 515_2, the wiring 515_2, the wiring 516, or the wiring 517) can be brought together into one wiring, so that the wiring 518 can be eliminated. In that case, in the flip flop 501_N, it is preferable that the wiring 116 be connected to the wiring 512, the wiring 513, the wiring 515_1, the wiring 515_2, the wiring 516, or the wiring 517. Alternatively, by employing another structure, the wiring 516 can be eliminated. In that case, in the flip flop 501_A, the transistor 303_1, the transistor 303_2, and the transistor 304 can be eliminated.

Figure 29:
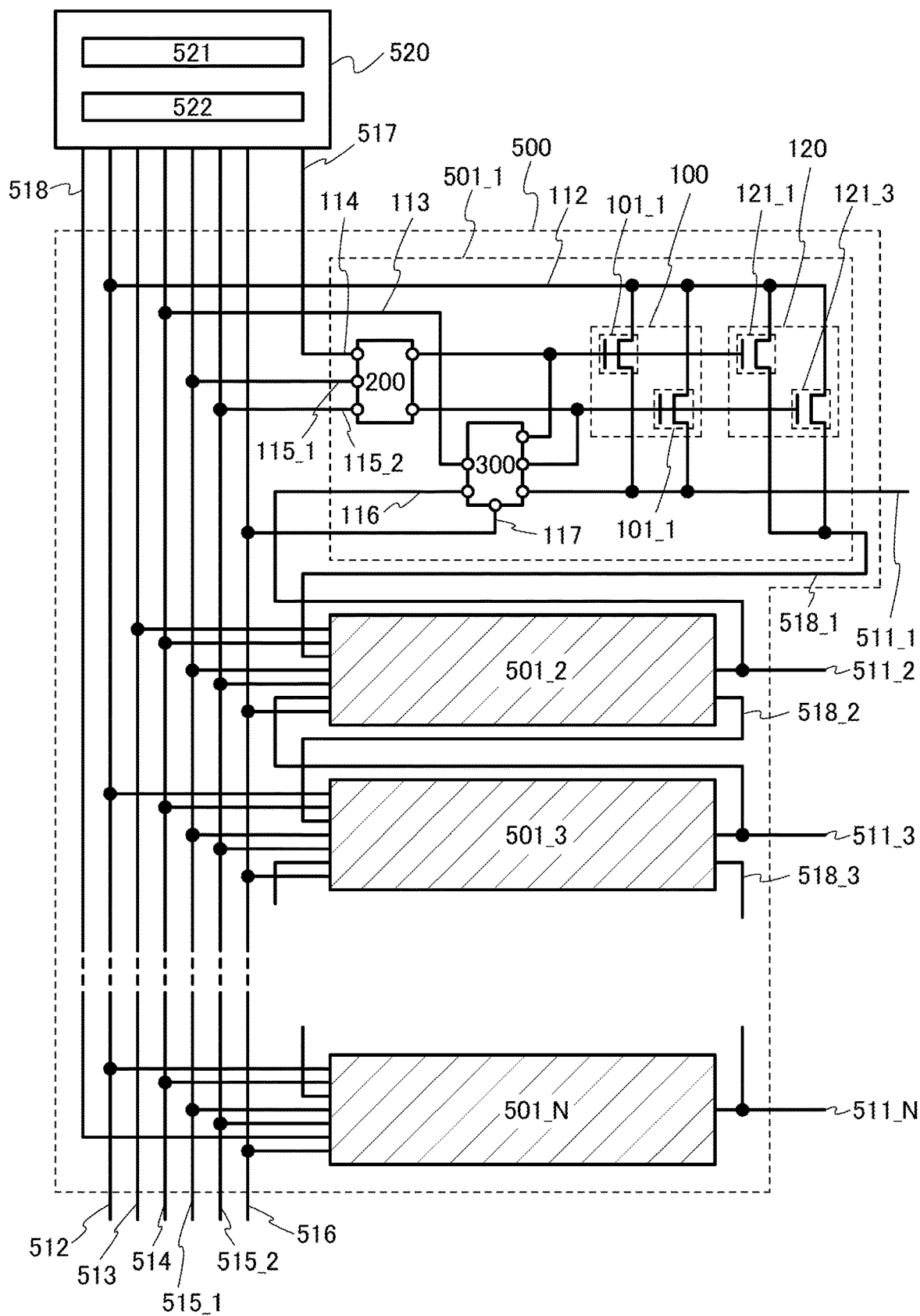
FIG. 29 is an example of a circuit diagram of a shift register in Embodiment 4.

Note that as shown in FIG. 20, it is possible to obtain a plurality of output signals. As an example of FIG. 29, the semiconductor device in FIG. 10E is used for each of the flip flops 501_1 to 501_N. Moreover, in the flip flop 501_i is and one of 2 to N), the wiring 111, the wiring 112, the wiring 113, the wiring 114, the wiring 115_1, the wiring 115_2, the wiring 116, and the wiring 117 are connected to the wiring 511_i, the wiring 512, the wiring 514, the wiring 518_i−1, the wiring 515_1 the wiring 515_2, the wiring 511_i+1, and the wiring 516, respectively. Accordingly, even when a load such as a pixel or a gate signal line is connected to the wirings 511_1 to 511_N, a transfer signal for driving a flip flop of the next stage is not distorted or delayed. Thus, the adverse effect of delay on the shift register can be reduced. Note that this embodiment is not limited thereto, and the wiring 114 can be connected to the wiring 511_i−1. Alternatively, the wiring 116 can be connected to a wiring 517_i+1.

Embodiment 5

In this embodiment, an example of a display device is described.

First, an example of a system block of a liquid crystal display device is described with reference to FIG. 30A. The liquid crystal display device includes a circuit 5361, a circuit 5362, a circuit 5363_1, a circuit 5363_2, a pixel portion 5364 including pixels, a circuit 5365, and a lighting device 5366. A plurality of wirings 5371 which are extended from the circuit 5362 and a plurality of wirings 5372 which are extended from the circuit 5363_1 and the circuit 5363_2 are provided in the pixel portion 5364. In addition, pixels 5367 which include display elements such as liquid crystal elements are provided in a matrix in respective regions where the plurality of wirings 5371 and the plurality of wirings 5372 intersect with each other.

The circuit 5361 has a function of supplying a signal, voltage, current, or the like to the circuit 5362, the circuit 5363_1, the circuit 5363_2, and lire circuit 5365 in response to a video signal 5360 and can serve as a controller, a control circuit, a timing generator, a power supply circuit, a regulator, or the like. In this embodiment, for example, the circuit 5361 supplies a signal line driver circuit start signal (SSP), a signal line driver circuit clock signal (SCK), an inverted signal line driver circuit clock signal (SCKB), video signal data (DATA), or a latch signal (LAT) to the circuit 5362. Alternatively, for example, the circuit 5361 supplies a scan line driver circuit start signal (GSP), a scan line driver circuit clock signal (GCK), or an inverted scan line driver circuit clock signal (GCKB) to the circuit 5363_1 and the circuit 5363_2. Alternatively, the circuit 5361 supplies a backlight control signal (BIX) to the circuit 5365. Note that this embodiment is not limited to this example. The circuit 5361 can supply a variety of signals, voltages, currents, or the like to the circuit 5362, the circuit 5363_1, the circuit 5363_2, and the circuit 5365.

The circuit 5362 has a function of outputting video signals to the plurality of wirings 5371 in response to a signal supplied from the circuit 5361 (e.g., SSP, SCK, SCKB, DATA, or LAT) and can serve as a signal line driver circuit. The circuit 5363_1 and the circuit 5363_2 each have a function of outputting scan signals to the plurality of wirings 5372 in response to a signal supplied from the circuit 5361 (e.g., GSP, GCK, or GCKB) and can serve as a scan line driver circuit. The circuit 5365 has a function of controlling the luminance (or average luminance) of the lighting device 5366 by controlling the amount of electric power supplied to the lighting device 5366, lime to supply the electric power to the lighting device 5366, or the like in response to the signal (BLC) supplied from the circuit 5361 and can serve as a power supply circuit.

Note that in the case where video signals are input to the plurality of wirings 5371, the plurality of wirings 5371 can serve as signal lines, video signal lines, source signal lines, or the like. In the case where scan signals are input to the plurality of wirings 5372, the plurality of wirings 5372 can serve as signal lines, scan lines, gate signal lines, or the like. Note that one example of this embodiment is not limited to this example.

Note that in the case where the same signal is input to the circuit 5363_1 and the circuit 5363_2 from the circuit 5361, scan signals output from the circuit 5363_1 to the plurality of wirings 5372 and scan signals output from the circuit 5363_2 to the plurality of wirings 5372 have approximately the same timings in many cases. Therefore, load caused by driving of the circuit 5363_1 and the circuit 5363_2 can be reduced. Accordingly, the display device can be made larger. Alternatively, the display device can have higher definition. Alternatively, since the channel width of transistors included in the circuit 5363_1 and the circuit 5363_2 can be reduced, a display device with a narrower frame can be obtained. Note that this embodiment is not limited to this example. The circuit 5361 can supply different signals to the circuit 5363_1 and die circuit 5363_2.

Note that one of the circuit 5363_1 and the circuit 5363_2 can be eliminated.

Note that a wiring such as a capacitor line, a power supply line, or a scan line can be additionally provided in the pixel portion 5364. Then, the circuit 5361 can output a signal, voltage, or the like to such a wiring. Alternatively, a circuit which is similar to the circuit 5363_1 or the circuit 5363_2 can be additionally provided. The additionally provided circuit can output a signal such as a scan signal to the additionally provided wiring.

Note that the pixel 5367 can include a light-emitting element such as an EL element as a display element. In this case, as shown in FIG. 30B, since the display element can emit light, the circuit 5365 and the lighting device 5366 can be eliminated. In addition, in order to supply electric power to the display element, a plurality of wirings 5373 which can serve as power supply lines can be provided in the pixel portion 5364. The circuit 5361 can supply power supply voltage (also referred to voltage ANO) to the wirings 5373. The wirings 5373 can be separately connected to the pixels in accordance with color elements or connected to all the pixels.

Note that FIG. 30B illustrates an example in which the circuit 5361 supplies different signals to the circuit 5363_1 and the circuit 5363_2. The circuit 5361 supplies a signal such as a scan line driver circuit start signal (GSP1), a scan line driver circuit clock signal (GCK1), or an inverted scan line driver circuit clock signal (GCKB1) to the circuit 5363_1. In addition, the circuit 5361 supplies a signal such as a scan line driver circuit start signal (GSP2), a scan line driver circuit clock signal (GCK2), or an inverted scan line driver circuit clock signal (GCKB2) to the circuit 5363_2. In this case, the circuit 5363_1 can scan only wirings in odd-numbered rows of the plurality of wirings 5372 and the circuit 5363_2 can scan only wirings in even-numbered rows of the plurality of wirings 5372. Thus, the driving frequency of the circuit 5363_1 and the circuit 5363_2 can be lowered, so that power consumption can be reduced. Alternatively, an area in which a flip-flop of one stage can be laid out can be made larger. Therefore, a display device can have higher definition. Alternatively, a display device can be made larger. Note that this embodiment is not limited to this example. As in FIG. 30A, the circuit 5361 can supply the same signal to the circuit S363_1 and the circuit 5363_2.

Figure 30A:
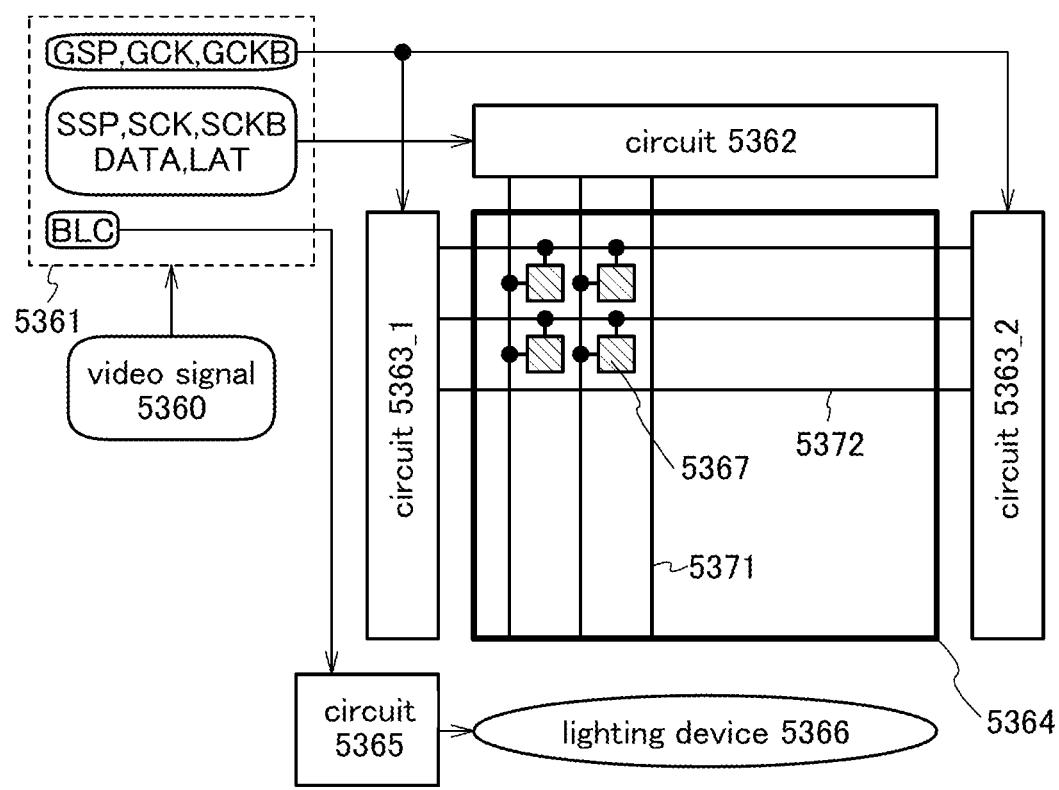
FIGS. 30A and 30B are examples of a block diagram of a display device in Embodiment 5.
Figure 30B:
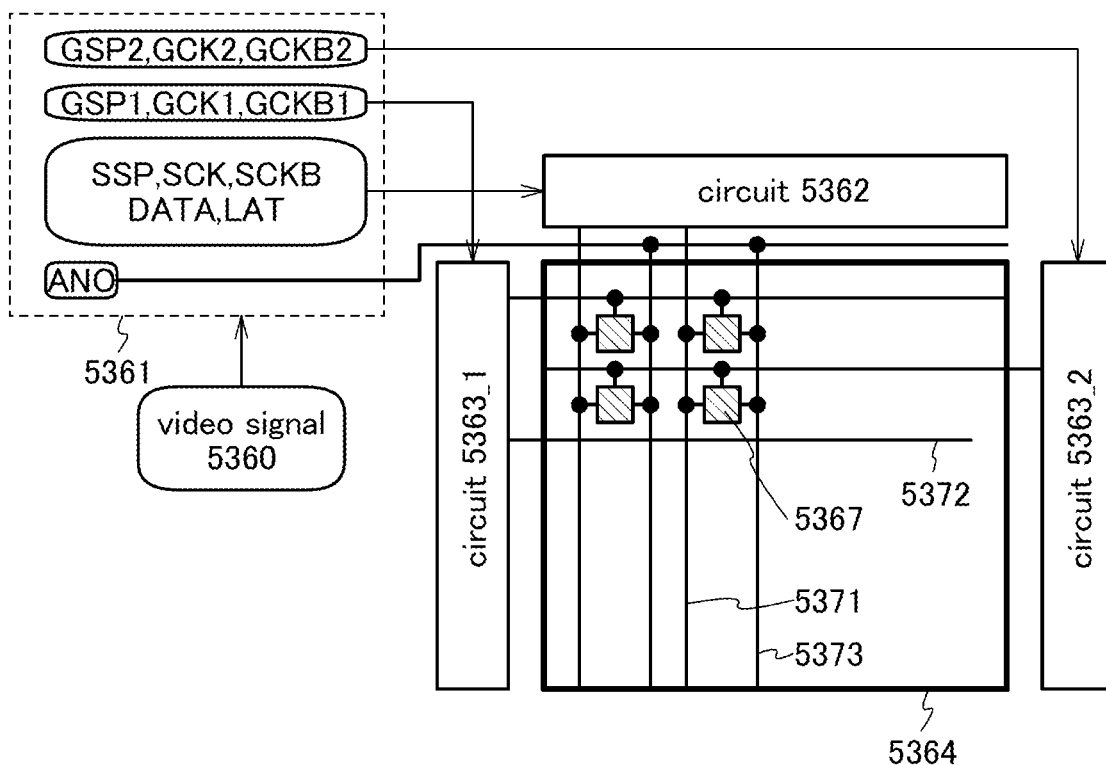

Note that as in FIG. 30B, the circuit 5361 can supply different signals to the circuit 5363_1 and the circuit 5363_2 in FIG. 30A.

Thus far, the example of a system block of a display device is described.

Next, examples of structures of the display devices are described with reference to FIGS. 31A to 31E.

Figure 31A:
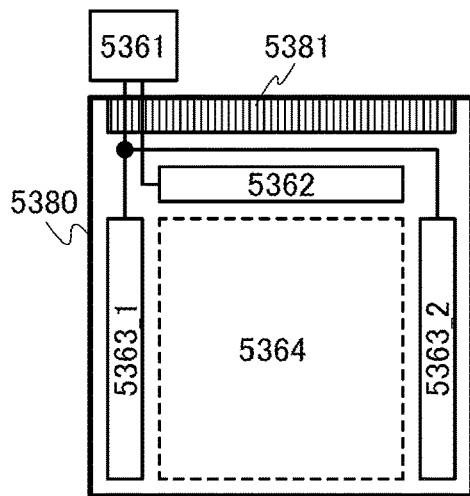
FIGS. 31A to 31E are examples of a block diagram of a display device in Embodiment 5.

In FIG. 31A, circuits which have a function of outputting signals to the pixel portion 5364 (e.g., the circuit 5362, the circuit 5363_1, and the circuit 5363_2) are formed over the same substrate 5380 as the pixel portion 5364. In addition, the circuit 5361 is formed over a different substrate from the pixel portion 5364. In this manner, since the number of external components is reduced, reduction in cost can be achieved. Alternatively, since the number of signals or voltages input to the substrate 5380 is reduced, the number of connections between the substrate 5380 and the external component can be reduced. Therefore, improvement in reliability or the increase in yield can be achieved.

Note that in the case where the circuit is formed over a different substrate from the pixel portion 5364, the substrate can be mounted on an FPC (flexible printed circuit) by TAB (tape automated bonding). Alternatively, the substrate can be mounted on the same substrate 5380 as the pixel portion 5364 by COG (chip on glass).

Note that in the case where the circuit is formed over a different substrate front the pixel portion 5364, a transistor formed using a single crystal semiconductor can be formed on the substrate. Therefore, the driving frequency of a circuit formed over the substrate can be set from a wide range. For example, by increasing the driving frequency, the number of pixels provided for the pixel portion 5364 can be increased (i.e., resolution can be increased). By decreasing a driving voltage, power consumption can be reduced. In addition, since the driving voltage of the circuit formed over the substrate can be high, a display element with the high driving voltage can be used as the display element. Moreover, in the circuit formed over the substrate, variations in an output signal can be reduced.

Note that a signal, voltage, current, or the like is input from an external circuit through an input terminal 5381 in many cases.

Figure 31B:
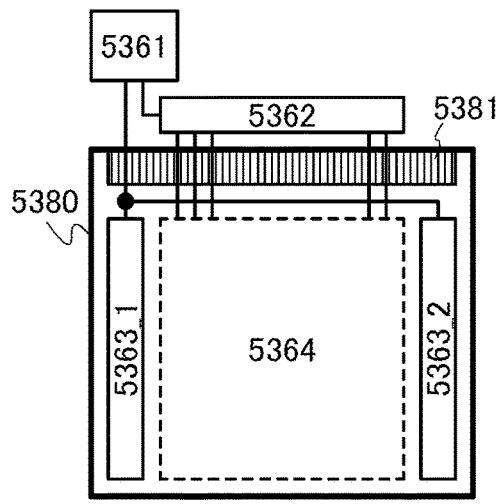

In FIG. 31B, the circuit 5363_1 and the circuit 5363_2 are formed over the same substrate 5380 as the pixel portion 5364 because the driving frequency of each of the circuit 5363_1 and the circuit 5363_2 is lower than the driving frequency of the circuit 5361 or the circuit 5362 in many cases and a transistor formed in the same steps as a transistor formed in the pixel portion can be used for the circuit 5363_1 and the circuit 5363_2. In addition, the circuit 5361 and the circuit 5362 are formed over a different substrate from the pixel portion 5364. In this manner, since the circuit formed over the substrate 5380 can be formed using a transistor with low mobility, an amorphous semiconductor, a microcrystalline semiconductor, an organic semiconductor, an oxide semiconductor, or the like can be used for a semiconductor layer of the transistor. Accordingly, the increase in the size of the display device, reduction in the number of steps, reduction in cost, improvement in yield, or the like can be achieved.

Figure 31C:
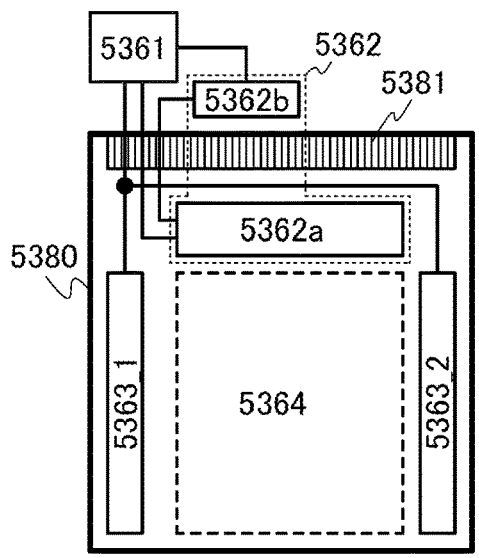

Note that as shown in FIG. 31C, part of the circuit 5362 (a circuit 5362a) can be formed over the same substrate 5380 as the pixel portion 5364 and the other pan of the circuit 5362 (a circuit 5362b) can be formed over a different substrate from the pixel portion 5364. The circuit 5362a includes a circuit which can be formed using u transistor with low mobility (e.g., a shift register, a selector, or a switch) in many cases. In addition, the circuit 5362b includes a circuit which is preferably formed using a transistor with high mobility and few variations in characteristics (e.g., a shift register, a latch circuit, a buffer circuit, a DA convener circuit, or an AD convener circuit) in many cases. In this manner, as in FIG. 31B, an amorphous semiconductor, a microcrystalline semiconductor, an organic semiconductor, an oxide semiconductor, or the like can be used for a semiconductor layer of the transistor, for example. Further, reduction in external components can be achieved.

Figure 31D:
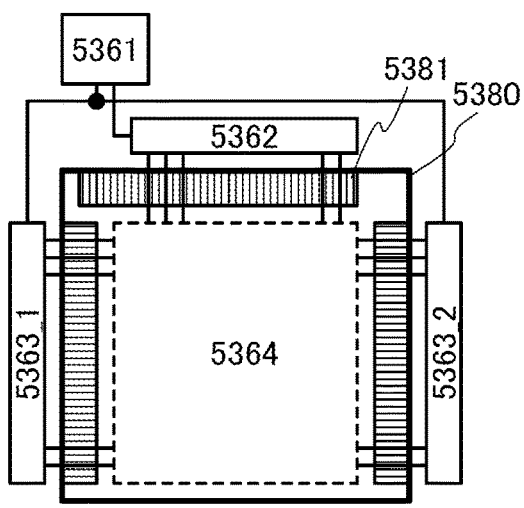

In FIG. 31D, circuits which have a function of outputting signals to the pixel portion 5364 (e.g., the circuit 5362, the circuit 5363_1, and the circuit 5363_2) and a circuit which has a function of controlling these circuits (e.g., the circuit 5361) are formed over a different substrate from the pixel portion 5364. In this manner, since the pixel portion and peripheral circuits thereof can be formed over different substrates, improvement in yield can be achieved.

Note that as in FIG. 31D, the circuit 5363_1 and the circuit 5363_2 can be formed over a different substrate from the pixel portion 5364 in FIGS. 31A to 31C.

Figure 31E:
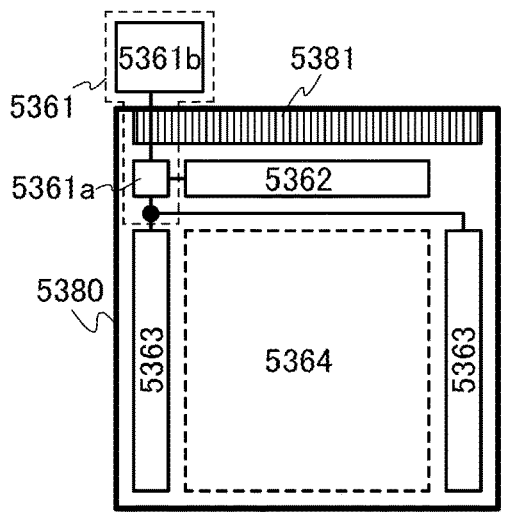

In FIG. 31E, part of the circuit 5361 (a circuit 5361a) is formed over the same substrate 5380 as the pixel portion 5364 and the other part of the circuit S361 (a circuit 5361b) is formed over a different substrate from the pixel portion 5364. The circuit 5361a includes a circuit which can be formed using a transistor with low mobility (e.g., a switch, a selector, or a level shifter) in many cases. In addition, the circuit 5361b includes a circuit which is preferably formed using a transistor with high mobility and few variations (e.g., a shift register, a liming generator, an oscillator, a regulator, or an analog buffer) in many cases.

Note that also in FIGS. 31A to 31D, the circuit 5361a can be formed over the same substrate as the pixel portion 5364 and the circuit 5361b can be formed over a different substrate from the pixel portion 5364.

Here, as each of the circuit 5363_1 and the circuit 5363_2, the semiconductor device or the shift register in Embodiments 1 to 4 can be used. In that case, since the circuit 5363_1, the circuit 5363_2, and the pixel portion are formed over one substrate, all the transistors formed over the substrate can be n-channel transistors or all the transistors formed over the substrate can be p-channel transistors. Accordingly, reduction in the number of steps, improvement in yield, improvement in reliability, or reduction in cost can be achieved. Specifically, if all the transistors are n-channel transistors, amorphous semiconductors, microcrystalline semiconductors, organic semiconductors, oxide semiconductors, or the like can be used for semiconductor layers of the transistors. Accordingly, increase in the size of the display device, reduction in cost, improvement in yield, or the like can be achieved.

Alternatively, in the semiconductor device or the shift register in Embodiments 1 to 4, the channel width of the transistor can be reduced. Accordingly, the layout area can be reduced, so that the frame can be reduced. Alternatively, since the layout area can be reduced, the resolution can be increased.

Alternatively, in the semiconductor device or the shift register in Embodiments 1 to 4, parasitic capacitance can be reduced. Therefore, power consumption can be reduced. Alternatively, the current capability of an external circuit can be decreased. Alternatively, the size of an external circuit or the size of a display device including the external circuit can be reduced.

Note that deterioration of characteristics such as increase in threshold voltage or decrease in mobility is caused in a transistor in which a non-single-crystal semiconductor, a microcrystalline semiconductor, an organic semiconductor, an oxide semiconductor, or the like is used as a semiconductor layer in many cases. However, since deterioration of characteristics of the transistor in the semiconductor device or the shift register in Embodiments 1 to 4 can be suppressed, the life of a display device can be made longer.

Note that as part of the circuit 5362, the semiconductor device or the shift register in Embodiments 1 to 4 can be used. For example, the circuit 5362a can include the semiconductor device or the shift register in Embodiments 1 to 4.

Embodiment 6

In this embodiment, an example of a signal line driver circuit will be described. Note that the signal line driver circuit can be referred to as a semiconductor device or a signal generation circuit.

An example of the signal line driver circuit is described with reference to FIG. 32A. The signal line driver circuit includes a plurality of circuits of circuits 602_1 to 602_N is a natural number), a circuit 600, and a circuit 601. The circuits 602_1 to 602_N each include a plurality of transistors of transistors 603_1 to 603_k (k is a natural number of 2 or more). The transistors 603_1 to 603_k are n-channel transistors. However, this embodiment is not limited to this. For example, the transistors 603_1 to 603_k can be p-channel transistors or CMOS switches.

A connection relation of the signal line driver circuit will be described by using the circuit 602_1 as an example. First terminals of the transistors 603_1 to 603_k are connected to a wiring 6051. Second terminals of the transistors 603_1 to 603_k are connected to wirings S1 to Sk, respectively. Gates of the transistors 603_1 to 603_k are connected to wirings 604_1 to 604_k, respectively. For example, the first terminal of the transistor 603_1 is connected to the wiring 605_1, the second terminal of the transistor 603_1 is connected to the wiring S1, and the gate of the transistor 603_1 is connected to the wiring 604_1.

The circuit 600 has a function of supplying a signal to the circuits 602_1 to 602_N through the wirings 604_1 to 604_k and can function as a shift register, a decoder, or the like. The signal is often a digital signal and can function as a selection signal. Moreover, the wirings 604_1 to 604_k can function as signal lines.

The circuit 601 has a function of outputting a signal to the circuits 602_1 to 602_N and can function as a video signal generation circuit or the like. For example, the circuit 601 supplies the signal to the circuit 602_1 through the wiring 605_1. At the same time, the circuit 601 supplies the signal to the circuit 602_2 through the wiring 605_2. The signal is often an analog signal and can function as a video signal. Moreover, the wirings 605_1 to 605_N can function as signal lines.

The circuits 602_1 to 602_N each have a function of selecting a wiring to which an output signal from the circuit 601 is output, and can function as a selector circuit. For example, the circuit 602_1 has a function of selecting one of the wirings S1 to Sk to output a signal output from the circuit 601 to the wiring 605_1.

The transistors 603_1 to 603_k each have a function of controlling a state of electrical continuity of the wiring 605_1 and die wirings Si to Sk in accordance with the output signal from the circuit 600, and function as switches.

Figure 32A:
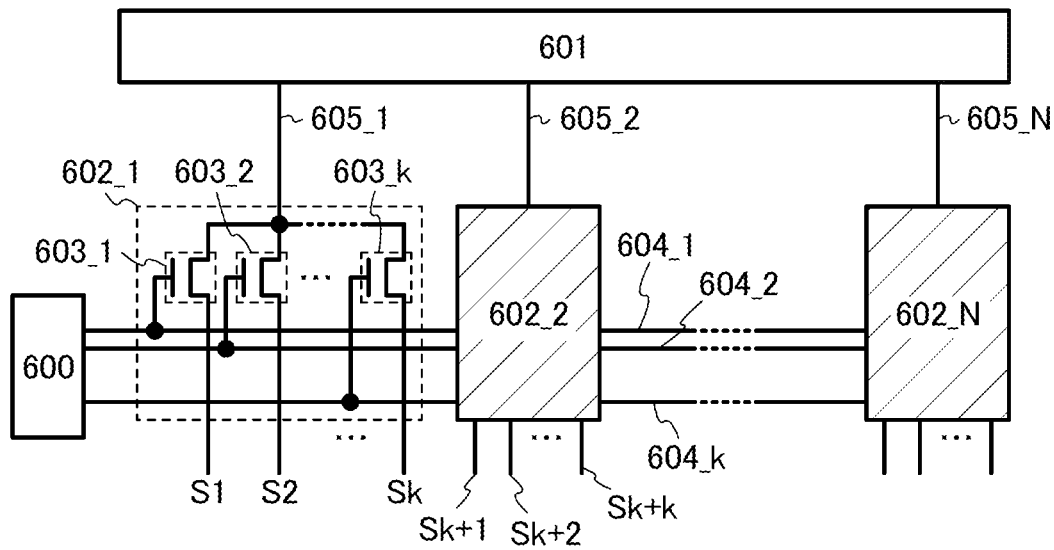
FIG. 32A is an example of a circuit diagram of a signal line driver circuit in Embodiment 6 and FIG. 32B is an example of a timing chart for illustrating operation of the signal driver circuit in Embodiment 6.
Figure 32B:
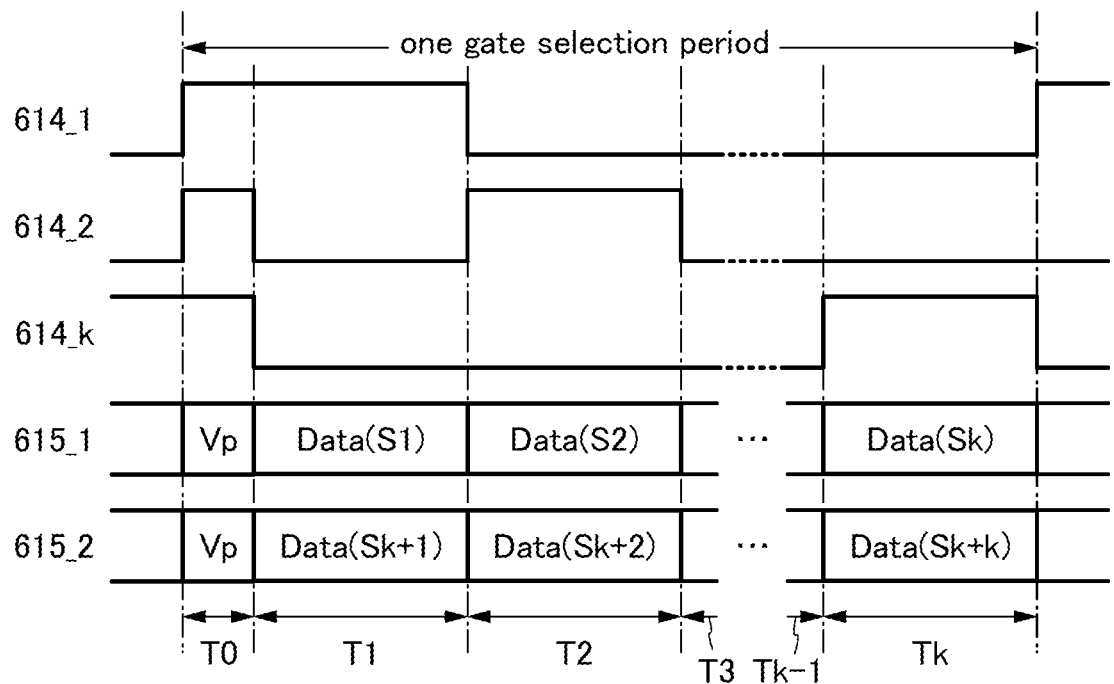

Next operation of the signal line driver circuit in FIG. 32A is described with reference to a timing chart in FIG. 32B. FIG. 32B illustrates examples of a signal 614_1 input to the wiring 604_1, a signal 614_2 input to the wiring 604_2, a signal 614_k input to the wiring 604_k, a signal 615_1 input to the wiring 605_1, and a signal 615_2 input to the wiring 605_2.

Note that one operation period of the signal line driver circuit corresponds to one gate selection period in a display device. One gale selection period is a period during which a pixel which belongs to one row is selected and a video signal can be written to the pixel.

Note that one gate selection period is divided into a period T0 and a period T1 to a period Tk. The period T0 is a period for applying voltages for precharge to pixels which belong to a selected row at the same time, and can serve as a precharge period. Each of the periods T1 to Tk is a period for writing video signals to pixels which belong to the selected row, and can serve as a writing period.

For simplicity, operation of the signal line driver circuit is described by using operation of the circuit 602_1 as an example.

First, in the period T0, the circuit 600 outputs a signal in the H level to the wirings 604_1 to 604_k. Accordingly, the transistors 603_1 to 603_k are turned on, whereby the wiring 605_1 and the wirings S1 to Sk are brought into electrical continuity. At that time, the circuit 601 applies a precharge voltage Vp to the wiring 605_1, so that the precharge voltage Vp is output to the wirings Si to Sk through the transistors 603_1 to 603_k, respectively. Then, the precharge voltage Vp is written to the pixels which belong to a selected row, so that the pixels which belong to the selected row are precharged.

Next, in the period T1, the circuit 600 outputs a signal in the H level to the wiring 604_1. Accordingly, the transistor 603_1 is turned on, whereby the wiring 605_1 and the wiring S1 are brought into electrical continuity. Moreover, the wiring 605_1 and the wirings S2 to Sk are brought out of electrical continuity. At that lime, if the circuit 601 outputs a signal Data(S1) to the wiring 605_1, the signal Data(S1) is output to the wiring S1 through the transistors 603_1. In this manner, the signal Data(S1) is written to, of the pixels connected to the wiring S1, the pixels which belong to the selected row.

Next, in the period T2, the circuit 600 outputs a signal in the H level to the wiring 604_2. Accordingly, the transistor 603_2 is turned on, whereby the wiring 605_2 and the wiring S2 are brought into electrical continuity. Moreover, the wiring 605_1 and the wirings S1 are brought out of electrical continuity, and the wiring 605_1 and the wirings S3 to Sk are kept out of electrical continuity. At that time, if the circuit 601 outputs a signal Data(S2) to the wiring 605_1, the signal Data(S2) is output to the wiring S2 through the transistor 603_2. In this manner, the signal Data(S2) is written to, of tire pixels connected to the wiring S2, the pixels which belong to the selected row.

After that, the circuit 600 sequentially outputs signals in the H level to the wirings 604_1 to 604_k until the end of the period Tk, so that the circuit 600 sequentially outputs the signals in the H level to the wirings 604_3 to 604_k from the period 13 to the period Tk, as in the period T1 and the period T2. Thus, since the transistors 603_3 to 603_k are sequentially turned on, the transistors 603_1 to 603_k are sequentially turned on. Accordingly, signals output from the circuit 601 are sequentially output to the wirings S1 to Sk. In this manner, the signals can be sequentially written to the pixels which belong to the selected row.

The above is the description of the example of the signal line driver circuit Since the signal line driver circuit in this embodiment includes the circuit functioning as a selector, the number of signals or the number of wirings can be reduced. Alternatively, since a voltage for precharging is written to a pixel before a video signal is written to the pixel (during the period T0), a writing time of the video signal can be shortened. Accordingly, increase in the size of a display device and higher resolution of the display device can be achieved. However, this embodiment is not limited to this, and the period T0 can be eliminated so that the pixel is not precharged.

Note that if k is too large a number, a writing time to the pixel is shortened, whereby writing of a video signal to the pixel is not completed in the writing time in some cases. Accordingly, it is preferable that k≤6. It is more preferable that k≤3. It is further preferable that k=2.

Specifically, in the case where a color element of a pixel is divided into n, it is possible to set k=n. For example, in the case where a color element of a pixel is divided into red (R), green (G), and blue (B), it is possible to set k=3. In that case, one gate selection period is divided into a period T0, a period T1, a period T2, and a period T3. A video signal can be written to the pixel of red (R), the pixel of green (G), and the pixel of blue (B) in the period T1, the period T2, and the period T3, respectively. However, this embodiment is not limited thereto, and the order of the period T1, the period T2, and the period T3 can be set as appropriate.

Specifically, in the case where a pixel is divided into n sub-pixels (also referred to as subpixels) (n is a natural number), it is possible to set k−n. For example, in the case where the pixel is divided into two sub-pixels, it is possible to set k=2. In that case, one gate selection period is divided into the period T0, the period T1, and the period T2. A video signal can be written to one of the two sub-pixels in the period T1, and a video signal can be written to the other of the two sub-pixels in the period T2.

Note that since the driving frequency of the circuit 600 and the circuits 602_1 to 602_N is low in many cases as compared to that of the circuit 601, the circuit 600 and the circuits 602_1 to 602_N can be formed over the same substrate as a pixel portion. Accordingly, the number of connections between the substrate over which the pixel portion is formed and an external circuit can be reduced;

thus, increase in yield, improvement in reliability, or the like can be achieved. Further, as shown in FIGS. 31A to 31E, by also forming a scan line driver circuit over the same substrate as the pixel portion, the number of connections between the substrate over which the pixel portion is formed and the external circuit can be further reduced.

Note that any of the semiconductor devices or shift registers described in Embodiments 1 to 4 can be used as the circuit 600. In that case, all the transistors in the circuit 600 can be n-channel transistors or all the transistors in the circuit 600 can p-channel transistors. Accordingly, reduction in the number of steps, increase in yield, or reduction in cost can be achieved.

Note that not only the transistors included in the circuit 600 but also all the transistors in the circuits 602_1 to 602_N can be n-channel transistors. Alternatively, not only the transistors included in the circuit 600 but also all the transistors in the circuits 602_1 to 602_N can be p-channel transistors. Accordingly, when the circuit 600 and the circuits 602_1 to 602_N are formed over the same substrate as the pixel portion, reduction in the number of steps, increase in yield, or reduction in cost can be achieved. Specifically, by using only n-channel transistors as the transistors in the circuits 600 and 602_1 to 602_N, an amorphous semiconductor, a microcrystalline semiconductor, an organic semiconductor, an oxide semiconductor, or the like, for example, can be used for semiconductor layers of the transistors.

Embodiment 7

In this embodiment, a structure and operation of a pixel which can be applied to a liquid crystal display device will be described.

Figure 33A:
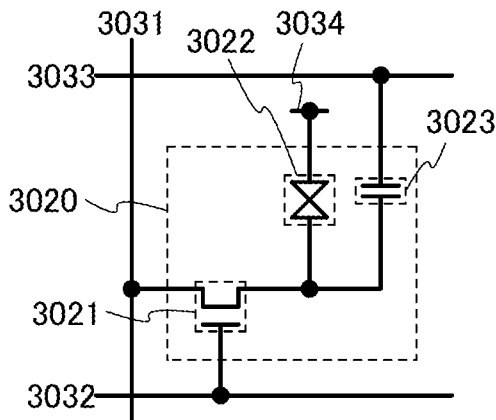
FIG. 33A is an example of a circuit diagram of a pixel in Embodiment 7 and FIGS. 33B and 33C are examples of a liming chart for illustrating operation of the pixel in Embodiment 7.

FIG. 33A illustrates an example of a pixel. A pixel 3020 includes a transistor 3021, a liquid crystal element 3022, and a capacitor 3023. A first terminal of the transistor 3021 is connected to a wiring 3031. A second terminal of the transistor 3021 is connected to one electrode of tire liquid crystal element 3022 and one electrode of the capacitor 3023. A gate of the transistor 3021 is connected to a wiring 3032. The other electrode of the liquid crystal element 3022 is connected to an electrode 3034. The other electrode of the capacitor 3023 is connected to a wiring 3033.

A video signal can be input to the wiring 3031, for example. A scan signal, a selection signal, or a gate signal can be input to the wiring 3032, for example. A constant voltage can be applied to the wiring 3033, for example. A constant voltage can be applied to the wiring 3034, for example. Note that this embodiment is not limited to this example. A writing time of a video signal can be shortened by supply of a precharge voltage to the wiring 3031. Alternatively, voltage applied to the liquid crystal element 3022 can be controlled by input of a signal to live wiring 3033. Alternatively, frame inversion driving can be achieved by input of a signal to the electrode 3034.

Note that the wiring 3031 can function as a signal line, a video signal line, or a source signal line. The wiring 3032 can function as a signal line, a scan line, or a gate signal line. The wiring 3033 can function as a power supply line or a capacitor line. The electrode 3034 can function as a common electrode or a counter electrode. However, this embodiment is not limited to this example. In the case where voltage is supplied to the wiring 3031 and the wiring 3032, these wirings can function as power supply lines. Alternatively, in the case where a signal is input to the wiring 3033, the wiring 3033 can function as a signal line.

The transistor 3021 has a function of controlling timing when a video signal is written to a pixel by controlling a state of electrical continuity of the wiring 3031 and one electrode of the liquid crystal element 3022, and can function as a switch. The capacitor 3023 has a function of keeping voltage applied to the liquid crystal element 3022 as a stable value by storing the potential difference between one electrode of the liquid crystal element 3022 and the wiring 3033, and functions as a storage capacitor. Note that this embodiment is not limned to this example.

Figure 33B:
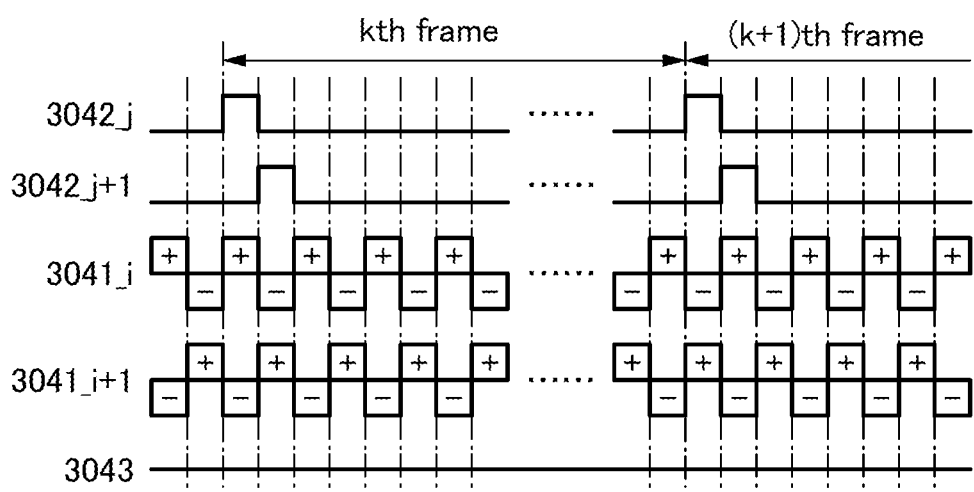

FIG. 33B shows an example of a timing chart for illustrating operation of the pixel in FIG. 33A. FIG. 33B illustrates a signal 3042_j (k is a natural number), a signal 3042_j+1, a signal 3041_i, a signal 3041_i+1, and a voltage 3043. In addition, FIG. 33B illustrates a kth (k is a natural number) frame and a (k+1)th frame. Note that the signal 3042_j+1, the signal 3042_i, tire signal 3041_j, the signal 3041_i+1, and the voltage 3043 are examples of a signal input to the wiring 3032 in a jth row, a signal input to the wiring 3032 in a (j+1)th row, a signal input to the wiring 303_1 in an ith column, a signal input to the wiring 303_1 in an (i+1)th column, and a voltage supplied to the wiring 3033, respectively.

Operation of the pixel 3020 in the jth row and the ith column is described. When the signal 3042_j is set at the H level, the transistor 3021 is turned on. Accordingly, since the wiring 303_1 in the t/th column and one electrode of the liquid crystal element 3022 are brought into electrical continuity, the signal 3041_j is input to one electrode of the liquid crystal element 3022 through the transistor 3021. Then, the capacitor 3023 keeps the potential difference between one electrode of the liquid crystal element 3022 and the wiring 3033. Thus, after that, a voltage applied to the liquid crystal element 3022 is constant until the signal 3042_j is set at the H level again. Then, the liquid crystal element 3022 expresses gray levels corresponding to the applied voltage.

Note that FIG. 33B illustrates an example of the case where a positive signal and a negative signal are alternately input to the wiring 3031 every one selection period. The positive signal is a signal whose potential is higher than a reference value (e.g., the potential of the electrode 3034). The negative signal is a signal whose potential is lower titan a reference value (e.g., the potential of the electrode 3034). However, this embodiment is not limited to this example, and signals with the same polarity can be input to the wiring 303_1 in one frame period.

Note that FIG. 33B illustrates an example of the case where the polarity of the signal 3041_i and the polarity of the signal 3041_i+1 are different from each other. However, this embodiment is not limited to this example. The polarity of the signal 3041_i and the polarity of the signal 3041_i+1 can be the same.

Figure 33C:
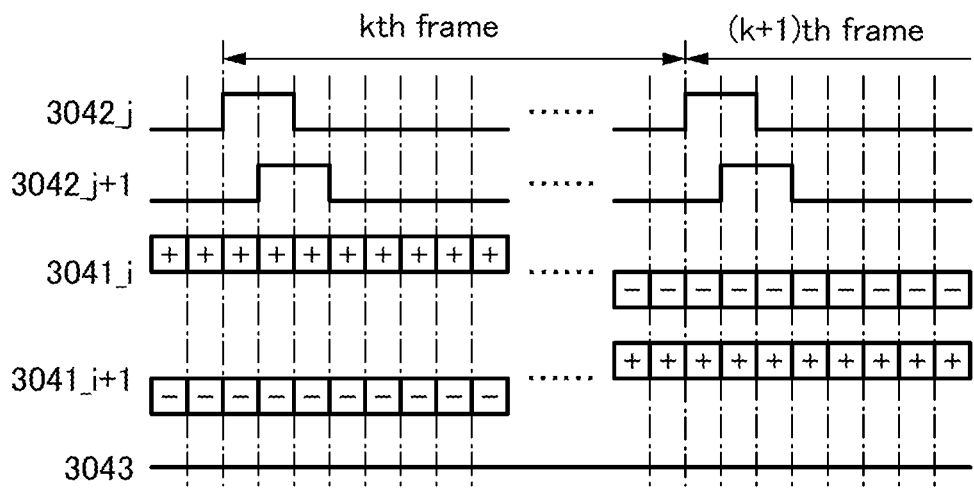

Note that FIG. 33B illustrates an example of the case where a period in which the signal 3042_j is at the H level and a period in which the signal 3042_j+1 is at the H level do not overlap with each other. However, this embodiment is not limited to this example. As shown in FIG. 33C, the period in which the signal 3042_j is at the H level and the period in which the signal 3042_j+1 is at the H level can overlap with each other. In that case, signals of the same polarity are preferably supplied to the wiring 3031 in one frame period. In this manner, pixels in a (j+1)th row can be precharged by using the signal 3041J_jwritten to pixels in the jth row. Accordingly, a writing time of a video signal to a pixel can be shortened. Therefore, a high-definition display device can be obtained. Alternatively, a display portion of the display device can be made large. Alternatively, since the signals of the same polarity are input to the wiring 3031 in one frame period, power consumption can be reduced.

Figure 34A:
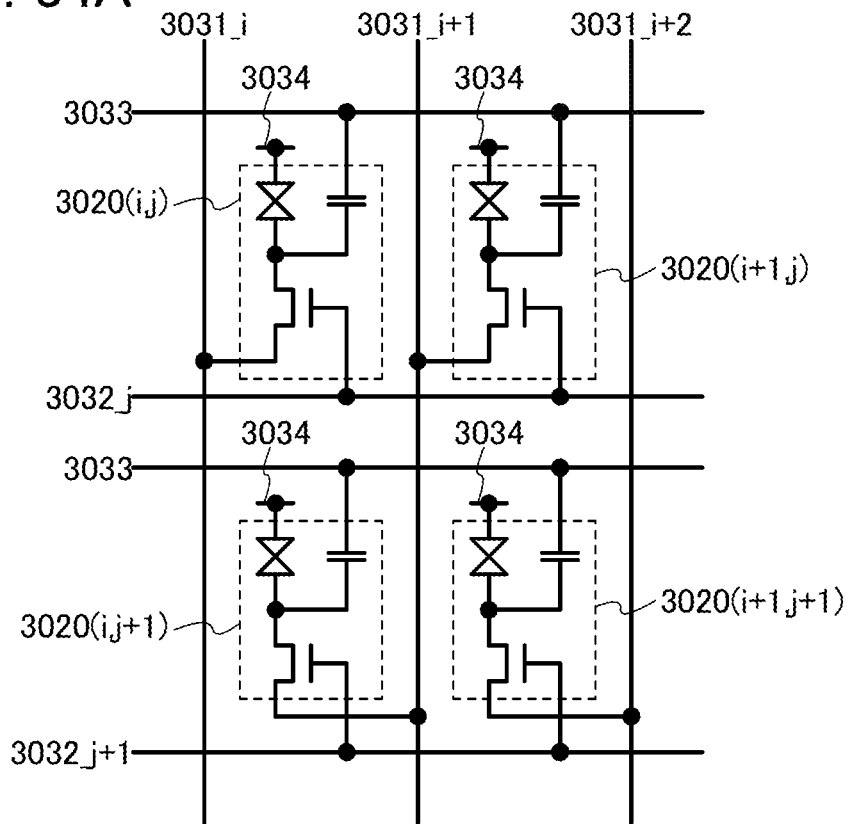
FIGS. 34A to 34C are examples of a circuit diagram of a pixel in Embodiment 7.

Note that by a combination of a pixel structure in FIG. 34A and the timing chart in FIG. 33C, dot inversion driving can be achieved. In the pixel structure in FIG. 34A, a pixel 3020(i, j) is connected to a wiring 3031_i. On the oilier hand, a pixel 3020(i, j+1) is connected to a wiring 3031_i. In other words, pixels in the ith column are alternately connected to the wiring 3031_i and the wiring 3031_i+1 row-by-row. In this manner, since a positive signal and a negative signal are alternately written to the pixels in the ith column row-by-row, dot inversion driving can be achieved. However, this embodiment is not limited to this example. The pixels, which are in the ith column, of every plural row s (e.g., two rows or three rows) can be alternately connected to the wiring 3031_i and the wiring 3031_i+1.

Figure 34B:
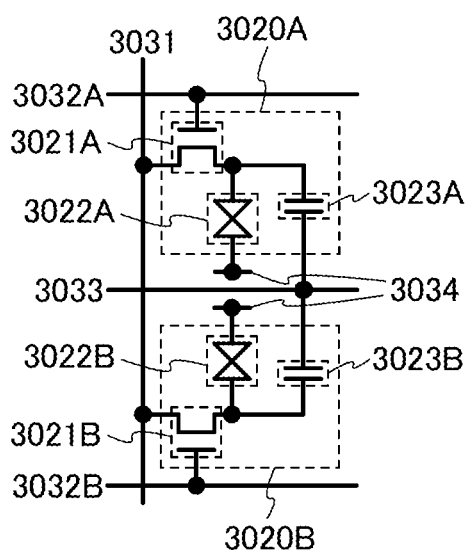
Figure 34C:
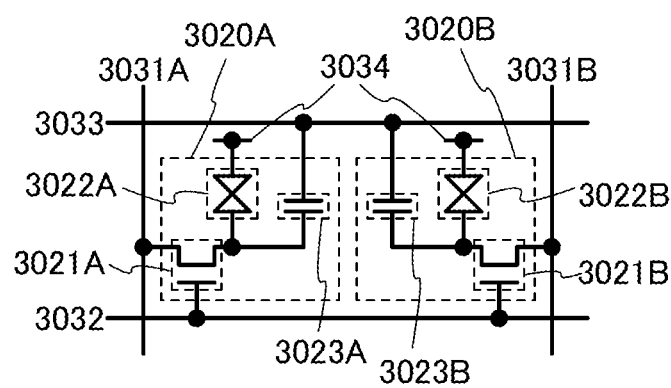

Note that a sub-pixel structure can be used as the pixel structure. FIGS. 34B and 34C each illustrate a structure of the case where a pixel is divided into two sub-pixels. FIG. 34B shows a sub-pixels structure called 1S+2G (for example, a structure in which one signal line and two scan lines are used for one sub-pixel), and FIG. 34C show's a sub-pixel structure called 2S+1G (for example, a structure in which two signal lines and one scan line are used for one sub-pixel). A sub-pixel 3020A and a sub-pixel 3020B correspond to the pixel 3020. A transistor 3021A and a transistor 3021B correspond to the transistor 3021. A liquid crystal element 3022A and a liquid crystal element 3022B correspond to the liquid crystal element 3022. A capacitor 3023A and a capacitor 3023B correspond to the capacitor 3023. A wiring 3031A and a wiring 3031B correspond to the wiring 3031. A wiring 3032A and a wiring 3032B correspond to the wiring 3032.

Here, by a combination of the pixel in this embodiment and any of the semiconductor devices, shift registers, display devices, and signal line driver circuits which are described in Embodiments 1 to 6, a variety of advantages can be obtained. For example, in the case where a sub-pixel structure is employed for the pixel, the number of signals required for driving a display device is increased Therefore, the number of gate signal lines or source signal lines is increased. As a result, the number of connections between a substrate over which a pixel portion is formed and an external circuit is greatly increased in some cases. However, even if the number of gate signal lines is increased, the scan line driver circuit can be formed over a substrate over which the pixel portion is formed, as described in Embodiment 7. Accordingly, the pixel with the sub-pixel structure can be used without greatly increasing the number of connections between the substrate over which the pixel portion is formed and the external circuit. Alternatively, even if die number of source signal lines is increased, the use of the signal line driver circuit in Embodiment 6 can reduce the number of source signal lines. Accordingly, the pixel with the sub-pixel structure can be used without greatly increasing the number of connections between the substrate over which the pixel portion is formed and the external circuit.

Alternatively, in the case where a signal is input to a capacitor line the number of connections between the substrate over which the pixel portion is formed and the external circuit is greatly increased in some cases. For that case, a signal can be supplied to the capacitor line by using any of the semiconductor device and the shift register in Embodiments 1 to 5. In addition, the semiconductor device or the shift register in Embodiments 1 to 5 can be formed over the substrate over which the pixel portion is formed. Accordingly, a signal can be input to the capacitor line without greatly increasing the number of connections between the substrate over which the pixel portion is formed and the external circuit.

Alternatively, in the case where alternate-current driving is employed, a time for writing a video signal to the pixel is short. As a result, shortage of the time for writing the video signal to the pixel is caused in some cases. Similarly, in the case where the pixel with the sub-pixel structure is used, the lime for writing the video signal to the pixel is short. Thus, shortage of the time for writing the video signal to the pixel is caused in some cases. For that case, the video signal can be written to the pixel by using the signal line driver circuit in Embodiment 6. In that case, since voltage for precharge is written to the pixel before the video signal is written to the pixel, the video signal can be written to the pixel in a short time. Alternatively, when a period in which one row is selected overlaps with a period in which a different row is selected as shown in FIG. 28B, a video signal for the different row can be used as the voltage for precharge.

Embodiment 8

In this embodiment, examples of a display device are described with reference to FIGS. 35A to 35C. Note that here, a liquid crystal display device is described as an example.

Figure 35A:
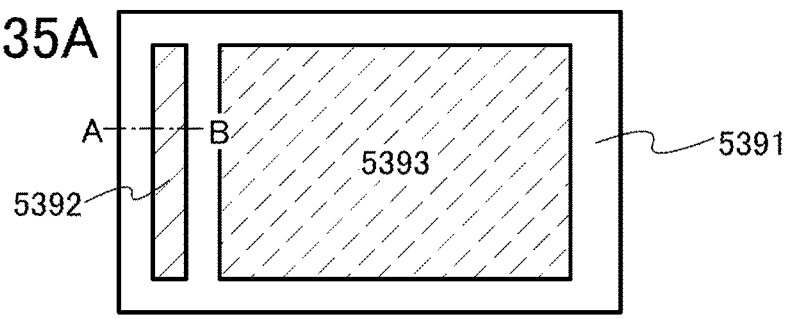
FIG. 35A is an example of a top view of a cross-sectional view of a display device in Embodiment 8 and FIGS. 35B and 35C are examples of a cross-sectional view of the display device in Embodiment 8.

FIG. 35A illustrates an example of a top view of a display device. A driver circuit 5392 and a pixel portion 5393 are formed over a substrate 5391. An example of the driver circuit 5392 is a scan line driver circuit, a signal line driver circuit, or the like. For example, in the case of the liquid crystal display device, the pixel portion 5393 includes a pixel and a voltage which is applied to a liquid crystal element in accordance with an output signal from the driver circuit 5392 is set to the pixel.

Figure 35B:
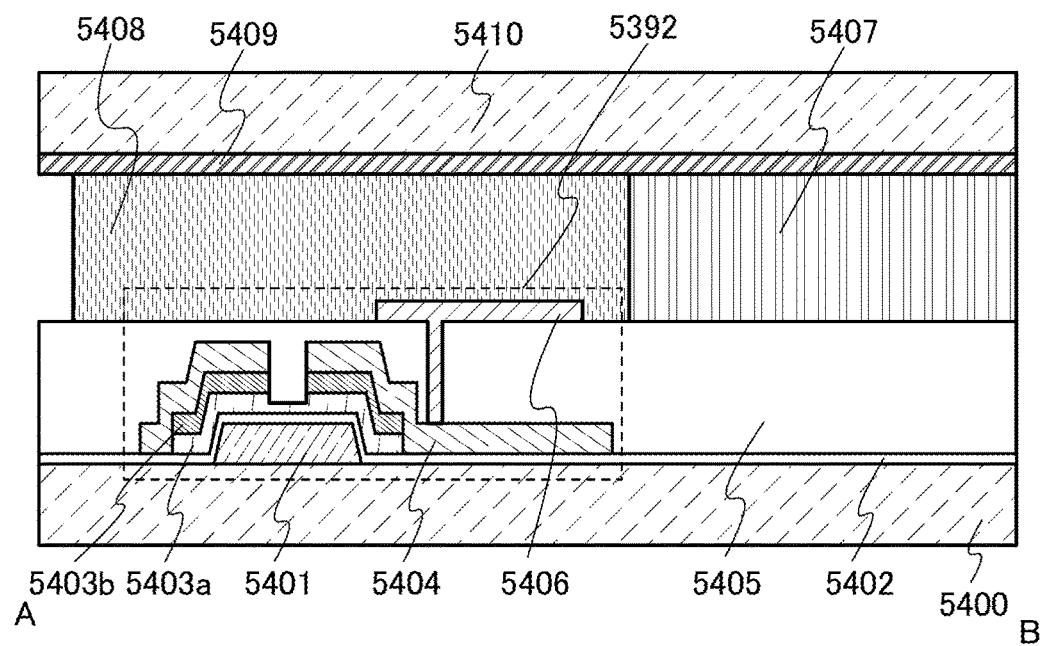

FIG. 35B illustrates an example of a cross section taken along line A B in FIG. 35A. FIG. 35B illustrates a substrate 5400, a conductive layer 5401 formed over the substrate 5400, an insulating layer 5402 formed so as to cover die conductive layer 5401, a semiconductor layer 5403a formed over the conductive layer 5401 and the insulating layer 5402, a semiconductor layer 5403b formed over die semiconductor layer 5403a, a conductive layer 5404 formed over the semiconductor layer 5403b and the insulating layer 5402, an insulating layer 5405 which is formed over the insulating layer 5402 and the conductive layer 5404 and is provided with an opening portion, a conductive layer 5406 formed over the insulating layer 5405 and in the opening portion in the insulating layer 5405, an insulating layer 5408 provided over the insulating layer 5405 and the conductive layer 5406, a liquid crystal layer 5407 formed over the insulating layer 5405, a conductive layer 5409 formed over the liquid crystal layer 5407 and the insulating layer 5408, and a substrate 5410 provided over the conductive layer 5409.

The conductive layer 5401 can serve as a gate electrode. The insulating layer 5402 can serve as a gate insulating film. The conductive layer 5404 can serve as a wiring, an electrode of a transistor, an electrode of a capacitor, or the like. The insulating layer 5405 can serve as an interlayer film or a planarization film. The conductive layer 5406 can serve as a wiring, a pixel electrode, or a reflective electrode. The insulating layer 5408 can serve as a sealant. The conductive layer 5400 can serve as a counter electrode or a common electrode.

Here, parasitic capacitance is generated between the driver circuit 5392 and the conductive layer 5409 in some cases. Accordingly, an output signal from the driver circuit 5392 or a potential of each node is distorted or delayed, or power consumption is increased. However, when the insulating layer 5408 which can serve as the sealant is formed over the driver circuit 5392 as shown in FIG. 24B, parasitic capacitance generated between the driver circuit 5392 and the conductive layer 5409 can be reduced. This is because the dielectric constant of the sealant is often lower than the dielectric constant of the liquid crystal layer. Therefore, distortion or delay of the output signal from the driver circuit 5392 or the potential of each node can be reduced. Alternatively, power consumption of the driver circuit 5392 can be reduced.

Figure 35C:
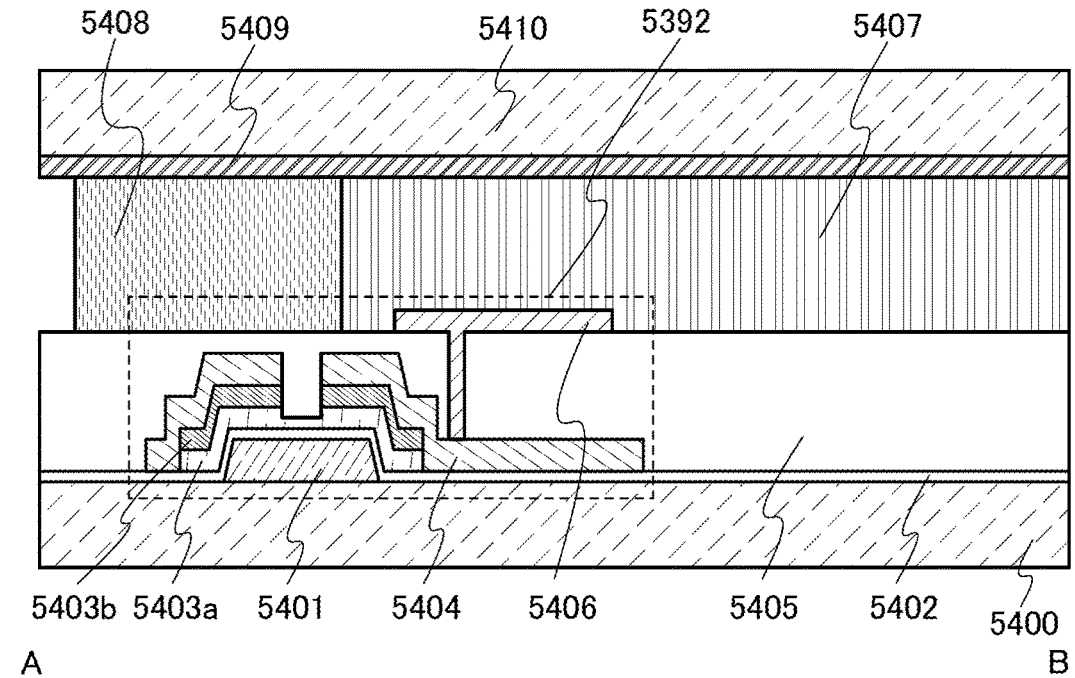

Note that as shown in FIG. 35C, the insulating layer 5408 which can serve as the sealant can be formed over part of the driver circuit 5392. Also in such a case, parasitic capacitance generated between the driver circuit 5392 and the conductive layer 5409 can be reduced. Thus, distortion or delay of the output signal from the driver circuit 5392 or the potential of each node can be reduced. Note that this embodiment is not limited to this. It is possible not to form the insulating layer 5408, which can serve as the sealant, over the driver circuit 5392.

Note that a display element is not limited to a liquid crystal element, and a variety of display elements such as an EL element or an electrophoretic element can be used.

As above, this embodiment describes one example of the cross-sectional structure of the display device. Such a structure can be combined with the semiconductor device or the shift register in Embodiments 1 to 4. For example, in the case where an amorphous semiconductor, a microcrystalline semiconductor, an organic semiconductor, an oxide semiconductor, or the like is used for a semiconductor layer of a transistor, the channel width of the transistor is increased in many cases. However, by reducing parasitic capacitance of the driver circuit as in this embodiment, the channel width of the transistor can be decreased. Thus, a layout area can be reduced, so that the frame of the display device can be reduced. Alternatively, the display device can have higher definition.

Embodiment 9

In this embodiment, examples of structures of transistors are described with reference to FIGS. 36A to 36C.

Figure 36A:
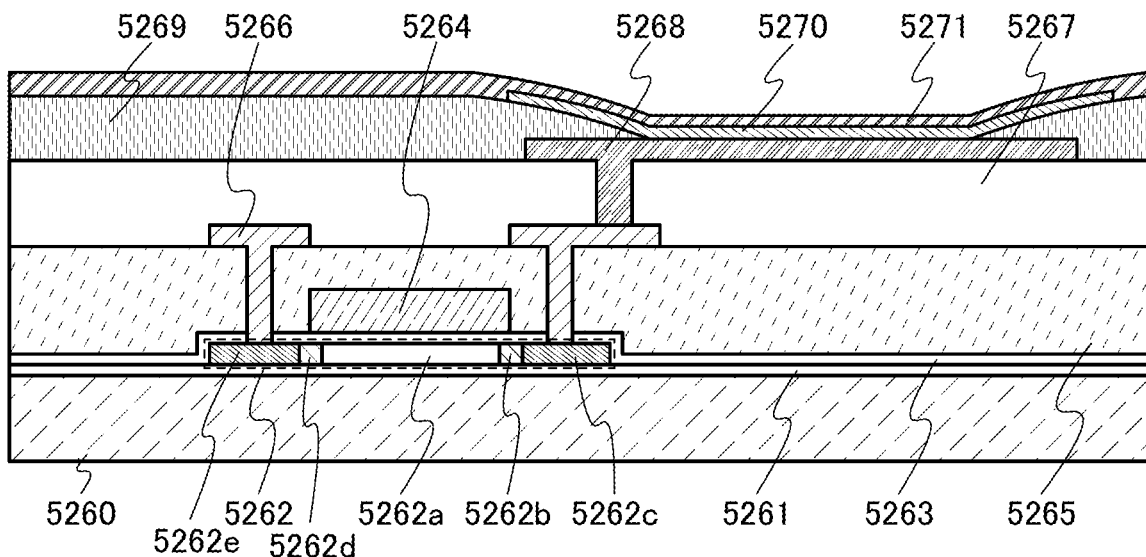
FIGS. 36A to 36C are examples of a cross-sectional view of a transistor in Embodiment 9.
Figure 36B:
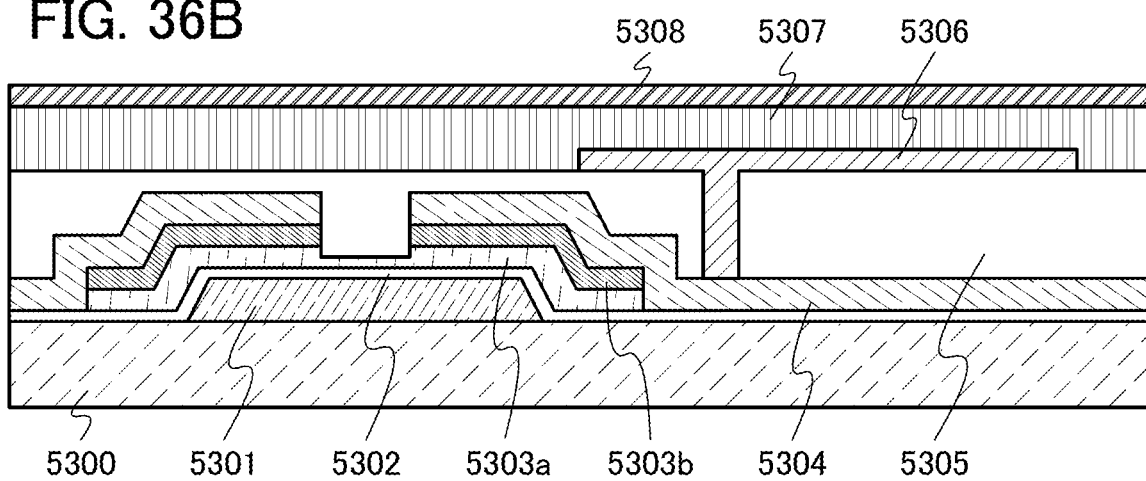

FIG. 36A illustrates an example of the structure of a display device or an example of the structure of a top-gate transistor FIG. 36B illustrates an example of the structure of a display device or an example of the structure of a bottom-gate transistor. FIG. 36C illustrates an example of the structure of a transistor formed using a semiconductor substrate.

The transistor in FIG. 36A includes a semiconductor layer 5262 which is formed over a substrate 5260 with an insulating layer 5261 interposed therebetween and is provided with a region 5262a, a region 5262b, a region 5262c, a region 5262d, and a region 5262e; an insulating layer 5263 formed so as to cover the semiconductor layer 5262; a conductive layer 5264 formed over the semiconductor layer 5262 and the insulating layer 5263; an insulating layer 5265 which is formed over the insulating layer 5263 and the conductive layer 5264 and is provided with openings; and a conductive layer 5266 which is formed over the insulating layer 5265 and in the openings formed in the insulating layer 5265.

An example of a transistor in FIG. 36B a conductive layer 5301 formed over a substrate 5300; an insulating layer 5302 formed so as to cover the conductive layer 5301; a semiconductor layer 5303a formed over the conductive layer 5301 and the insulating layer 5302; a semiconductor layer 5303b formed over the semiconductor layer 5303a; a conductive layer 5304 formed over the semiconductor layer 5303b and the insulating layer 5302; an insulating layer 5305 which is formed over the insulating layer 5302 and the conductive layer 5304 and is provided with an opening; and a conductive layer 5306 which is formed over the insulating layer 5305 and in the opening formed in the insulating layer 5305.

Figure 36C:
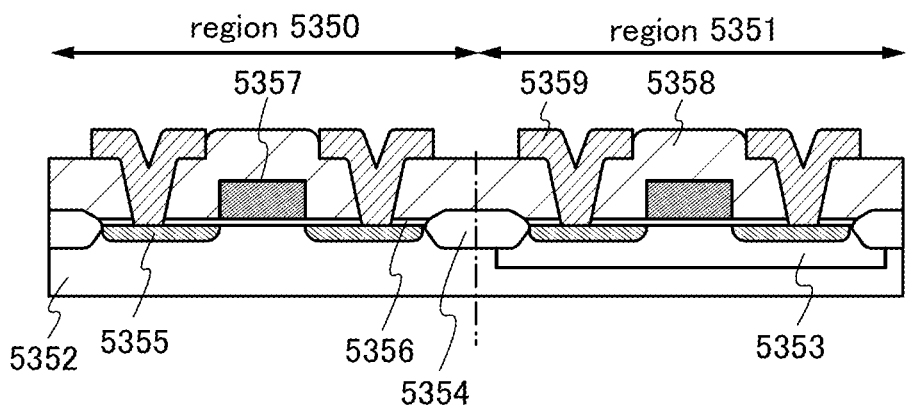

An example of a transistor in FIG. 36C includes a semiconductor substrate 5352 including a region 5353 and a region 5355; an insulating layer 5356 formed over the semiconductor substrate 5352; an insulating layer 5354 formed over the semiconductor substrate 5352; a conductive layer 5357 formed over the insulating layer 5356; an insulating layer 5358 which is formed over the insulating layer 5354, the insulating layer 5356, and the conductive layer 5357 and is provided with openings; and a conductive layer 5359 which is formed over the insulating layer 5358 and in the openings formed in the insulating layer 5358. Thus, a transistor is formed in each of a region 5350 and a region 5351.

Note that in the case where a display device is formed using the transistors illustrated in this embodiment, as shown in FIG. 36A, it is possible to form an insulating layer 5267 which is formed over the conductive layer 5266 and the insulating layer 5265 and is provided with an opening, a conductive layer 5268 which is formed over the insulating layer 5267 and in the opening formed in the insulating layer 5267; an insulating layer 5269 which is formed over the insulating layer 5267 and the conductive layer 5268 and is provided with the opening; a light-emitting layer 5270 which is formed over the insulating layer 5269 and in the opening formed in the insulating layer 5269; and a conductive layer 5271 formed over the insulating layer 5269 and the light-emitting layer 5270.

Note that as shown in FIG. 36A, it is possible to form a liquid crystal layer 5307 which is formed over the insulating layer 5305 and the conductive layer 5306 and a conductive layer 5308 which is formed over the liquid crystal layer 5307.

The insulating layer 5261 can serve as a base film. The insulating layer 5354 serves as an element isolation layer (e.g., a Held oxide film). Each of the insulating layer 5263, the insulating layer 5302, and the insulating layer 5356 can serve as a gate insulating film. Each of the conductive layer 5264, the conductive layer 5301, and the conductive layer 5357 can serve as a gate electrode. Each of the insulating layer 5265, the insulating layer 5267, the insulating layer 5305, and the insulating layer 5358 can serve as mi interlayer film or a planarization film. Each of the conductive layer 5266, the conductive layer 5304, and the conductive layer 5350 can serve as a wiring, an electrode of a transistor, an electrode of a capacitor, or the like. Each of the conductive layer 5268 and the conductive layer 5306 can serve as a pixel electrode, a reflective electrode, or the like. The insulating layer 5260 can serve as a partition wall. Each of the conductive layer 5271 and the conductive layer 5308 can serve as a counter electrode, a common electrode, or the like.

As each of the substrate 5260 and the substrate 5300, a glass substrate, a quartz substrate, a semiconductor substrate (e.g., a single crystal substrate such as a silicon substrate) or a single crystal substrate, an SOI substrate, a plastic substrate, a metal substrate, a stainless steel substrate, a substrate including stainless steel foil, a tungsten substrate, a substrate including tungsten foil, a flexible substrate, or the like can be used, for example. As a glass substrate, a barium borosilicate glass substrate, an aluminoborosilicate glass substrate, or the like can be used, for example. For a flexible substrate, a flexible synthetic resin such as plastics typified by polyethylene terephthalate (PET), polyethylene naphthalate (PEN), and polyether silicone (PES), or acrylic can be used, for example. Alternatively, an attachment film (formed using polypropylene, polyester, vinyl, polyvinyl fluoride, polyvinyl chloride, or the like), paper of a fibrous material, a base material film (formed using polyester, polyamide, polyimide, an inorganic vapor deposition film, paper, or the like), or lire like can be used.

As the semiconductor substrate 5352, for example, a single crystal silicon substrate having n-type or p-type conductivity can be used. For example, the region 5353 is a region where an impurity is added to the semiconductor substrate 5352 and serves as a well. For example, in the case where the semiconductor substrate 5352 has p-type conductivity, the region 5353 has n-type conductivity and serves as an n-well. On the other hand, in the case where die semiconductor substrate 5352 has n-type conductivity, the region 5353 has p-type conductivity and serves as a p-well. For example, the region 5355 is a region where an impurity is added to the semiconductor substrate 5352 and serves as a source region or a drain region. Note that an LDD region can be formed in the semiconductor substrate 5352.

For the insulating layer 5261, an insulating film containing oxygen or nitrogen, such as silicon oxide ($SiO_x$), silicon nitride ($SiN_x$), silicon oxynitride ($SiO_xN_y$) (x>y>0), or silicon nitride oxide ($SiN_xO_y$) (x>y>0) or a layered structure thereof can be used, for example. In an example in the case where the insulating film 5261 has a two-layer structure, a silicon nitride film and a silicon oxide film can be formed as a first insulating layer and a second insulating layer, respectively. In an example in the case where the insulating layer 5261 has a three-layer structure, a silicon oxide film, a silicon nitride film, and a silicon oxide film can be formed as a first insulating layer, a second insulating layer, and a third insulating layer, respectively.

For each of the semiconductor layer 5262, the semiconductor layer 5303a, and the semiconductor layer 5303b, for example, a non-single-crystal semiconductor (e.g., amorphous silicon, polycrystalline silicon, or microcrystalline silicon), a single crystal semiconductor, a compound semiconductor or an oxide semiconductor (e.g., ZnO, InGaZnO, SiGe, GaAs, IZO, ITO, SnO, AZTO, an organic semiconductor, or a carbon nanotube), or the like can be used.

Note that for example, the region 5262a is an intrinsic region where an impurity is not added to the semiconductor layer 5262 and serves as a channel region. However, an impurity can be added to the region 5262a. The concentration of the impurity added to the region 5262a is preferably lower than the concentration of an impurity added to the region 5262b, the region 5262c, the region 5262d, or the region 5262e. Each of the region 5262b and the region 5262d is a region to which an impurity is added at lower concentration as compared to the region 5262c or the region 5262e and serves as an LDD region. Note that the region 5262b and the region 5262d can be eliminated. Each of the region 5262c and die region 5262e is a region to which an impurity is added at high concentration and serves as a source region or a drain region.

Note that the semiconductor layer 5303b is a semiconductor layer to which phosphorus or the like is added as an impurity element and has n-type conductivity.

Note that in the case where an oxide semiconductor or a compound semiconductor is used for the semiconductor layer 5303a, the semiconductor layer 5303b can be eliminated.

For each of the insulating layer 5263, the insulating layer 5302, and the insulating layer 5356, a film containing oxygen or nitrogen, such as silicon oxide ($SiO_x$) silicon nitride ($SiN_x$), silicon oxynitride ($SiO_xN_y$) (x>y>0), or silicon nitride oxide ($SiN_xO_y$) (x>y>0) or a layered structure thereof can be used, for example.

As each of the conductive layer 5264, the conductive layer 5266, the conductive layer 5268, the conductive layer 5271, the conductive layer 5301, the conductive layer 5304, the conductive layer 5306, the conductive layer 5308, the conductive layer 5357, and the conductive layer 5359, a conductive film having a single-layer structure or a layered structure, or the like can be used. For example, for the conductive film, a single-layer film containing one element selected from the group consisting of aluminum (Al), tantalum (Ta), titanium (Ti), molybdenum (Mo), tungsten (W), neodymium (Nd), chromium (Cr), nickel (Mi), platinum (Pt), gold (Au), silver (Ag), copper (Cu), manganese (Mn), cobalt (Co), niobium (Nb), silicon (Si), iron (Fe), palladium (Pd), carbon (C), scandium (Sc), zinc (Zn), gallium (Ga), indium (In), tin (Sn), zirconium (Zr), and cerium (Ce); a compound containing one or more elements selected from the above group; or the like can be used. Note that the single film or the compound can contain phosphorus (P), boron (B), arsenic (As), and/or oxygen (O). For example, the compound is an alloy containing one or more elements selected from the above plurality of elements (e.g., an alloy material such as indium tin oxide (ITO), indium zinc oxide (JZO), indium tin oxide containing silicon oxide (ITSO), zinc oxide (ZnO), tin oxide (SnO), cadmium tin oxide (CTO), aluminum-neodymium (Al—Nd), aluminum-tungsten (Al—W), aluminum-zirconium (Al—Zr), aluminum titanium (Al—Ti), aluminum-cerium (Al—Ce), magnesium-silver (Mg—Ag), molybdenum-niobium (Mo—Nb), molybdenum-tungsten (Mo—W), or molybdenum-tantalum (Mo—Ta)); a compound containing nitrogen and one or more elements selected from the above plurality of elements (e.g., a nitride film containing titanium nitride, tantalum nitride, molybdenum nitride, or the like); or a compound containing silicon and one or more elements selected from the above plurality of elements (e.g., a silicide film containing tungsten silicide, titanium silicide, nickel silicide, aluminum silicon, or molybdenum silicon); or the like. Alternatively, a nanotube material such as a carbon nanotube, an organic nanotube, an inorganic nanotube, or a metal nanotube can be used, for example.

For each of the insulating layer 5265, the insulating layer 5267, the insulating layer 5269, the insulating layer 5305, and the insulating layer 5358, an insulating layer having a single-layer structure or a layered structure, or the like can be used, for example. For example, as the insulating layer, a film containing oxygen or nitrogen, such as silicon oxide ($SiO_x$), silicon nitride ($SiN_y$), silicon oxynitride ($SiO_xN_y$) (x>y>0), or silicon nitride oxide ($SiN_xO_y$) (x>y>0); a film containing carbon such as diamond-like carbon (DLC); an organic material such as a siloxane resin, epoxy, polyimide, polyamide, polyvinyl phenol, benzocyclobutene, or acrylic; or the like can be used.

For the light-emitting layer 5270, an organic EL element, an inorganic EL element, or the like can be used, for example. For the organic EL element, for example, a single-layer structure or a layered structure of a hole injection layer formed using a hole injection material, a hole transport layer formed using a hole transport material, a light-emitting layer formed using a light-emitting material, an electron transport layer formed using an electron transport material, an electron injection layer formed using an electron injection material, or a layer in which a plurality of these materials are mixed can be used.

As an example of liquid crystal layer 5307 or an example of materials which can be applied to the liquid crystal layer 5307, the following liquid crystals can be used: a nematic liquid crystal, a cholesteric liquid crystal, a smectic liquid crystal, a discotic liquid crystal, a thermotropic liquid crystal, a lyotropic liquid crystal, a low molecular liquid crystal, a high molecular liquid crystal, a PDLC (polymer dispersed liquid crystal), a ferroelectric liquid crystal, an anti-ferroelectric liquid crystal, a mam chain type liquid crystal, a side chain type polymer liquid crystal, a plasma addressed liquid crystal (PALC), or a banana-shaped liquid crystal. As an example of a liquid crystal mode which can be applied to a liquid crystal element including the liquid crystal layer 5307, the following liquid crystal mode can be employed: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an A FLC (anti-ferroelectric liquid crystal) mode, a PDLC (polymer dispersed liquid crystal) mode, a guest-host mode, and a blue-phase mode.

Note that an insulating layer which serves as an alignment film, an insulating layer which serves as a protrusion portion, or the like can be formed over the insulating layer 5305 and the conductive layer 5306.

Note that an insulating layer or the like which serves as a color filter, a black matrix, or a protrusion portion can be formed over the conductive layer 5308. An insulating layer which serves as an alignment film can be formed below the conductive layer 5308.

The transistor in this embodiment can be applied to Embodiments 1 to 8, Specifically, in the case where an amorphous semiconductor, a microcrystalline semiconductor, an organic semiconductor, an oxide semiconductor, or the like is used for the semiconductor layer in FIG. 36B, the transistor deteriorates in some cases. Therefore, if the transistor in this embodiment is used for a semiconductor device, a shift register or a display device, the lifetime of the semiconductor device, the shift register, or the display device becomes shorter. However, deterioration of the transistor in the semiconductor device, the shift register, or the display device in Embodiments 1 to 8 can be suppressed. Therefore, by application of the transistor in this embodiment to the semiconductor device, the shift register, or the display device in Embodiments 1 to 8, the lifetime thereof can be made longer.

Embodiment 10

In this embodiment, an example of a manufacturing process of a transistor and a capacitor is described. In particular, a manufacturing process in the case where an oxide semiconductor is used for a semiconductor layer is described.

Figure 37A:
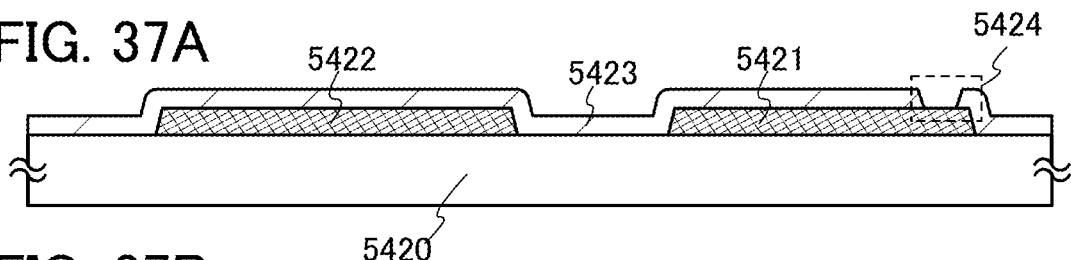
FIGS. 37A to 37E are examples of a cross-sectional view for illustrating manufacturing steps of a transistor in Embodiment 10.
Figure 37B:
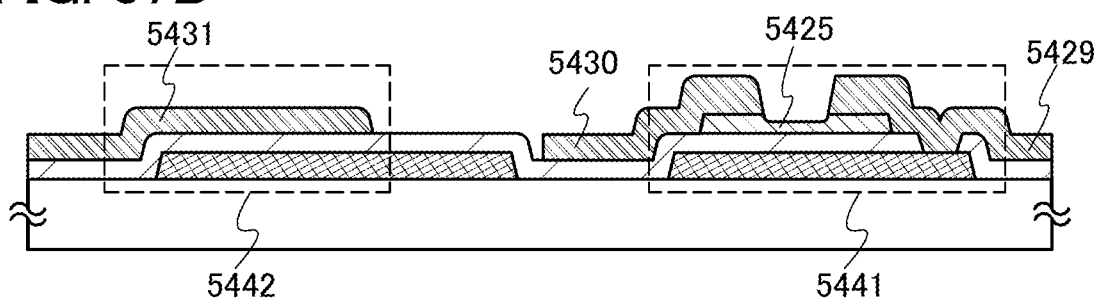
Figure 37C:
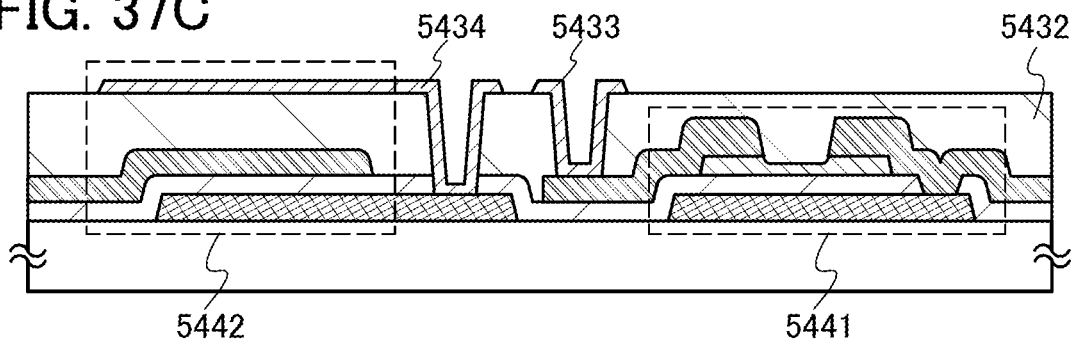

An example of a manufacturing process of a transistor and a capacitor is described with reference to FIGS. 37A to 37C. FIGS. 37A to 37C illustrate an example of a manufacturing process of a transistor 5441 and a capacitor 5442. The transistor 5441 is an example of an inverted staggered thin film transistor, in which a wiring is provided over an oxide semiconductor layer with a source electrode or a drain electrode therebetween.

First, a first conductive layer is formed over tire entire surface of a substrate 5420 by sputtering. Next, the first conductive layer is selectively etched with the use of a resist mask formed through a photolithography process using a first photomask, so that a conductive layer 5421 and a conductive layer 5422 are formed. The conductive layer 5421 can serve as a gate electrode. The conductive layer 5422 can serve as one of electrodes of the capacitor. Note that this embodiment is not limited to this, and each of the conductive layers 5421 and 5422 can include a portion serving as a wiring, a gate electrode, or an electrode of the capacitor. After that, the resist mask is removed.

Next an insulating layer 5423 is formed over the entire surface by plasma-enhanced CVD or sputtering. The insulating layer 5423 can serve as a gate insulating layer and is formed so as to cover the conductive layers 5421 and 5422. Note that the thickness of the insulating layer 5423 is often 50 to 250 nm.

Next, the insulating layer 5423 is selectively etched with the use of a resist mask formed through a photolithography process using a second photomask, so that a contact hole 5424 which reaches the conductive layer 5421 is formed. Then, the resist mask is removed. Note that this embodiment is not limited to this, and the contact hole 5424 can be eliminated. Alternatively, the contact hole 5424 can be formed after an oxide semiconductor layer is formed. A cross-sectional view of the steps so far corresponds to FIG. 37A.

Next, an oxide semiconductor layer is formed over the entire surface by sputtering Note that this embodiment is not limited to this, and it is possible to form the oxide semiconductor layer by sputtering and to form a buffer layer (e.g., an n$^+$ layer) thereover. Note that the thickness of the oxide semiconductor layer is often 5 to 200 nm.

Next, the oxide semiconductor layer is selectively etched with the use of a resist mask formed through a photolithography process using a third photomask. After that, the resist mask is removed.

Next, a second conductive layer is formed over the entire surface by sputtering. Then, the second conductive layer is selectively etched with the use of a resist mask formed through a photolithography process using a fourth photomask, so that a conductive layer 5429, a conductive layer 5430, and a conductive layer 5431 are formed. The conductive layer 5429 is connected to the conductive layer 5421 through the contact hole 5424. The conductive layers 5429 and 5430 can serve as the source electrode and the drain electrode. The conductive layer 5431 can serve as die other of die electrodes of the capacitor. Note that this embodiment is not limited to this, and each of the conductive layers 5429, 5430, and 5431 can include a portion serving as a wiring, the source electrode, the drain electrode, or the electrode of the capacitor.

Note that if heat treatment (e.g., at 200° C. to 600° C.) is performed in a subsequent step, the second conductive layer preferably has heat resistance high enough to withstand the heat treatment. Accordingly, for the second conductive layer, Al and a conductive material with a high heat resistance (e.g., an element such as Ti, Ta, W, Mo, Cr, Nd, Sc, Zr, or Ce; an alloy in which these elements are combined; or nitride containing any of these elements) are preferably used in combination. Note that this embodiment is not limited thereto, and by employing a layered structure, the second conductive layer can have a high heat resistance. For example, it is possible to provide a conductive material with a high heat resistance such as Ti or Mo above and below an A1 film.

Note that at the time of etching the second conductive layer, part of the oxide semiconductor layer is also etched, so that an oxide semiconductor layer 5425 is formed. By this etching, part of the oxide semiconductor layer 5425, which overlaps with the conductive layer 5421, or part of the oxide semiconductor layer 5425, over which the second conductive layer is not formed, is etched to be thinned in many cases. Note that this embodiment is not limited thereto, and it is possible not to etch the oxide semiconductor layer 5425. However, in the case where the n⁺ layer is formed over the oxide semiconductor layer 5425, the oxide semiconductor layer 5425 is often etched. Then, the resist mask is removed. The transistor 5441 and the capacitor 5442 are completed when this etching is finished. A cross-sectional view of the steps so for corresponds to FIG. 37B.

Next, heat treatment is performed at 200 to 600° C. in an air atmosphere or a nitrogen atmosphere. Through this heat treatment, rearrangement at the atomic level occurs in the oxide semiconductor layer 5425. In this manner, through heat treatment (including light annealing), strain which inhibits carrier movement is released. Note that there is no particular limitation to timing at which the heat treatment is performed, and the heat treatment can be performed at any time after the oxide semiconductor layer is formed.

Next, an insulating layer 5432 is formed over the entire surface. The insulating layer 5432 can have either a single-layer structure or a layered structure. For example, in the case where an organic insulating layer is used as the insulating layer 5432, the organic insulating layer is formed in such a manner that a composition which is a material for the organic insulating layer is applied and subjected to heal treatment at 200 to 600° C. in an air atmosphere or a nitrogen atmosphere. By forming the organic insulating layer which is in contact with the oxide semiconductor layer 5425 in this manner, a highly reliable thin film transistor can be manufactured. Note that in the case where an organic insulating layer is used as the insulating layer 5432, a silicon nitride film or a silicon oxide film can be provided below the organic insulating layer.

FIG. 37C illustrates a mode in which the insulating layer 5432 is formed using a non-photosensitive resin, so that an end portion of the insulating layer 5432 is angular in the cross section of a region where the contact hole is formed. However, when the insulating layer 5432 is formed using a photosensitive resin, the end portion of the insulating layer 5432 can be curved in the cross section of the region where the contact hole is formed. Thus, the coverage of the insulating layer 5432 with a third conductive layer or a pixel electrode which is formed later is increased.

Note that instead of application of the composition, the following method can be used depending on the material: dip coating, spray coating, an ink-jet method, a printing method, a doctor knife, a roll coater, a curtain in coaler, a knife coaler, or the like.

Note that without performing the heat treatment after the oxide semiconductor layer is formed, the heat treatment for the composition, which is the material for the organic insulating layer, can also serve to heat the oxide semiconductor layer 5425.

Note that the insulating layer 5432 can be formed to a thickness of 200 nm to 5 μm, preferably 300 nm to 1 μm.

Next, a third conductive layer is formed over the entire surface. Then, the third conductive layer is selectively etched with the use of a resist mask formed through a photolithography process using a fifth photomask, so that a conductive layer 5433 and a conductive layer 5434 are formed. A cross-sectional view of the steps so far corresponds to FIG. 37C. Each of the conductive layers 5433 and 5434 can serve as a wiring, a pixel electrode, a reflective electrode, a light-transmitting electrode, or the electrode of the capacitor. In particular, since the conductive layer 5434 is connected to the conductive layer 5422, the conductive layer 5434 can serve as the electrode of the capacitor 5442. Note that this embodiment is not limited to this, and the conductive layers 5433 and 5434 can have a function of connecting a conductive layer formed using the first conductive layer and a conductive layer formed using the second conductive layer to each other. For example, by connecting the conductive layers 5433 and 5434 to each other, the conductive layer 5422 and the conductive layer 5430 can be connected to each other through the third conductive layer (the conductive layers 5433 and 5434).

Since the capacitor 5442 has a structure where the conductive layer 5431 is sandwiched between the conductive layers 5422 and 5434, the capacitance value of the capacitor 5442 can be increased. Note that this embodiment is not limited thereto, and one of the conductive layers 5422 and 5434 can be eliminated.

Note that after the resist mask is removed by wet etching, it is possible to perform heat treatment at 200° C. to 600° C. in an air atmosphere or a nitrogen atmosphere.

Through the above steps, the transistor 5441 and the capacitor 5442 can be manufactured.

Figure 37D:
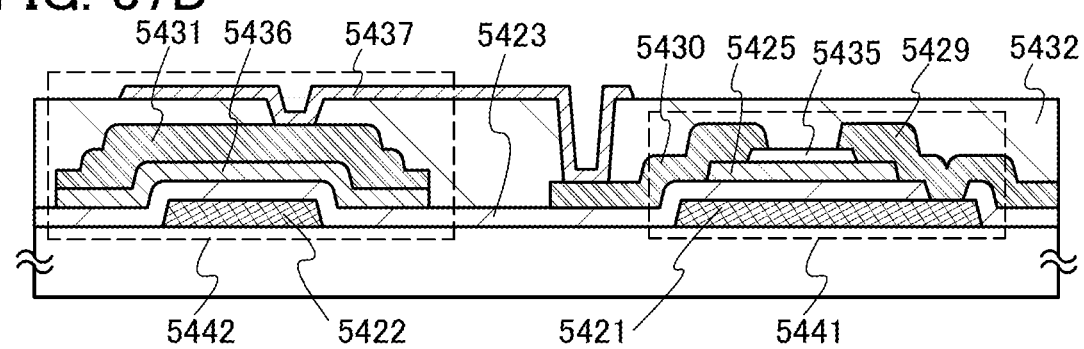

Note that as shown in FIG. 37D, an insulating layer 5435 can be formed over die oxide semiconductor layer 5425. The insulating layer 5435 has a function of preventing the oxide semiconductor layer 5425 from being etched when the second conductive layer is patterned, and functions as a channel slop film. Accordingly, the thickness of the oxide semiconductor layer 5425 can be reduced, so that reduction in driving voltage, reduction in off-state current, increase m the on/off ratio of dram current, improvement in subthreshold swing (S value), or the like of the transistor can be achieved. The insulating layer 5435 can be formed in such a manner that an oxide semiconductor layer and an insulating layer are successively formed over the entire surface, and then, the insulating layer is selectively patterned using a resist mask formed through a photolithography process using a photomask. After that, the second conductive layer is formed over the entire surface, and the oxide semiconductor layer is patterned at the same time as the second conductive layer. That is, the oxide semiconductor layer and the second conductive layer can be patterned using the same mask (reticle) In that case, the oxide semiconductor layer is always placed below the second conductive layer. In such a manner, the insulating layer 5435 can be formed without increase in the number of steps. The oxide semiconductor layer is often formed below the second conductive layer in such a manufacturing process. However, this embodiment is not limited thereto. The insulating layer 5435 can be formed in such a manner that after an oxide semiconductor layer is patterned, an insulating layer is formed over the entire surface and is patterned.

In FIG. 37D, the capacitor 5442 has a structure where the insulating layer 5423 and an oxide semiconductor layer 5436 are sandwiched between the conductive layers 5422 and 5431. Note that the oxide semiconductor layer 5436 can be eliminated. Moreover, the conductive layers 5430 and 5431 are connected through a conductive layer 5437 which is formed by patterning the third conductive layer. Such a structure can be used for a pixel of a liquid crystal display device, for example. For example, the transistor 5441 can function as a switching transistor, and the capacitor 5442 can function as a storage capacitor. Moreover, the conductive layers 5421, 5422, 5429, and 5437 can function as a gate line, a capacitor line, a source line, and a pixel electrode, respectively. However, this embodiment is not limited to this. In addition, as in FIG. 37D, the conductive layer 5430 and the conductive layer 5431 can be connected through the third conductive layer in FIG. 37C.

Figure 37E:
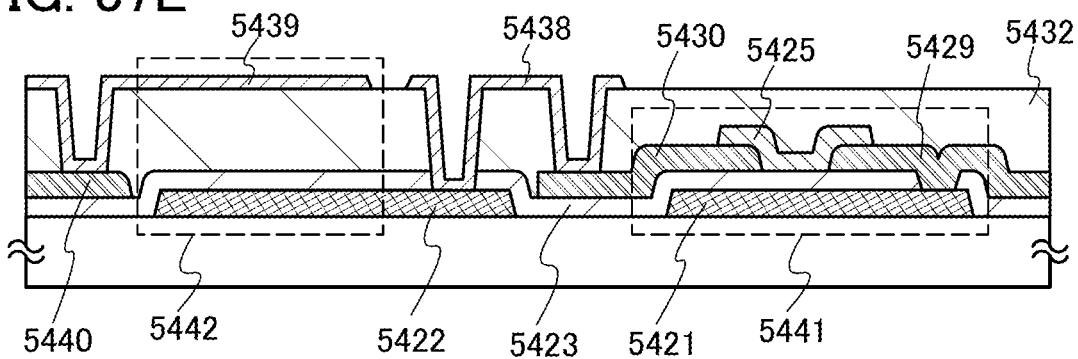

Note that as shown in FIG. 37E, the oxide semiconductor layer 5425 can be formed after the second conductive layer is patterned. Accordingly, the oxide semiconductor layer 5425 is not yet formed when the second conductive layer is patterned, so that the oxide semiconductor layer 5425 is not etched. Accordingly, the thickness of the oxide semiconductor layer 5425 can be reduced, so that reduction in driving voltage, reduction in off-state current, increase in the on/off ratio of drain current, improvement in subthreshold swing (S value), or the like of the transistor can be achieved. Note that the oxide semiconductor layer 5425 can be formed in such a manner that after the second conductive layer is patterned, an oxide semiconductor layer 5425 is formed over the entire surface and selectively patterned using a resist mask formed through a photolithography process using a photomask.

In FIG. 37E, the capacitor 5442 has a structure where the insulating layers 5423 and 5432 are sandwiched between the conductive layer 5422 and a conductive layer 5439 which is formed by patterning the third conductive layer. Moreover, the conductive layers 5422 and 5430 are connected through a conductive layer 5438 which is formed by patterning the third conductive layer. Further, the conductive layer 5439 is connected to a conductive layer 5440 which is formed by patterning the second conductive layer. In addition, as in FIG. 37E, the conductive layers 5430 and 5422 can be connected through the conductive layer 5438 in FIGS. 37C and 37D.

Note that a complete depletion slate can be obtained by making the thickness of the oxide semiconductor layer (or a channel layer) smaller than or equal to that of a depletion layer formed in the case where tire transistor is off. Accordingly, the off-state current can be reduced. In order to achieve this, the thickness of the oxide semiconductor layer 5425 is preferably less than or equal to 20 nm. It is more preferable that the thickness of the oxide semiconductor layer 5425 be less titan or equal to 10 nm. It is further preferable that the thickness of the oxide semiconductor layer 5425 be less titan or equal to 6 nm.

Note that in order to realize reduction in operation voltage, reduction in off-state current, increase in the on/off ratio of drain current, improvement in S value, or the like of the transistor, the thickness of the oxide semiconductor layer is preferably the smallest among those of the layers included in the transistor. For example, the thickness of the oxide semiconductor layer is preferably smaller than that of the insulating layer 5423. It is more preferable that live thickness of the oxide semiconductor layer be less than or equal to ½ of lire thickness of the insulating layer 5423. It is further preferable that the thickness of the oxide semiconductor layer be less than or equal to ⅕ of the thickness of die insulating layer 5423. It is further preferable that the thickness of the oxide semiconductor layer be less than or equal to ¹⁄₁₀ of the thickness of the insulating layer 5423. Note that this embodiment is not limited thereto, and the thickness of the oxide semiconductor layer can be larger than that of the insulating layer 5423 in order to improve the reliability. Since the thickness of the oxide semiconductor layer is preferably larger particularly in the case where the oxide semiconductor layer is etched as in FIG. 37C, it is possible to make the thickness of the oxide semiconductor Layer larger than that of the insulating layer 5423.

Note that the thickness of the insulating layer 5423 is preferably larger than that of the first conductive layer in order to increase the withstand voltage of the transistor. It is more preferable that the thickness of the oxide semiconductor layer 5423 be more than or equal to ⅝ of the thickness of the insulating layer 5423. It is further preferable that the thickness of the oxide semiconductor layer 5423 be more than or equal to ⅔ of the thickness of the insulating layer 5423. Note that this embodiment is not limited thereto, and the thickness of the insulating layer 5423 can be smaller than that of die first conductive layer in order to increase the mobility of the transistor.

Note that for the substrate, the insulating layer, the conductive layer, and the semiconductor layer in this embodiment, the materials described in the other embodiments or materials which are similar to those described in this specification can be used.

When the transistor in this embodiment is used in any of the semiconductor devices, shift registers, or display devices in Embodiments 1 to 8, die size of a display portion can lie increased. Alternatively, the display portion can have higher definition.

Embodiment 11

In this embodiment, a layout view (hereinafter also referred to as a lop view) of a shift register will be described. In this embodiment, as an example, a layout view of the shift register described in Embodiment 4 will be described. Note that a content described in this embodiment can be applied to any of the semiconductor devices, shift registers, or display devices in Embodiments 1 to 7 in addition to the shift register in Embodiment 4. Note that the layout view in this embodiment is one example and does not limit this embodiment.

Figure 38:
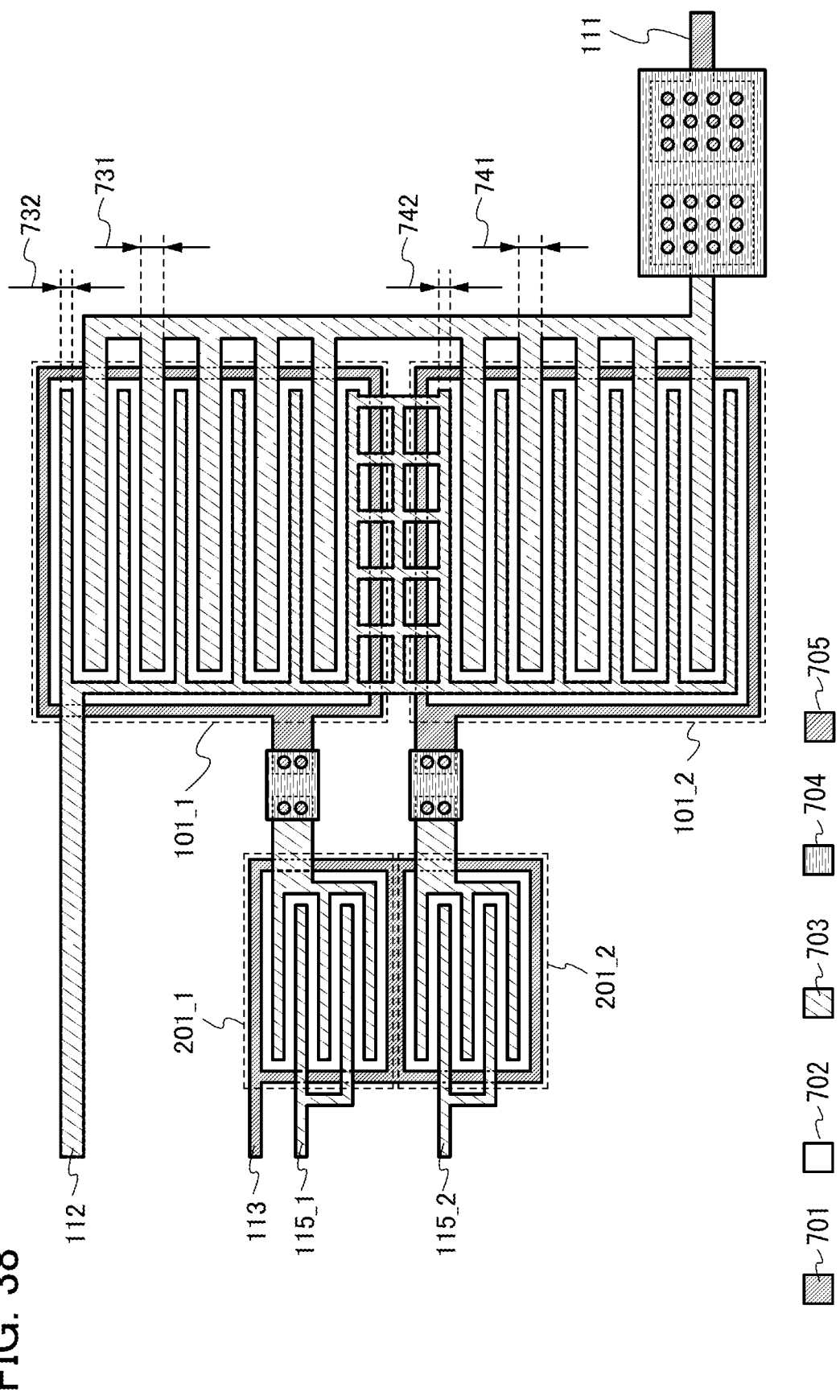
FIG. 38 is an example of a layout view of a semiconductor device in Embodiment 11.

The layout view in this embodiment is described with reference to FIG. 38. FIG. 38 illustrates an example of a layout view of FIG. 5A. Note that a hatching pattern on the right portion of FIG. 38 is a hatching pattern of component elements of reference numerals given to each hatching pattern.

A transistor, a wiring, and the like illustrated in FIG. 38 include a conductive layer 701, a semiconductor layer 702, a conductive layer 703, a conductive layer 704, and a contact hole 705. Note that this embodiment is not limited thereto A different conductive layer, insulating film, or contact hole can be additionally formed. For example, a contact hole which connects the conductive layer 701 to the conductive layer 703 can be additionally provided.

The conductive layer 701 can include a portion which functions as a gate electrode or a wiring. The semiconductor layer 702 can include a portion which functions as a semiconductor layer of a transistor. The conductive layer 703 can include a portion which functions as a wiring or a source electrode or drain electrode. The conductive layer 704 can include a portion which functions as an electrode having a light-transmitting properly, a pixel electrode, or a wiring. The contact hole 705 has a function of connecting the conductive layer 701 and the conductive layer 704 or a function of connecting the conductive layer 703 and the conductive layer 704.

In this embodiment, in any of the transistor 101_1, the transistor 101_2, the transistor 201_1, and the transistor 202_2, the area where the part of the conductive layer 703 which functions as a second terminal and the conductive layer 701 overlap is preferably smaller than the area where the part of the conductive layer 703 which functions as a first terminal and the conductive layer 701 overlap. In this manner, since concentration of an electric field on the second terminal can be suppressed, deterioration of the transistor or the breakdown of the transistor can be suppressed. However, this embodiment is not limited to this example. The area where the part of the conductive layer 703 which functions as the second terminal and the conductive layer 701 overlap can be larger than the area where the part of the conductive layer 703 which functions as the first terminal and die conductive layer 701 overlap.

Note that the semiconductor layer 702 can be provided in a portion where the conductive layer 701 and the conductive layer 703 overlap with each other. Accordingly, the parasitic capacitance between the conductive layer 701 and the conductive layer 703 can be reduced, whereby reduction in noise can be achieved. For a similar reason, the semiconductor layer 702 can be provided in a portion where the conductive layer 703 and the conductive layer 704 overlap with each other.

Note that tire conductive layer 704 can be formed over part of the conductive layer 701 and can be connected to the conductive layer 701 through the contact hole 705. Accordingly, wiring resistance can be reduced. Alternatively, the conductive layers 703 and 704 can be formed over part of the conductive layer 701, so that the conductive layer 701 can be connected to the conductive layer 704 through the contact hole 705 and the conductive layer 703 can be connected to the conductive layer 704 through the different contact hole 705. Accordingly, wiring resistance can be reduced.

Note that the conductive layer 704 can be formed over part of the conductive layer 703, so that the conductive layer 703 can be connected to die conductive layer 704 through the contact hole 705. Accordingly, wiring resistance can be reduced.

Note that the conductive layer 701 or the conductive layer 703 can be formed below part of the conductive layer 704, so that the conductive layer 704 can be connected to the conductive layer 701 or the conductive layer 703 through the contact hole 705. Accordingly, wiring resistance can be reduced.

Note that as has been described above, the parasitic capacitance between the gale and the second terminal of the transistor 101_1 can be higher than the parasitic capacitance between the gate and the first terminal of the transistor 101_1. As shown in FIG. 38, the width of the conductive layer 703 which can function as the first terminal of the transistor 101_1 is referred to as width 731, and the width of the conductive layer 703 which can function as the second terminal of the transistor 101_1 is referred to as width 732. The width 731 can be larger than the width 732. In this manner, the parasitic capacitance between the gate and the second terminal of the transistor 101_1 can be higher than the parasitic capacitance between the gale and the first terminal of the transistor 101_2. However, this embodiment is not limited to this.

Note that as has been described above, the parasitic capacitance between the gate and the second terminal of the transistor 101_2 can be higher than the parasitic capacitance between the gate and the first terminal of die transistor 101_2. As shown in FIG. 38, the width of the conductive layer 703 which can function as the first terminal of the transistor 101_1 is referred to as width 741, and the width of the conductive layer 703 which can function as the second terminal of the transistor 101_2 is referred to as width 742. The width 741 can be larger titan the width 742. Accordingly, the parasitic capacitance between the gate and the second terminal of the transistor 101_2 can be higher than the parasitic capacitance between the gate and the first terminal of die transistor 101_2. However, this embodiment is not limited to this.

Embodiment 12

In this embodiment, examples of electronic devices will be described.

FIGS. 39A to 39H and FIGS. 40A to 40D illustrate electronic devices. These electronic devices can include a housing 5000, a display portion 5001, a speaker 5003, an LED lamp 5004, operation keys 5005 (including a power switch or an operation switch for controlling the operation of a display device), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 39A:
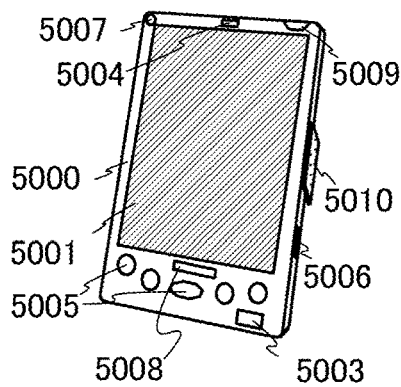
FIGS. 39A to 39H are examples of diagrams each illustrating an electronic device in Embodiment 12.
Figure 39B:
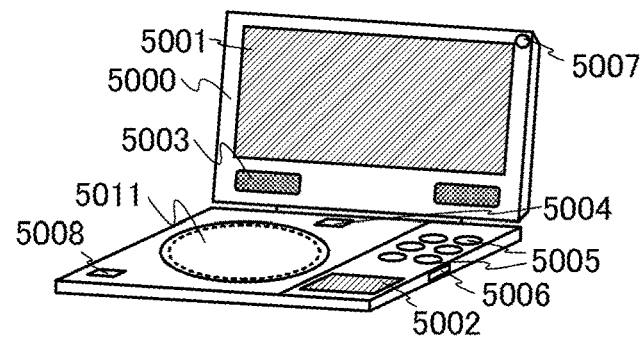
Figure 39C:
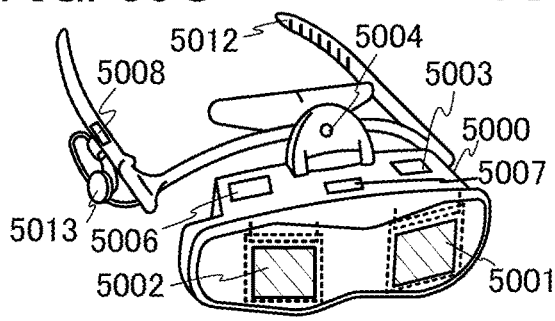
Figure 39D:
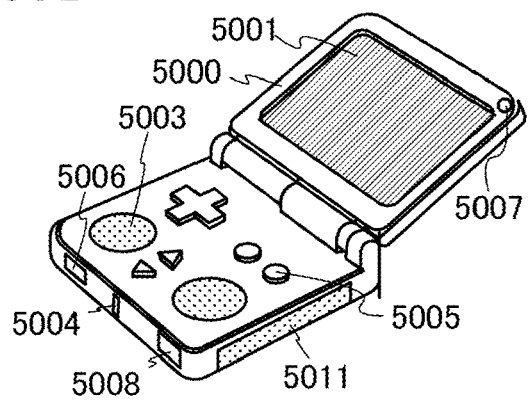
Figure 39E:
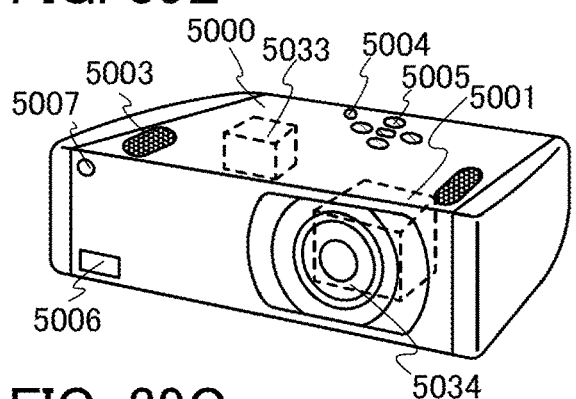
Figure 39F:
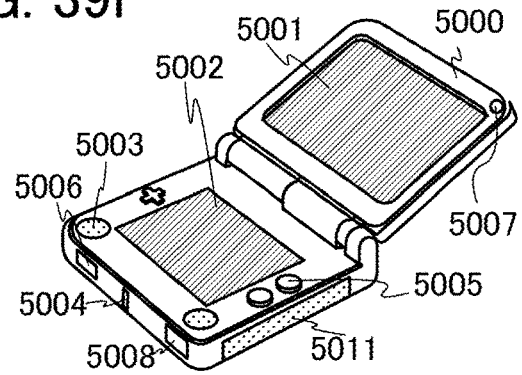
Figure 39G:
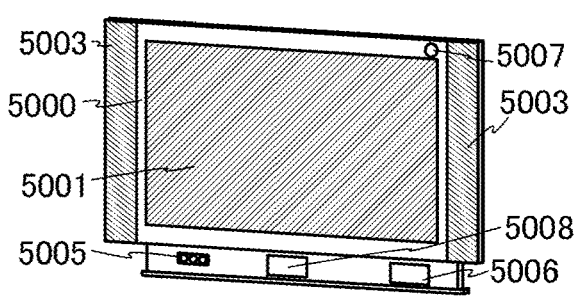
Figure 39H:
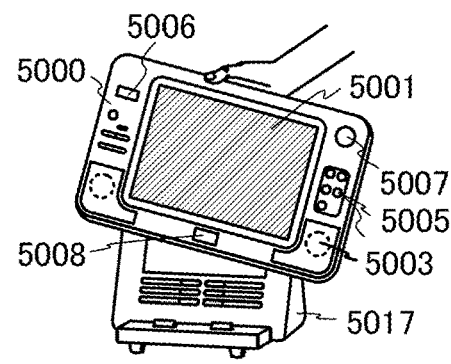
Figure 40A:
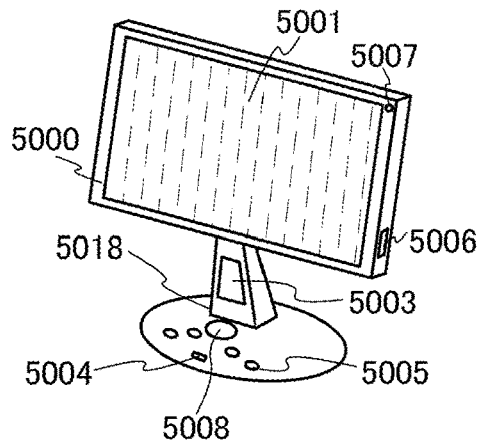
FIGS. 40A to 40H are examples of diagrams each illustrating an electronic device in Embodiment 12.
Figure 40B:
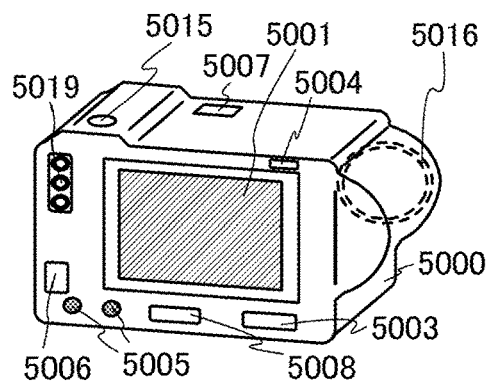
Figure 40C:
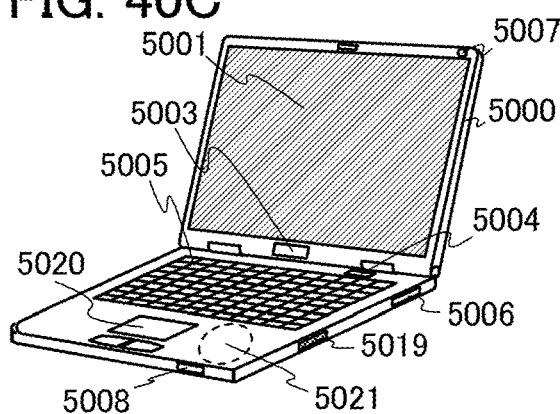
Figure 40D:
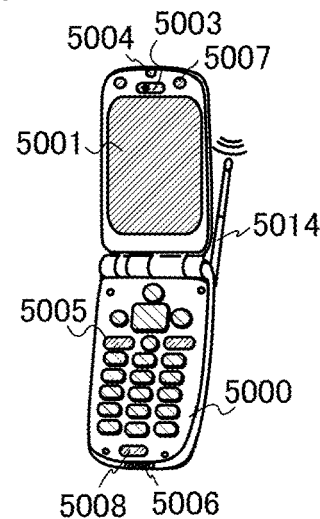

FIG. 39A illustrates a mobile computer, which can include a switch 5009, an infrared port 5010, and the like in addition to the above objects. FIG. 39B illustrates a portable image reproducing device provided with a memory medium (e.g., a DVD reading device), which can include a second display portion 5002, a memory medium reading portion 5011, and the like in addition to the above objects. FIG. 39C illustrates a goggle-type display, which can include the second display portion 5002, a support portion 5012, an earphone 5013, and the like in addition to the above objects. FIG. 39D illustrates a portable game machine, which can include the memory medium reading portion 5011 and the like in addition to the above objects. FIG. 39E illustrates a projector, which can include a light source 5033, a projector lens 5034, and the like in addition to the above objects. FIG. 39F illustrates a portable game machine, which can include the second display portion 5002, the memory medium reading portion 5011, and the like in addition to the above objects. FIG. 39G illustrates a television receiver, which can include a tuner, an image processing portion, and the like in addition to the above objects. FIG. 39H illustrates a portable television receiver, which can include a charger 5017 capable of transmitting and receiving signals and the like in addition to the above objects. FIG. 40A illustrates a display, which can include a support base 5018 and the like in addition to the above objects. FIG. 40B illustrates a camera, which can include an external connecting port 5019, a shutter button 5015, an image receiving portion 5016, and the like in addition to the above objects. FIG. 40C illustrates a computer, which can include a pointing device 5020, the external connecting port 5019, a reader/writer 5021, and the like in addition to the above objects. FIG. 40D illustrates a mobile phone, which can include an antenna 5014, a tuner of one-segment (1 seg digital TV broadcasts) partial reception service for mobile phones and mobile terminals, and the like in addition to the above objects.

The electronic devices illustrated in FIGS. 39A to 39H and FIGS. 40A to 40D can have a variety of functions, for example, a function of displaying various informations (e.g., a still image, a moving image, and a text image) on a display portion, a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 39A to 39H and FIGS. 40A to 40D are not limited them, and the electronic devices can have a variety of functions.

The electronic devices described in this embodiment each include a display portion for displaying some sort of information. By a combination of the electronic devices of this embodiment and the semiconductor device, shift register, or display device of Embodiments 1 to 9, improvement in reliability, improvement to yield, reduction in cost, increase in the size of the display portion, increase in the definition of the display portion, or the like can be achieved.

Next, applications of a semiconductor device will be described.

Figure 40E:
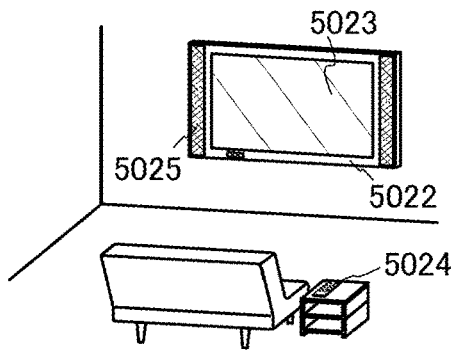

FIG. 40E illustrates an example in which a semiconductor device is incorporated in a building structure. FIG. 40E illustrates a housing 5022, a display portion 5023, a remote controller 5024 which is an operation portion, a speaker 5025, and the like. The semiconductor device is incorporated in the building structure as a wall-hanging type and can be provided without requiring a large space.

Figure 40F:
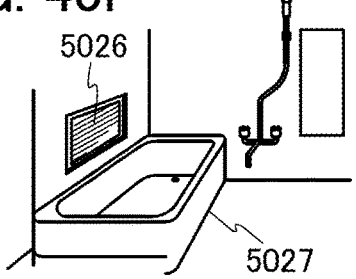

FIG. 40F illustrates another example in which a semiconductor device is incorporated in a building structure. A display panel 5026 is incorporated in a prefabricated hath unit 5027, so that a bather can view the display panel 5026.

Note that although this embodiment describes the wall and the prefabricated bath are given as examples of the budding structures, this embodiment is not limited to them. The semiconductor devices can be provided in a variety of building structures.

Next, examples in which semiconductor devices are incorporated in moving objects are described.

Figure 40G:
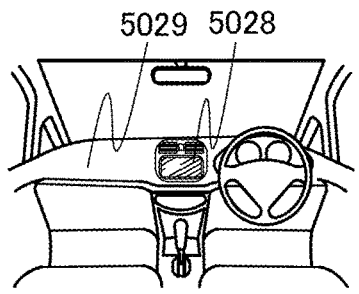

FIG. 40G illustrates an example in which a semiconductor device is incorporated in a car. A display panel 5028 is incorporated in a car body 5029 of the car and can display information related to the operation of the car or information input from inside or outside of the car on demand. Note that the display panel 5028 may have a navigation function.

Figure 40H:
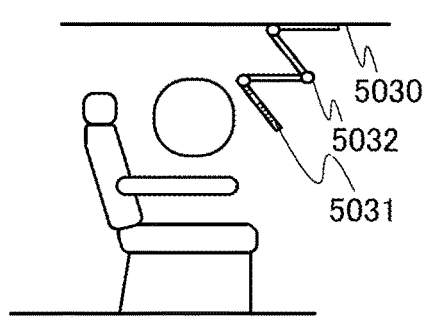

FIG. 40H illustrates an example in which a semiconductor device is incorporated in a passenger airplane. FIG. 40H illustrates a usage pattern when a display panel 5031 is provided for a ceiling 5030 above a seat of the passenger airplane. The display panel 5031 is incorporated in the ceiling 5030 through a hinge portion 5032, and a passenger can view the display panel 5031 by stretching of the hinge portion 5032. The display panel 5031 has a function of displaying information by the operation of the passenger.

Note that although bodies of a car and an airplane are illustrated as examples of moving objects in this embodiment, this embodiment is not limited to them. The semiconductor devices can be provided for a variety of objects such as two-wheeled vehicles, four-wheeled vehicles (including cars, buses, and the like), trains (including monorails, railroads, and the like), and vessels.

Thus application is based on Japanese Patent Application serial No. 2009-077200 (tied with Japan Patent Office on Mar. 26, 2009, tire entire contents of which are hereby incorporated by reference.

What is claimed is:

1. A display device comprising:
a gate driver,
wherein the gate driver comprises a first transistor,
wherein the first transistor comprises a first gate electrode, a first semiconductor layer, a first source electrode and a first drain electrode,
wherein the first semiconductor layer is provided over the first gate electrode,
wherein the first source electrode is provided over the first semiconductor layer,
wherein the first drain electrode is provided over the first semiconductor layer,
wherein one of the first source electrode and the first drain electrode comprises a first conductive layer,
wherein the first gate electrode comprises a second conductive layer,
wherein the one of the first source electrode and the first drain electrode comprises an enclosed opening portion,
wherein the enclosed opening portion comprises a region overlapping the second conductive layer and a region not overlapping the second conductive layer, and
wherein the other of the first source electrode and the first drain electrode is electrically connected to a gate signal line.

2. A display device comprising:
a gate driver,
wherein the gate driver comprises a first transistor and a second transistor,
wherein the first transistor comprises a first gate electrode, a first semiconductor layer, a first source electrode and a first drain electrode,
wherein the first semiconductor layer is provided over the first gate electrode,
wherein the first source electrode is provided over the first semiconductor layer,
wherein the first drain electrode is provided over the first semiconductor layer,
wherein the second transistor comprises a second gate electrode, a second semiconductor layer, a second source electrode and a second drain electrode,
wherein the second semiconductor layer is provided over the second gate electrode,
wherein the second source electrode is provided over the second semiconductor layer,
wherein the second drain electrode is provided over the second semiconductor layer, wherein one of the first source electrode and the first drain electrode comprises a first conductive layer, wherein the first conductive layer comprises one of the second source electrode and the second drain electrode, wherein the first gate electrode comprises a second conductive layer, wherein the one of the first source electrode and the first drain electrode comprises an enclosed opening portion, wherein the enclosed opening portion comprises a region overlapping the second conductive layer and a region not overlapping the second conductive layer, and wherein the other of the first source electrode and the first drain electrode is electrically connected to a gate signal line.

3. A display device comprising:

a first pixel, a second pixel and a gate driver, wherein the first pixel and the second pixel belong to a same line, wherein the first pixel comprises a first transistor and a first liquid crystal element, wherein the second pixel comprises a second transistor and a second liquid crystal element, wherein the first transistor comprises a first gate electrode, a first semiconductor layer, a first source electrode and a first drain electrode, wherein the second transistor comprises a second gate electrode, a second semiconductor layer, a second source electrode and a second drain electrode, wherein the first gate electrode is electrically connected to a first gate signal line, wherein the second gate electrode is electrically connected to a second gate signal line, wherein one of the first source electrode and the first drain electrode is electrically connected to a first source signal line, wherein one of the second source electrode and the second drain electrode is electrically connected to a second source signal line, wherein the other of the first source electrode and the second drain electrode is electrically connected to the first liquid crystal element, wherein the other of the second source electrode and the second drain electrode is electrically connected to the second liquid crystal element, wherein the gate driver comprises a third transistor, wherein the third transistor comprises a third gate electrode, a third semiconductor layer, a third source electrode and a third drain electrode, wherein the third semiconductor layer is provided over the third gate electrode, wherein the third source electrode is provided over the third semiconductor layer, wherein the third drain electrode is provided over the third semiconductor layer, wherein one of the third source electrode and the third drain electrode comprises a first conductive layer, wherein the third gate electrode comprises a second conductive layer, wherein the one of the third source electrode and the third drain electrode comprises an enclosed opening portion, wherein the enclosed opening portion comprises a region overlapping the second conductive layer and a region not overlapping the second conductive layer, and wherein the other of the third source electrode and the third drain electrode is electrically connected to one of the first gate signal line and the second gate signal line.

4. A display device comprising:

a first pixel, a second pixel and a gate driver, wherein the first pixel and the second pixel belong to a same line, wherein the first pixel comprises a first transistor and a first liquid crystal element, wherein the second pixel comprises a second transistor and a second liquid crystal element, wherein the first transistor comprises a first gate electrode, a first semiconductor layer, a first source electrode and a first drain electrode, wherein the second transistor comprises a second gate electrode, a second semiconductor layer, a second source electrode and a second drain electrode, wherein the first gate electrode is electrically connected to a first gate signal line, wherein the second gate electrode is electrically connected to a second gate signal line, wherein one of the first source electrode and the first drain electrode is electrically connected to a first source signal line, wherein one of the second source electrode and the second drain electrode is electrically connected to a second source signal line, wherein the other of the first source electrode and the second drain electrode is electrically connected to the first liquid crystal element, wherein the other of the second source electrode and the second drain electrode is electrically connected to the second liquid crystal element, wherein the gate driver comprises a third transistor and a fourth transistor, wherein the third transistor comprises a third gate electrode, a third semiconductor layer, a third source electrode and a third drain electrode, wherein the third semiconductor layer is provided over the third gate electrode, wherein the third source electrode is provided over the third semiconductor layer, wherein the third drain electrode is provided over the third semiconductor layer, wherein the fourth transistor comprises a fourth gate electrode, a fourth semiconductor layer, a fourth source electrode and a fourth drain electrode, wherein the fourth semiconductor layer is provided over the fourth gate electrode, wherein the fourth source electrode is provided over the fourth semiconductor layer, wherein the fourth drain electrode is provided over the fourth semiconductor layer, wherein one of the third source electrode and the third drain electrode comprises a first conductive layer, wherein the first conductive layer comprises one of the fourth source electrode and the fourth drain electrode, wherein the third gate electrode comprises a second conductive layer, wherein the one of the third source electrode and the third drain electrode comprises an enclosed opening portion, wherein the enclosed opening portion a region overlapping the second conductive layer and a region not overlapping the second conductive layer, and wherein the other of the third source electrode and the third drain electrode is electrically connected to one of the first gate signal line and the second gate signal line.

5. The display device according to claim 1, wherein the one of the first source electrode and the first drain electrode comprises a plurality of enclosed opening portions, wherein the plurality of enclosed opening portions comprises the enclosed opening portion.

\* \* \* \* \*